United States Patent
Kaneko et al.

(10) Patent No.: US 9,519,079 B2
(45) Date of Patent: *Dec. 13, 2016

(54) COLORING COMPOSITION, COLORED PATTERN, COLOR FILTER AND METHOD OF PRODUCING THE SAME, PATTERN FORMING METHOD, SOLID-STATE IMAGING DEVICE, AND IMAGE DISPLAY DEVICE

(71) Applicant: FUJIFILM Corporation, Minato-ku, Tokyo (JP)

(72) Inventors: Yushi Kaneko, Haibara-gun (JP); Yuzo Nagata, Haibara-gun (JP); Hiroaki Idei, Haibara-gun (JP); Kazuya Oota, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/174,344

(22) Filed: Feb. 6, 2014

(65) Prior Publication Data

US 2014/0154429 A1 Jun. 5, 2014

Related U.S. Application Data

(63) Continuation of application No. PCT/JP2012/075281, filed on Sep. 24, 2012.

(30) Foreign Application Priority Data

Sep. 28, 2011 (JP) ................. 2011-213221

(51) Int. Cl.

| C09K 19/00 | (2006.01) |
|---|---|
| G02B 1/04 | (2006.01) |
| G02B 5/20 | (2006.01) |
| G02B 5/22 | (2006.01) |
| C08G 18/67 | (2006.01) |
| C08G 18/75 | (2006.01) |
| C08G 18/32 | (2006.01) |
| C08G 18/34 | (2006.01) |
| C08F 8/10 | (2006.01) |
| G02F 1/13 | (2006.01) |
| G03F 7/00 | (2006.01) |
| G03F 7/027 | (2006.01) |
| G03F 7/033 | (2006.01) |
| G03F 7/038 | (2006.01) |
| G03F 7/105 | (2006.01) |
| C08F 212/14 | (2006.01) |
| C08F 212/32 | (2006.01) |

(52) U.S. Cl.
CPC . *G02B 1/04* (2013.01); *C08F 8/10* (2013.01); *C08G 18/329* (2013.01); *C08G 18/348* (2013.01); *C08G 18/672* (2013.01); *C08G 18/6705* (2013.01); *C08G 18/755* (2013.01); *G02B 5/20* (2013.01); *G02B 5/201* (2013.01); *G02B 5/223* (2013.01); *G02F 1/1306* (2013.01); *G03F 7/0007* (2013.01); *G03F 7/027* (2013.01); *G03F 7/033* (2013.01); *G03F 7/0388* (2013.01); *G03F 7/105* (2013.01); *C08F 212/14* (2013.01); *C08F 212/32* (2013.01); *Y10T 428/1041* (2015.01); *Y10T 428/24802* (2015.01)

(58) Field of Classification Search
CPC ............... G08B 1/04; G08B 1/08; G02B 5/20; G02B 5/201; G02B 5/22; G02B 5/223; C08F 299/02; C08F 212/14; C08F 212/32; C08G 18/6705; C08G 18/672
USPC ......... 428/1.1, 1.3, 1.31; 349/104, 106, 108; 430/7, 281.1, 285.1, 286.1
See application file for complete search history.

(56) References Cited

U.S. PATENT DOCUMENTS

| 6,509,125 B1 | 1/2003 | Ito et al. |
|---|---|---|
| 7,622,521 B2 | 11/2009 | Seto |
| 7,901,851 B2 | 3/2011 | Mizukawa et al. |
| 8,197,994 B2 | 6/2012 | Mizukawa et al. |
| 2008/0171271 A1* | 7/2008 | Kim et al. .................. 430/7 |
| 2012/0021354 A1* | 1/2012 | Fujie et al. ............. 430/270.1 |
| 2012/0187351 A1* | 7/2012 | Ito et al. .................. 252/586 |
| 2013/0012648 A1* | 1/2013 | Fujie et al. ............... 524/547 |

FOREIGN PATENT DOCUMENTS

| CN | 101226328 | 7/2008 |
|---|---|---|
| CN | 102803399 A | 11/2012 |
| JP | 8-73643 A | 3/1996 |
| JP | 2000162429 A * | 6/2000 |

(Continued)

OTHER PUBLICATIONS

International Search Report of PCT/JP2012/075281 dated Nov. 13, 2012, 4 pages.

(Continued)

*Primary Examiner* — Ruiyun Zhang
(74) *Attorney, Agent, or Firm* — Sughrue Mion, PLLC

(57) ABSTRACT

A coloring composition is provided which is less likely to remain on a pattern of other colors as residues and can inhibit occurrence of coating defects. Also provided are a colored pattern, a color filter, a method of producing a color filter, a pattern forming method, a solid-state imaging device, and an image display device, each using the coloring composition. The coloring composition contains a resin (A) having a dye structure, in which in the peak area of the total molecular weight distribution of the resin (A) as measured by gel permeation chromatography, the proportion of the peak area of a component having a molecular weight of 20,000 or more is 10% or less.

16 Claims, No Drawings

(56) References Cited

FOREIGN PATENT DOCUMENTS

| | | |
|---|---|---|
| JP | 2005-266149 A | 9/2005 |
| JP | 3736221 B2 | 1/2006 |
| JP | 2007-138051 A | 6/2007 |
| JP | 2007-139906 A | 6/2007 |
| JP | 2008-292970 A | 12/2008 |
| JP | 2011-016974 A | 1/2011 |
| JP | 2011-095732 A | 5/2011 |
| JP | 2011-158654 A | 8/2011 |
| KR | 2000-0017604 A | 3/2000 |
| TW | 201111909 A1 | 4/2011 |
| TW | 201129559 A1 | 9/2011 |
| WO | 2009/157536 A1 | 12/2009 |
| WO | 2010/143745 A1 | 12/2010 |
| WO | WO 2011040628 A1 * | 4/2011 |
| WO | WO 2011122707 A1 * | 10/2011 |

OTHER PUBLICATIONS

Written Opinion of PCT/JP2012/075281 dated Nov. 13, 2012, 5 pages.
Office Action from the Japanese Patent Office issued Oct. 14, 2014 in counterpart Japanese Patent Application No. 2011-213221.
Communication dated Jun. 2, 2015 from the Japanese Patent Office in counterpart JP Application No. 2011-213221.
Office Action dated Nov. 2, 2015 from the Taiwan Intellectual Property Office in counterpart Taiwanese Application No. 101134534.
Office Action dated Feb. 1, 2016, issued by the Korean Intellectual Property Office in corresponding Korean Application No. 10-2014-7008346.
Office Action dated Feb. 14, 2016, issued by the State Intellectual Property Office of People's Republic of China in counterpart CN Application No. 201280047039.8.
Office Action dated Apr. 14, 2016 from the Taiwanese Intellectual Property Office in counterpart Taiwanese Application No. 101134534.
Office Action dated Jul. 5, 2016, issued by the Korean Intellectual Property Office in corresponding Korean Application No. 10-2014-7008346.
Office Action dated Aug. 23, 2016 from the Japanese Patent Office in counterpart Japanese Application No. 2015-146961.
Office Action dated Sep. 1, 2016, issued by the Korean Intellectual Property Office in corresponding Korean Application No. 10-2014-7008346.

* cited by examiner

COLORING COMPOSITION, COLORED PATTERN, COLOR FILTER AND METHOD OF PRODUCING THE SAME, PATTERN FORMING METHOD, SOLID-STATE IMAGING DEVICE, AND IMAGE DISPLAY DEVICE

BACKGROUND OF THE INVENTION

1. Field of the Invention

The present invention relates to a coloring composition that contains a resin having a dye structure and is suitable for producing a color filter used for a liquid crystal display device or a solid-state imaging device, a colored pattern, a color filter and a method of producing the same, a pattern forming method, a solid-state imaging device, and an image display device.

2. Description of the Related Art

As one of the methods of producing a color filter used for a liquid crystal display device or a solid-state imaging device, there is a pigment dispersion method, and as the pigment dispersion method, there is a method of producing a color filter by photolithography by using a radiation-sensitive coloring composition that is obtained by dispersing pigments in various photosensitive compositions. Specifically, a radiation-sensitive coloring composition is coated onto a substrate by using a spin coater, a roll coater, or the like, followed by drying to form a coating film, and the coating film is developed by pattern exposure, thereby obtaining colored pixels. This operation is repeated for the number of the desired colors, thereby producing a color filter.

The above method is stable with respect to light or heat since the method uses pigments, and positional accuracy is sufficiently secured since patterning is performed by photolithography. Accordingly, the method has been widely used as a method suitable for producing a color filter or the like for color display.

Meanwhile, in recent years, there has been a demand for color filters for a solid-state imaging device such as a CCD to have a higher resolution. As the resolution of the color filter increases, the size of a pattern tends to be miniaturized, but it is considered that the pigment dispersion method that has been widely used in the related art has a difficulty in further improving resolution while also miniaturizing the size of a pattern. One of the reasons is that coarse particles generated due to the aggregation of pigment particles cause color unevenness in a fine pattern. Consequently, in recent years, the pigment dispersion method having been widely used so far has not necessarily been used for purposes requiring a fine pattern, such as in a solid-state imaging device.

In the related art, a color filter has been prepared using a pigment as a colorant, but recently, using a dye instead of a pigment has been examined. When a dye is used, the following points particularly become problems.

(1) A dye is generally inferior to a pigment in terms of light resistance and heat resistance. Particularly, there is a problem in that optical characteristics are changed due to a high-temperature process when a film is formed using ITO (indium tin oxide) widely used as an electrode of liquid crystal display or the like.

(2) Since a dye tends to suppress a radical polymerization reaction, in a system using radical polymerization as curing means, there is a difficulty in designing a radiation-sensitive coloring composition.

Particularly, when photolithography is used for preparing a color filter, the following points become problems.

(3) Generally, a dye exhibits low solubility in an aqueous alkaline solution or an organic solvent (hereinafter, simply referred to as a "solvent"), so it is difficult to obtain a radiation-sensitive coloring composition having a desired spectrum.

(4) A dye interacts with other components in a radiation-sensitive coloring composition in many cases, and it is difficult to adjust the solubility (developability) in an exposed and an unexposed portion.

(5) When a molar extinction coefficient ($\epsilon$) of a dye is low, the dye has to be added in a large amount. As a result, amounts of other components in a radiation-sensitive coloring composition, such as a polymerizable compound (monomer), a binder, and a photopolymerization initiator, have to be relatively reduced, and curability of the composition, heat resistance after curing, developability, and the like deteriorate.

Due to these problems, it has been difficult so far to form a colored pattern that is constituted with a fine and thin film for a high-resolution color filter and that has excellent fastness by using a dye. In addition, in a case of a color filter for a solid-state imaging device, a coloring layer is required to be a thin film of 1 µm or less. Accordingly, in order to obtain desired absorption, a large amount of dye needs to be added to a radiation-sensitive coloring composition, and consequently, the problem described above arises.

Moreover, a fact that when a radiation-sensitive coloring composition containing a dye is formed into a film and then subjected to a heating treatment, a phenomenon of color migration is easily caused between different colors of colored patterns adjacent to each other or between layers laminated and stacked on each other has been observed. In addition to color migration, there is also a problem that a pattern is easily peeled off in an area with a low exposure amount due to decrease in sensitivity, a problem that since the amount of photosensitive components contributing to photolithography properties is relatively reduced, a desired shape or color density is not obtained due to heat sagging or elution at the time of development, or the like.

As a method for resolving these problems, there is a disclosure regarding a method of solving these problems by polymerizing dyes (for example, see JP2007-139906A, JP2007-138051A, JP3736221B, and JP2011-95732A)

SUMMARY OF THE INVENTION

However, if a coloring composition containing a polymerized dye is coated, a problem that the coloring composition remains as a residue on a pattern of other colors formed previously arises in some cases. In addition, in a coating step, defects are caused in some cases by generation of foreign substances.

The present invention has been made in consideration of the above circumstances and aims to achieve the following objects.

That is, a first object of the present invention is to provide a coloring composition that is less likely to remain on a pattern of other colors as residues and can inhibit the occurrence of coating defects.

A second object of the present invention is to provide a colored pattern that has excellent color separation properties and does not exhibit coating defects, a color filter including the colored pattern, and a method of producing the color filter.

A third object of the present invention is to provide a pattern forming method that residues are likely to remain on a pattern of other colors and the occurrence of coating defects can be inhibited.

A fourth object of the present invention is to provide a solid-state imaging device and an image display device that have excellent color separation properties by including the color filter.

Specific means for achieving the above objects are as follows.

[1] A coloring composition containing a resin (A) having a dye structure, wherein in a peak area of the total molecular weight distribution of the resin (A) measured by gel permeation chromatography (GPC), a proportion of a peak area of a component having a molecular weight of 20,000 or more is 10% or less.

[2] The coloring composition according to section [1], wherein a weight average molecular weight of the resin (A) is 4,000 to 15,000.

[3] The coloring composition according to section [1] or [2], further containing (B) a pigment.

[4] The coloring composition according to any one of sections [1] to [3], further containing (C) a polymerizable compound and (D) a photopolymerization initiator.

[5] The coloring composition according to any one of sections [1] to [4], further containing (E) an alkali-soluble resin.

[6] The coloring composition according to any one of sections [1] to [5], wherein the dye structure of the resin (A) is a structure derived from a dye selected from a dipyrromethene dye, an azo dye, an anthraquinone dye, a triphenylmethane dye, a xanthene dye, a cyanine dye, a squarylium dye, a quinophthalone dye, a phthalocyanine dye, and a subphthalocyanine dye.

[7] The coloring composition according to any one of sections [1] to [6], wherein the resin (A) further contains a polymerizable group.

[8] The coloring composition according to any one of sections [1] to [7], wherein the resin (A) is a resin obtained by a polymerization reaction in the presence of a polymerization inhibitor.

[9] The coloring composition according to any one of sections [1] to [8], wherein the resin (A) is a resin obtained by a step of removing the component having a molecular weight of 20,000 or more by precipitating the component by using a poor solvent.

[10] The coloring composition according to any one of sections [1] to [9], which is used for forming a coloring layer of a color filter.

[11] A colored pattern obtained by using the coloring composition according to any one of sections [1] to [10].

[12] A color filter including the colored pattern according to section [11].

[13] A method of producing a color filter, including a step of forming a coloring layer by imparting the coloring composition according to any one of sections [1] to [10] onto a support, a step of exposing the coloring layer, and a step of developing the coloring layer after exposure and removing an unexposed portion to form a colored pattern.

[14] A pattern forming method, including a step of forming a coloring layer by imparting the coloring composition according to any one of sections [1] to [10] onto a support, a step of exposing the coloring layer, and a step of developing the coloring layer after exposure and removing an unexposed portion to form a colored pattern.

[15] A solid-state imaging device including the color filter according to section [12] or a color filter obtained by the method of producing a color filter according to section [13].

[16] An image display device including the color filter according to section [12] or a color filter obtained by the method of producing a color filter according to section [13].

According to the coloring composition of the present invention, residues can be inhibited from being generated on a pattern of other colors, and coating defects can be inhibited.

In addition, according to the present invention, a color pattern that has excellent color separation properties and does not exhibit coating defects, a color filter including the colored pattern, and a method of producing the color filter can be provided.

Moreover, according to the present invention, a pattern forming method that is likely to remain the coloring composition on a pattern of other colors as residues and can inhibit the occurrence of coating defects can be provided.

Furthermore, according to the present invention, a solid-state imaging device and an image display device (a liquid crystal display device, an organic EL display device, or the like) that have excellent color separation properties due to inclusion of the color filter can be provided.

DESCRIPTION OF THE PREFERRED EMBODIMENTS

The constituent elements of the present invention described below will be explained based on typical embodiments of the present invention, but the present invention is not limited to the embodiments.

Regarding the description for a group (atomic group) in the present specification, if a group is not described with regard to whether the group is substituted or unsubstituted, this group includes not only a group (atomic group) not having a substituent but also a group (atomic group) having a substituent. For example, an "alkyl group" includes not only an alkyl group (unsubstituted alkyl group) not having a substituent but also an alkyl group (substituted alkyl group) having a substituent.

In the present invention, the term "actinic rays" or "radiation" refers to, for example, a bright line spectrum of a mercury lamp, far-ultraviolet rays represented by an excimer laser, extreme ultraviolet rays (EUV light), X-rays, or an electron beam. In addition, the "light" in the present invention refers to the actinic rays or the radiation. The term "exposure" in this specification includes not only the exposure performed using a mercury lamp, far-ultraviolet rays represented by an excimer laser, X-rays, EUV light, and the like, but also patterning performed using particle beams such as an electron beam and an ion beam, unless otherwise specified.

In the present specification, a range of numerical values represented by "xx to yy" refers to a range that includes "xx" as a lower limit and "yy" as an upper limit.

In the present specification, "total solid contents" refers to a total mass of components that is obtained by excluding a solvent from the total constitution of a coloring composition.

In addition, in the present specification, "(meth)acrylate" indicates either or both of "acrylate" and "methacrylate", "(meth)acryl" indicates either or both of "acryl" and "methacryl", and "(meth)acryloyl" indicates either or both of "acryloyl" or "methacryloyl".

In the present specification, a monomer is distinguished from an oligomer or a polymer, and refers to a compound having a weight average molecular weight of 2,000 or less.

In the present specification, a polymerizable compound refers to a compound having a polymerizable functional group and may be either a monomer or a polymer. The polymerizable functional group refers to a group involved in a polymerization reaction.

In the present invention, a "coloring layer" refers to a layer that is used for a color filter and includes pixels and/or a black matrix.

In the present specification, a term "step" includes not only an independent step, but also such steps that can achieve an action desired for these steps even if these steps are not clearly distinguished from other steps.

[Coloring Composition]

The coloring composition of the present invention contains a resin (A) having a dye structure, and in a peak area of the total molecular weight distribution of the resin (A) measured by gel permeation chromatography (GPC), a proportion of a peak area of a component having a molecular weight of 20,000 or more is 10% or less.

The coloring composition of the present invention, in which in a peak area of the total molecular weight distribution of the resin (A) measured by gel permeation chromatography (GPC), a proportion of a peak area of a component having a molecular weight of 20,000 or more is 10% or less, can form a colored pattern that inhibits residues from being generated on a pattern of other colors and occurrence of coating defects.

Though unclear, the mechanism of the action is assumed to be as below. In the resin (A) having a dye structure, the high-molecular weight components having a molecular weight of 20,000 or more have a large number of dye structures, which causes multiple-point adsorption of the components onto the dye in a pattern of other colors formed previously. The resin having the dye structure that is adsorbed onto the pattern of another color due to the association fails to be removed in a developing step, and therefore residues are generated. Moreover, the high-molecular weight components having a molecular weight of 20,000 or more in the resin having a dye structure are considered to have aggregability and to generate foreign substances (defects) by being aggregated at the time of coating.

On the other hand, in the present invention, in a peak area of the total molecular weight distribution of the resin (A) measured by GPC, a proportion of a peak area of the component having a molecular weight of 20,000 or more is set to 10% or less. Consequently, presumably, a colored pattern that inhibits residues from being generated on a pattern of other colors and inhibits occurrence of coating defects can be formed.

The coloring composition of the present invention is preferably a radiation-sensitive coloring composition sensitive to radiation.

The coloring composition of the present invention preferably contains (B) a pigment, more preferably contains (C) a polymerizable compound and (D) a photopolymerization initiator in addition to (A) and (B), and particularly preferably contains (E) an alkali-soluble resin in addition to (A) to (D). The coloring composition may optionally contain other components such as a crosslinking agent.

Hereinafter, the respective components contained in the coloring composition of the present invention will be described in detail.

[Resin (A) having dye structure in which proportion of peak area of component having a molecular weight of 20,000 or more measured by gel column chromatography (GPC) in peak area of total molecular weight distribution of resin (A) is 10% or less (hereinafter, simply referred to as "resin (A) having dye structure or "resin (A)" in some cases)]

In the present invention, a molecular weight and a weight average molecular weight can be measured by GPC under the following conditions and can be expressed as a converted value in terms of polystyrene.

Measurement instrument: HLC-8220GPC (manufactured by TOSOH CORPORATION)

Guard column: HZ-L (manufactured by TOSOH CORPORATION)

Columns: TSK gel Super HZM-M (manufactured by TOSOH CORPORATION), TSK gel Super HZM-4000 (manufactured by TOSOH CORPORATION), TSK gel Super HZM-3000 (manufactured by TOSOH CORPORATION), and TSK gel Super HZM-2000 (manufactured by TOSOH CORPORATION)

Eluent: tetrahydrofuran

Conditions for solution delivery: a sample pump rate of 0.35 mL/min, and a reference pump rate of 0.20 mL/min Column temperature: 40° C.

Concentration of sample measured: 0.1% by mass (tetrahydrofuran solution)

Injection amount: 10 µL

In the present invention, in a peak area of the total molecular weight distribution of the resin (A) measured by GPC, a proportion of a peak area of a component having a molecular weight of 20,000 or more is 10% or less, preferably 7% or less in a peak area of the total molecular weight distribution of the resin (A), and more preferably 5% or less.

The weight average molecular weight of the resin (A) having a dye structure is preferably 4,000 to 15,000 and more preferably 5,000 to 10,000. If the weight average molecular weight is lower than this range, worsening of generation of residues on a pattern of other colors (the size of the dye is reduced, so the dye soaks into the pattern) cannot be inhibited. Moreover, if the weight average molecular weight is larger than the above, worsening of color unevenness becomes serious.

In the present specification, as a weight average molecular weight and a number average molecular weight, values that are obtained by measurement using GPC and converted in terms of polystyrene are used.

A ratio [(Mw)/(Mn)] between a weight average molecular weight (Mw) and a number average molecular weight (Mn) of the resin (A) having a dye structure is preferably 1.0 to 3.0, more preferably 1.6 to 2.5, and most preferably 1.6 to 2.0.

In the present invention, there is no particular limitation on the method of producing the resin (A) in which a proportion of a peak area of a component having a molecular weight of 20,000 or more measured by GPC in a peak area of the total molecular weight distribution of the resin (A) is 10% or less. Examples of the method include (i) a method of producing the resin (A) by a polymerization reaction performed in the presence of a polymerization inhibitor, (ii) a method of producing the resin (A) by a step of adding a poor solvent (water or the like) for the high-molecular weight component having a molecular weight of 20,000 or more to the obtained polymerization solution, and removing the precipitated high-molecular weight component having a molecular weight of 20,000 or more by filtration, and the like. According to these production methods, the generation of the component having a molecular weight of 20,000 or more can be inhibited, and a proportion of a peak area of the component having a molecular weight of 20,000 or more in a peak area of the total molecular weight distribution of the resin (A) can be suitably set to 10% or less.

Particularly, the production method (i) is preferable since this method shows a high degree of production suitability.

In the present invention, known polymerization inhibitors (radical polymerization inhibitors and the like) can be used without limitation, and examples thereof include phenols (for example, p-methoxyphenol, 2,5-di-tert-butyl-4-methylphenol, 2,6-di-tert-butyl-4-methylphenol, 4,4'-thiobis(3-methyl-6-t-butylphenol), 2,2'-methylenebis(4-methyl-6-t-butylphenol), and 4-methoxyphenol), hydroquinones (for example, hydroquinone and 2,6-di-tert-butyl hydroquinone), quinones (for example, benzoquinone), nitroxy radicals (for example, a 2,2,6,6-tetramethylpiperidine 1-oxyl free radical and a 4-hydroxyl-2,2,6,6-tetramethylpiperidine 1-oxyl free radical), nitrobenzenes (for example, nitrobenzene and 4-nitrotoluene), and phenothiazines (for example, phenothiazine and 2-methoxyphenothiazine). Among these, phenols, hydroquinones, quinones, and nitroxy radicals are particularly preferable, and phenols are most preferable.

The amount of the polymerization inhibitor such as a radical polymerization inhibitor used is preferably 10 ppm to 5000 ppm and more preferably 100 ppm to 1000 ppm, based on a dye monomer corresponding to a constitutional unit having a dye structure contained in a solution of polymerization reaction. If the amount is larger than this range, polymerization is hindered, and if the amount is smaller than this range, the component having a molecular weight of 20,000 or more tends to increase.

More specifically, the resin (A) having a dye structure is preferably a resin that has a partial structure having a dye structure of which a maximum absorption wavelength is present in a range of 400 nm to 780 nm, in a molecular structure of the resin. In the coloring composition of the present invention, the resin (A) having a dye structure functions as, for example, a colorant.

Hereinafter, the resin (A) having a dye structure (a dye-derived partial structure in the resin (A) having a dye structure, preferable structures of the resin (A) having a dye structure, functional groups that the resin (A) having a dye structure may have, and the like) will be described in detail.

The "dye-derived partial structure" mentioned herein refers to a structure that can be directly or indirectly linked to a linking portion (polymer chain) of the resin having a dye structure and is formed when a hydrogen atom is removed from the specific dye (hereinafter, also referred to as a "dye compound") described later that can form a dye structure.

(Dye-Derived Partial Structure)

The dye-derived partial structure (hereinafter, also referred to as a "dye structure") in the resin (A) having a dye structure is not particularly limited, and various structures having known dye structures can be used. Examples of the known dye structures include dye structures and the like derived from a dye selected from an azo dye, an azomethine dye, (an indoaniline dye, an indophenol dye, or the like), a dipyrromethene dye, a quinone dye (a benzoquinone dye, a naphthoquinone dye, an anthraquinone dye, an anthrapyridone dye, or the like), a carbonium dye (a diphenylmethane dye, a triphenylmethane dye, a xanthene dye, an acridine dye, or the like), a quinonimine dye (an oxazine dye, a thiazine dye, or the like), an azine dye, a polymethine dye (an oxonol dye, a merocyanine dye, an arylidene dye, a styryl dye, a cyanine dye, a squarylium dye, a croconium dye, or the like), a quinophthalone dye, a phthalocyanine dye, a subphthalocyanine dye, a perinone dye, an indigo dye, a thioindigo dye, a quinoline dye, a nitro dye, a nitroso dye, and a metal complex dye of these. The resin (A) of the present invention may have one kind or two or more kinds of the above dye structure.

Among these dye structures, in view of color characteristics such as hues, color separation properties, and color unevenness, dye structures derived from a dye selected from an azo dye, a dipyromethene dye, an anthraquinone dye, a triphenylmethane dye, a xanthene dye, a cyanine dye, a squarylium dye, a quinophthalone dye, a phthalocyanine dye, and a subphthalocyanine dye are preferable, and dye structures derived from a dye selected from an anthraquinone dye, a triphenylmethane dye, a xanthene dye, a cyanine dye, a squarylium dye, a quinophthalone dye, a phthalocyanine dye, and a subphthalocyanine dye are most preferable. Specific dye compounds that can form a dye structure are disclosed in "New edition, Dye Handbook" (edited by The Society of Synthetic Organic Chemistry, Japan; MARUZEN, Co., Ltd., 1970), "Color index" (The Society of Dyers and Colourists), "Dye Handbook" (Gen Ookawara et al; Kodansha Ltd., 1986), and the like.

In the resin (A) having a dye structure of the present invention, a hydrogen atom in the dye structure may be substituted with a substituent selected from the following substituent group A.

<Substituent Group A>

Examples of the substituent that the resin having a dye structure may have include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an alkylamino group and an anilino group), an acylamino group, an aminocarbonylamino group, an alkoxycarbonylamino group, an aryloxycarbonylamino group, a sulfamoyl amino group, an alkyl or arylsulfonylamino group, a mercapto group, an alkylthio group, an arylthio group, a heterocyclic thio group, a sulfamoyl group, a sulfo group, an alkyl or aryl sulfonyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like. These will be described in detail below.

Examples of the substituent include a halogen atom (for example, a fluorine atom, a chlorine atom, a bromine atom, or an iodine atom), a linear or branched alkyl group (linear or branched, substituted or unsubstituted alkyl group preferably having 1 to 30 carbon atoms, for example, methyl, ethyl, n-propyl, isopropyl, t-butyl, n-octyl, 2-chloroethyl, 2-cyanoethyl, 2-ethylhexyl), a cycloalkyl group (preferably a substituted or unsubstituted cycloalkyl group having 3 to 30 carbon atoms, for example, cyclohexyl or cyclopentyl, examples thereof include groups having a polycyclic structure, such as polycycloalkyl groups like a bicycloalkyl group (preferably a substituted or unsubstituted bicycloalkyl group having 5 to 30 carbon atoms, for example, bicyclo[1,2,2]heptan-2-yl and bicyclo[2,2,2]octan-3-yl) and a tricycloalkyl group, a monocyclic cycloalkyl group and bicycloalkyl group are preferable, and a monocyclic cycloalkyl group is particularly preferable), a linear or branched alkenyl group (a linear or branched substituted or unsubstituted alkenyl group, which is preferably an alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, for example, 2-cyclopenten-1-yl or 2-cyclohexen-1-yl; the alkenyl group is a polycycloalkenyl group, for example, a bicycloalkenyl group (preferably a substituted or unsubstituted bicycloalkenyl group having 5 to 30 carbon atoms, for example, bicyclo[2,2,1]hepto-2-en-1-yl or bicyclo[2,2,2]octo-2-en-4-yl) or a tricycloalkenyl group, a monocyclic cycloalkenyl group is particularly preferable), an alkynyl group (preferably a substituted or unsubstituted alkynyl group having 2 to 30 carbon atoms, for example, an ethynyl, propargyl, or trimethylsilyl ethynyl group), an aryl group (preferably a substituted or unsubstituted aryl group having 6 to 30 carbon atoms, for example, phenyl, p-tolyl, naphthyl, m-chlorophenyl, or o-hexadecanoyl aminophenyl), a heterocyclic group (preferably a substituted or unsubstituted, saturated or unsaturated, aromatic or non-aromatic, and monocyclic or ring-condensed 5- to 7-membered heterocyclic group, more preferably a heterocyclic group of which ring-constituting atoms are selected from carbon atoms, nitrogen atoms, and sulfur atoms, and which has at least any one of hetero atoms including a nitrogen atom, an oxygen atom, and a sulfur atom, and even more preferably a 5- or 6-membered aromatic heterocyclic group having 3 to 30 carbon atoms, for example, 2-furyl, 2-thienyl, 2-pyridyl, 4-pyridyl, 2-pyrimidinyl, or 2-benzothiazolyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 2,4-di-t-amylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, a heterocycle portion of the heterocyclic oxy group is preferably the heterocycle portion explained for the heterocyclic group described above, the heterocyclic oxy group is 1-phenyltetrazol-5-oxy or 2-tetrahydropyranyloxy, for example), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxy carbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxy carbonyloxy), an amino group (preferably an amino group, a substituted or unsubstituted alkylamino group having 1 to 30 carbon atoms, a substituted or unsubstituted arylamino group having 6 to 30 carbon atoms, or a heterocyclic amino group having 0 to 30 carbon atoms, for example, amino, methylamino, dimethylamino, anilino, N-methyl-anilino, diphenylamino, or N-1,3,5-triazin-2-ylamino), an acylamino group (preferably a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenyl carbonylamino), an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), an alkyl or aryl sulfonylamino group (preferably a substituted or unsubstituted alkyl sulfonylamino group having 1 to 30 carbon atoms, or a substituted or unsubstituted aryl sulfonylamino group having 6 to 30 carbon atoms, for example, methyl sulfonylamino, butyl sulfonylamino, phenyl sulfonylamino, 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably a substituted or unsubstituted arylthio group having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, in which a heterocycle portion is preferably the heterocycle portion explained for the heterocyclic group described above, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsufamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, an alkyl or aryl sulfinyl group (preferably a substituted or unsubstituted alkyl sulfinyl group having 1 to 30 carbon atoms or a substituted or unsubstituted aryl sulfinyl group having 6 to 30 carbon atoms, for example, methyl sulfinyl, ethyl sulfinyl, phenyl sulfinyl, or p-methylphenyl sulfinyl), an alkyl or aryl sulfony group (preferably a substituted or unsubstituted alkyl solfonyl group having 1 to 30 carbon atoms or a substituted or unsubstituted aryl sulfonyl group having 6 to 30 carbon atoms, for example, methyl sulfonyl, ethyl sulfonyl, phenyl sulfonyl, or p-methylphenyl sulfonyl), an acyl group (preferably a formyl group, a substituted or unsubstituted alkyl carbonyl group having 2 to 3 carbon atoms, or a substituted or unsubstituted aryl carbonyl group having 7 to 30 carbon atoms, for example, acetyl, pivaloyl, 2-chloroacetyl, stearoyl, benzoyl, or p-n-octyloxyphenylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably a substituted or unsubstituted carbamoyl group having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an aryl or heterocyclic azo group (preferably a substituted or unsubstituted arylazo group having 6 to 30 carbon atoms, or a substituted or unsubstituted heterocyclic azo group having 3 to 30 carbon atoms (in which a heterocycle portion is preferably the heterocycle portion explained for the heterocyclic group described above, for example, phenylazo, p-chlorophenylazo, or 5-ethylthio-1,3,4-thiadiazol-2-ylazo), an imide group (preferably a substituted or unsubstituted imide group having 2 to 30 carbon atoms, for example, N-succinimide or N-phthalimide), a phosphino group (preferably a substituted or unsubstituted phosphino group having 2 to 30 carbon atoms, for example, dimethylphosphino, diphenylphosphino, or methyl phenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), and a silyl group (preferably a substituted or unsubstituted silyl group having 3 to 30 carbon atoms, for example, trimethyl silyl, t-butyl dimethyl silyl, or phenyl dimethyl silyl).

Among the above functional groups, in the functional groups having hydrogen atoms, the portion of hydrogen atoms in the functional groups may be substituted with any one of the above groups. Examples of the functional groups that can be introduced as substituents include an alkylcarbonylaminosulfonyl group, an arylcarbonylaminosulfonyl group, an alkylsulfonylaminocarbonyl group, and an arylsulfonylaminocarbonyl group, and specific examples thereof include methylsulfonylaminocarbonyl, p-methylphenyl sulfonylaminocarbonyl, acetylaminosylfonyl, and benzoylaminosulfonyl groups.

Particularly preferable dyes (dye compounds) that can form a dye-derived partial structure in the resin (A) having a dye structure will be described in detail.

(Dipyrromethene Dye)

One of the embodiments of the resin (A) having a dye structure according to the present invention is a resin having a dye structure that has a partial structure derived from a dipyrromethene dye described below as a partial structure of the dye moiety.

As the dipyrromethene dye of the present invention, a dipyrromethene compound and a dipyrromethene metal complex compound obtained from a dipyromethene compound with a metal or a metal compound are preferable.

In addition, in the present invention, a compound having a dipyrromethene structure is called a dipyrromethene compound, and a complex in which a metal or a metal compound is coordinated to the compound having a dipyrromethene structure is called a dipyrromethene metal complex compound.

As the dipyrromethene metal complex compound, a dipyrromethene metal complex compound obtained from a dipyrromethene compound represented by the following General Formula (M) with a metal or a metal compound and a tautomer thereof are preferable. Among these, a dipyrromethene metal complex compound represented by the following General Formula (7) and a dipyrromethene metal complex compound represented by the following General Formula (8) are exemplified as preferable embodiments, and the dipyrromethene metal complex compound represented by the following General Formula (8) is most preferable.

<<Dipyrromethene Metal Complex Compound Obtained from Dipyrromethene Compound Represented by General Formula (M) with Metal or a Metal Compound, and Tautomer Thereof>>

One of preferable embodiments of the dye structure in the resin (A) having a dye structure is a dye structure that includes, as a dye moiety, a complex (hereinafter, appropriately referred to as a "specific complex") in which a compound (dipyrromethene compound) represented by the following General Formula (M) or a tautomer thereof is coordinated to a metal or as metal complex.

[Chem. 1]

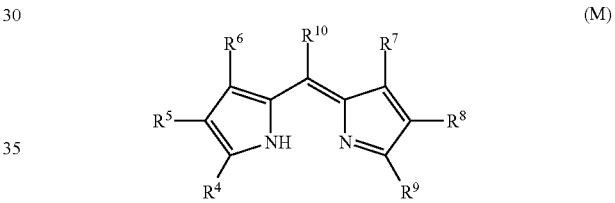

(M)

In General Formula (M), each of $R^4$ to $R^{10}$ independently represents a hydrogen atom or a monovalent substituent. Here, $R^4$ and $R^9$ do not form a ring by binding to each other.

When the compound represented by General Formula (M) is introduced by being bonded to the structural unit represented by General Formulae (A) to (C) described later, the binding position is not particularly limited. However, in view of synthesis suitability, the compound is preferably introduced by being bonded via one position among $R^4$ to $R^9$, more preferably introduced by being bonded via one position among $R^4$, $R^6$, $R^7$, and $R^9$, and even more preferably introduced by being bonded via one position among $R^4$ and $R^9$.

When $R^4$, to $R^9$ in General Formula (M) represent a monovalent substituent, examples of the monovalent substituent include the substituents exemplified in the above section of the substituent group A.

When the monovalent substituent represented by $R^4$ to $R^9$ in General Formula (M) is a group that can be further substituted, the group may have the substitutes described for $R^4$ to $R^9$, and when the group has two or more substituents, these substituents may be the same as or different from each other.

In General Formula (M), $R^4$ and $R^5$, $R^5$ and $R^6$, $R^7$ and $R^8$, and $R^8$ and $R^9$ may independently form a 5-, 6-, or 7-membered saturated or unsaturated ring by binding to each other respectively. Here, $R^4$ and $R^9$ do not form a ring by binding to each other. When the 5-, 6-, or 7-membered ring formed is a group that can be further substituted, the ring may be substituted with the substituents described for $R^4$ to $R^9$, and when the ring is substituted with two or more substituents, these substituents may be the same as or different from each other.

In General Formula (M), when $R^4$ and $R^5$, $R^5$ and $R^6$, $R^7$ and $R^8$, and $R^8$ and $R^9$ independently form a 5-, 6-, or 7-membered saturated or unsaturated ring by binding to each other respectively, examples of the 5-, 6-, or 7-membered saturated or unsaturated ring not having a substituent include a pyrrole ring, a furan ring, a thiophene ring, a pyrazole ring, an imidazole ring, a triazole ring, an oxazole ring, a thiazole ring, pyrrolidine ring, a piperidine ring, a cyclopentene ring, a cyclohexene ring, a benzene ring, a pyridine ring, a pyrazine ring, and a pyridazine ring, and among these, a benzene ring and a pyridine ring are preferable.

$R^{10}$ in General Formula (M) preferably represents a hydrogen atom, a halogen atom, an alkyl group, an aryl group, or a heterocyclic group. The halogen atom, alkyl group, aryl group, and heterocyclic group respectively have the same definition as that of the halogen atom, alkyl group, aryl group, and heterocyclic group described in the above section of the substituent group A, and a preferable range thereof is also the same.

When $R^{10}$ represents an alkyl group, an aryl group, or a heterocyclic group, if the alkyl group, aryl group, and heterocyclic group are groups that can be further substituted, they may be substituted with the substituents described in the above section of substituent group A, and if the groups are substituted with two or more substituents, the substituents may be the same as or different from each other.

Metal or Metal Compound

The specific complex of the present invention is a complex in which the dipyrromethene compound represented by the General Formula (M) or a tautomer thereof is coordinated to a metal or a metal compound.

Here, the metal or metal compound may be any types of metal or metal compound as long as they can form a complex, and include a divalent metal atom, a divalent metal oxide, a divalent metal hydroxide, and a divalent metal chloride. Examples of the metal or metal compound include metals such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, in view of the stability of the complex, spectral characteristics, heat resistance, light resistance, and production suitability, Fe, Zn, Mg, Si, Pt, Pd, Mo, Mn, Cu, Ni, Co, TiO, or VO is preferable, Zn, Mg, Si, Pt, Pd, Cu, Ni, Co, or VO is more preferable, and Zn is most preferable.

Next, a more preferable range of the specific complex of the compound represented by General Formula (M) in the present invention will be described.

A preferable range of the specific complex in the present invention is such a range that in General Formula (M), each of $R^4$ and $R^9$ independently represents a hydrogen atom, an alkyl group, an alkenyl group, an aryl group, a heterocyclic group, a silyl group, a hydroxyl group, a cyano group, an alkoxy group, an aryloxy group, a hetereocyclic oxy group, an acyl group, an alkoxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group; each of $R^5$ and $R^8$ independently represents a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group; each of $R^6$ and $R^7$ independently represents a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group; $R^{10}$ represents a hydrogen atom, a halogen atom, an alkyl group, an aryl group, or a heterocyclic group; and the metal or metal compound is Zn, Mg, Si, Pt, Pd, Mo, Mn, Cu, Ni, Co, TiO, or VO.

A more preferable range of the specific complex in the present invention is such a range that in General Formula (M), each of $R^4$ and $R^9$ independently represents a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, a ureido group, an imide group, an alkoxycarbonylamino group, an aryloxycarbonylamino group, a sulfonamide group, an azo group, an alkylsulfonyl group, an arylsulfonyl group, or a phosphinoylamino group; each of $R^5$ and $R^8$ independently represents an alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an aryl sulfonyl group, or a sulfamoyl group; each of $R^6$ and $R^7$ independently represents a hydrogen atom, an alkyl group, an alkenyl group, an aryl group, a heterocyclic group, a cyano group, an acyl group, an alkoxycarbonyl group, a carbamoyl group, a carbonamide group, a ureido group, an imide group, an alkoxycarbonylamino group, a sulfonamide group, an alkylthio group, an arylthio group, a heterocyclic thio group, an alkylsulfonyl group, an arylsulfonyl group, or a sulfamoyl group; $R^{10}$ represents a hydrogen atom, a halogen atom, an alkyl group, an aryl group, or a heterocyclic group; and the metal or metal compound is Zn, Mg, Si, Pt, Pd, Cu, Ni, Co, or VO.

A particularly preferable range of the specific complex in the present invention is such a range that in General Formula (M), each of $R^4$ and $R^9$ independently represents a hydrogen atom, an alkyl group, an aryl group, a heterocyclic group, an amino group, a heterocyclic amino group, a carbonamino group, a ureido group, an imide group, an alkoxycarbonylamino group, a sulfonamide group, an azo group, an alkylsulfonyl group, an arylsulfonyl group, or a phosphinoylamino group; each of $R^5$ and $R^8$ independently represents an alkyl group, an aryl group, a heterocyclic group, a cyano group, an acyl group, an alkoxycarbonyl group, a carbamoyl group, an alkylsulfonyl group, or an arylsulfonyl group; each of $R^6$ and $R^7$ independently represents a hydrogen atom, an alkyl group, an aryl group, or a heterocyclic group; $R^{10}$ represents a hydrogen atom, an alkyl group, an aryl group, or a heterocyclic group; and the metal or metal compound is Zn, Cu, Co, or VO.

In addition, the dipyrromethene metal complex compound represented by General Formula (7) or (8) described later in detail is also a particularly preferable embodiment of the dipyrromethene dye.

<<Dipyrromethene Metal Complex Compound Represented by General Formula (7)>>

One of the preferable embodiments of the dye structure in the resin (A) having a dye structure is a dye structure derived from the dipyrromethene metal complex compound represented by the following General Formula (7).

[Chem. 2]

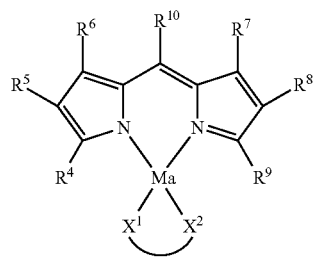

(7)

In General Formula (7), each of $R^4$ to $R^9$ independently represents a hydrogen atom or a monovalent substituent, and $R^{10}$ represents to hydrogen atom, a halogen atom, an alkyl group, an aryl group, or a heterocyclic group. Ma represents a metal atom or a metal compound. $X^1$ represents a group that can be bonded to Ma, $X^2$ represents a group that neutralizes the charge of Ma, and $X^1$ and $X^2$ may form a 5-, 6-, or 7-membered ring by binding to each other together with Ma. Here, $R^4$ and $R^9$ do not form a ring by binding to each other.

Moreover, the dipyrromethene metal complex compound represented by General Formula (7) includes a tautomer.

When the dipyrromethene metal complex compound represented by General Formula (7) is introduced by being bonded to the constitutional unit represented by General Formulae (A) to (C) described later, the binding position is not particularly limited. However, in view of synthesis suitability, the compound is preferably introduced by being bonded via one position among $R^4$ to $R^9$, more preferably introduced by being bonded via one position at $R^4$, $R^6$, $R^7$, and $R^9$, and even more preferably introduced by being bonded is one position among $R^4$ and $R^9$.

When the resin (A) having a dye structure has an alkali-soluble group, as a method of introducing the alkali-soluble group, a method of bonding the alkali-soluble group to one or two or more substituents among $R^4$ to $R^{10}$, $X^1$, and $X^2$ in the General Formula (7) can be used. Among these substituents, one of $R^4$ to $R^{10}$ and $X^1$ is preferable, one of $R^4$, $R^6$, $R^7$, and $R^9$ is more preferable, and one of $R^4$ and $R^9$ is even more preferable.

The dipyrromethene metal complex compound represented by General Formula (7) may have a functional group other than the alkali-soluble group, as long as the effects of the present invention are not impaired.

$R^4$ to $R^9$ in General Formula (7) have the same definition as that of $R^4$ to $R^9$ in the General Formula (M), and preferable embodiments thereof are the same.

In General Formula (7), Ma represents a metal atom or a metal compound. The metal atom or metal compound may be any type as long as it is a metal atom or a metal compound that can form a complex, and includes a divalent metal atom, a divalent metal oxide, a divalent metal hydroxide, and a divalent metal chloride.

Examples of the metal atom or metal compound include metals such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, in view of stability of the complex, spectral characteristics, heat resistance, light resistance, and production suitability, as the metal atom or metal compound, Fe, Zn, Mg, Si, Pt, Pd, Mo, Mn, Cu, Ni, Co, TiO, and VO are preferable, Zn, Mg, Si, Pt, Pd, Cu, Ni, Co, and VO are more preferable, Zn, Co, VO, and Cu are particularly preferable, and Zn is most preferable.

In General Formula (7), $R^{10}$ represents a hydrogen atom, a halogen atom, an alkyl group, an aryl group, or a heterocyclic group, and is preferably a hydrogen atom.

In General Formula (7), $X^1$ may be any group as long as the group can be bonded to Ma, and specific examples thereof include water, alcohols (for example, methanol, ethanol, and propanol), and compounds disclosed in "Metal Chelates" ([1] Takeichi Sakaguchi and Kagehira Ueno (1995, Nankodo Co., Ltd.), [2] (1996), [3] (1997), and the like). Among these, in respect of production, water, a carboxylic acid compound, and alcohols are preferable, and water and a carboxylic acid compound are more preferable.

In Formula (7), examples of the "group that neutralizes charges of Ma" represented by $X^2$ include a halogen atom, a hydroxyl group, a carboxylic acid group, a phosphoric acid group, a sulfonic acid group, and the like, and among these, in respect of production, a halogen atom, a hydroxyl group, a carboxylic acid group, and a sulfonic acid group are preferable, and a hydroxyl group and a carboxylic acid group are more preferable.

In General Formula (7), $X^1$ and $X^2$ may form a 5-, 6-, or 7-membered ring by binding to each other together with Ma. The 5-, 6-, or 7-membered ring formed may be a saturated or unsaturated ring. In addition, the 5-, 6-, or 7-membered ring may be constituted only with carbon atoms or may form a heterocycle having at least one atom selected from a nitrogen atom, an oxygen atom, or/and a sulfur atom.

As the preferable embodiments of the compound represented by General Formula (7), each of $R^4$ to $R^9$ independently represents the preferable embodiment described in the description for $R^4$ to $R^9$, and $R^{10}$ represents the preferable embodiment described in the description for $R^{10}$, Ma represents Zn, Cu, Co, or VO, $X^1$ represents water or a carboxylic acid compound, $X^2$ represents a hydroxyl group or a carboxylic acid group, and $X^1$ and $X^2$ may form a 5- or 6-membered ring by binding to each other.

<<Dipyrromethene Metal Complex Compound Represented by General Formula (8)>>

One of the preferable embodiments of the dye structure in the resin (A) having a dye structure is a dye structure derived from a dipyrromethene metal complex compound represented by the following General Formula (8).

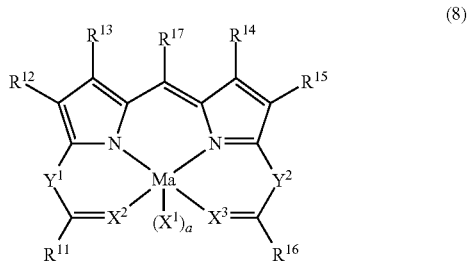

(8)

In General Formula (8), each of $R^{11}$ and $R^{16}$ independently represents an alkyl group, an alkenyl group, an aryl group, a heterocyclic group, an alkoxy group, an aryloxy group, an alkylamino group, an arylamino group, or a heterocyclic amino group. Each of $R^{12}$ to $R^{15}$ independently represents a hydrogen atom, or a substituent. $R^{17}$ represents a hydrogen atom, a halogen atom, an alkyl group, an aryl group, or a heterocyclic group. Ma represents a metal atom or a metal compound. Each of $X^2$ and $X^3$ independently represents NR (R represents a hydrogen atom, an alkyl group, an alkenyl group, an aryl group, a heterocyclic group, an acyl group, an alkylsulfonyl group, or an arylsulfonyl group), a nitrogen atom, an oxygen atom or a sulfur atom. Each of $Y^1$ and $Y^2$ independently represents $NR^c$ ($R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom. $R^{11}$ and $Y^1$ may form a 5-, 6-, or 7-membered ring by binding to each other, and $R^{16}$ and $Y^2$ may form a 5-, 6-, or 7-membered ring by binding to each other. $X^1$ represents a group that can be bonded to Ma, and a represents 0, 1, or 2.

In addition, the dipyrromethene metal complex compound represented by General Formula (8) includes a tautomer.

When the dipyrromethene metal complex compound represented by General Formula (8) is introduced by being bonded to the constitutional unit represented by General Formulae (A) to (C) described later, the moiety where the compound is introduced is not particularly limited as for as the effects of the present invention are not impaired. However, the moiety is preferably one of $R^{11}$ to $R^{17}$, $X^1$, $Y^1$, and $Y^2$. Among these, in respect of synthesis suitability, the compound is preferably introduced by being bonded via one of $R^{11}$ to $R^{16}$ and $X^1$. As a more preferable embodiment, the compound is introduced by being bonded via one of $R^{11}$, $R^{13}$, $R^{14}$, and $R^{16}$, and as an even more preferable embodiment, the compound is introduced by being bonded via one of $R^{11}$ and $R^{16}$.

When the resin (A) having a dye structure has an alkali-soluble group, as the method of introducing the alkali-soluble group, a method of bonding the alkali-soluble group to one or two or more substituents among $R^{11}$ to $R^{17}$, $X^1$, $Y^1$, and $Y^2$ in the General Formula (8) can be used, if a dye monomer or a constitutional unit having the alkali-soluble group is used. Among these substituents, one of $R^{11}$ to $R^{16}$ and $X^1$ is preferable, one of $R^{11}$, $R^{13}$, $R^{14}$, and $R^{16}$ is more preferable, and one of $R^{11}$ and $R^{16}$ is even more preferable.

The dipyrromethene metal complex compound represented by General Formula (8) may have a functional group other than the alkali-soluble group, as long as the effects of the present invention are not impaired.

In General Formula (8), $R^{12}$ to $R^{15}$ have the same definition as that of $R^5$ to $R^8$ in the General Formula (M), and the preferable embodiment thereof is also the same. $R^{17}$ has the same definition as that of $R^{10}$ in the General Formula (M), and the preferable embodiment thereof is also the same. Ma has the same definition as that of Ma in General Formula (7), and the preferable embodiment thereof is also the same.

More specifically, among $R^{12}$ to $R^{15}$ in the General Formula (8), as the $R^{12}$ and $R^{15}$, an alkoxycarbonyl group, an aryloxycarbonyl group, a carbamoyl group, an alkylsulfonyl group, an arylsulfonyl group, a nitrile group, an imide group, or a carbamoylsulfonyl group is preferable, an alkoxycarbonyl group, an aryloxycarbonyl group, a carbamoyl group, an alkylsulfonyl group, a nitrile group, an imide group, or a carbamoylsulfonyl group is more preferable, an alkoxycarbonyl group, an aryloxycarbonyl group, a carbamoyl group, a nitrile group, an imide group, or a carbamoylsulfonyl group is even more preferable, and an alkoxycarbonyl group, an aryloxycarbonyl group, or a carbamoyl group is particularly preferable.

As the $R^{13}$ and $R^{14}$, a substituted or unsubstituted alkyl group, a substituted or unsubstituted aryl group, and a substituted or unsubstituted heterocyclic group are preferable, and a substituted or unsubstituted alkyl group and a substituted or unsubstituted aryl group are more preferable. Herein, specific examples of the more preferable alkyl group, aryl group, and heterocyclic group include the same specific examples as exemplified for the $R^6$ and $R^7$ of General Formula (M).

In General Formula (8), $R^{11}$ and $R^{16}$ represents an alkyl group (a linear, branched, or cyclic alkyl group preferably having 1 to 36 carbon atoms and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms and more preferably having 2 to 12 carbon atoms, for example, a vinyl group, an allyl group, or a 3-buten-1-yl group), an aryl group (an aryl group preferably having 6 to 36 carbon atoms and more preferably having 6 to 18 carbon atoms, for example, a phenyl group or a naphthyl group), a heterocyclic group (a heterocyclic group preferably having 1 to 24 carbon atoms and more preferably having 1 to 12 carbon atoms, for example, a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group, or a benzotriazol-1-yl group), an alkoxy group (an alkoxy group preferably having 1 to 36 carbon atoms and more preferably having 1 to 18 carbon atoms, for example, a methoxy group, an ethoxy group, a propyloxy group, a butoxy group, a hexyloxy group, a 2-ethylhexyloxy group, a dodecyloxy group, or a cyclohexyloxy group), an aryloxy group (an aryloxy group preferably having 6 to 24 carbon atoms and more preferably having 1 to 18 carbon atoms, for example, a phenoxy group or a naphthyloxy group), an alkylamino group (an alkylamino group preferably having 1 to 36 carbon atoms and more preferably having 1 to 18 carbon atoms, for example, a methylamino group, an ethyl amino group, a propyl amino group, a butyl amino group, a hexyl amino group, a 2-ethylhexylamino group, an isopropylamino group, a t-butylamino group, a t-octylamino group, a cyclohexylamino group, a N,N-diethylamino group, a N,N-dipropylamino group, a N,N-dibutylamino group, or N-methyl-N-ethylamino group), an arylamino group (an arylamino group preferably having 6 to 36 carbon atoms and more preferably having 6 to 18 carbon atoms, for example, a phenylamino group, a naphthylamino group, a N,N-diphenylamino group, or a N-ethyl-N-phenylamino group), or a heterocyclic amino group (a heterocyclic amino group preferably having 1 to 24 carbon atoms and more preferably having 1 to 12 carbon atoms, for example, a 2-aminopyrrole group, a 3-aminopyrazole group, a 2-aminopyridine group, or a 3-aminopyrimidine group).

Among the above groups, as $R^{11}$ and $R^{16}$, an alkyl group, an alkenyl group, an aryl group, a heterocyclic group, an alkylamino group, an arylamino group, and a heterocyclic amino group are preferable, an alkyl group, an alkenyl group, an aryl group, and a heterocyclic group are more preferable, an alkyl group, an alkenyl group, and an aryl group are even more preferable, and an alkyl group is particularly preferable.

In General Formula (8), when the alkyl group, alkenyl group, aryl group, heterocyclic group, alkoxy group, aryloxy group, alkylamino group, arylamino group, or heterocyclic amino group represented by $R^{11}$ and $R^{16}$ is a group that can be further substituted, the group may be substituted with the substituents described in the above section of the substituent group A. When the group is substituted with two or more substituents, these substituents may be the same as or different from each other.

In General Formula (8), each of $X^2$ and $X^3$ independently represents NR, a nitrogen atom, an oxygen atom, or a sulfur atom. Here, R represents a hydrogen atom, an alkyl group (a linear, branched, or cyclic alkyl group preferably having 1 to 36 carbon atoms and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms and more preferably having 2 to 12 carbon atoms, for example, a vinyl group, an allyl group, or a 3-buten-1-yl group), an aryl group (an aryl group preferably having 6 to 36 carbon atoms and more preferably having 6 to 18 carbon atoms, for example, a phenyl group or a naphthyl group), a heterocyclic group (a heterocyclic group preferably having 1 to 24 carbon atoms and more preferably having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, or a benzotriazol-1-yl group), an acyl group (an acyl group preferably having 1 to 24 carbon atoms and more preferably having 2 to 18 carbon atoms, for example, an acetyl group, a pivaloyl group, a 2-ethylhexyl group, a benzoyl group, or a cyclohexanoyl group), an alkylsulfonyl group (preferably an alkylsulfonyl group having 1 to 24 carbon atoms and more preferably having 1 to 18 carbon atoms, for example, a methylsulfonyl group, an ethylsulfonyl group, an isopropylsulfonyl group, or a cyclohexylsulfonyl group), or an aryl sulfonyl group (an arylsulfonyl group preferably having 6 to 24 carbon atoms and more preferably having 6 to 18 carbon atoms, for example, a phenylsulfonyl group or a naphthylsulfonyl group).

In General Formula (8), each of $Y^1$ and $Y^2$ independently represents $NR^c$, a nitrogen atom, or a carbon atom. $R^c$ has the same definition as that of $X^2$, $X^3$, and R described above, and the preferable embodiment thereof is also the same.

In General Formula (8), $R^{11}$ and $Y^1$ may form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, or a quinazoline ring), or a 7-membered ring (for example, a cycloheptane ring or a hexamethylene imine ring) by binding to each other together with a carbon atom.

In the General Formula (8), $R^{16}$ and $Y^2$ may form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, or a quinazoline ring), or a 7-membered ring (for example, a cycloheptane ring or a hexamethylene imine ring) by binding to each other together with a carbon atom.

In General Formula (8), when the 5-, 6-, and 7-membered rings that and $Y^1$ as well as $R^{16}$ and $Y^2$ form by binding to each other are rings that can be substituted, the rings may be substituted with the substituents described in the above section of the substituent group A. When the rings are substituted with two or more substituents, these substituents may be the same as or different from each other.

In General Formula (8), each of and $R^{16}$ preferably independently represents a monovalent substituent of which an –Es' value as a steric parameter is 1.5 or more. The –Es' value is more preferably 2.0 or more, more preferably 3.5 or more, and particularly preferably 5.0 or more.

Herein, the –Es' value as a steric parameter is a parameter represents steric bulkiness of a substituent. As the value, the –Es' value disclosed in the paper (J. A. Macphee, et al, Tetrahedron, Vol. 34, pp 3553-3562, and Chemistry Special Edition 107, Structure-activity Correlation and Drug Design, edited by Toshio Fujita, published Feb. 20, 1986 (Kagaku-Doujin Publishing Company, Inc.)) is used.

In General Formula (8), $X^1$ represents a group that can be bonded to Ma. Specific examples of the group include the same group as represented by $X^1$ in the Formula (7), and the preferable embodiment is also the same. a represents 0, 1, or 2.

As the preferable embodiments of the compound represented by General Formula (8), each of $R^{12}$ to $R^{15}$ independently represents the preferable embodiment described for $R^5$ to $R^8$ in the General Formula (M), $R^{17}$ represents the preferable embodiment described for $R^{10}$ in the General Formula (M). Ma represents Zn, Cu, Co, or VO, $X^2$ represents NR (R represents a hydrogen atom or an alkyl group), a nitrogen atom, or an oxygen atom, $X^3$ represents NR (R represents a hydrogen atom or an alkyl group) or an oxygen atom, $Y^1$ represents $NR^c$ ($R^c$ represents a hydrogen atom or an alkyl group), a nitrogen atom, or a carbon atom, and $Y^2$ represents a nitrogen atom or a carbon atom. Each of $R^{11}$ and $R^{16}$ independently represents an alkyl group, an aryl group, a heterocyclic group, an alkoxy group, or an alkylamino group, $X^1$ represents a group bonded via an oxygen atom, and a represents 0 or 1. $R^{11}$ and $Y^1$ may form a 5- or 6-membered ring by binding to each other, or $R^{16}$ and $Y^2$ may form a 5- or 6-membered ring by binding to each other.

As a more preferable embodiment of the compound represented by General Formula (8), each of $R^{12}$ to $R^{15}$ independently represents the preferable embodiment described for $R^5$ to $R^8$ in the compound represented by General Formula (M), and $R^{17}$ represents the preferable embodiment described for $R^{10}$ in the General Formula (M). Ma represents Zn, $X^2$ and $X^3$ represents an oxygen atom, $Y^1$ represents NH, $Y^2$ represents a nitrogen atom. Each of $R^{11}$ and $R^{16}$ independently represents an alkyl group, an aryl group, a heterocyclic group, an alkoxy group, or an alkylamino group, $X^1$ represents a group bonded via an oxygen atom, and a represents 0 or 1. $R^{11}$ and $Y^1$ may form a 5- or 6-membered ring by binding to each other, or $R^{16}$ and $Y^2$ may form a 5- or 6-membered ring by binding to each other.

The molar extinction coefficient of the dipyrromethene metal complex compound represented by the General Formulae (7) and (8) is preferably as high as possible, in view of a coloring ability. In addition, the maximum absorption wavelength λmax is preferably 520 nm to 580 nm and more preferably 530 nm to 570 nm, in view of improving color purity. If the value is in this range, a color filter having excellent color reproducibility can be prepared using the coloring composition of the present invention.

Moreover, an absorbance at the maximum absorption wavelength (λmax) of the resin (A) having a dye structure that has a dye structure derived from a dipyrromethene dye is preferably 1,000 times or more, more preferably 10,000 times or more, and even more preferably 100,000 times or more the absorbance at 450 nm. If the ratio is in this range, when particularly a blue color filter is prepared using the coloring composition of the present invention, a color filter having a higher transmissivity can be formed. In addition, the maximum absorption wavelength and molar extinction coefficient are measured by a Cary 5 spectrophotometer (manufactured by Varian).

The melting point of the dipyrromethene metal complex compound represented by the General Formulae (7) and (8) is preferably not too high, in view of solubility.

The dipyrromethene metal complex compound represented by the General Formulae (7) and (8) can be synthesized by the method disclosed in U.S. Pat. No. 4,774,339A, U.S. Pat. No. 5,433,896A, JP2001-240761A, JP2002-155052A, JP3614586B, Aust. J. Chem, 1965, 11, 1835-1845, J. H. Boger et al., Heteroatom Chemistry, Vol. 1, No. 5,389 (1990), and the like. Specifically, the methods disclosed in JP2008-292970A, Paragraphs 0131 to 0157 can be applied.

Specific examples of the dipyrromethene dye shown below, but the present invention is not limited thereto.

[Chem. 4]

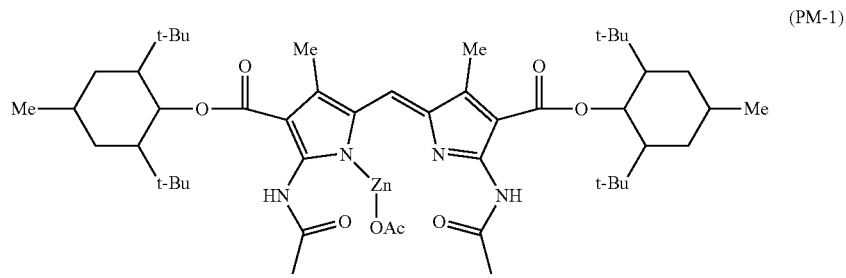

(PM-1)

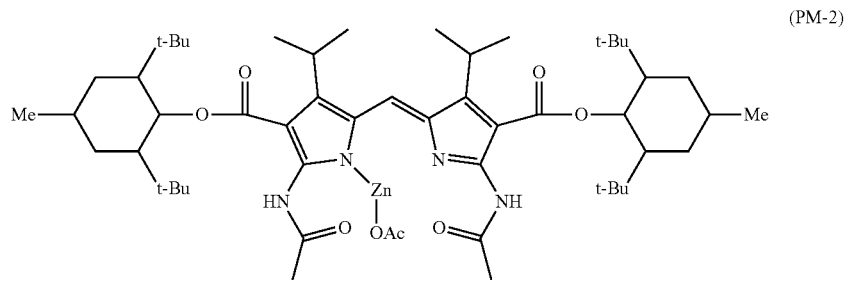

(PM-2)

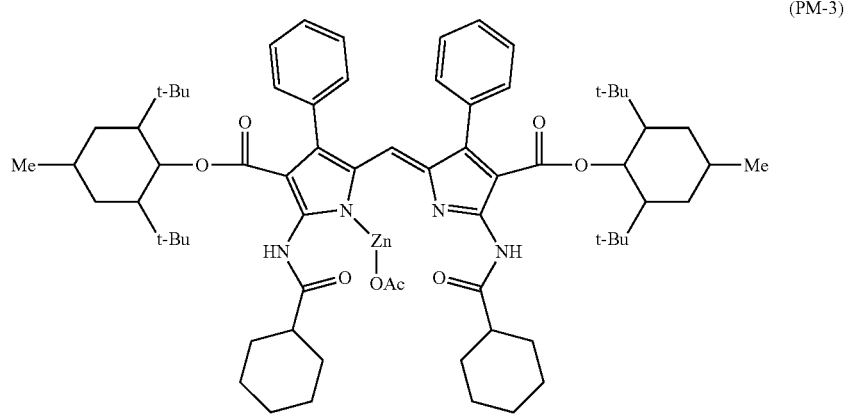

(PM-3)

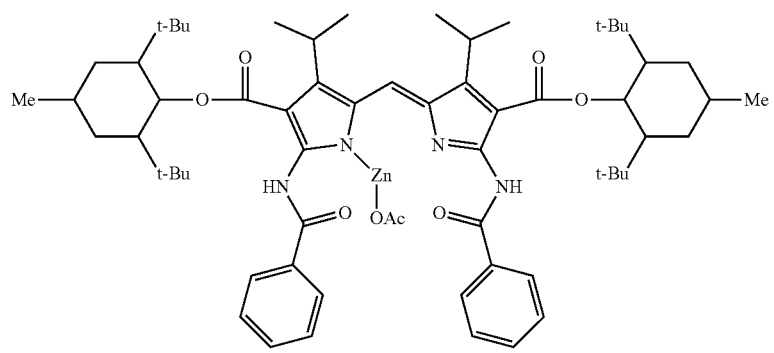
(PM-4)
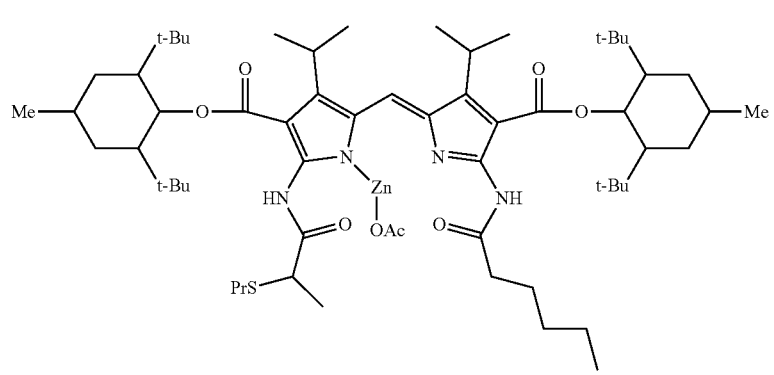
(PM-5)
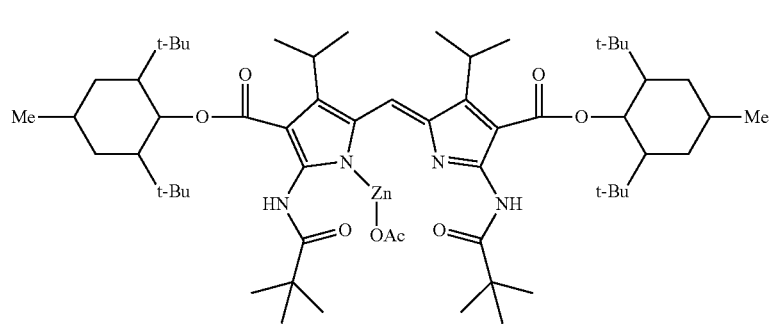
(PM-6)
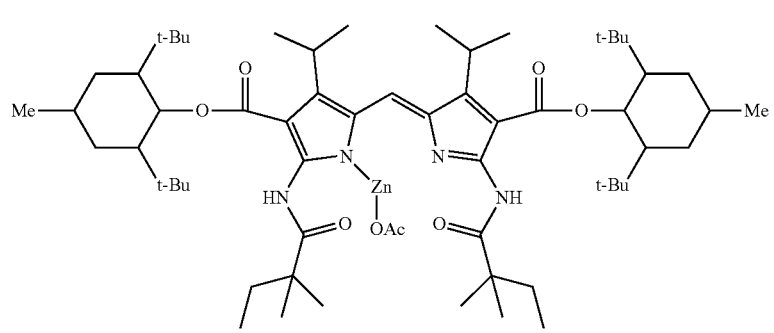
(PM-7)

-continued
(PM-8)
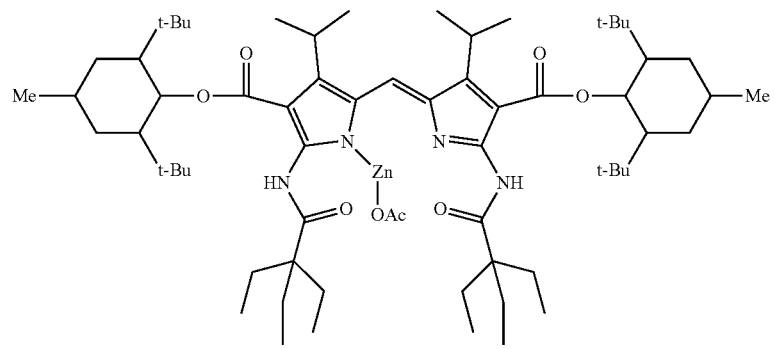
(PM-9)
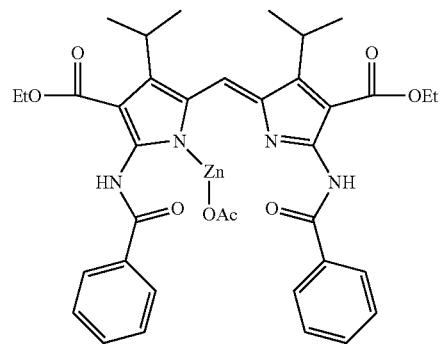
(PM-10)
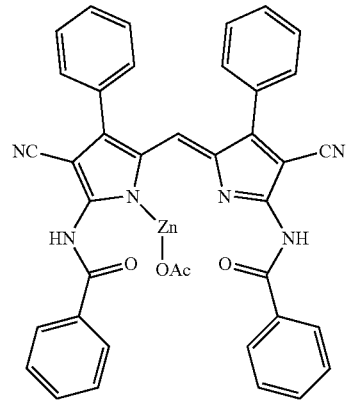
[Chem. 5]
(PM-11)
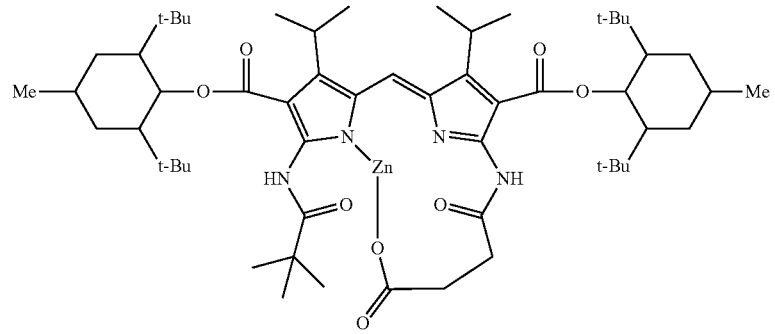

-continued
(PM-12)
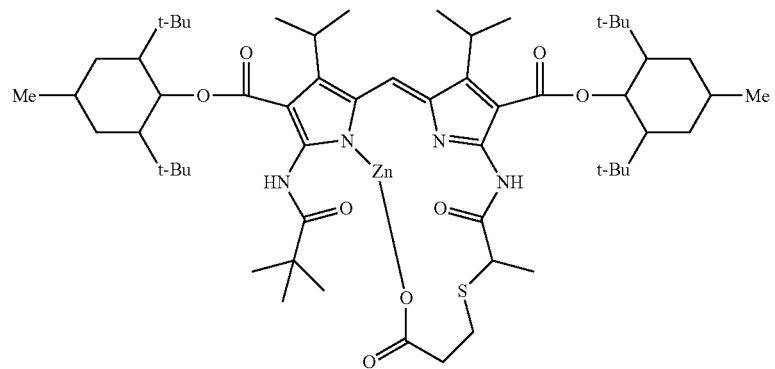
(PM-13)
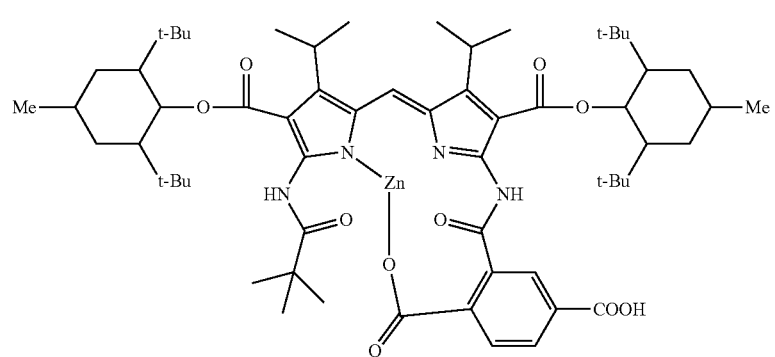
(PM-14)
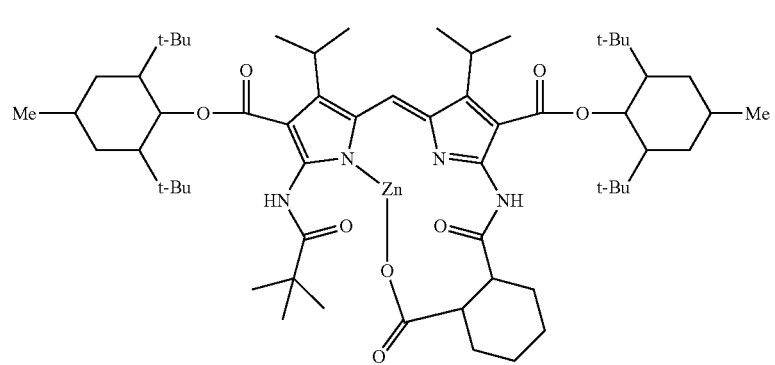
(PM-15)
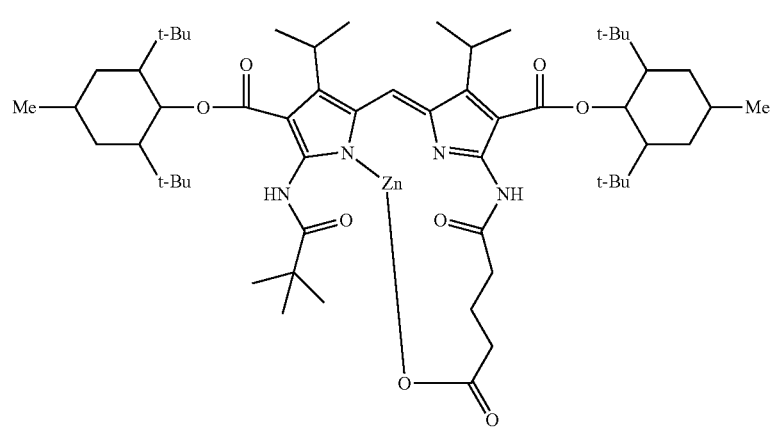

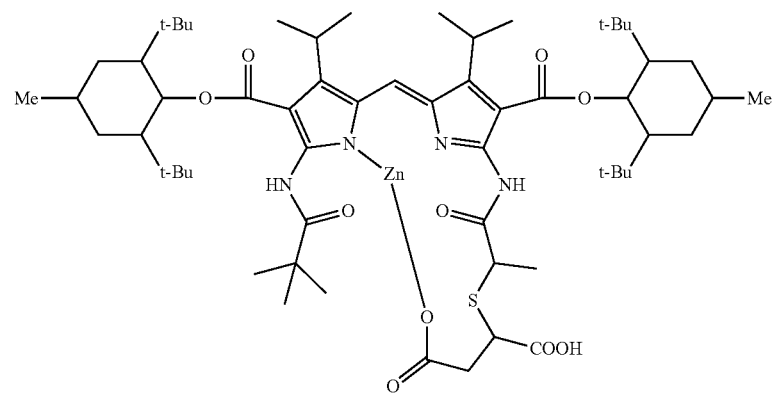
(PM-16)
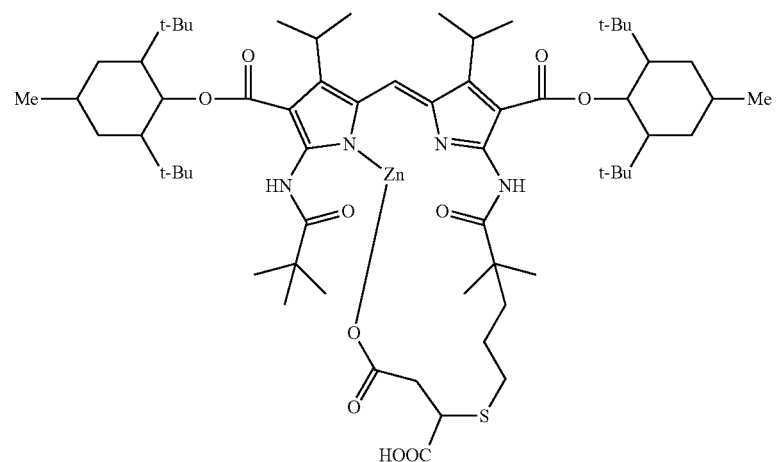
(PM-17)
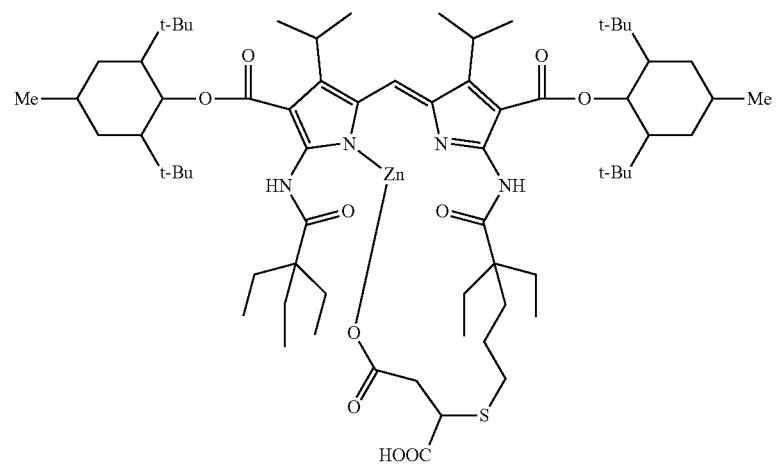
(PM-18)

-continued
[Chem. 6]
(PM-19)
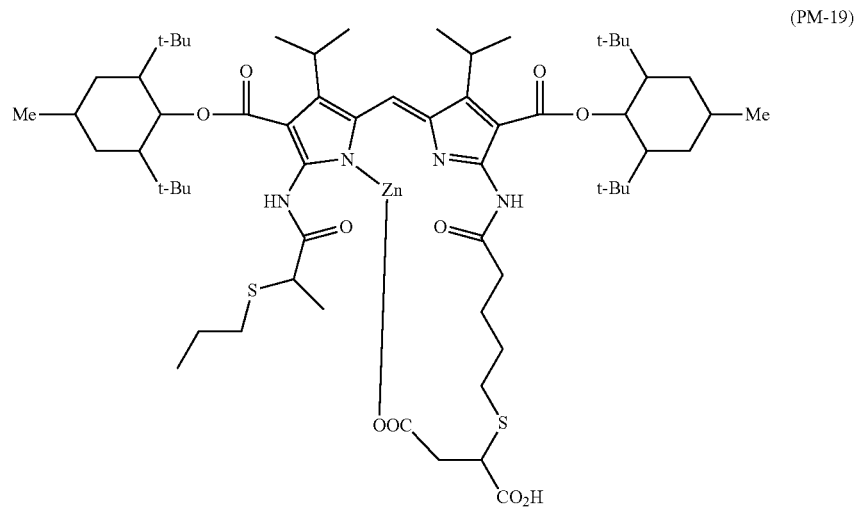
(PM-20)
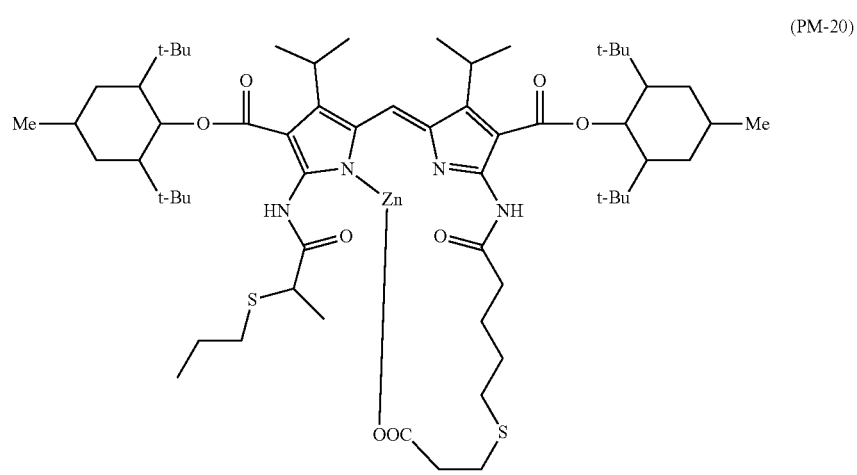
(PM-21)
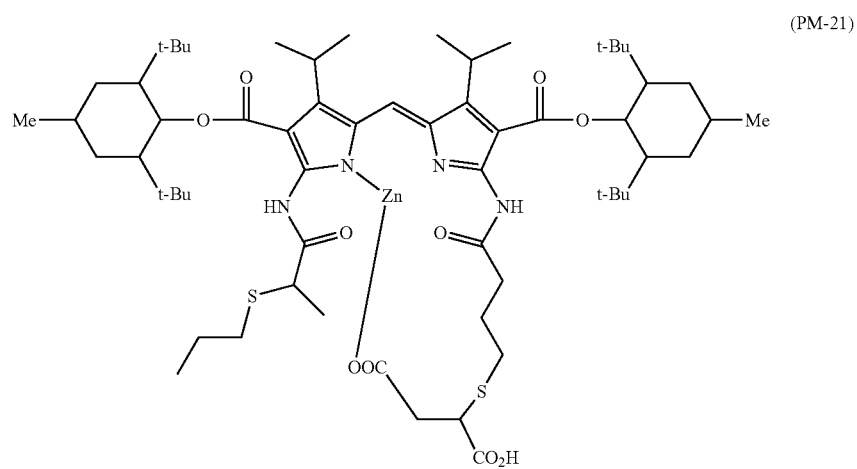

(PM-22)

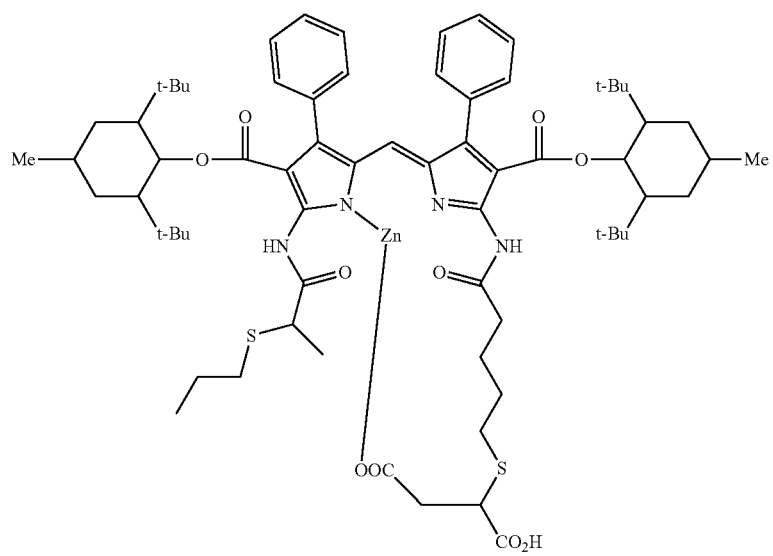

Among the above specific examples, in view of color characteristics, developability, and heat resistance, (PM-16) to (PM-22) are particularly preferable, and (PM-18) is most preferable.

(Azo Dye)

One of the preferable embodiments of the resin (A) having a dye structure according to the present invention is resin having a dye structure that has a partial structure derived from an azo dye (azo compound) as a partial structure of the dye moiety. The azo compounds in the present invention collectively refer to compounds having a dye moiety including a N=N group in a molecule.

The azo dye can be used by being appropriately selected from known azo dyes (for example, substituted azobenzene (specific examples thereof include (AZ-4) to (AZ-6) and the like described later)).

As the azo dye, azo dyes known as a magenta dye and a yellow dye can be used, and among these, azo dyes represented by the following General Formulae (d), (e), (g), (I-1), (I-2), and (V) are particularly preferable.

<<Magenta Dye>>

Preferable examples of the azo dye include an azo dye represented by the following General Formula (d) that is a magenta dye.

[Chem. 7]

General Formula (d)

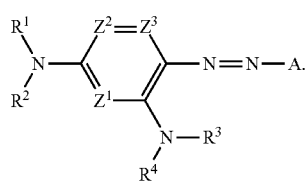

In General Formula (d), each of $R^1$ to $R^4$ independently represents a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group, A represents an aryl group or an aromatic heterocyclic group, each of $Z^1$ to $Z^3$ independently represents —C($R^5$)= or —N—, and $R^5$ represents a hydrogen atom or a substituent.

The respective substituents in General Formula (d) will be described in detail.

In General Formula (d), each of $R^1$ to $R^4$ independently represents a hydrogen atom, an alkyl group (a linear, branched, or cyclic alkyl group preferably having 1 to 36 carbon atoms and more preferably having 1 to 12 carbon atoms, for example, methyl, ethyl, propyl, isopropyl, butyl, isobutyl, t-butyl, hexyl, 2-ethyl hexyl, dodecyl, cyclopropyl, cyclopentyl, cyclohexyl, or 1-adamantyl), an alkenyl group (an alkenyl group preferably having 2 to 24 carbon atoms more preferably having 2 to 12 carbon atoms, for example, vinyl, allyl, or 3-buten-1-yl), an aryl group (an aryl group preferably having 6 to 36 carbon atoms and more preferably having 6 to 18 carbon atoms, for example, phenyl or naphthyl), a heterocyclic group (a heterocyclic group preferably having 1 to 24 carbon atoms more preferably having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), an acyl group (an acyl group preferably having 1 to 24 carbon atoms and more preferably having 2 to 18 carbon atoms, for example, acetyl, pivaloyl, 2-ethylhexyl, benzoyl, or cyclohexanoyl), an alkoxycarbonyl group (an alkoxycarbonyl group preferably having 1 to 10 carbon atoms and more preferably having 1 to 6 carbon atoms, for example, methoxycrabonyl or ethoxycarbonyl), an aryloxycarbonyl group (an aryloxycarbonyl group preferably having 6 to 15 carbon atoms and more preferably having 6 to 10 carbon atoms, for example, phenoxycarbonyl), a carbamoyl group (a carbamoyl group preferably having 1 to 8 carbon atoms and more preferably having 2 to 6 carbon atoms, for example, dimethylcarbamoyl), an alkylsulfonyl group (an alkylsulfonyl group preferably having 1 to 24 carbon atoms and more preferably having 1 to 18 carbon atoms, for example, methylsulfonyl, ethylsulfonyl, isopropylsulfonyl, or cyclohexylsulfonyl), or an arylsufonyl group (an arylsufonyl group preferably having 6 to 24 carbon atoms and more preferably having 6 to 18 carbon atoms, for example, phenyl sulfonyl or naphthylsulfonyl).

Preferably, each of $R^1$ and $R^3$ independently represents an alkyl group, an alkenyl group, an aryl group, or a heterocyclic group. Preferably, each of $R^2$ and $R^4$ independently represents a hydrogen atom or an alkyl group.

When $R^1$ to $R^4$ are groups that can be substituted, for example, these groups may be substituted with the substituents described in the above section of the substituent group A. When these groups have two or more substituents, these substituents may be the same as or different from each other.

$R^1$ and $R^2$, $R^1$ and $R^5$ (when $Z^1$ or $Z^2$ represents $-C(R^5)=$), $R^3$ and $R^4$, and $R^3$ and $R^5$ (when $Z^1$ represents $-C(R^5)=$) may form a 5- or 6-membered ring by binding to each other.

Each of $Z^1$ to $Z^3$ independently represents $-C(R^5)=$ or $-N=$, and $R^5$ represents a hydrogen atom or a substituent. Examples of the substituent represented by $R^5$ include the substituents exemplified in the above section of substituents. When the substituent represented by $R^5$ is a group that can be further substituted, the group may be substituted with, for example, the substituents described in the above section of the substituent group A. When the group has two or more substituents, these substituents may be the same as or different from each other.

Among $Z^1$ to $Z^3$, preferably, $Z^1$ is $-N=$, $Z^2$ is $-C(R^5)=$ or $-N=$, and $Z^3$ is $-C(R^5)=$. More preferably, $Z^1$ is $-N=$, and $Z^2$ and $Z^3$ are $-C(R^5)=$.

A represents an aryl group or an aromatic heterocyclic group. The aryl group and aromatic heterocyclic group represented by A may further have, for example, the substituents described in the above section of substituents. When the groups are substituted with two or more substituents, these substituents may be the same as or different from each other.

A is preferably an aromatic heterocyclic group. More preferably, examples of A include an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring, and the like.

When the dye represented by General Formula (d) is introduced by being bonded to the constitutional unit represented by General Formulae (A) to (C) described later, the binding portion is not particularly limited. However, in respect of synthesis suitability, the dye is preferably introduced by being bonded via one or two or more positions among $R^1$, $R^2$, and A, and a more preferable position is $R^1$ and/or A.

The azo dye represented by General Formula (d) is more preferably an azo dye represented by the following General Formula (d')

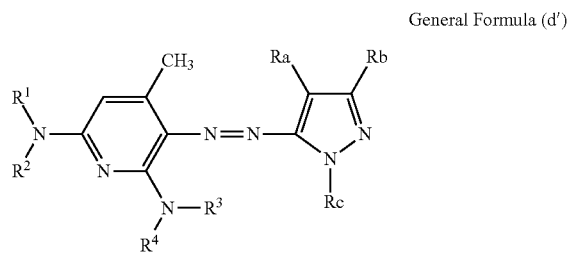

General Formula (d')

In General Formula (d'), $R^1$ to $R^4$ have the same definition as that of $R^1$ to $R^4$ in the General Formula (d), and the preferable range thereof is also the same. Ra represents an electron-attracting group having a Hammett substituent constant σp of 0.2 or more, and Rb represents a hydrogen atom or a monovalent substituent. Rc represents an alkyl group, an alkenyl group, an aryl group, a heterocyclic group, an acyl group, an alkoxycarbonyl group, a carbamoyl group, an alkylsulfonyl group, or an arylsulfonyl group.

Examples of the substituent represented by Rb include the substituents exemplified in the above section of the substituent group A.

Suitable examples of the azo dye also include an azo dye represented by the following General Formula (e) that is a magenta dye.

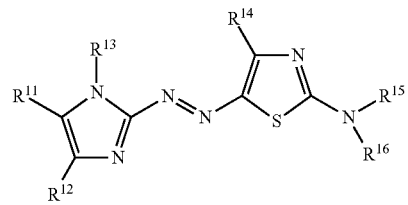

General Formula (e)

In General Formula (e), each of $R^{11}$ to $R^{16}$ independently represents a hydrogen atom or a monovalent substituent. $R^{11}$ and $R^{12}$, and $R^{15}$ and $R^{16}$ may independently form a ring by binding to each other respectively.

The respective substituents in General Formula (e) will be described in detail.

Each of $R^{11}$ to $R^{16}$ independently represents a hydrogen atom or a monovalent substituent. Examples of the monovalent substituent include a halogen atom, an alkyl group having 1 to 30 carbon atoms (herein, refers to a saturated aliphatic group including a cycloalkyl group and a bicycloalkyl group), an alkenyl group having 2 to 30 carbon atoms (herein, refers to an unsaturated aliphatic group having a double bond, including a cycloalkenyl group and a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group having 2 to 30 carbon atoms, an aryloxycarbonyloxy group having 7 to 30 carbon atoms, an amino group having 0 to 30 carbon atoms (including an alkylamino group, an anilino group, and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkyl or aryl sulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl or aryl sulfinyl group having 1 to 30 carbon atoms, an alkyl or aryl sulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl or heterocyclic azo group having 3 to 30 carbon atoms, and an imide group. Each of these groups may further have a substituent.

Each of $R^{11}$ and $R^{12}$ preferably independently represents a hydrogen atom, a heterocyclic group, or a cyano group, and more preferably represents a cyano group.

Each of $R^{13}$ and $R^{14}$ preferably independently represents a hydrogen atom, a substituted or unsubstituted alkyl group, or a substituted or unsubstituted aryl group, and more preferably represents a substituted or unsubstituted alkyl group.

Each of $R^{15}$ and $R^{16}$ preferably independently represents a hydrogen atom, a substituted or unsubstituted alkyl group, or a substituted or unsubstituted aryl group, and more preferably represents a substituted or unsubstituted alkyl group.

When the azo dye represented by General Formula (e) is introduced by being bonded to the constitutional unit represented by General Formulae (A) to (C) described later, the binding position is not particularly limited. However, in view of synthesis suitability, the dye is preferably introduced by being bonded via one or two or more positions among $R^{13}$, $R^{15}$, and $R^{16}$. The binding position is more preferably $R^{13}$ and/or $R^{15}$, and even more preferably $R^{13}$.

Among the above azo dyes, the azo dye represented by General Formula (e) is more preferable as a magenta dye.

—Yellow Dye—

Suitable examples of the azo dye include the azo dyes (including a tautomer thereof) as yellow dyes represented by the following General Formulae (g), (I-1), (I-2), and (V).

[Chem. 10]

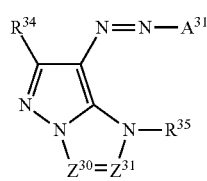

General Formula (g)

In General Formula (g), $R^{34}$ represents a hydrogen atom or a substituent, and $R^{35}$ represents a hydrogen atom, an alkyl group, an alkenyl group, an aryl group, a heterocyclic group, an acyl group, an alkoxycarbonyl group, or a carbamoyl group. Each of $Z^{30}$ and $Z^{31}$ independently represents —C($R^{36}$)═ or —N═, and $R^{36}$ represents a hydrogen atom or a substituent. $A^{31}$ represents an aryl group or an aromatic heterocyclic group.

The respective substituents in General Formula (g) will be described in detail.

$R^{34}$ represents a hydrogen atom or a monovalent substituent, and examples thereof include the substituents described in the above section of the substituent group A. $R^{34}$ is preferably an aryl group or a heterocyclic group, and more preferably a phenyl group.

$R^{35}$ represents a hydrogen atom, an alkyl group (a linear, branched, or cyclic alkyl group preferably having 1 to 36 carbon atoms and more preferably having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an alkenyl group (an alkenyl group preferably having 2 to 24 carbon atoms and more preferably having 2 to 12 carbon atoms, for example, vinyl, allyl, or 3-buten-1-yl), an aryl group (an aryl group preferably having 6 to 36 carbon atoms and more preferably having 6 to 18 carbon atoms, for example, phenyl or naphthyl), a heterocyclic group (a heterocyclic group preferably having 1 to 24 carbon atoms and more preferably having 1 to 12 carbon atoms, for example, 2-thienyl, 4-pyridyl, 2-furyl, 2-pyrimidinyl, 1-pyridyl, 2-benzothiazolyl, 1-pyrazolyl, or benzotriazol-1-yl), an acyl group (an acyl group preferably having 1 to 24 carbon atoms and more preferably having 2 to 18 carbon atoms, for example, acetyl, pivaloyl, 2-ethylhexyl, benzoyl, or cyclohexanoyl), an alkoxycarbonyl group (an alkoxycarbonyl group preferably having 1 to 10 carbon atoms and more preferably having 1 to 6 carbon atoms, for example, a methoxycrabonyl group or an ethoxycarbonyl group), or a carbamoyl group (a carbamoyl group preferably having 1 to 10 carbon atoms and more preferably having 1 to 6 carbon atoms, for example, N,N-dimethylcarbamoyl).

Each of $Z^{30}$ and $Z^{31}$ independently represents —C($R^{36}$)═ or —N═, and $R^{36}$ represents a hydrogen atom or a substituent. Examples of the substituent represented by $R^{36}$ include the substituents described in the above section of the substituent group A. When the substituent represented by $R^{36}$ is a group that can be further substituted, the group may be substituted with, for example, the substituents described in the above section of the substituent group A, and when the group is substituted with two or more substituents, these substituents may be the same as or different from each other.

In $Z^{30}$ and $Z^{31}$, preferably, $Z^{30}$ is —N═, and $Z^{31}$ is —C($R^{36}$)═.

$A^{31}$ has the same definition as that of A in the General Formula (d), and the preferable embodiment thereof is also the same.

When the dye represented by General Formula (g) is introduced by being bonded to the constitutional unit represented by General Formulae (A) to (C) described later, the binding position is not particularly limited. However, in respect of synthesis suitability, the binding position is preferably $R^{34}$ and/or $A^{31}$.

[Chem. 11]

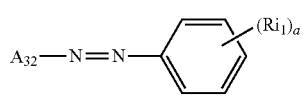

General Formula (I-1)

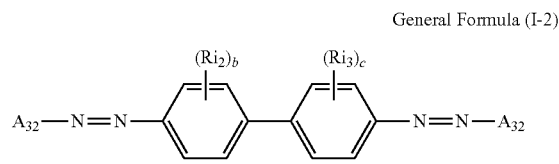

General Formula (I-2)

In General Formulae (I-1) and (I-2), each of $Ri_1$, $Ri_2$, and $Ri_3$ independently represents a monovalent substituent, and a represents an integer of 0 to 5. When a is 2 or greater, a condensed ring may be formed by two adjacent $Ri_1$s linked to each other. Each of h and c independently represents an integer of 0 to 4. When b and c are 1 or greater, a condensed ring may be formed by two adjacent $Ri_1$s linked to each other. $A_{32}$ represents the following General Formula (IA), (IB), or (IC).

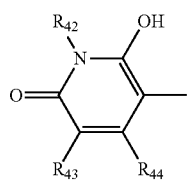

General Formula (IA)

In General Formula (IA), $R_{42}$ represents a hydrogen atom, an alkyl group, or an aryl group, $R_{43}$ represents a monovalent substituent, and $R_{44}$ represents a hydrogen atom, an alkyl group, or an aryl group.

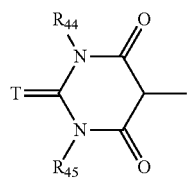

General Formula (IB)

In General Formula (IB), each of $R_{44}$ and $R_{45}$ independently represents a hydrogen atom, an alkyl group, or an aryl group. T represents an oxygen atom or a sulfur atom.

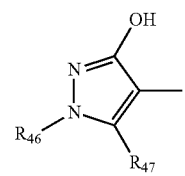

General Formula (IC)

In General Formula (IC), $R_{46}$ represents a hydrogen atom, an alkyl group, or an aryl group. $R_{47}$ represents a monovalent substituent.

Examples of the monovalent substituent represented by $Ri_1$, $Ri_2$, and $Ri_3$ in General Formulae (I-1) and (I-2) include the substituents exemplified in the above section of the substituent group A. More specific examples of the monovalent substituent include an alkyl group (a linear, branched, or cyclic alkyl group preferably having 1 to 10 carbon atoms and more preferably having 1 to 5 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an aryl group (an aryl group preferably having 6 to 36 carbon atoms and more preferably having 6 to 18 carbon atoms, for example, a phenyl or naphthyl), a sulfonamide group, an alkenyl group (a linear, branched, or cyclic alkenyl group preferably having 1 to 10 carbon atoms more preferably having 1 to 5 carbon atoms, for example, vinyl, allyl, prenyl, geranyl, or oleyl), a sulfo group, and a sulfamoyl group (preferably an alkylsulfamoyl group having 1 to 10 carbon atoms). Among these, an alkyl group having 1 to 5 carbon atoms and an alkylsulfamoyl group having 1 to 10 carbon atoms are particularly preferable a is preferably 1 to 3, and b and c are preferably 1 to 3

In General Formula (IA), $R_{42}$ represents a hydrogen atom, an alkyl group, or an aryl group and is preferably an alkyl having 1 to 5 carbon atoms and a phenyl group. Examples of the monovalent substituent represented by $R_{43}$ include the substituents exemplified in the above section of the substituent group A, and among these, a cyano group and a carbamoyl group are particularly preferable. $R_{44}$ represents a hydrogen atom, an alkyl group, or an aryl group and is particularly preferably an alkyl group having 1 to 5 carbon atoms and a phenyl group.

In General Formula (IB), T represents an oxygen atom or a sulfur atom and is preferably an oxygen atom. Each of $R_{44}$ and $R_{45}$ independently represents a hydrogen atom, an alkyl group, or an aryl group, and is particularly preferably an alkyl group having 1 to 5 carbon atoms and a phenyl group.

In General Formula (IC), $R_{46}$ represents a hydrogen atom, an alkyl group, or an aryl group, and is particularly preferably an alkyl group having 1 to 5 carbon atoms and a phenyl group. Examples of the monovalent substituent represented by $R_{47}$ include the substituents exemplified in the above section of the substituent group A. Among these, a hydrogen atom, an alkyl group and an aryl group are preferable, and an alkyl group having 1 to 5 carbon atoms and a phenyl group are particularly preferable.

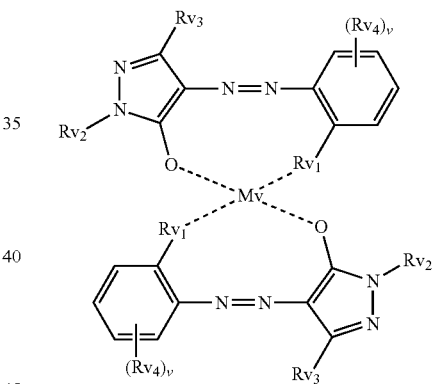

General Formula (V)

In General Formula (V), Mv represents Cr or Co, and $Rv_1$ represents an oxygen atom or —COO—. Each of $Rv_2$ and $Rv_3$ independently represents a hydrogen atom, an alkyl group, or an aryl group. v represents an integer of 0 to 4, and $Rv_4$ represents a monovalent substituent. When v is 2 or greater, adjacent $Rv_4$s may form a ring by being linked to each other.

$Rv_2$ and $Rv_3$ are particularly preferably an alkyl group having 1 to 5 carbon atoms or a phenyl group. Examples of the monovalent substituent represented by Rv include the substituents exemplified in the above section of the substituent group A. Among these, an alkyl group, an aryl group, a nitro group, a sulfamoyl group, and a sulfo group are particularly preferable, and an alkyl group having 1 to 5 carbon atoms, a phenyl group, and a nitro group are most preferable.

Among the azo dyes described above, the azo dyes represented by General Formulae (I-1), (I-2), and (V) are preferable as yellow dyes.

Specific examples of the azo dyes will be shown below, but the present invention is not limited thereto.

[Chem. 16]
(AZ-1)
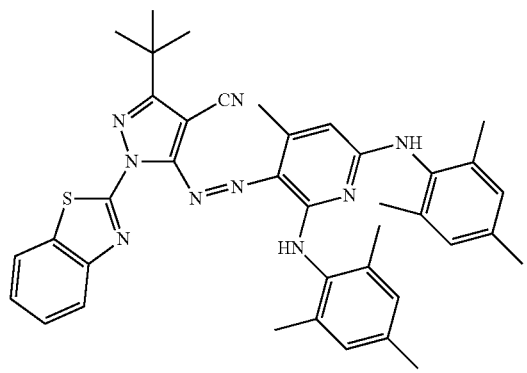
(AZ-2)
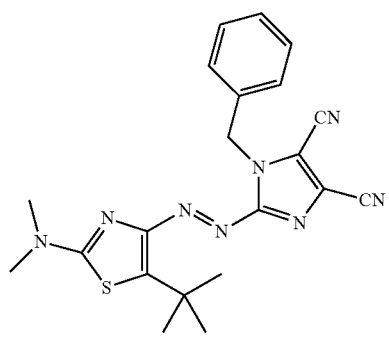
(AZ-3)
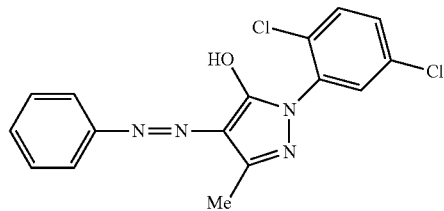
(AZ-4)
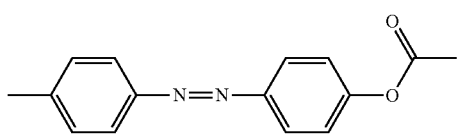
(AZ-5)
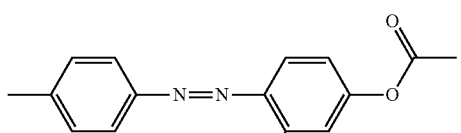
(AZ-6)
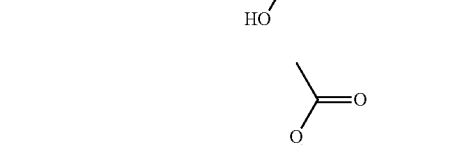
[Chem. 17]
(AZ-7)
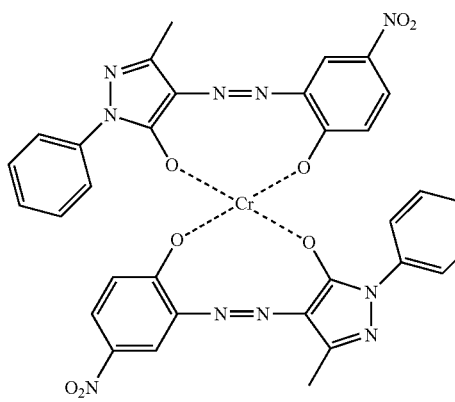
(AZ-8)
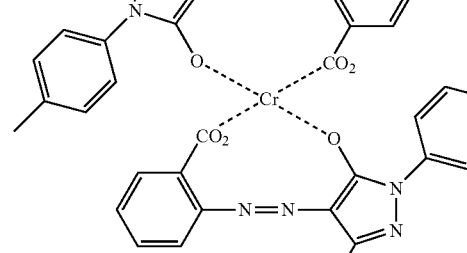
(AZ-9)
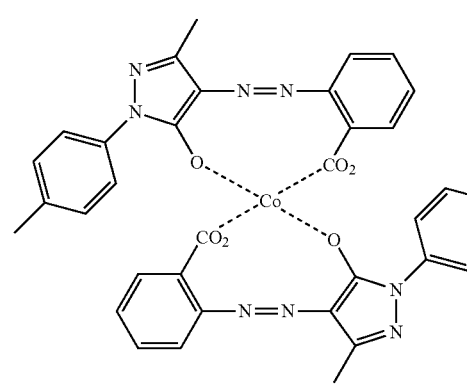
(AZ-10)

[Chem. 18]
(2-1)
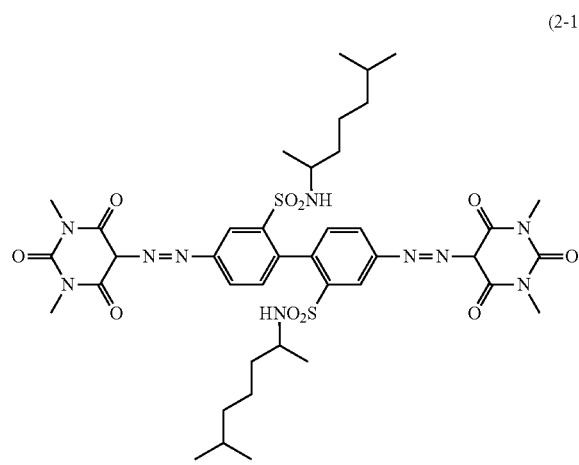
(2-2)
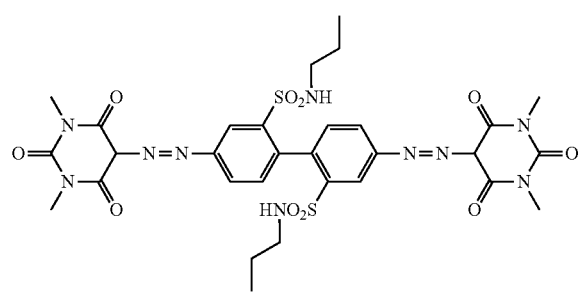
(2-3)
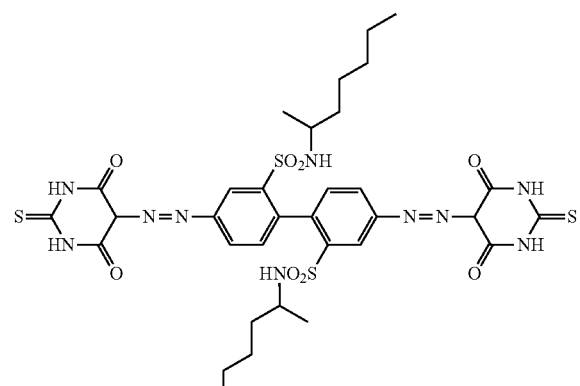
(2-4)
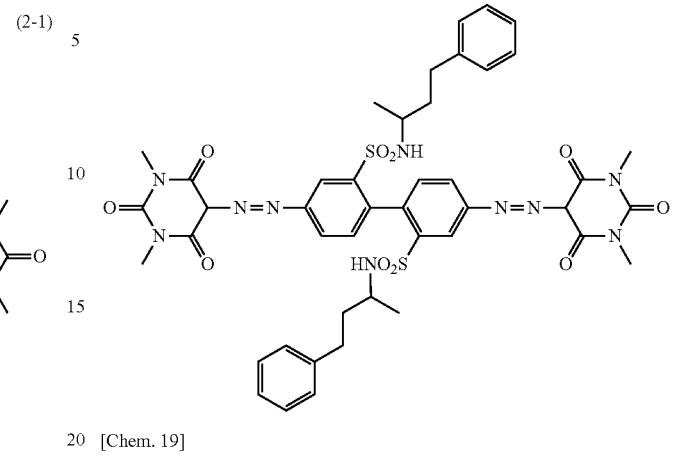
[Chem. 19]
(3-1)
(3-2)
(3-3)
(3-4)
(3-5)
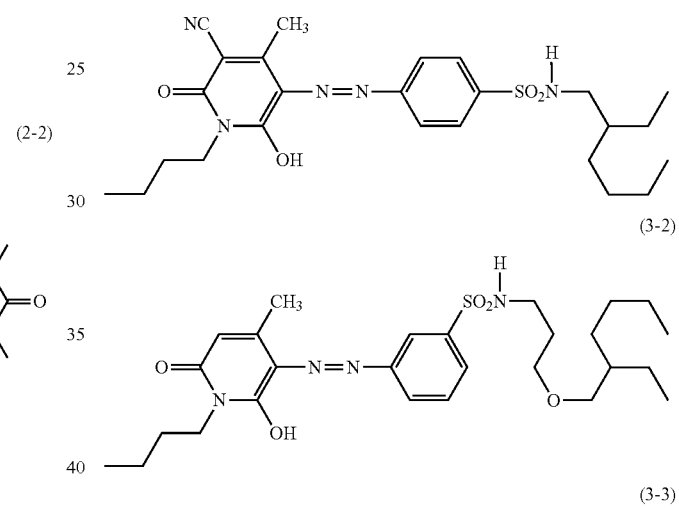
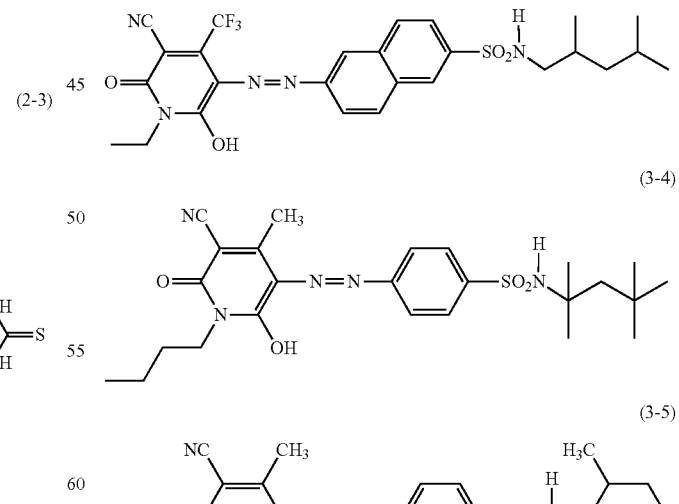

[Chem. 20]

(3-12)

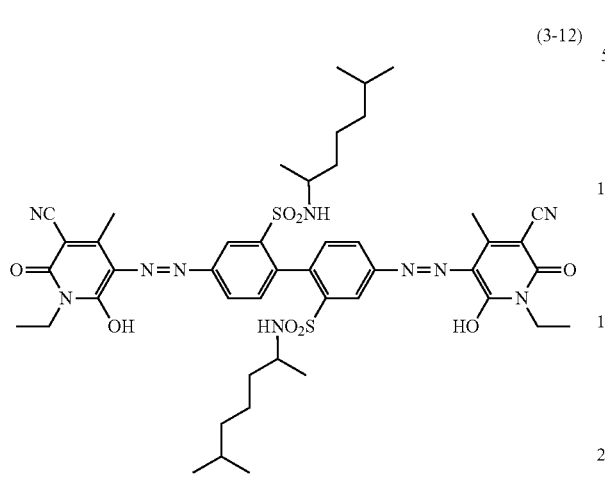

(3-13)

(3-14)

(3-15)

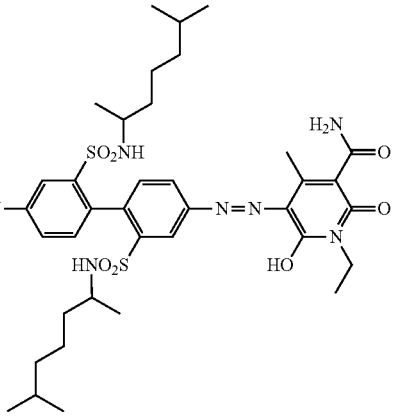

Among the above specific examples, in view of color characteristics and heat resistance, (AZ-7) and (AZ-8), (2-1), (2-2), (2-4), (3-1) to (3-5), and (3-12) to (3-15) are particularly preferable.

(Anthraquinone Dye)

One of the embodiments of the resin (A) having a dye structure according to the present invention is a resin having a partial structure derived from an anthraquinone dye (anthraquinone compound). The resin (A) having such a dye structure includes a resin having a dye structure that has, as a partial structure of a dye moiety, a partial structure derived from the compound (anthraquinone compound) represented by the following General Formulae (AQ-1) to (AQ-3). The anthraquinone compounds in the present invention collectively refer to compounds having a dye moiety including an anthraquinone skeleton in a molecule.

[Chem. 21]

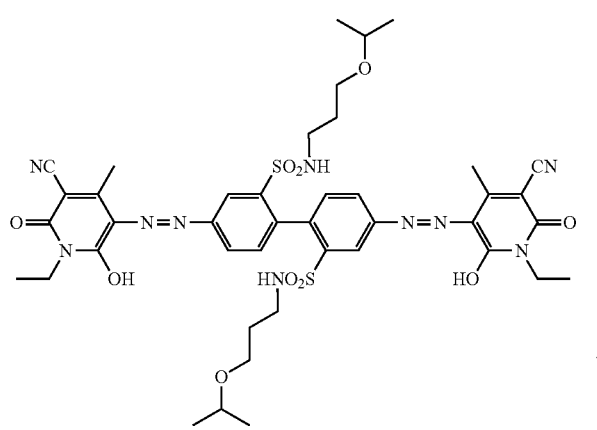

General Formula (AQ-1)

General Formula (AQ-2)

General Formula (AQ-3)

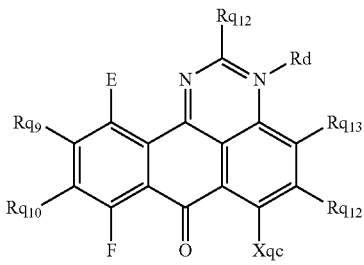

In General Formula (AQ-1), each of A and B independently represents an amino group, a hydroxyl group, an alkoxy group, or a hydrogen atom. Xqa represents ORqa$_1$ or NRqa$_2$Rqa$_3$. Each of Rqa$_1$ to Rqa$_3$ independently represents a hydrogen atom, an alkyl group, or an aryl group, and Rq$_1$ to Rq$_4$ represent substituents. The substituents that Rq$_1$ to Rq$_4$ may have are the same substituents as exemplified in the above section of the substituent group A. Each of Ra and Rb independently represents a hydrogen atom, an alkyl group, or an aryl group.

In General Formula (AQ-2), C and D have the same definition as that of A and B in General Formula (AQ-1). Xqb represents ORqb$_1$ or NRqb$_2$Rqb$_3$. Each of Rqb$_1$ to Rqb$_3$ independently represents a hydrogen atom, an alkyl group, or an aryl group, and Rq$_5$ to Rq$_8$ represents substituents. Rq$_5$ to Rq$_8$ have the same definition as that of Rq$_1$ to Rq$_4$ in General Formula (AQ-1). Rc has the same definition as Ra or Rb in General Formula (AQ-1).

In General Formula (AQ-3), E and F have the same definition as that of A and B in General Formula (AQ-1). Xqc represents ORqc$_1$ or NRqc$_2$Rqc$_3$. Each of Rqc$_1$ to Rqc$_3$ independently represents a hydrogen atom, an alkyl group, or an aryl group. Rq$_9$ to Rq$_{12}$ have the same definition as that of Rq$_1$ to Rq$_4$ in General Formula (AQ-1). Rd has the same definition as that of Ra or Rb in General Formula (AQ-1).

In General Formula (AQ-1), A and B are preferably a hydrogen atom. Xqa is preferably ORqa$_1$ (Rqa$_1$ represents a hydrogen atom, an alkyl group having 1 to 5 carbon atoms, or a phenyl group) or NRqa$_2$Rqa$_3$ (Rqa$_2$ represents a hydrogen atom, and Rqa$_3$ represents an alkyl group having 1 to 5 carbon atoms or a phenyl group). R$_{q1}$ to R$_{q4}$ are preferably a hydrogen atom, a halogen atom, or an alkoxy group. Ra is preferably a hydrogen atom, and Rb is preferably a hydrogen atom, an alkyl group having 1 to 5 carbon atoms, or a phenyl group.

In General Formula (AQ-2), C and D are preferably a hydrogen atom. Xqb is preferably ORqb$_1$ (Rqb$_1$ represents a hydrogen atom, an alkyl group having 1 to 5 carbon atoms, or a phenyl group) or NRqb$_2$Rqb$_3$ (Rqb$_2$ represents a hydrogen atom, and Rqb$_3$ represents an alkyl group having 1 to 5 carbon atoms or a phenyl group). Rq$_5$ to Rq$_8$ are preferably a hydrogen atom, a halogen atom, or an alkoxy group. Rc is preferably a hydrogen atom, an alkyl group having 1 to 5 carbon atoms, or a phenyl group.

In General Formula (AQ-3), E and F are preferably a hydrogen atom. Xqc is preferably ORqc$_1$ (Rqc$_1$ represents a hydrogen atom, an alkyl group having 1 to 5 carbon atoms, or a phenyl group) or NRqc$_2$Rqc$_3$ (Rqc$_2$ represents a hydrogen atom, and Rqc$_3$ represents an alkyl group having 1 to 5 carbon atoms or a phenyl group). Rq$_9$ to Rq$_{12}$ are preferably a hydrogen atom, a halogen atom, or an alkoxy group. Rd is preferably a hydrogen atom, an alkyl group having 1 to 5 carbon atoms, or a phenyl group.

Specific examples of the anthraquinone dye will be shown below, but the present invention is not limited thereto.

[Chem. 22]

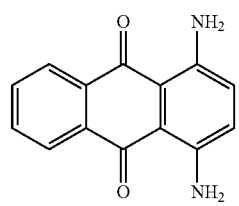
(aq-1)

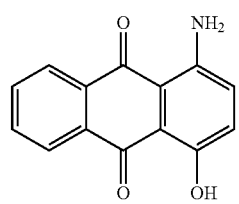
(aq-2)

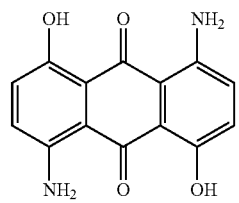
(aq-3)

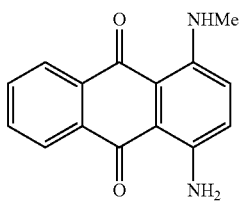
(aq-4)

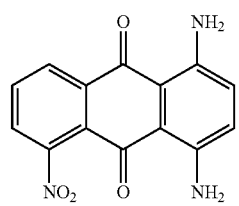
(aq-5)

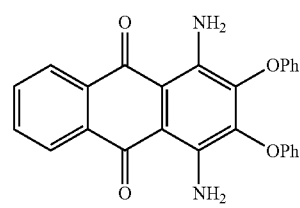
(aq-6)

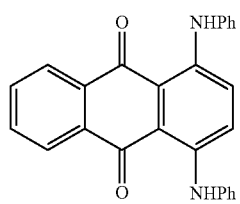
(aq-7)

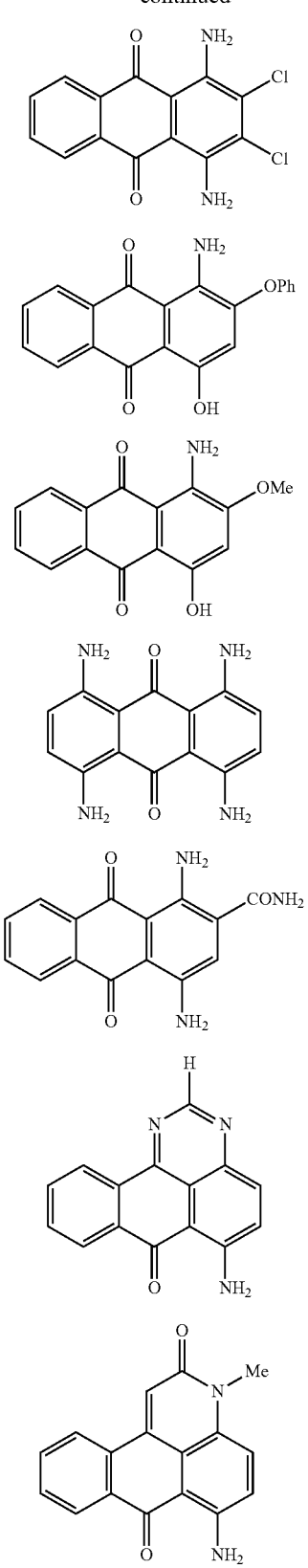

Among the above specific examples, in view of color characteristics and heat resistance, (aq-1) to (aq-4) and (aq-13) and (aq-14) are particularly preferable.

(Triphenylmethane Dye)

One of the embodiments of the resin having a dye structure according to the present invention is a resin having a partial structure derived from a triphenylmethane dye (triphenylmethane compound). The resin (A) having a dye structure includes a resin having a dye structure that has, as a partial structure of a dye moiety, a partial structure derived from a compound (triphenylmethane compound) represented by the following General Formula (TP). The triphenylmethane compounds in the present invention collectively refer to compounds having a dye moiety including a triphenylmethane skeleton in a molecule.

[Chem 23]

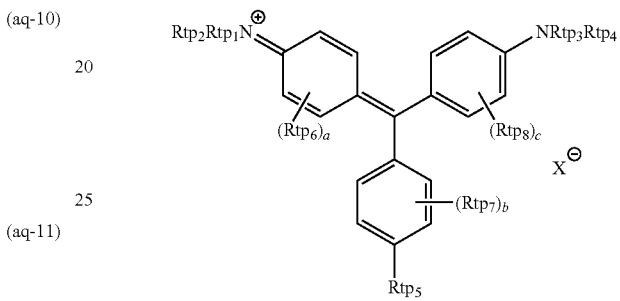

General Formula (TP)

In General Formula (TP), each of $Rtp_1$ to $Rtp_4$ independently represents a hydrogen atom, an alkyl group, or an aryl group. $Rtp_5$ represents a hydrogen atom, an alkyl group, an aryl group, or $NRtp_9Rtp_{10}$ ($Rtp_9$ and $Rtp_{10}$ represent a hydrogen atom, an alkyl group, or an aryl group). $Rtp_6$, $Rtp_7$, and $Rtp_8$ represent substituents. a, b, and c represent an integer of 0 to 4. When a, b, and c are 2 or greater, $Rtp_6$, $Rtp_7$, and $Rtp_8$ may form a ring by being linked to each other respectively. $X^-$ represents an anion.

$Rtp_1$ to $Rtp_6$ are preferably a hydrogen atom, a linear or branched alkyl group having 1 to 5 carbon atoms, and a phenyl group. $Rtp_5$ is preferably a hydrogen atom or $NRtp_9Rtp_{10}$, and most preferably $NRtp_9Rtp_{10}$. $Rtp_9$ and $Rtp_{10}$ are preferably a hydrogen atom, a linear or branched alkyl group having 1 to 5 carbon atoms, or a phenyl group. As the substituents represented by $Rtp_6$, $Rtp_7$, and $Rtp_8$, the substituents exemplified in the above section of the substituent group A can be used. Particularly, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 15 carbon atoms, an alkenyl group having 1 to 5 carbon atoms, a phenyl group, or a carboxyl group is more preferable. Particularly, $Rtp_6$ and $Rtp_8$ are preferably an alkyl group having 1 to 5 carbon atoms, and $Rtp_7$ is preferably an alkenyl group (particularly preferably a phenyl group formed when two adjacent alkenyl groups are linked to each other), a phenyl group, or a carboxyl group.

Each of a, b, and c independently represents an integer of 0 to 4. Particularly, a and b are preferably 0 to 1, and c is preferably 0 to 2.

$X^-$ represents an anion. Specific examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. X⁻ preferably forms an ionic bond with a dye structure, and may be linked to a portion (polymer chain or the like) of the resin having a dye structure.

X⁻ is preferably a fluorine anion, a chlorine anion, a bromine anion, an iodine anion, a perchlorate anion, or a carboxylic acid anion, and most preferably a perchlorate anion or a carboxylic acid anion.

Specific examples of the compound represented by General Formula (TP) will be shown below, but the present invention is not limited thereto.

[Chem. 24]

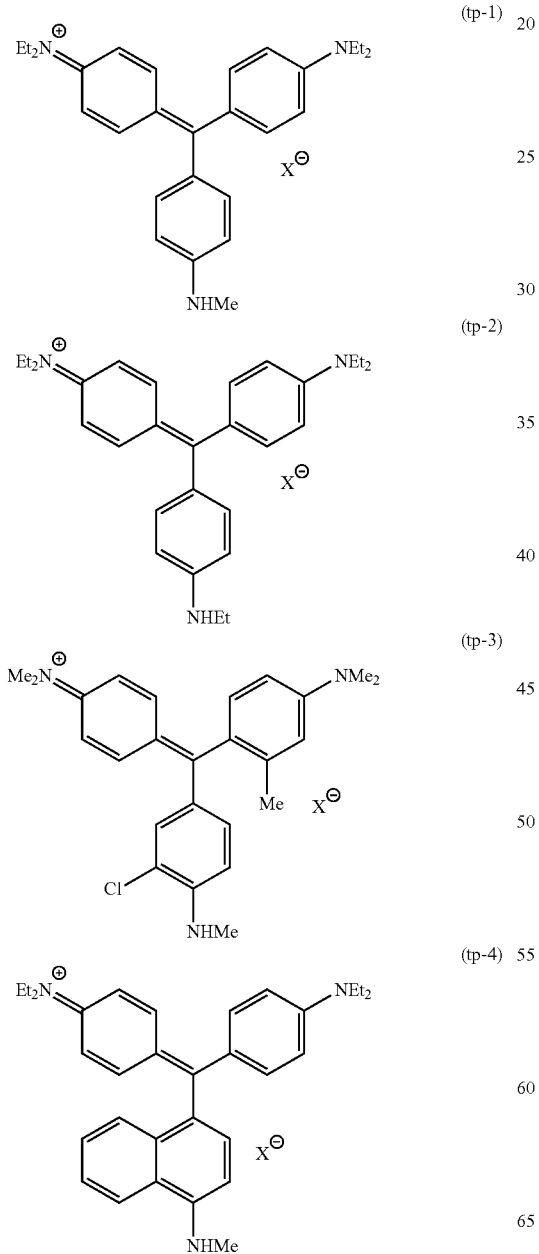
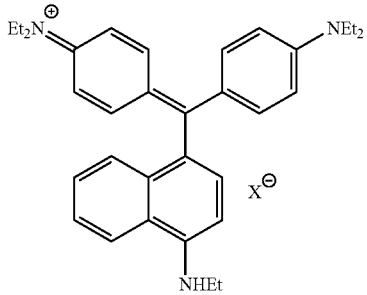
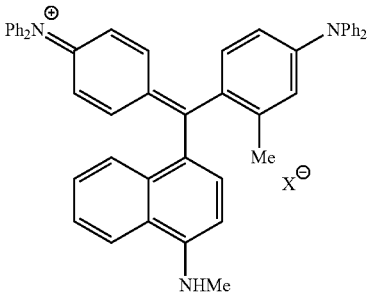
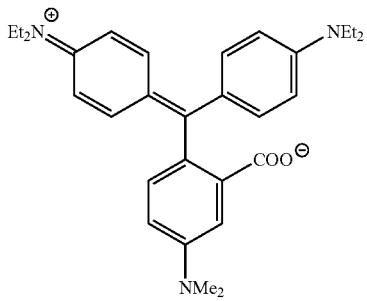
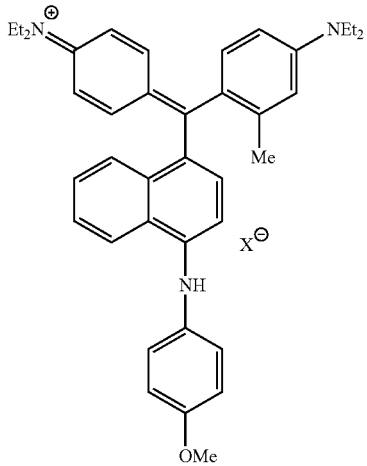

(tp-9)
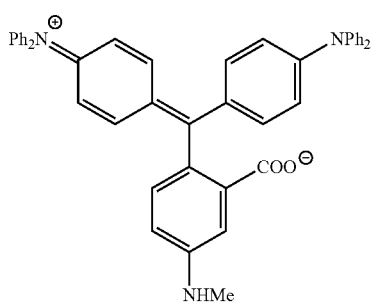

[Chem. 25]

(tp-10)
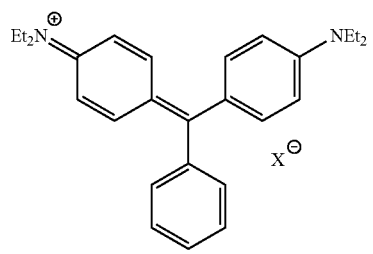

(tp-11)
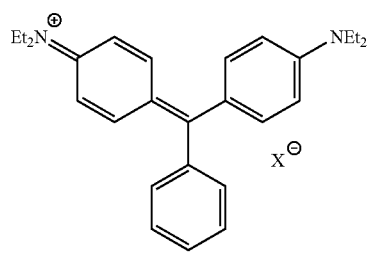

(tp-12)
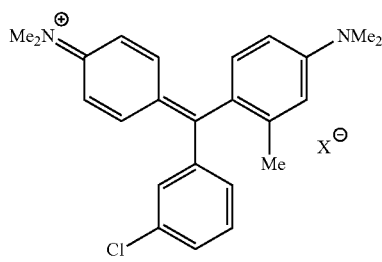

(tp-13)
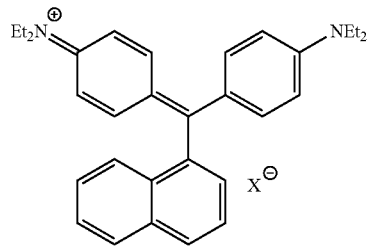

(tp-14)
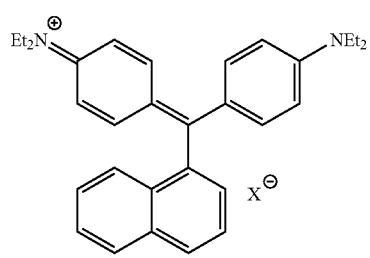

(tp-15)
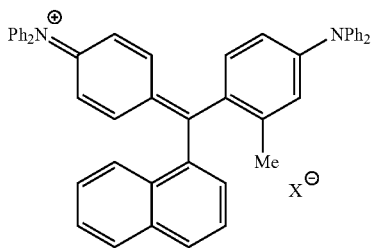

(tp-16)
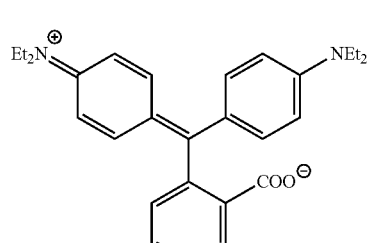

(tp-17)
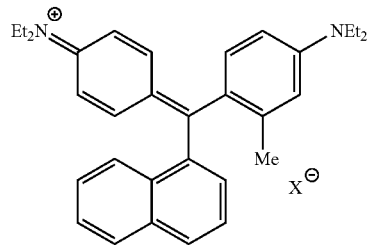

(tp-18)
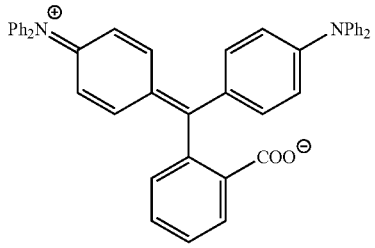

Among the above specific examples, in view of color characteristics and heat resistance, (tp-4), (tp-5), (tp-6), and (tp-8) are particularly preferable.

(Xanthene Dye)

A preferable embodiment of the resin having a dye structure in the present invention is a resin having a partial structure derived from a xanthene dye (xanthene compound). The resin (A) having such a dye structure includes a resin having a dye structure that has, as a partial structure of a dye moiety, a partial structure derived from a xanthene compound represented by the following General Formula (J).

[Chem. 26]

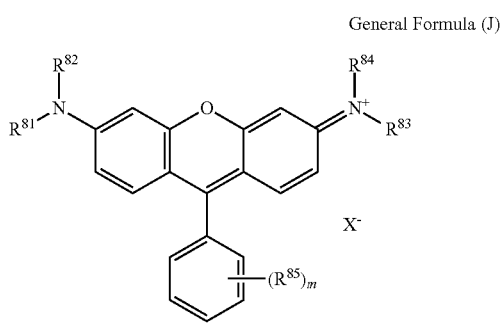

General Formula (J)

In General Formula (J), each of $R^{81}$, $R^{82}$, $R^{83}$, and $R^{84}$ independently represents a hydrogen atom or a monovalent substituent. Each $R^{85}$ independently represents a monovalent substituent, and m represents an integer of 0 to 5. $X^-$ represents an anion.

The substituents that $R^{81}$ to $R^{84}$ and $R^{85}$ in General Formula (J) may have are the same substituents as exemplified in the above section of the substituent group A.

In General Formula (J), $R^{81}$ and $R^{82}$, $R^{83}$ and $R^{84}$, and $R^{85}$s in a case where m is 2 or greater may independently form a 5-, 6-, or 7-membered saturated ring or a 5-, 6-, or 7-membered unsaturated ring respectively by binding to each other. When the 5-, 6-, or 7-membered ring formed is a group that can be further substituted, the ring may be substituted with the substituents described for $R^{81}$ to $R^{85}$. When the ring is substituted with two or more substituents, these substituents may be the same as or different from each other.

In General Formula (J), when $R^{81}$ and $R^{82}$, $R^{83}$ and $R^{84}$, and $R^{85}$s in a case where m is 2 or greater independently form 5-, 6-, and 7-membered saturated rings not having a substituent or form 5-, 6-, and 7-membered unsaturated rings respectively by binding to each other, examples of the 5-, 6-, and 7-membered saturated rings not having a substituent or the 5-, 6-, and 7-membered unsaturated rings include a pyrrole ring, a pyran ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and among these, a benzene ring and a pyridine ring are preferable.

Particularly preferably, $R^{82}$ and $R^{83}$ are a hydrogen atom, $R^{81}$ and $R^{84}$ is a substituted or unsubstituted phenyl group. In addition, $R^{85}$ is preferably a halogen atom, a linear or branched alkyl group having 1 to 5 carbon atoms, a sulfo group, a sulfonamide group, or a carboxyl group. The substituent that the phenyl group represented by $R^{81}$ and $R^{84}$ has is most preferably a hydrogen atom, a halogen atom, a linear or branched alkyl group having 1 to 5 carbon atoms, a sulfo group, a sulfonamide group, or a carboxyl group.

$X^-$ represents an anion. Specific examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion, a benzoate anion, organic sulfonate anions such as a benzene sulfonate anion, a toluene sulfonate anion, and a trifluoromethane sulfonate anion, organic perchlorate anions such as octyl phosphate anion, a dodecyl phosphate anion, an octadecyl phosphate anion, a phenyl phosphate anion, and a nonyl phenyl phosphate anion, and the like. $X^-$ may be linked to a dye skeleton, or may be linked to a portion (polymer chain or the like) of the resin having a dye structure.

$X^-$ is preferably a fluorine anion, a chlorine anion, a bromine anion, an iodine anion, a perchlorate anion, or a carboxylic acid anion, and most preferably a perchlorate anion or a carboxylic acid anion.

The compound having the xanthene skeleton represented by General Formula (J) can be synthesized by methods disclosed in documents. Specifically, the methods disclosed in Tetrahedron Letters, 2003, Vol. 44, No. 23, pp 4355-4360, Tetrahedron, 2005, Vol. 61, No. 12, pp 3097-3106, and the like can be applied.

Specific examples of the xanthene compound will be shown below, but the present invention is not limited thereto.

[Chem. 27]

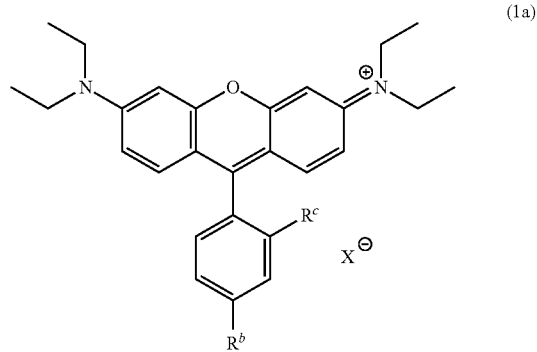

(1a)

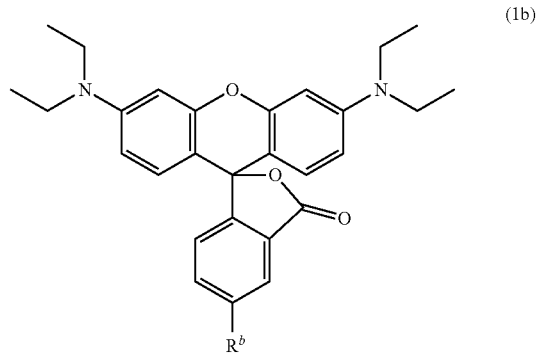

(1b)

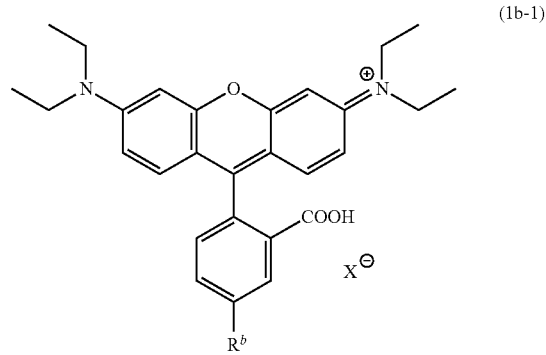

(1b-1)

-continued (1c)
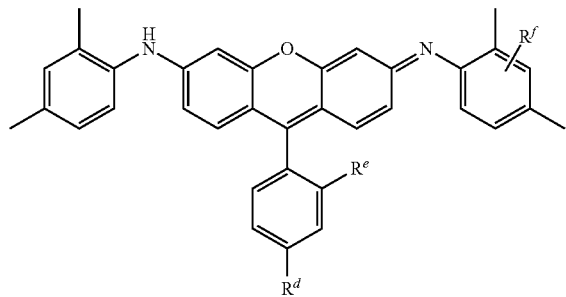

(1d)
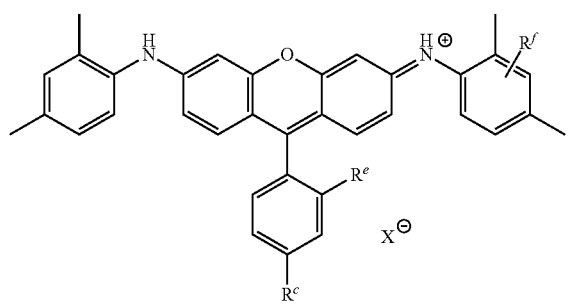

(1e)
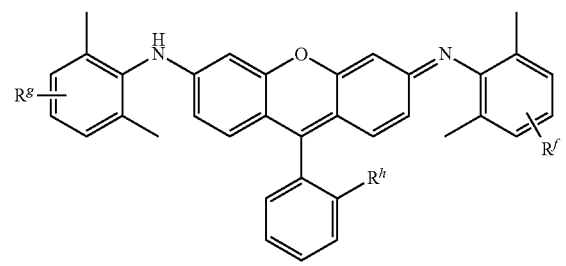

(1f)
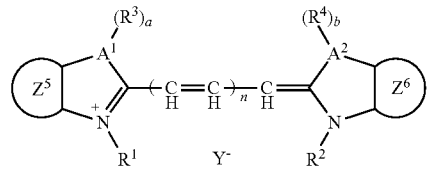

In Formulae (1a) to (1f), each of $R^b$ and $R^c$ independently represents a hydrogen atom, —SO$_3$—, —CO$_2$H, or —SO$_2$NHR$^a$. Each of $R^d$, $R^e$, and $R^f$ independently represents —SO$_3$—, —SO$_3$Na—, or —SO$_2$NHR$^a$—.

Each of Rg, Rh, and Ri independently represents a hydrogen atom, —SO$_3$—, —SO$_3$H—, or —SO$_2$NHR$^a$—.

$R^a$ represents an alkyl group having 1 to 10 carbon atoms and preferably represents a 2-ethylhexyl group. X has the same definition as described above.

The compound represented by Formula (1b) is a tautomer of the compound represented by Formula (1b-1).

Among the above compounds, Formulae (1e) and (1f) are particularly preferable in view of color characteristics and heat resistance.

(Cyanine Dye)

One of the embodiments of the resin having a dye structure according to the present invention is a resin having a partial structure derived from a cyanine dye (cyanine compound). The resin (A) having such a dye structure includes a resin having a dye structure that has, as a partial structure of a dye moiety, a partial structure derived from a compound (cyanine compound) represented by the following General Formula (PM). The cyanine compounds in the present invention collectively refer to compounds having a dye moiety including a cyanine skeleton in a molecule.

[Chem. 28]

General Formula (PM)

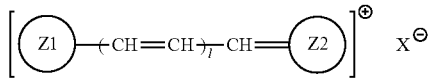

In General Formula (PM), each of a ring Z1 and ring Z2 independently represents a heterocycle that may have a substituent. 1 represents an integer of 0 to 3, and X$^-$ represents an anion.

Each of the ring Z1 and the ring Z2 independently includes, for example, oxazole, benzoxazole, oxazoline, thiazole, thizoline, benzothiazole, indolenine, benzoindolenine, 1,3-thiadiazine, and the like.

The substituents that the ring Z1 and the ring Z2 may have are the same substituents exemplified in the above section of the substituent group A. Examples of X$^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic perchlorate anions such as an octyl phosphate anion, a dodecyl phosphate anion, an octadecyl phosphate anion, a phenyl phosphate anion, and a nonyl phenyl phosphate anion, and the like. X$^-$ preferably forms an ionic bond with a dye structure, or may be linked to a portion (polymer chain or the like) of a resin having a dye structure.

The compound represented by General Formula (PM) is preferably a compound represented by the following General Formula (PM-2)

[Chem. 29]

General Formula (PM-2)

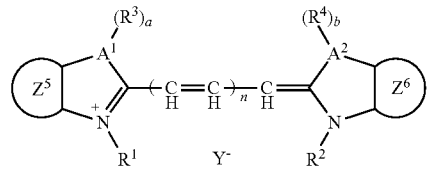

In General Formula (PM-2), each of a ring $Z^5$ and a ring $Z^6$ independently represents a benzene ring that may have a substituent or a naphthalene ring that may have a substituent.

Y$^-$ represents Cl$^-$, Br$^-$, ClO$_4^-$, OH$^-$, a monovalent organic carboxylic acid anion, a monovalent organic sulfonate anion, a monovalent organic boron anion, or a monovalent organic metal complex anion. Y$^-$ preferably forms an ionic bond with a dye structure, or may be linked to a portion (polymer chain or the like) of a resin having a dye structure.

n represents an integer of 0 to 3.

Each of $A^1$ and $A^2$ independently represents an oxygen atom, a sulfur atom, a selenium atom, a carbon atom, or a nitrogen atom.

Each of $R^1$ and $R^2$ independently represents a monovalent aliphatic hydrocarbon group having 1 to 20 carbon atoms that may have a substituent.

Each of $R^3$ and $R^4$ independently represents a hydrogen atom, a monovalent aliphatic hydrocarbon group having 1 to 6 carbon atoms, or represents a divalent aliphatic hydrocarbon group having 2 to 6 carbon atoms that is formed when one $R^3$ and one $R^4$ are linked to each other.

Each of a and b independently represents an integer of 0 to 2.

In General Formula (PM-2), $Y^-$ is preferably a fluorine anion, a chlorine anion, a bromine anion, an iodine anion, a perchlorate anion, or a carboxylic acid anion, and most preferably a chlorine anion, a perchlorate anion, or a carboxylic acid anion. n is preferably 1. Each of $A^1$ and $A^2$ preferably independently represents an oxygen atom, a sulfur atom, or a carbon atom, and most preferably, both the $A^1$ and $A^2$ represent a carbon atom.

Specific examples of the cyanine compound will be shown below, but the present invention is not limited thereto.

[Chem. 30]

(pm-1)
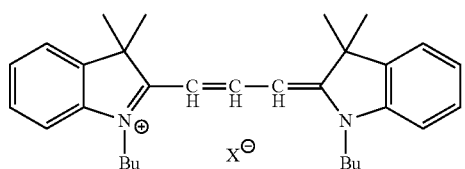

(pm-2)
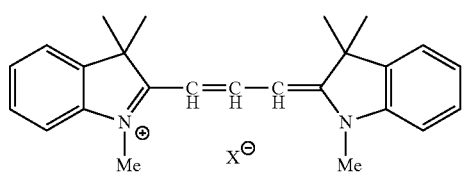

(pm-3)
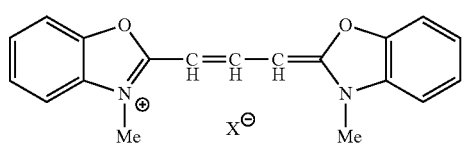

(pm-4)
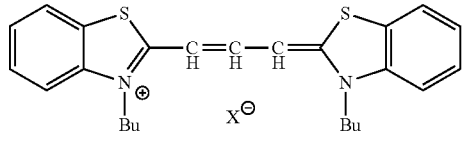

(pm-5)
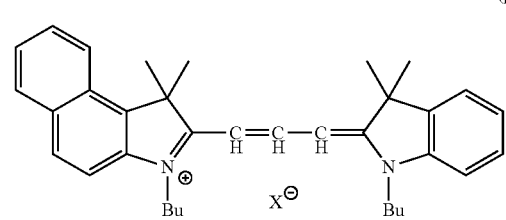

-continued (pm-6)
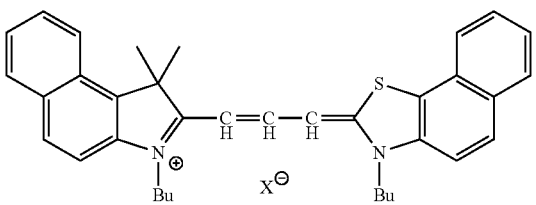

(pm-7)
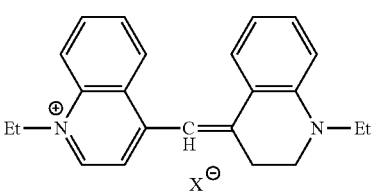

(pm-8)
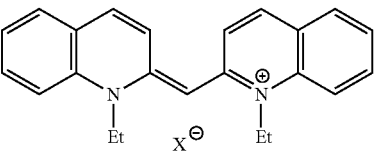

(pm-9)
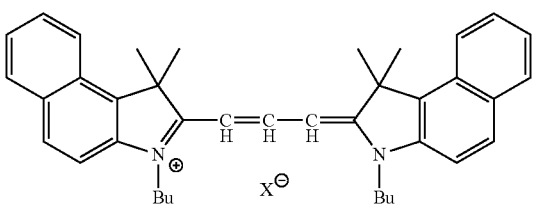

(pm-10)
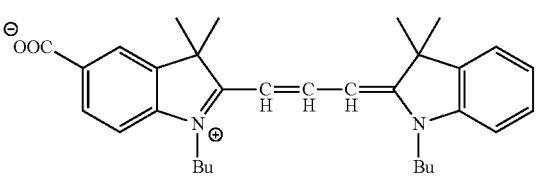

(pm-11)
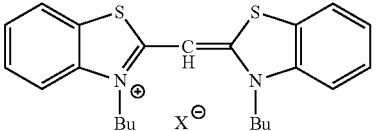

(pm-12)
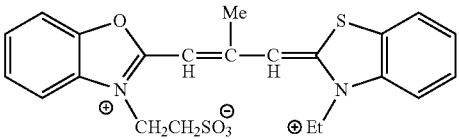

(pm-13)
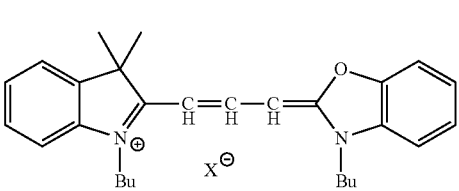

-continued (pm-14)
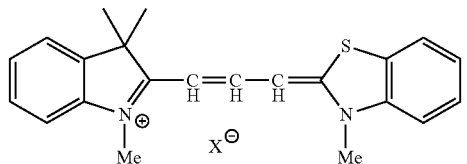

(pm-15)
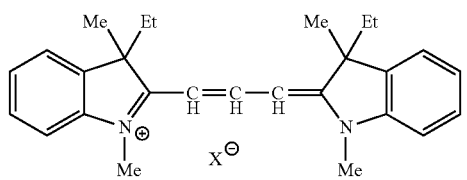

(pm-16)
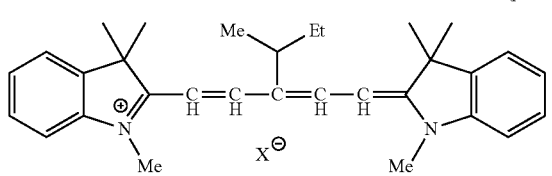

(pm-17)
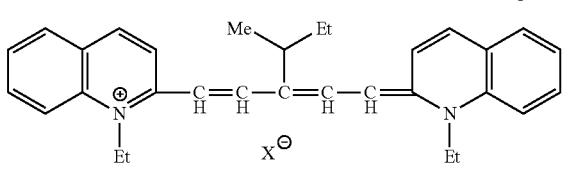

Among the specific examples, structures represented by (pm-1) to (pm-6), (pm-9), and (pm-10) are preferable, and among these, in view of color characteristics and heat resistance, dye structures represented by (pm-1), (pm-2), and (pm-10) are particularly preferable.

(Squarylium Dye)

One of the embodiments of the resin having a dye structure according to the present invention is a resin having a partial structure derived from a squarylium dye (squarylium compound). The resin (A) having such a dye structure includes a resin having a dye structure that has, as a partial structure of a dye moiety, a partial structure derived from a compound (squarylium compound) represented by the following General Formula (K). The squarylium compounds in the present invention collectively refer to compounds having a dye moiety including a squarylium skeleton in a molecule.

[Chem. 31]

General Formula (K)
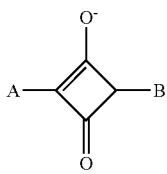

In General Formula (K), each of A and B independently represents an aryl group or a heterocyclic group. The aryl group is an aryl group preferably having 6 to 48 carbon atoms and more preferably having 6 to 24 carbon atoms, and examples thereof include phenyl, naphthyl, and the like. The heterocyclic group is preferably a 5-membered or 6-membered heterocyclic group, and examples thereof include pyrrolyl, imidazolyl, pyrazolyl, thienyl, pyridyl, pyrimidyl, pyridazyl, triazol-1-yl, furyl, thiadiazolyl, and the like.

The compound represented by General Formula (K) is particularly preferably a compound represented by the following General Formula (K-1), (K-2), (K-3), or (K-4).

[Chem. 32]

General Formula (K-1)
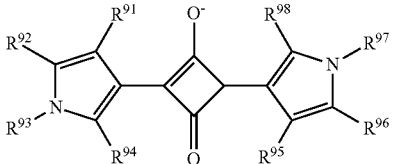

In General Formula (K-1), each of $R^{91}$, $R^{92}$, $R^{94}$, $R^{95}$, $R^{96}$, and $R^{98}$ independently represents a hydrogen atom, a halogen atom, a linear or branched alkyl group, a cycloalkyl group, a linear or branched alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, a furylthio group, a heterocyclic thio group, a sulfamoyl group, a sulfa group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, or as silyl group.

Each of $R^{93}$ and $R^{97}$ independently represents a hydrogen atom, a linear or branched alkyl group, a cycloalkyl group, a cycloalkenyl group, an alkynyl group, an aryl group, or a heterocyclic group.

$R^{91}$ and $R^{92}$, and $R^{95}$ and $R^{96}$ may respectively form a ring by being linked to each other.

The substituents that $R^{91}$, $R^{92}$, $R^{94}$, $R^{95}$, $R^{97}$, and $R^{98}$ in General Formula (K-1) may have are the same substituents as exemplified in the above section of the substituent group A.

Each of $R^{91}$ to $R^{98}$ preferably independently represents a hydrogen atom, an alkyl group, a hydroxyl group, an amino group, an aryl group, or a heterocyclic group. More preferably, $R^{93}$, $R^{94}$, $R^{97}$, and $R^{98}$ are an alkyl group, and $R^{91}$ and $R^{92}$ and $R^{95}$ and $R^{96}$ form an aryl ring by being linked to each other. Most preferably, $R^{93}$, $R^{94}$, $R^{97}$, and $R^{98}$ are an alkyl group having 1 to 20 carbon atoms, and $R^{91}$ and $R^{92}$ and $R^{95}$ and $R^{96}$ form a benzene ring by being linked to each other.

[Chem. 33]

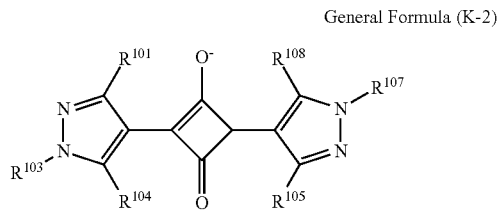

General Formula (K-2)

In General Formula (K-2), $R^{101}$, $R^{103}$, $R^{104}$, $R^{105}$, $R^{107}$, and $R^{108}$ have the same definition as that of $R^{91}$, $R^{93}$, $R^{94}$, $R^{95}$, $R^{97}$, and $R^{98}$ in General Formula (K-1) respectively. $R^{103}$ and $R^{107}$ have the same definition as that of $R^{93}$ and $R^{97}$ in the General Formula (K-1).

In General Formula (K-2), $R^{101}$, $R^{103}$, $R^{104}$, $R^{105}$, $R^{107}$, and $R^{108}$ are preferably a hydrogen atom, an alkyl group, a hydroxy group, an amino group, an aryl group, or a heterocyclic group. More preferably, $R^{101}$, $R^{103}$, $R^{105}$, and $R^{107}$ are an alkyl group or an aryl group, and $R^{104}$ and $R^{108}$ are a hydroxy group or an amino group. Even more preferably, $R^{101}$, $R^{103}$, $R^{105}$, and $R^{107}$ are an alkyl group having 1 to 20 carbon atoms, and $R^{104}$ and $R^{108}$ are a hydroxy group. $R^{103}$ and $R^{107}$ are preferably a hydrogen atom, a linear or branched alkyl group, and an and group, and more preferably an alkyl group having 1 to 5 carbon atoms and a phenyl group.

[Chem. 34]

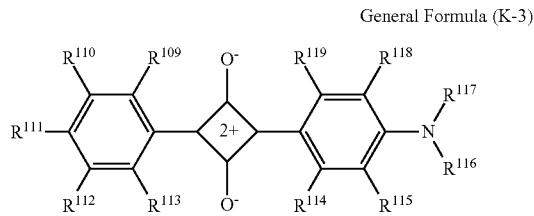

General Formula (K-3)

In General Formula (K-3), $R^{109}$, $R^{110}$, $R^{111}$, $R^{112}$, $R^{113}$, $R^{114}$, $R^{115}$, $R^{118}$, and $R^{119}$ have the same definition as that of $R^{91}$, $R^{93}$, $R^{94}$, $R^{95}$, $R^{97}$, and $R^{98}$ in the General Formula (K-1). $R^{116}$ and $R^{117}$ have the same definition as that of $R^{93}$ and $R^{97}$ in the General Formula (K-1).

In General Formula (K-3), $R^{109}$, $R^{110}$, $R^{111}$, $R^{112}$, $R^{113}$, $R^{114}$, $R^{115}$, $R^{118}$, and $R^{119}$ are preferably a hydrogen atom, a halogen atom, a linear or branched alkyl group, a hydroxy group, or an alkoxy group. Particularly, $R^{109}$, $R^{113}$, $R^{115}$, $R^{118}$, and $R^{119}$ are most preferably a hydrogen atom, $R^{110}$, $R^{111}$, and $R^{112}$ are most preferably a hydrogen atom or an alkoxy group, and $R^{114}$ is most preferably a hydrogen atom, a halogen atom, a hydroxy group, an alkyl group having 1 to 5 carbon atoms, or an alkoxy group having 1 to 5 carbon atoms.

[Chem. 35]

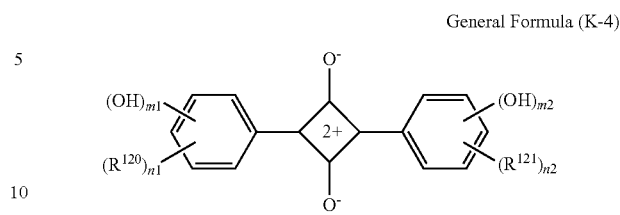

General Formula (K-4)

In General Formula (K-4), each of $R^{120}$ and $R^{121}$ independently represents a halogen atom, an alkyl group, an alkoxy group, or an alkenyl group. Each of m1 and m2 independently represents an integer of 1 to 4, and each of n1 and n2 independently represents an integer of 0 to 4.

$R^{120}$ and $R^{121}$ are particularly preferably an alkyl group having 1 to 5 carbon atoms or an alkoxy group having 1 to 5 carbon atoms. m1 and m2 are preferably 1 to 3 and most preferably 3. n1 and n2 are preferably 0 to 3 and more preferably 0 or 1.

In the present invention, the dye compound that can form a dye structure is preferably the squarylium compound represented by the General Formula (K-1), in view of hue.

The squarylium compound represented by the General Formulae (K-1) to (K-4) can be synthesized by applying the method disclosed in J. Chem. Soc., Perkin Trans. 1, 2000, 599.

Specific examples of the squarylium compound represented by General Formulae (K-1) to (K-4) will be shown below, but the present invention is not limited thereto.

[Chem. 36]

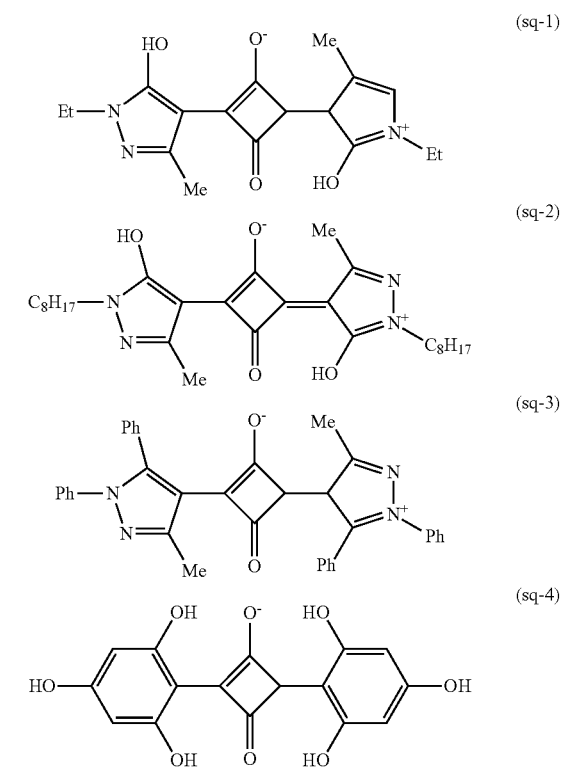

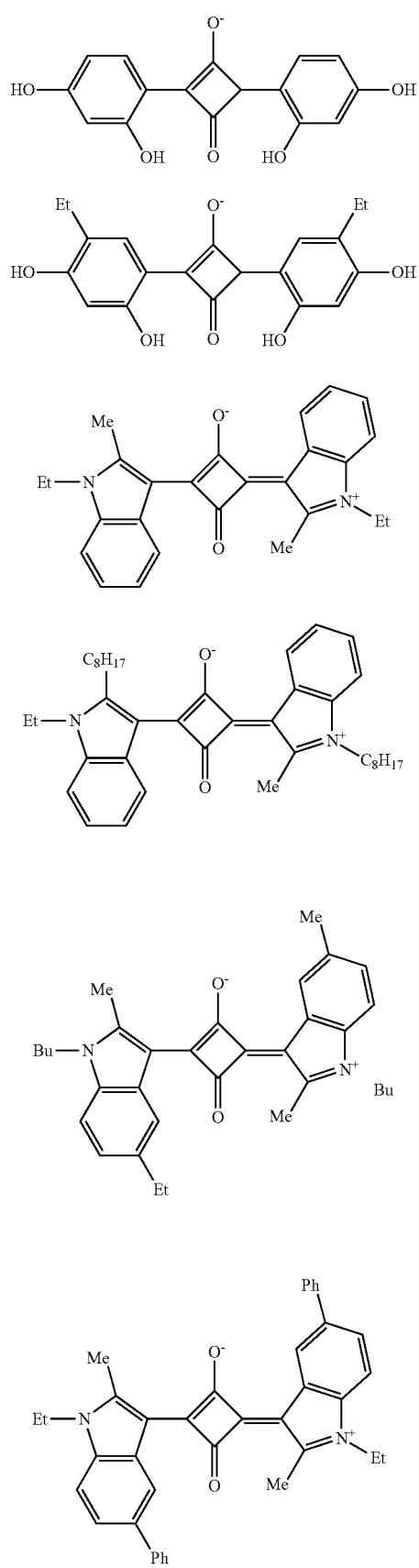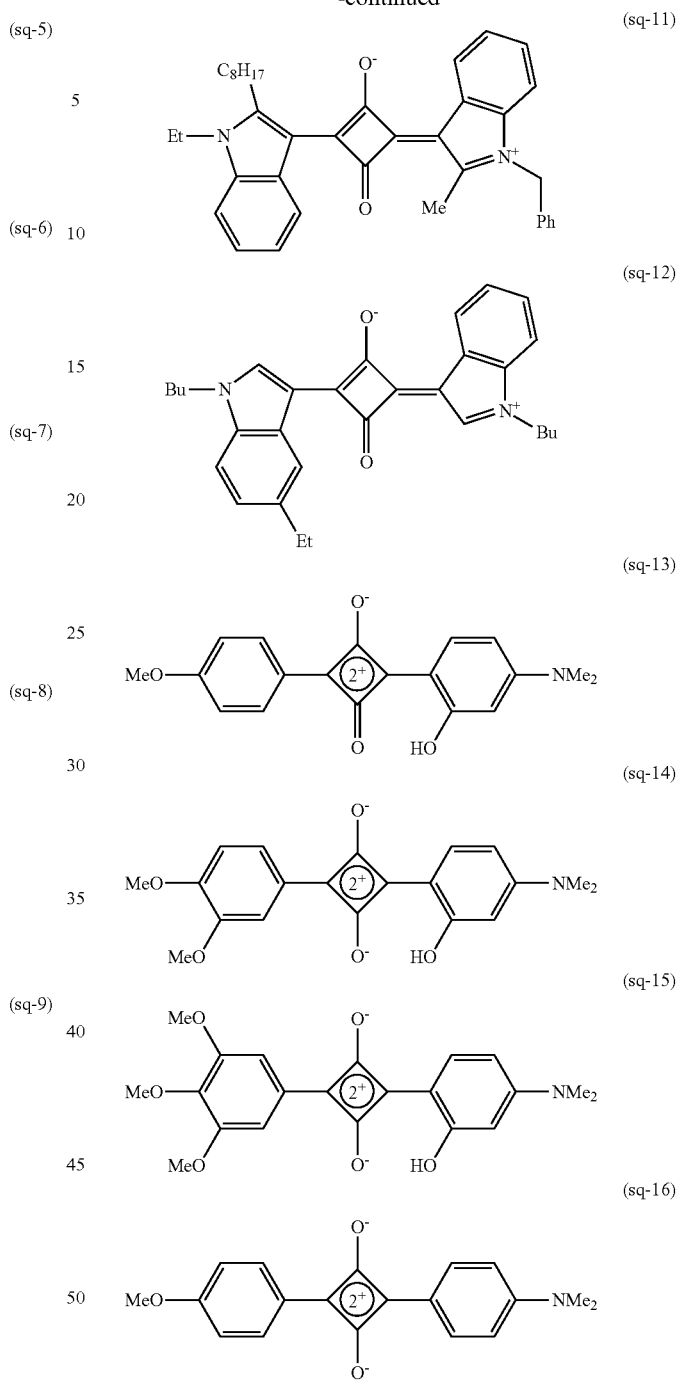

Among the above specific examples, in view of color characteristics and heat resistance, (sq-1), (sq-2), (sq-3), (sq-7), (sq-8), (sq-9), (sq-10), (sq-11), and (sq-12) are preferable.

(Quinophthalone Dye)

One of the embodiments of the resin having a dye structure according to the present invention is a resin having a partial structure derived from a quinophthalone dye (quinophthalone compound). The resin (A) having such a dye structure includes a resin having a dye structure that has, as a partial structure of a dye moiety, a partial structure derived from the compound (quinophthalone compound) represented by the following General Formula (QP). The quinophthalone compound in the present invention collectively refers to compounds having a dye moiety including a quinophthalone skeleton in a molecule.

[Chem. 37]

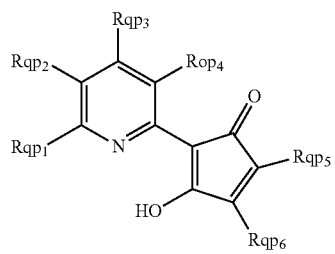

General Formula (QP)

In General Formula (QP), each of $Rqp_1$ to $Rqp_6$ independently represents a hydrogen atom or a substituent. When at least two out of $Rqp_1$ to $Rqp_6$ are adjacent to each other, these may form a ring by binding to each other, and the ring may further have a substituent.

The substituent represented by $Rqp_1$ to $Rqp_6$ represents the substituents exemplified in the above section of the substituent group A. As the substituent represented by $Rqp_1$ to $Rqp_6$, a halogen atom, an alkyl group, an alkenyl group, and an aryl group are preferable. Particularly preferably, $Rqp_1$ and $Rqp_2$ and $Rqp_5$ and $Rqp_6$ form a substituted or unsubstituted phenyl ring by being linked to each other. $Rqp_3$ and $Rqp_4$ are preferably a hydrogen atom, a chlorine atom, or a bromine atom.

Examples of substituents that the phenyl ring formed by $Rqp_1$ and $Rqp_2$ and $Rqp_5$ and $Rqp_6$ linked to each other may have include the substituents exemplified in the above section of the substituent group A, and among the substituents, a halogen atom, a carbamoyl group, an amino group, an alkoxy group, an aryloxy group, an alkylthio group, an arylthio group, and an alkoxycarbonyl group are preferable.

Specific examples of the compound represented by General Formula (QP) will be shown below, but the present invention is not limited thereto.

[Chem. 38]

(QP-1)

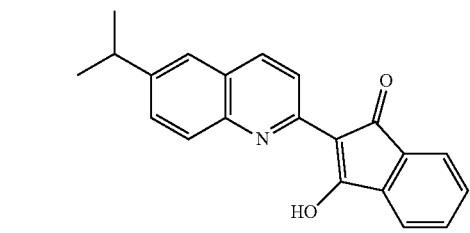

(QP-2)

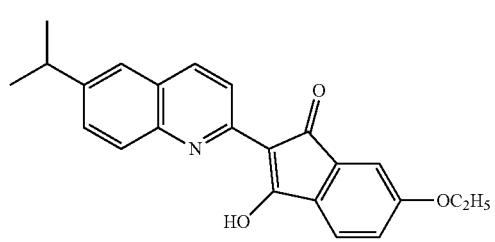

(QP-3)

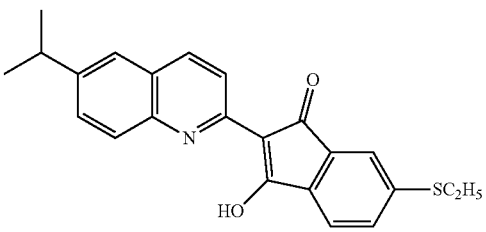

(QP-4)

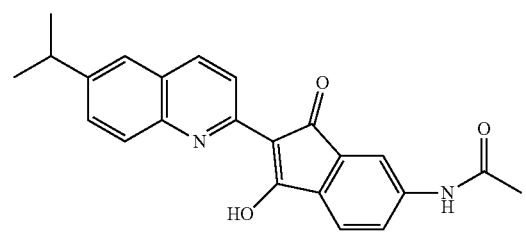

(QP-5)

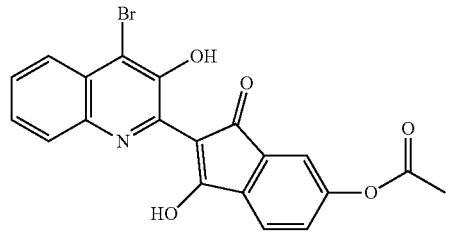

(QP-6)

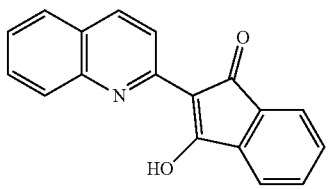

(QP-7)

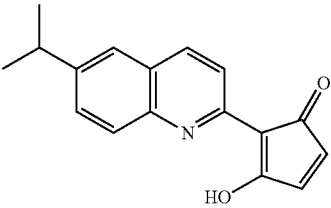

(QP-8)

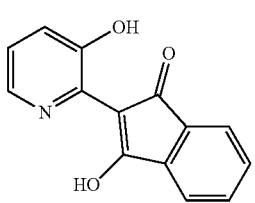

(QP-9)

Among the above specific examples, in view of color characteristics and heat resistance, (QP-1) to (QP-5) are preferable.

(Phthalocyanine Dye)

One of the embodiments of the resin having a dye structure according to the present invention is a resin having a partial structure derived from a phthalocyanine dye (phthalocyanine compound). The resin (A) having such a dye structure includes a resin having a dye structure that has, as a partial structure of a dye moiety, a partial structure derived from a compound (phthalocyanine compound) represented by the following General Formula (F). The phthalocyanine dye in the present invention collectively refers to compounds having a dye moiety including a phthalocyanine skeleton in a molecule.

[Chem. 39]

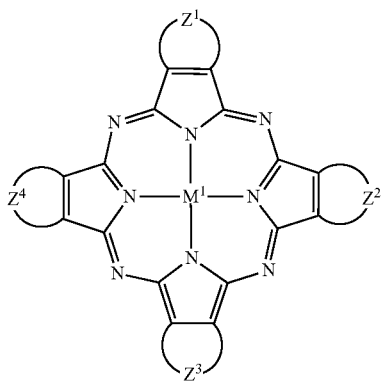

General Formula (F)

In General Formula (F), $M^1$ represents metals, and each of $Z^1$, $Z^2$, $Z^3$, and $Z^4$ independently represents an atomic group that is necessary for forming a 6-membered ring constituted with atoms selected from a hydrogen atom, a carbon atom, and a nitrogen atom.

General Formula (F) will be described in detail.

In General Formula (F), the metals represented by $M^1$ include, for example, metal atoms such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$, and among these, Cu and Zn are particularly preferable.

In General Formula (F), each of $Z^1$, $Z^2$, $Z^3$, and $Z^4$ independently represents an atomic group that is necessary for forming a 6-membered ring constituted with atoms selected from a hydrogen atom, a carbon atom, and a nitrogen atom. The 6-membered ring may be a saturated or unsaturated ring and may be unsubstituted or have a substituent. Examples of the substituent include the substituents exemplified in the above section of the substituent group A. In addition, when the 6-membered ring has two or more substituents, these substituents may be the same as or different from each other. Moreover, the 6-membered ring may be condensed with another 5 or 6-membered ring.

The 6-membered ring include a benzene ring, a cyclohexane ring, and the like.

Among residues of the phthalocyanine dye represented by General Formula (F), a residue derived from a phthalocyanine dye represented by the following General Formula (F-1) is particularly preferable.

[Chem. 40]

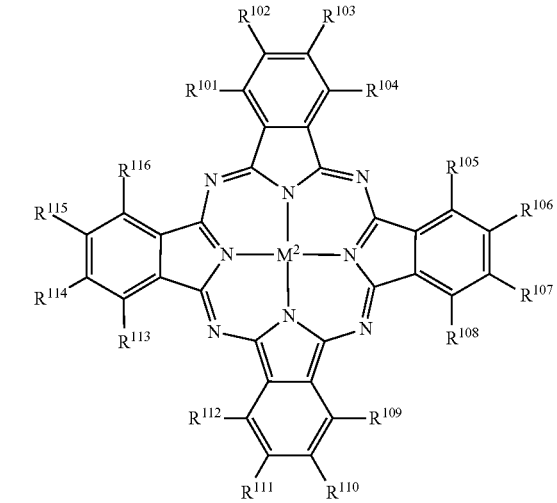

General Formula (F-1)

In General Formula (F-1), $M^2$ has the same definition as that of $M^1$ in the General Formula (F), and the preferable embodiment thereof is also the same.

In the General Formula (F-1), each of $R^{101}$ to $R^{116}$ represents a hydrogen atom or a substituent. When the substituent represented by $R^{101}$ to $R^{116}$ is a group that can be further substituted, the group may be substituted with the substituents described in the above section of the substituent group A, and when the group is substituted with two or more substituents, these substituents may be the same as or different from each other.

The substituent represented by $R^{101}$ to $R^{116}$ is preferably a hydrogen atom, $SO_2NR^{117}R^{118}$ ($R^{117}$ and $R^{118}$ are a hydrogen atom or a linear or branched alkyl group having 3 to 20 carbon atoms that may have a substituent), or $SR^{119}$ ($R^{119}$ is a linear or branched alkyl group having 3 to 20 carbon atoms that may have a substituent), among the above substituents.

Specific examples of the compound represented by General Formula (F) will be shown below, but the present invention is not limited thereto.

[Chem. 41]

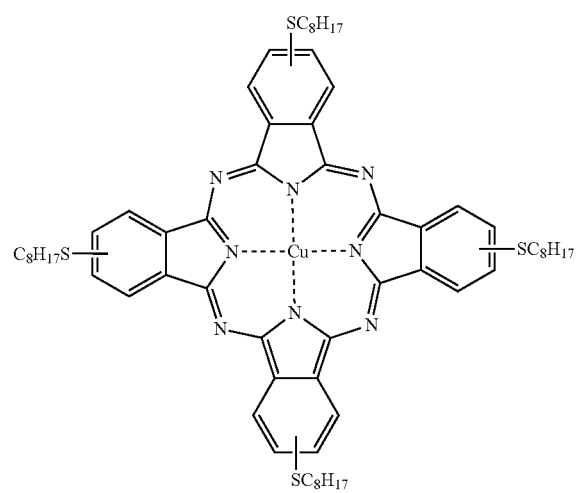

(Ph-1)

(ph-2)

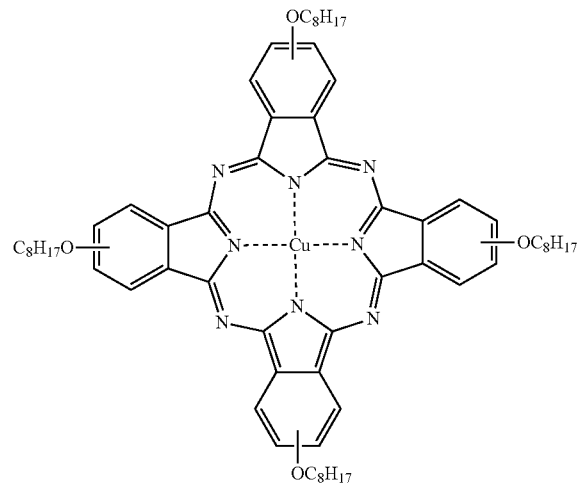

(Ph-3)

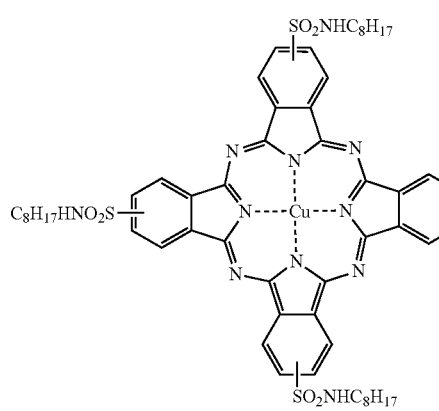

(ph-4)

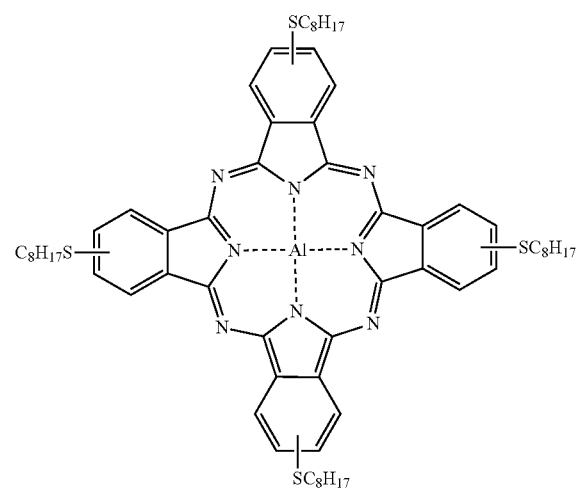

(ph-5)

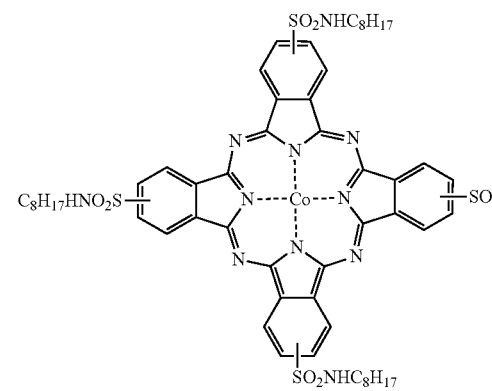

(ph-6)

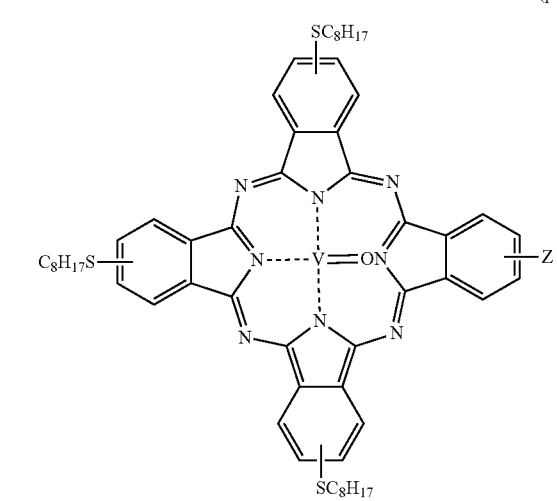

Among the above specific examples, in view of color characteristics and heat resistance, (Ph-1) to (Ph-3) are particularly preferable.

(Subphthalocyanine Dye)

One of the embodiments of the resin having a dye structure according to the present invention is a resin having a partial structure derived from a subphthalocyanine dye (subphthalocyanine compound) The resin (A) having such a dye structure includes a resin having a dye structure that has, as a partial structure of a dye moiety, a partial structure derived from a compound (subphthalocyanine compound) represented by the following General Formula (SP). The subphthalocyanine compounds in the present invention collectively refer to compounds having a dye moiety including a subphthalocyanine skeleton in a molecule.

[Chem. 42]

General Formula (SP)

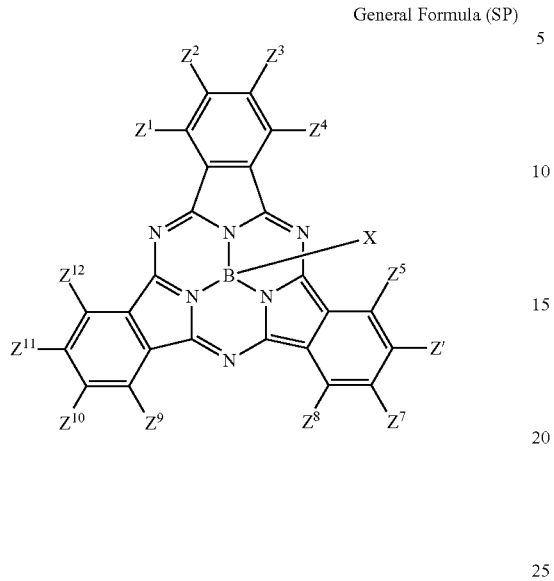

[Chem. 43]

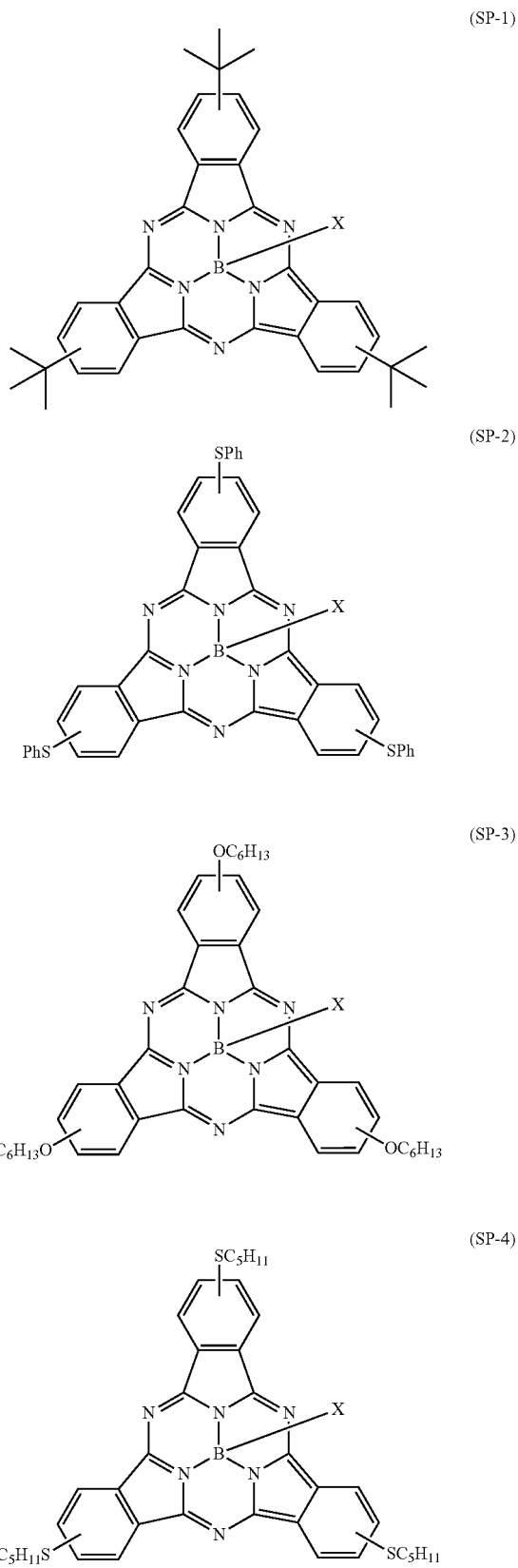

In General Formula (SP), each of $Z^1$ to $Z^{12}$ independently represents a hydrogen atom, an alkyl group, an aryl group, a hydroxy group, a mercapto group, an amino group, an alkoxy group, an aryloxy group, or a thioether group. X represents an anion.

General Formula (SP) will be described in detail.

The alkyl group that $Z^1$ to $Z^{12}$ in General Formula (SP) may have represents a linear or branched substituted or unsubstituted alkyl group. Particularly, $Z^1$ to $Z^{12}$ preferably have 1 to 20 carbon atoms, and more preferably have 1 to 10 carbon atoms. Examples of the substituent that $Z^1$ to $Z^{12}$ may have include the substituents exemplified in the above section of the substituent group A, and among the substituents, a fluorine atom, a hydroxy group, and a mercapto group are particularly preferable.

X in General Formula (SP) represents an anion. Specific examples of X include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sultanate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. X may preferably be linked to a dye skeleton, or may be linked to a portion (polymer chain or the like) of the resin having a dye structure.

X is preferably a fluorine anion, a chlorine anion, a bromine anion, an iodine anion, a perchlorate anion, a carboxylic acid anion, or a perchlorate anion, and most preferably a perchlorate anion or a carboxylic acid anion.

Specific examples of the subphthalocyanine will be shown below, but the present invention is not limited thereto.

-continued (SP-5)
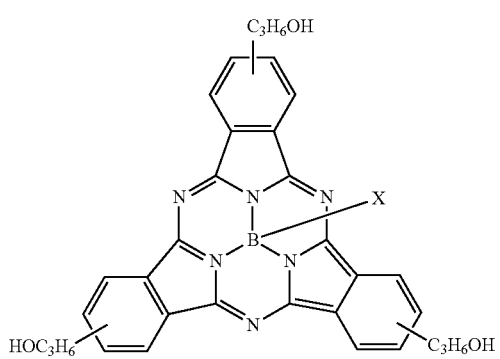

(SP-6)
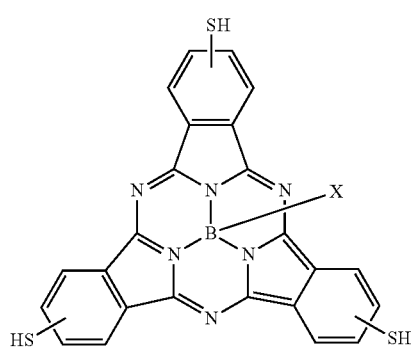

(SP-7)
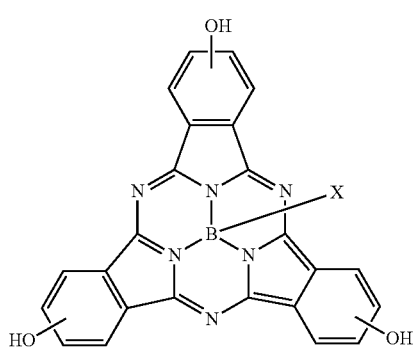

(SP-8)
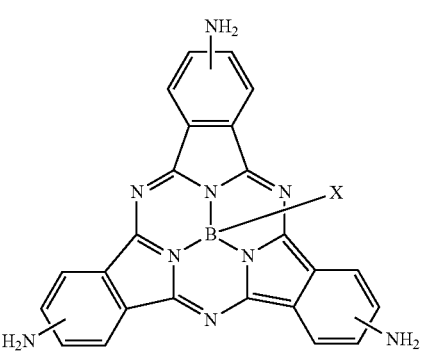

-continued (SP-9)
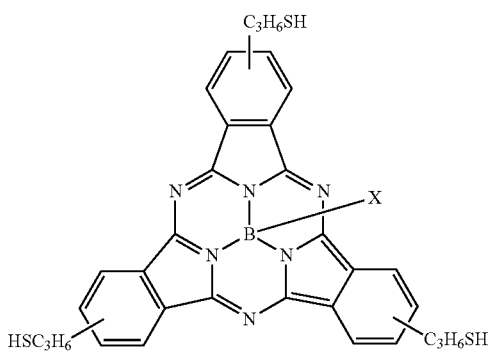

(SP-10)
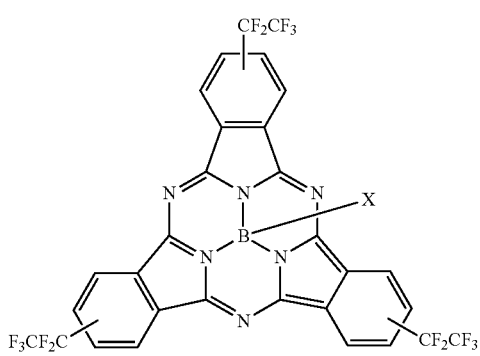

Among the above specific examples, in view of color characteristics and heat resistance, (SP-2), (SP-3), (SP-4), (SP-5), (SP-6), and (SP-7) are particularly preferable.

(Structure of Resin Having Dye Structure Using Coloring Composition of the Present Invention)

The resin (A) having a dye structure using the coloring composition of the present invention is preferably a resin having a dye structure that includes at least one of the constitutional units represented by the following General Formulae (A), (B), and (C). The General Formulae will be described in order.

<Constitutional Unit Represented by General Formula (A)>

[Chem. 44]

General Formula (A)

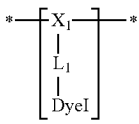

In General Formula (A), $X_1$ represents a linking group formed by polymerization, and $L_1$ represents a single bond or a divalent linking group. DyeI represents a dye structure.

Hereinafter, General Formula (A) will be described in detail.

in General Formula (A), $X_1$ represents a linking group formed by polymerization. That is, $X_1$ represents a portion that forms a repeating unit corresponding to a main chain formed by a polymerization reaction. In addition, the moiety represented by two *s is a repeating unit. $X_1$ is not particularly limited as long as it is a linking group formed of a known polymerizable monomer. Particularly, $X_1$ is preferably linking chains represented by the following (XX-1) to (XX-24), and most preferably (meth)acrylic linking chains represented by (XX-1) and (XX-2), styrene-based linking chains represented by (XX-10) to (XX-17), and a vinyl-based linking chain represented by (XX-24). In (XX-1) to (XX-24), * represents a moiety linked to $L_1$. Me represents a methyl group. R in (XX-18) and (XX-19) represents a hydrogen atom, an alkyl group having 1 to 5 carbon atoms, or a phenyl group.

[Chem. 45]

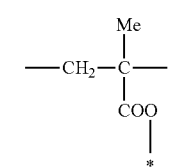
(XX-1)

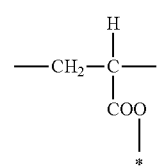
(XX-2)

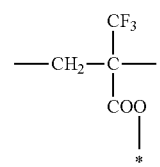
(XX-3)

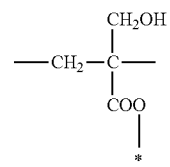
(XX-4)

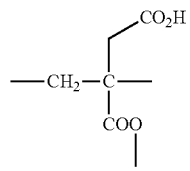
(XX-5)

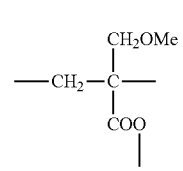
(XX-6)

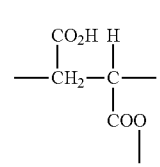
(XX-7)

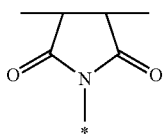
(XX-8)

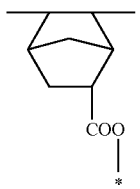
(XX-9)

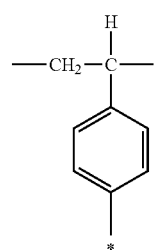
(XX-10)

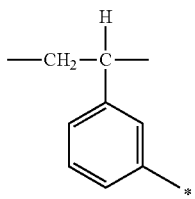
(XX-11)

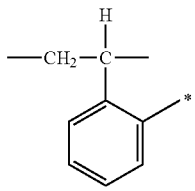
(XX-12)

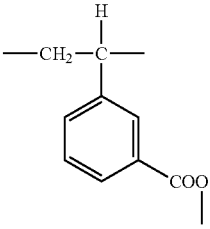
(XX-13)

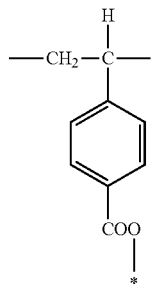
(XX-14)

(XX-15) 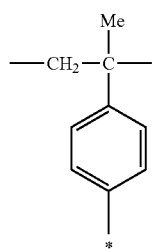

(XX-16) 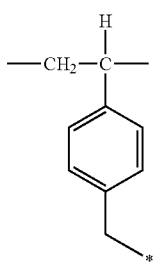

(XX-17) 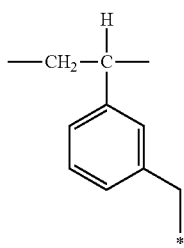

(XX-18) 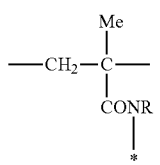

(XX-19) 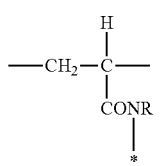

(XX-20) 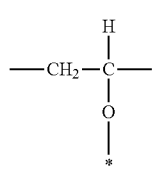

(XX-21) 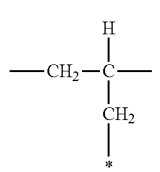

(XX-22) 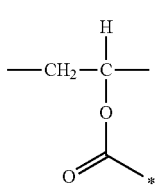

(XX-23) 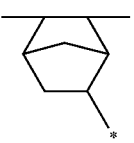

(XX-24) 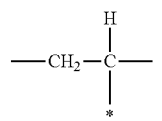

In General Formula (A), $L_1$ represents a single bond or a divalent linking group. When $L_1$ represents a divalent linking group, the divalent linking group represents a substituted or unsubstituted alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthalene group), a substituted or unsubstituted heterocyclic linking group, —CH=CH—, —O—, —C(=O)—, —NR—, —CONR—, —O₂C—, —SO—, —SO₂—, and a linking group formed of two or more of these linked to each other. Herein, each R independently represents a hydrogen atom, an alkyl group, an aryl group, or a heterocyclic group.

In General Formula (A), DyeI represents a dye structure derived from the dye compound described above.

The resin having a dye structure that has the constitutional unit represented by General Formula (A) can be synthesized by (1) a method of synthesizing the resin by addition polymerization using a monomer having a dye structure, or (2) a method of synthesizing the resin by causing a reaction between a polymer having a highly reactive functional group such as an isocyanate group, an acid anhydride group, or an epoxy group and a dye having a functional group (a hydroxyl group, a primary or secondary amino group, a carboxyl group, or the like) that can react with the highly reactive group.

At the time of the addition polymerization of the method (1), by applying the above-described (i) method of producing the resin by a polymerization reaction performed in the presence of a polymerization inhibitor, a proportion of a peak area of the component having a molecular weight of 20,000 or more can be suitably set to 10% or less with respect to a peak area of the total molecular weight distribution of the resin (A). In addition, after the addition reaction, the above-described (ii) method of producing the resin by a step of adding a poor solvent (water or the like) of the high-molecular weight component having a molecular weight of 20,000 or more to the obtained polymerized solution, and removing the precipitated high-molecular weight component having a molecular weight of 20,000 or more by filtration may be applied.

Likewise, the polymer having a highly reactive functional group provided to the reaction of the method (2) may be the resin synthesized by the above-described (i) method of producing the resin by a polymerization reaction performed in the presence of a polymerization inhibitor. In addition, for the above-described polymer and a polymer having undergone the reaction with the dye described above, the above-described (ii) method of producing the resin by a step of adding a poor solvent of the precipitated high-molecular weight component having a molecular weight of 20,000 or more to the polymerized solution, and removing the precipitated high-molecular weight component having a molecular weight of 20,000 or more by filtration may be applied.

For the addition polymerization, known addition polymerization (radical polymerization, anionic polymerization, or cationic polymerization) is applicable. Among these, it is particularly preferable that the resin be synthesized by radical polymerization, since the reaction condition can be set to be mild conditions, and the dye structure is not decomposed by radical polymerization. For the radical polymerization, known reaction conditions can be applied.

Among these, the resin having a dye structure that has the constitutional unit represented by General Formula (A) in the present invention is preferably a radical polymer that is obtained by radical polymerization using a dye monomer (monomer having a dye structure) having an ethylenically unsaturated bond, in view of inhibiting residues from being generated on a pattern of other colors and inhibiting coating defects.

Specific examples of the constitutional unit represented by General Formula (A) will be shown below, but the present invention is not limited thereto.

[Chem. 46]

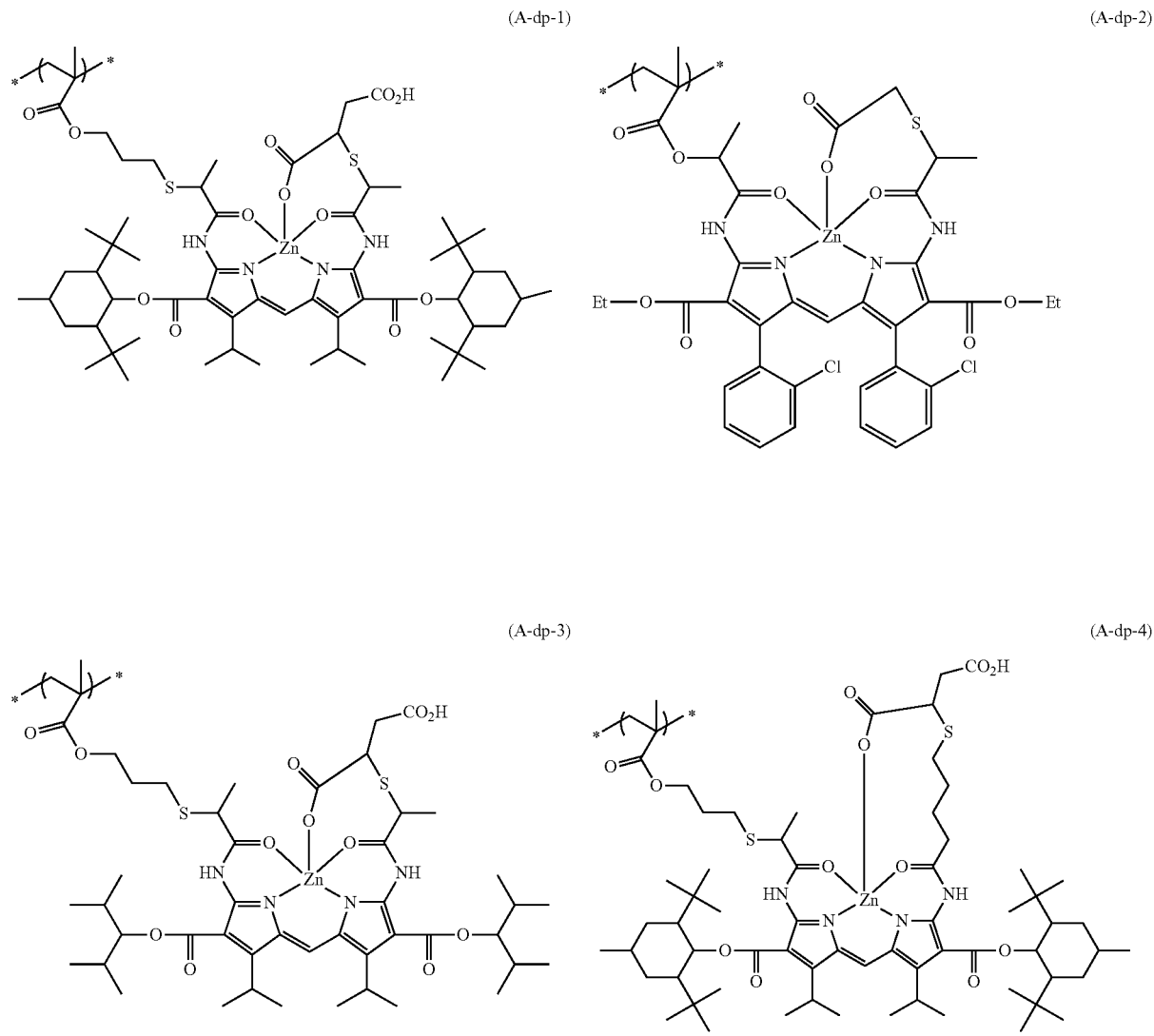

-continued
[Chem. 47]
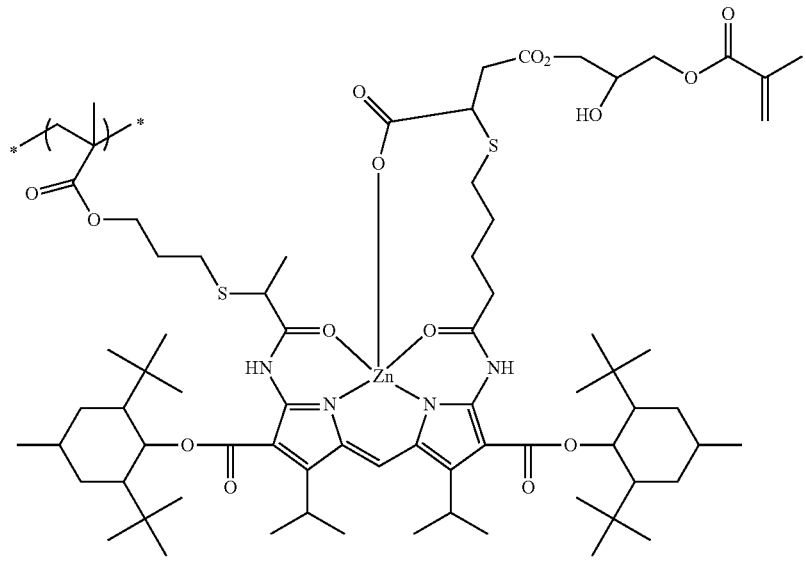
(A-dp-5)
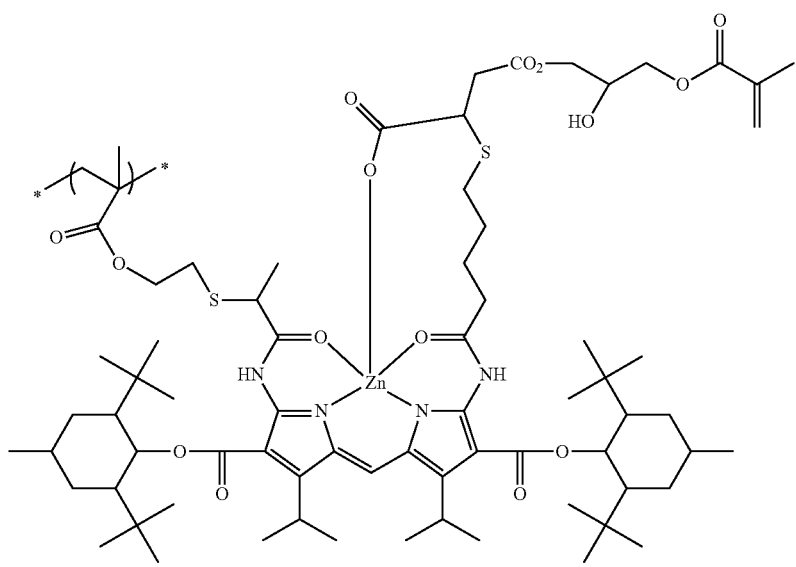
(A-dp-6)

-continued
(A-dp-7)
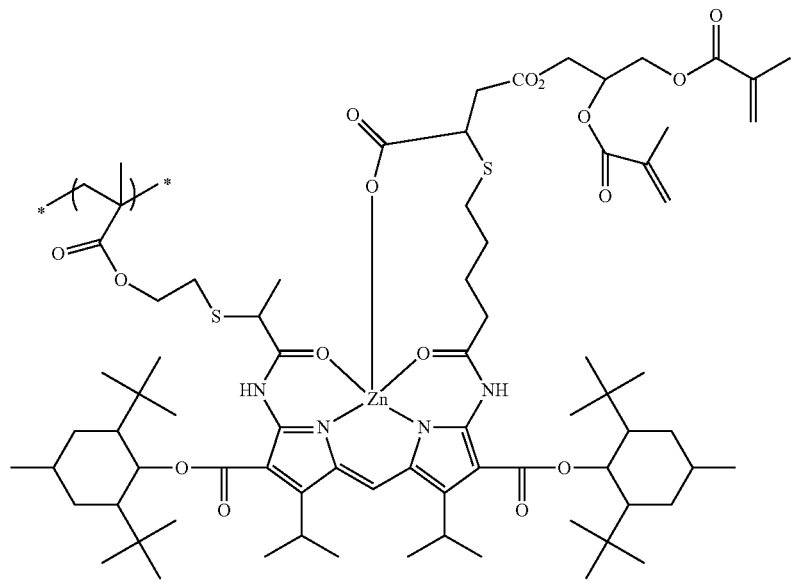
(A-dp-8)
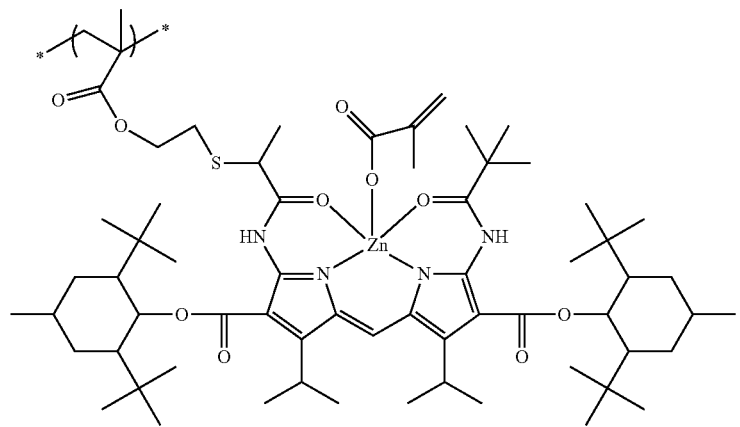
[Chem. 48]
(A-dp-9)
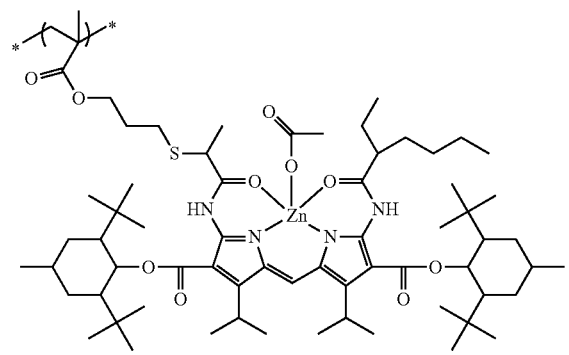
(A-dp-10)
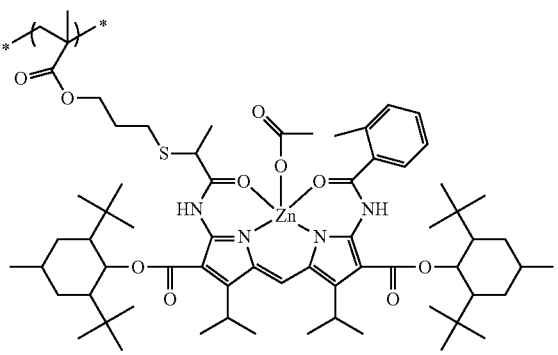

-continued
(A-dp-11)
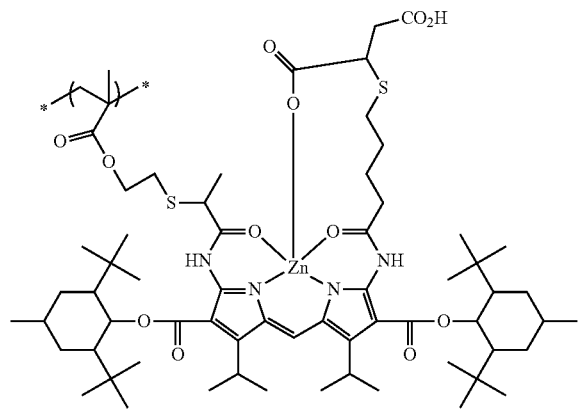
(A-dp-12)
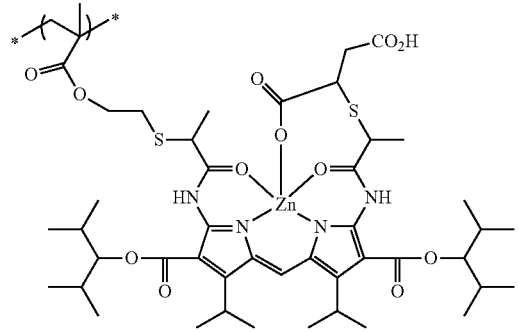
(A-dp-13)
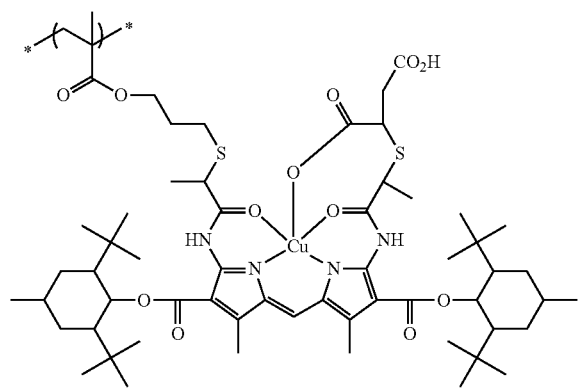
(A-dp-14)
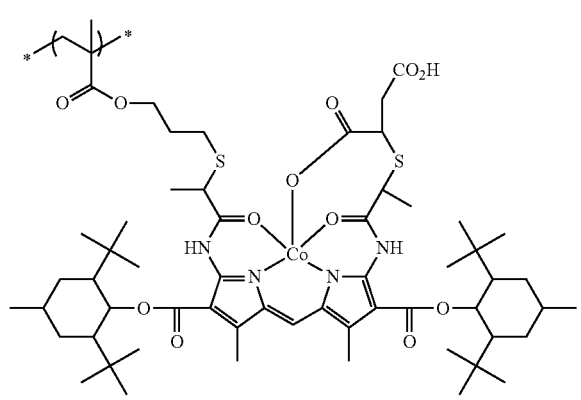
[Chem. 49]
(A-dp-15)
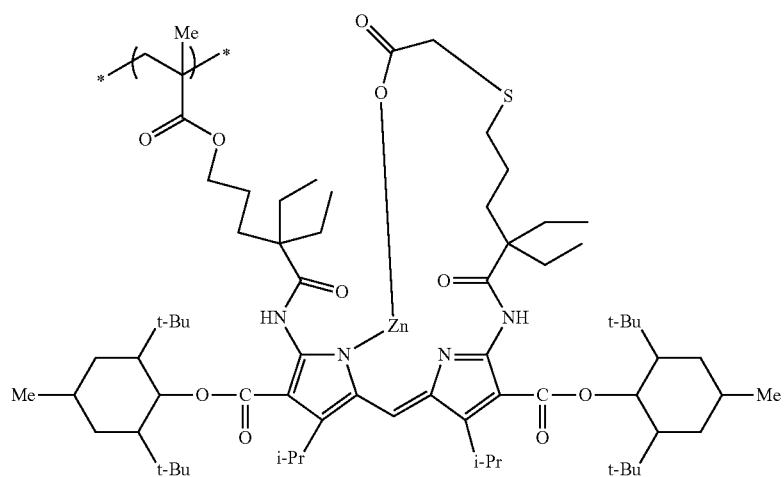

(A-dp-16)
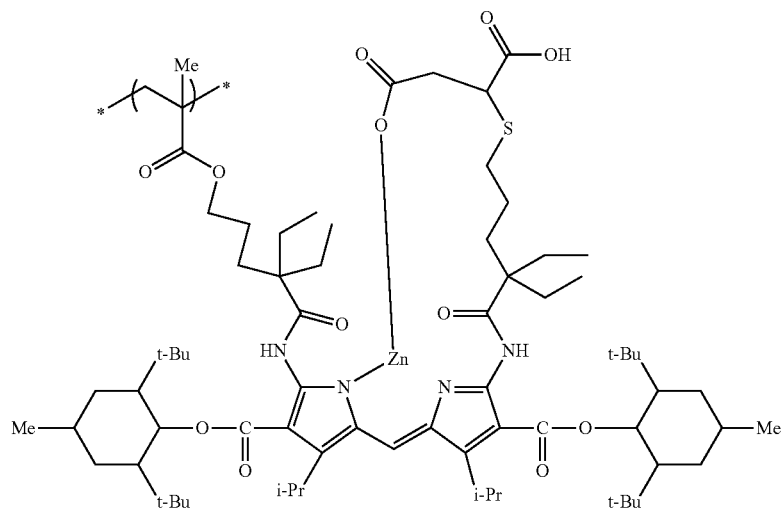
(A-dp-17)
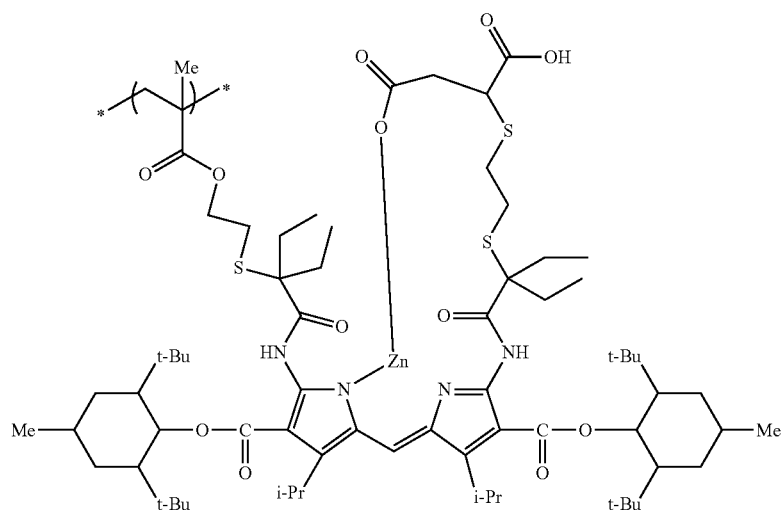
(A-dp-18)
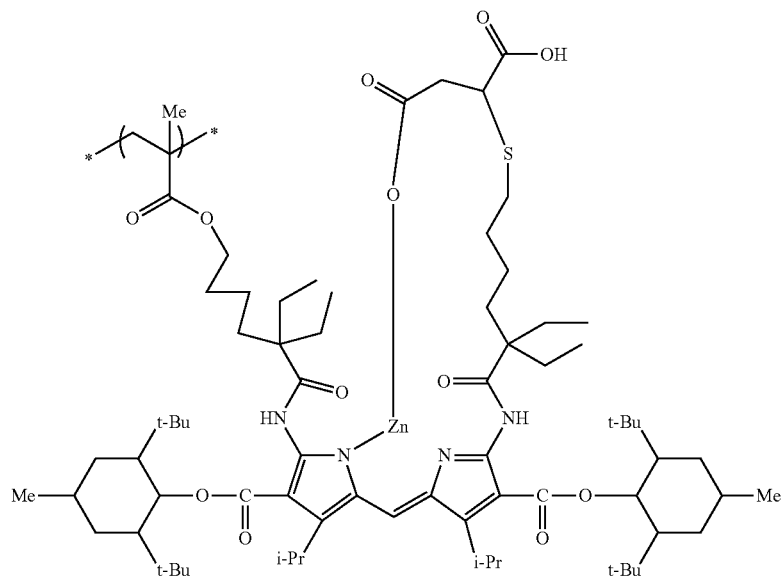

(A-dp-19)
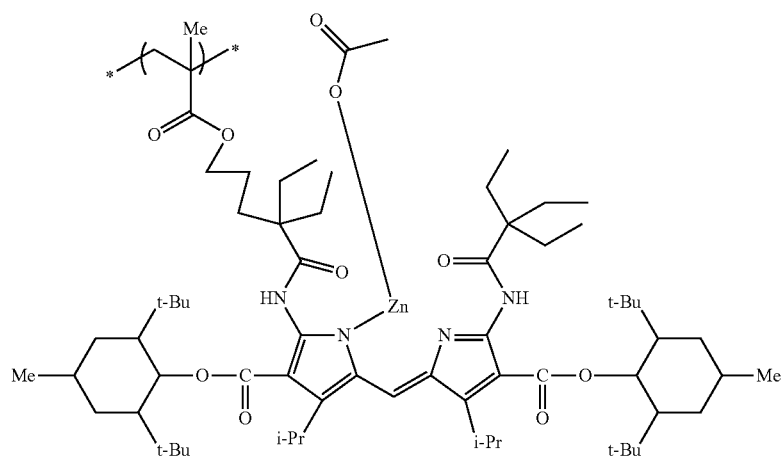
(A-dp-20)
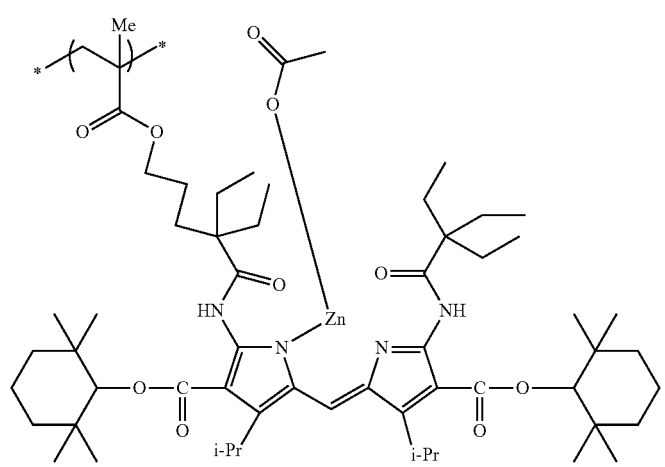
[Chem. 50]
(A-dp-21)
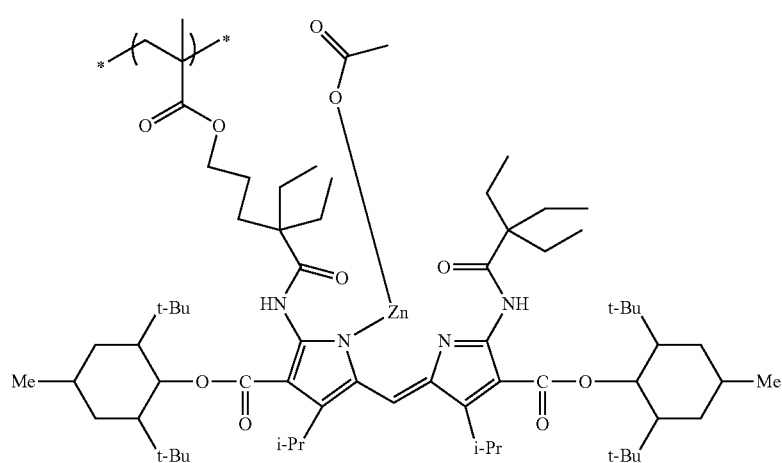

(A-dp-22)
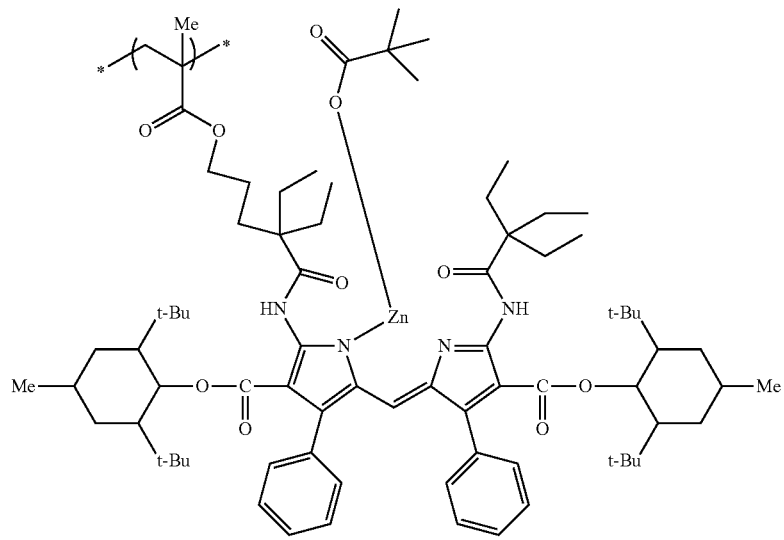
(A-dp-23)
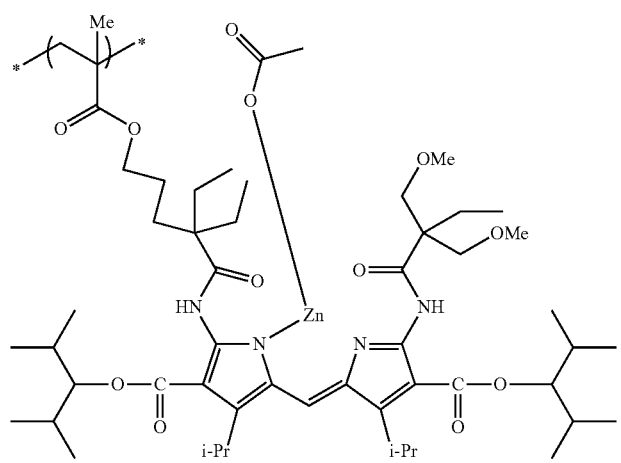
(A-dp-24)
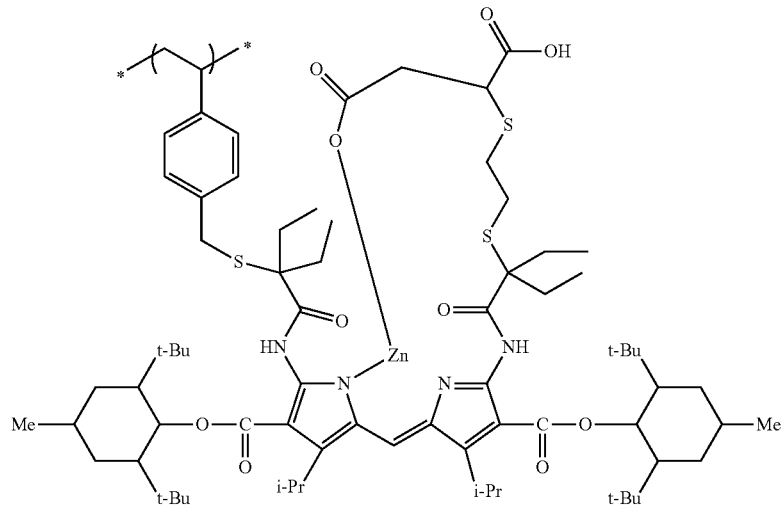

(A-dp-25)
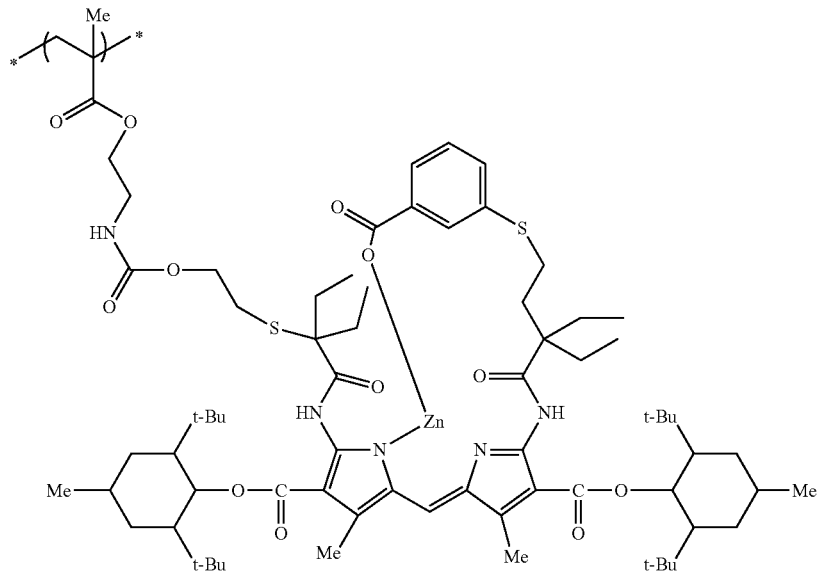
(A-dp-26)
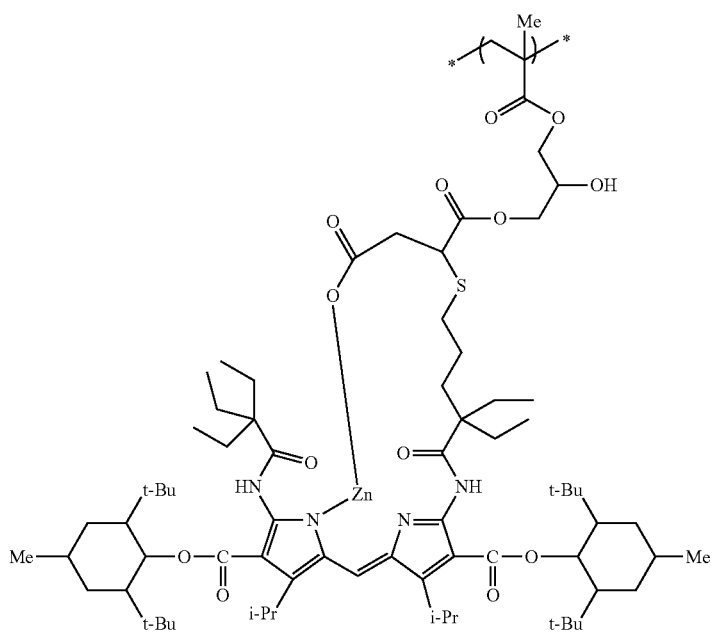
[Chem. 51]
(A-az-1)
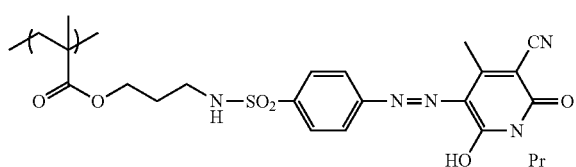
(A-az-2)
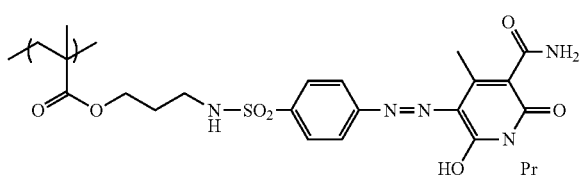
(A-az-3)
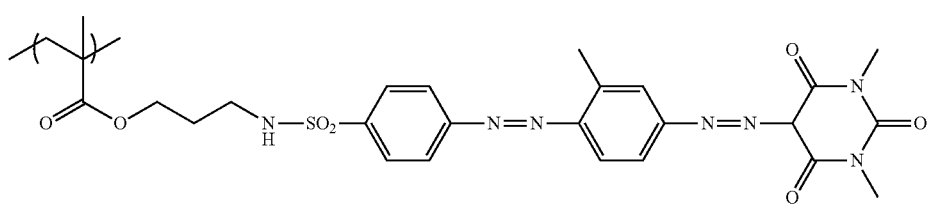

-continued
(A-az-4)
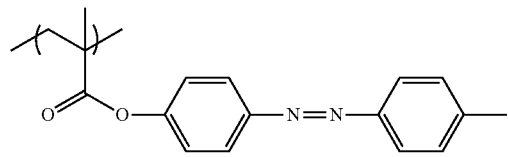
(A-az-5)
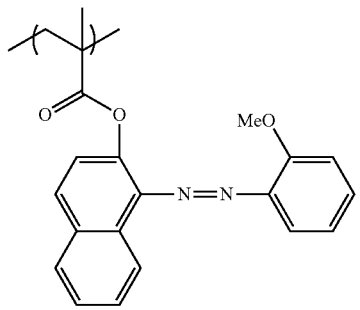
(A-az-6)
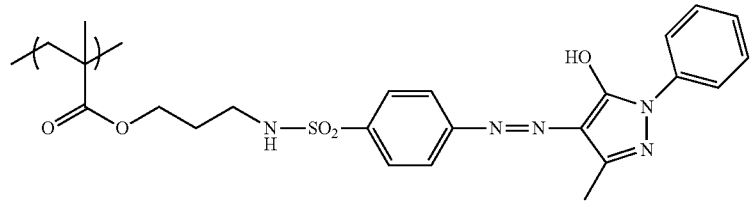
[Chem. 52]
(A-az-7)
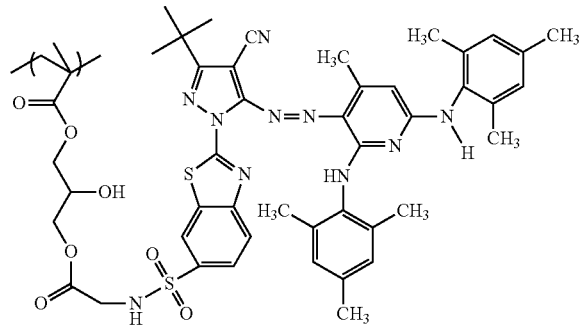
(A-az-8)
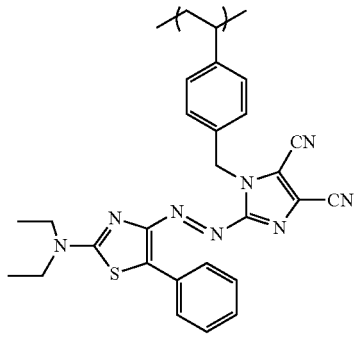
(A-az-9)
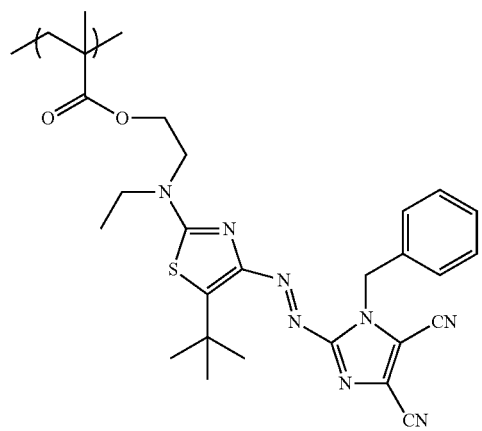
(A-az-10)
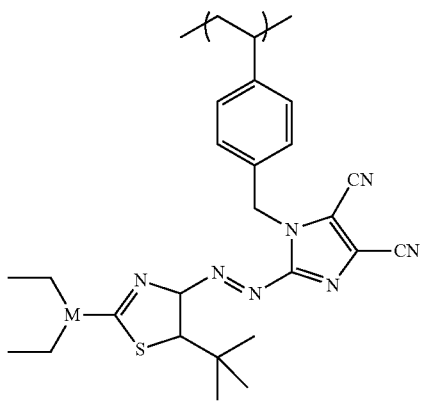
(A-az-11)
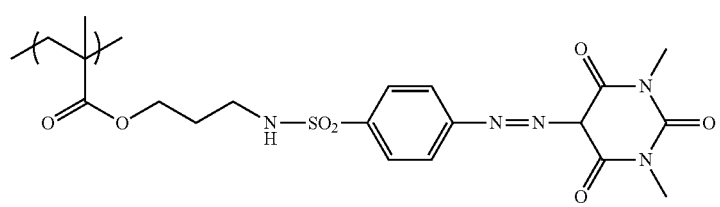

[Chem. 53]
(A-aq-1)
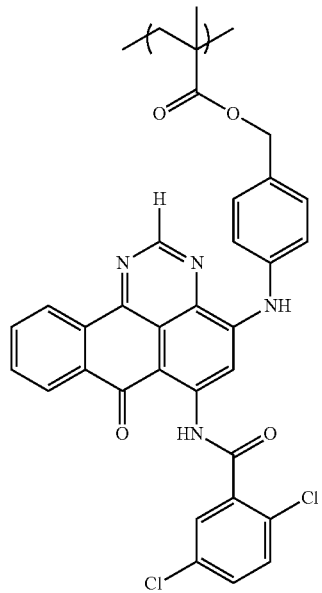
(A-aq-2)
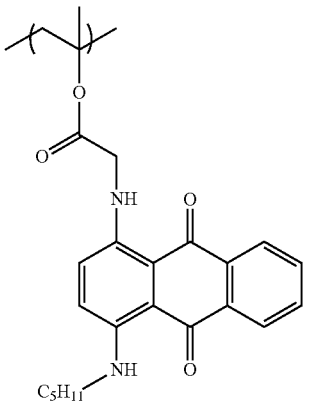
(A-aq-3)
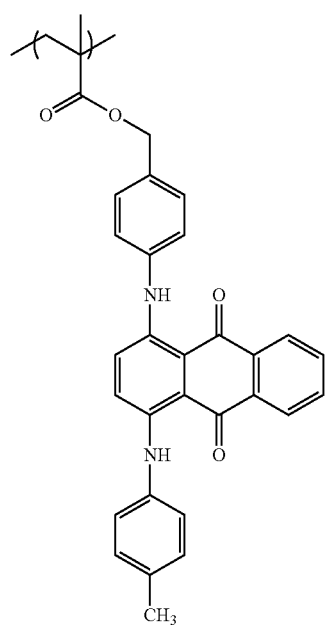
(A-aq-4)
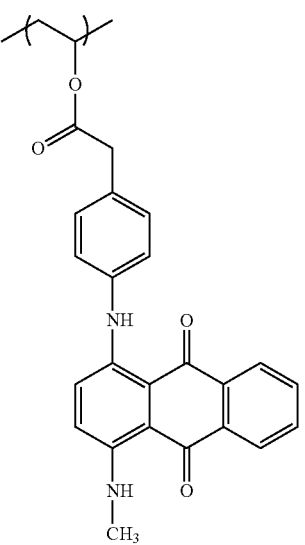

-continued
(A-aq-5)
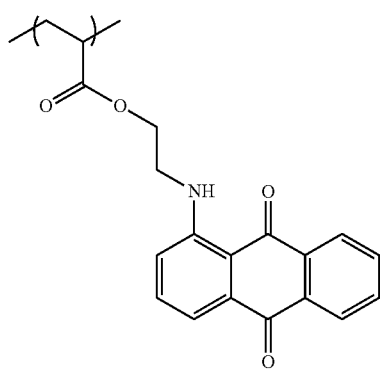
(A-aq-6)
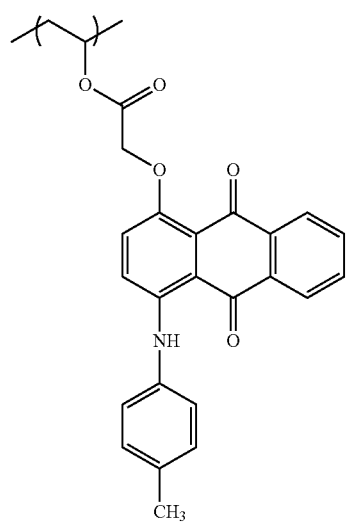
(A-aq-7)
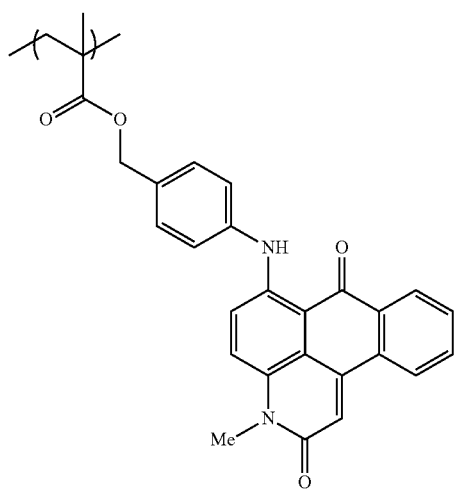
(A-aq-8)
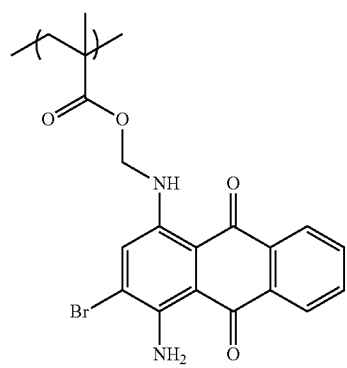
(A-aq-9)
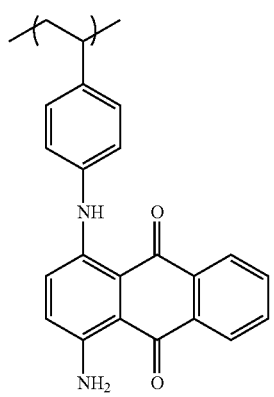
(A-aq-10)
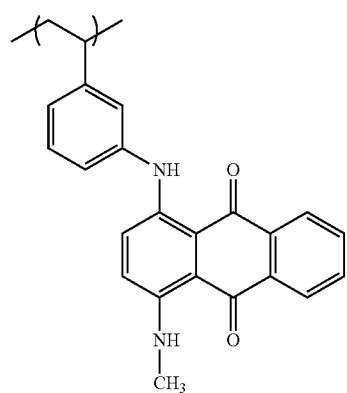

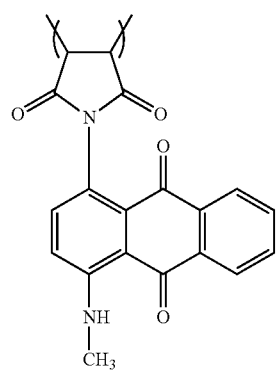
(A-aq-11)
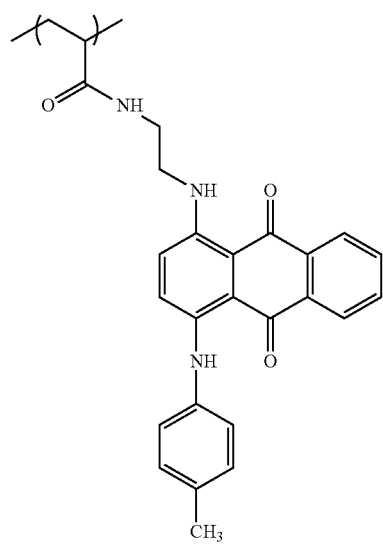
(A-aq-12)
[Chem. 54]
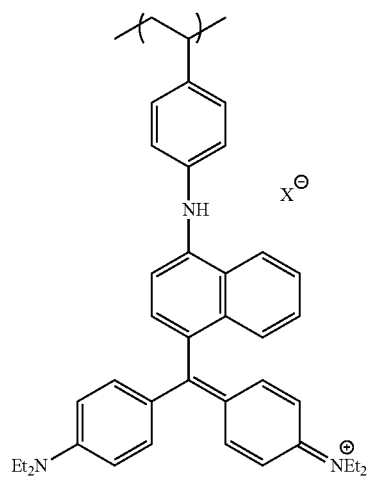
(A-tp-1)
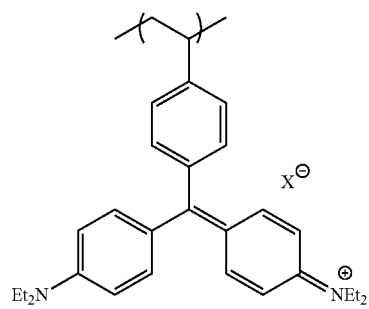
(A-tp-2)
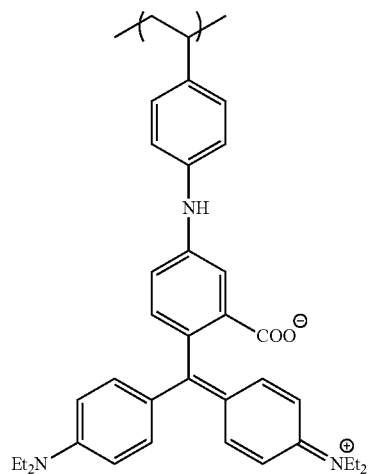
(A-tp-3)

[Chem. 55]
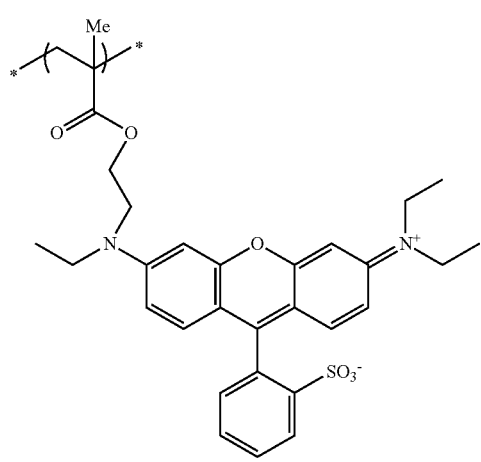
(A-xt-1)
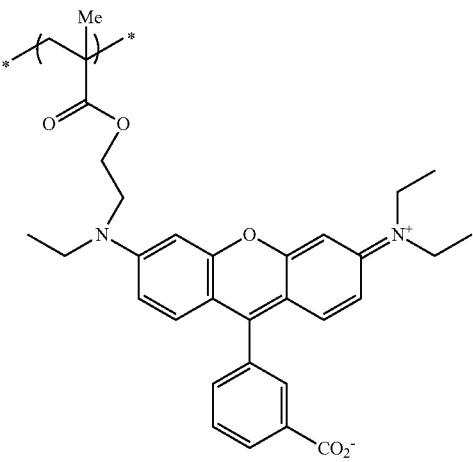
(A-xt-2)
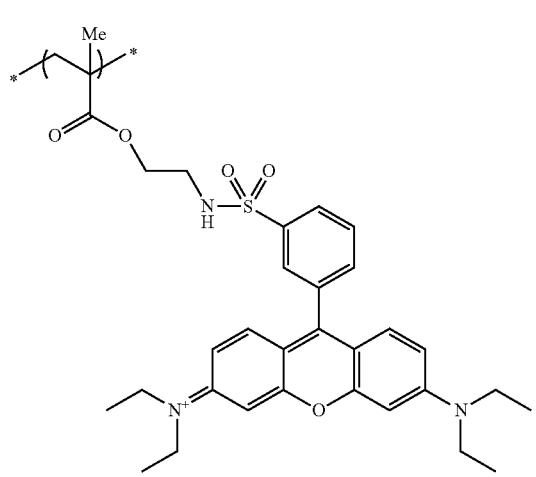
(A-xt-3)
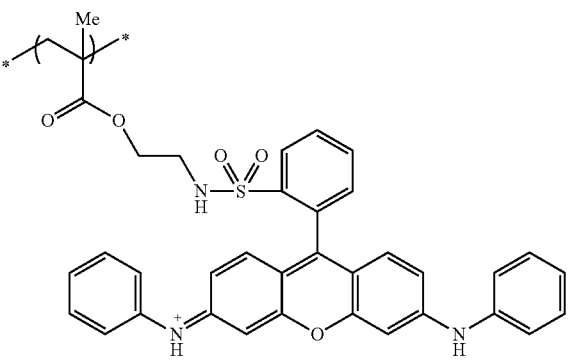
(A-xt-4)
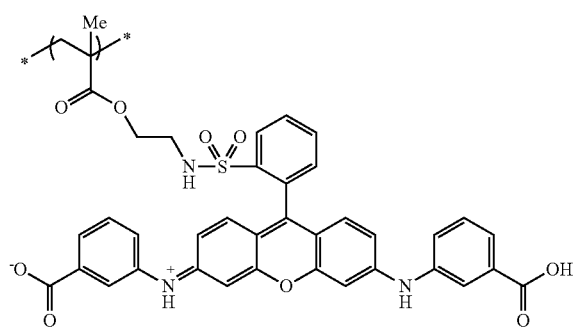
(A-xt-5)
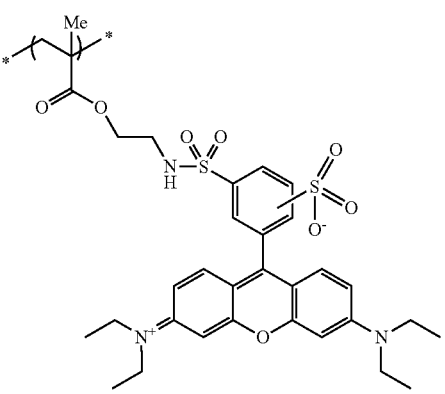
(A-xt-6)

-continued
[Chem. 56]
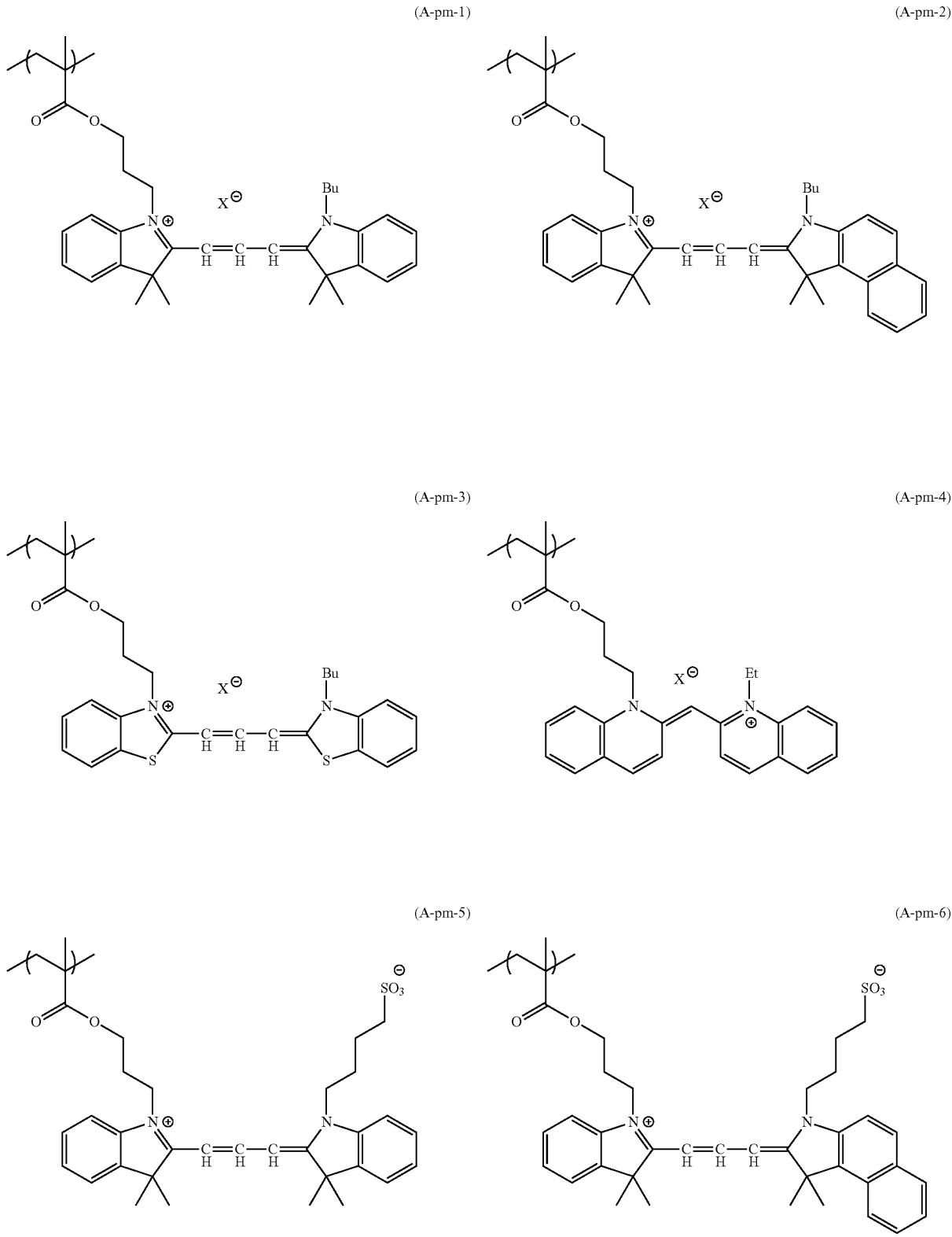

[Chem. 57]
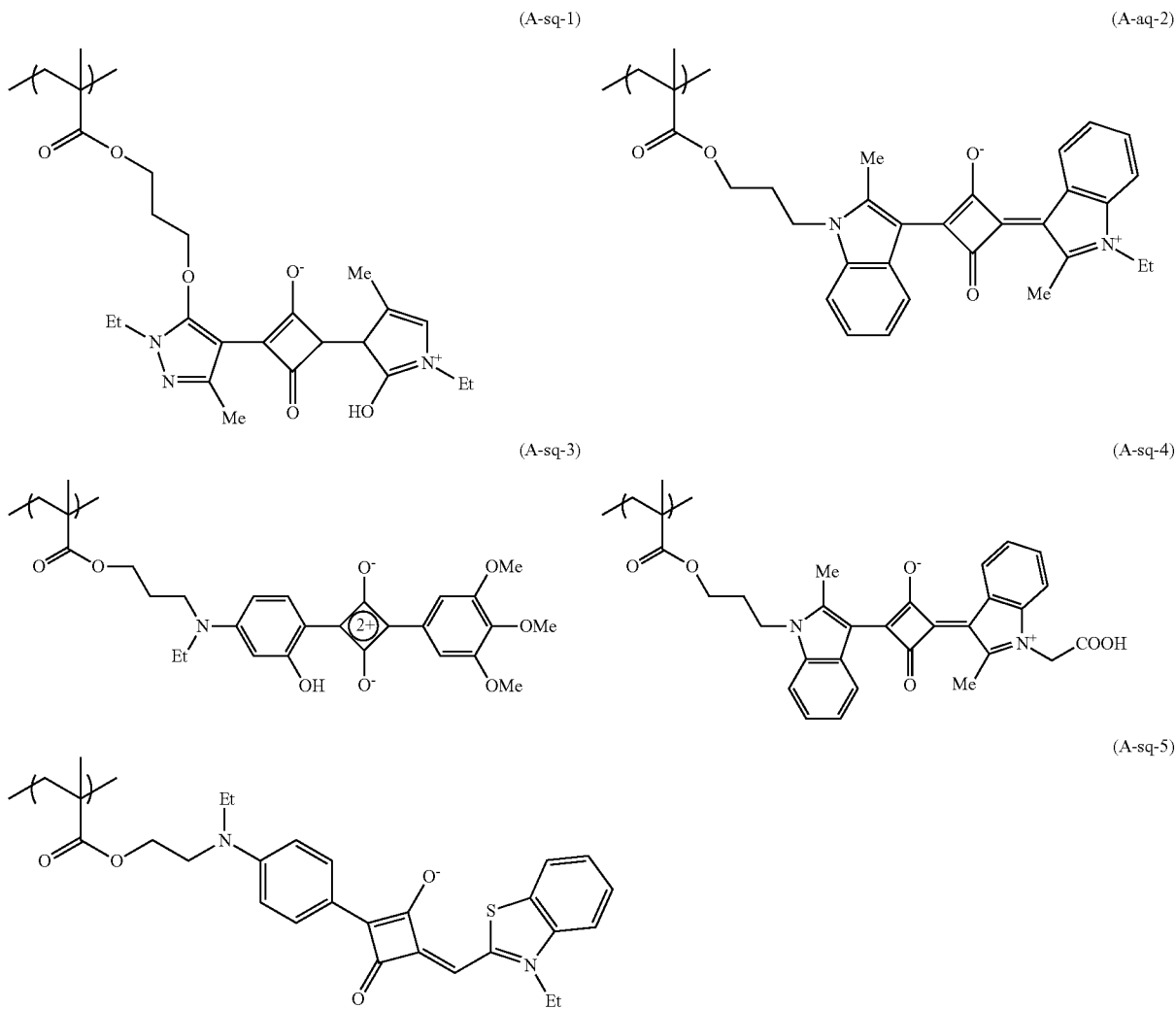
[Chem. 58]
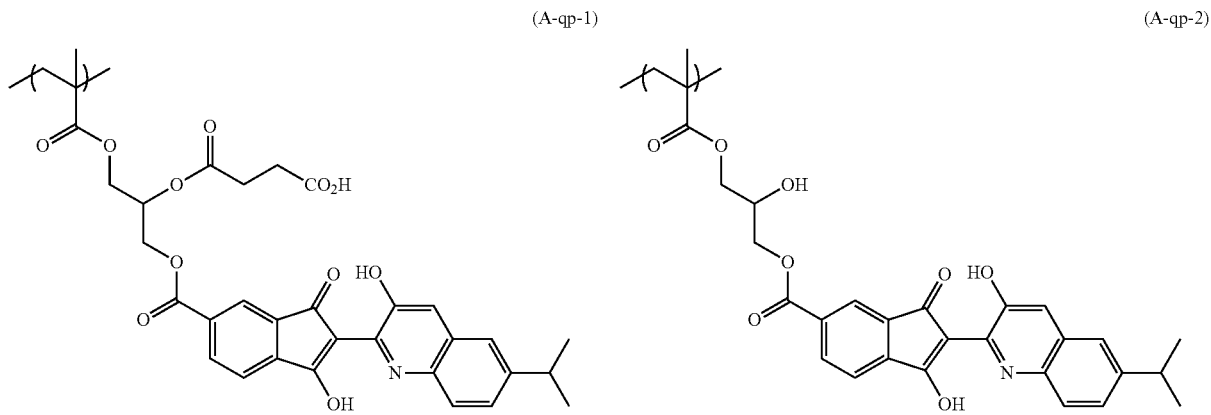

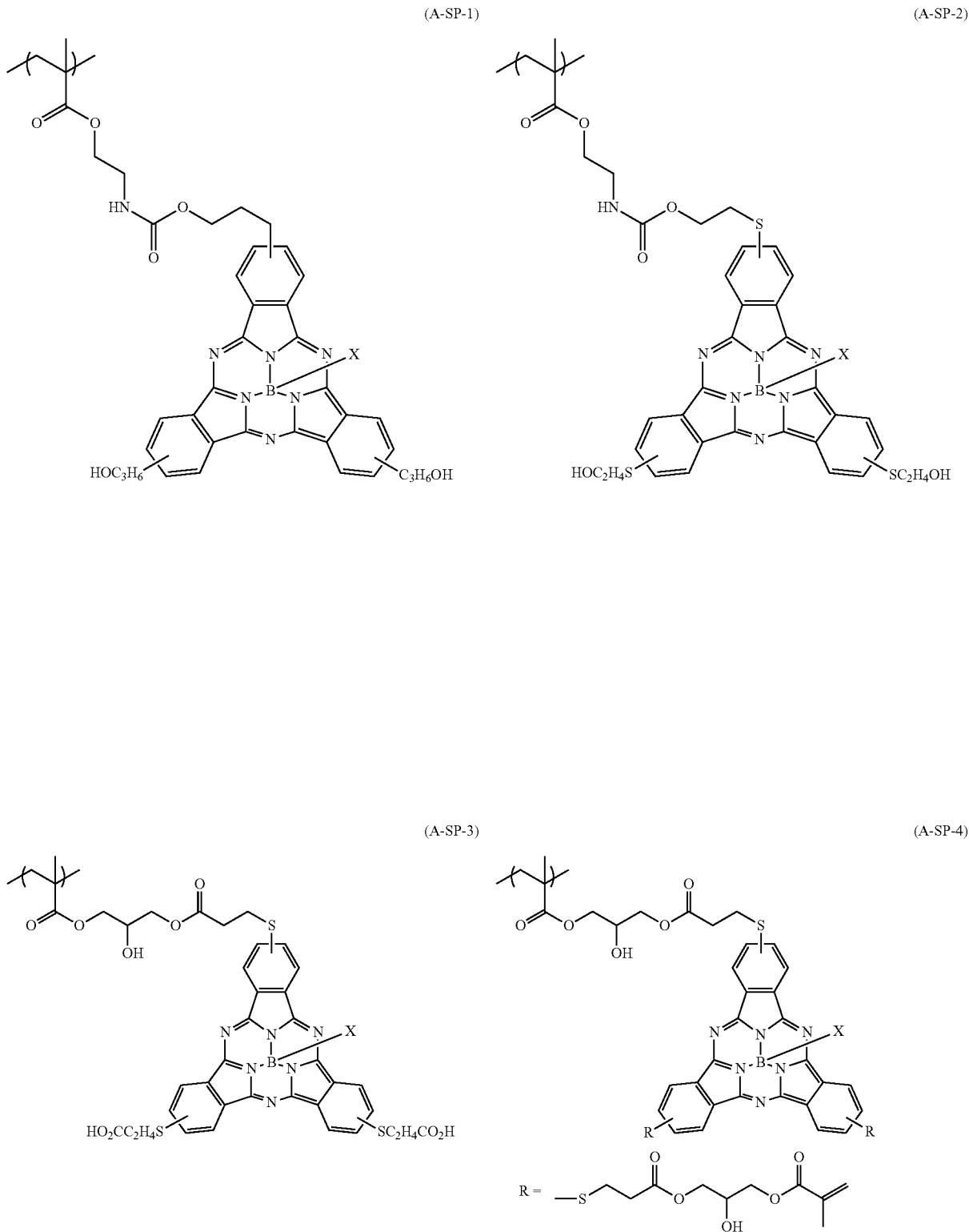

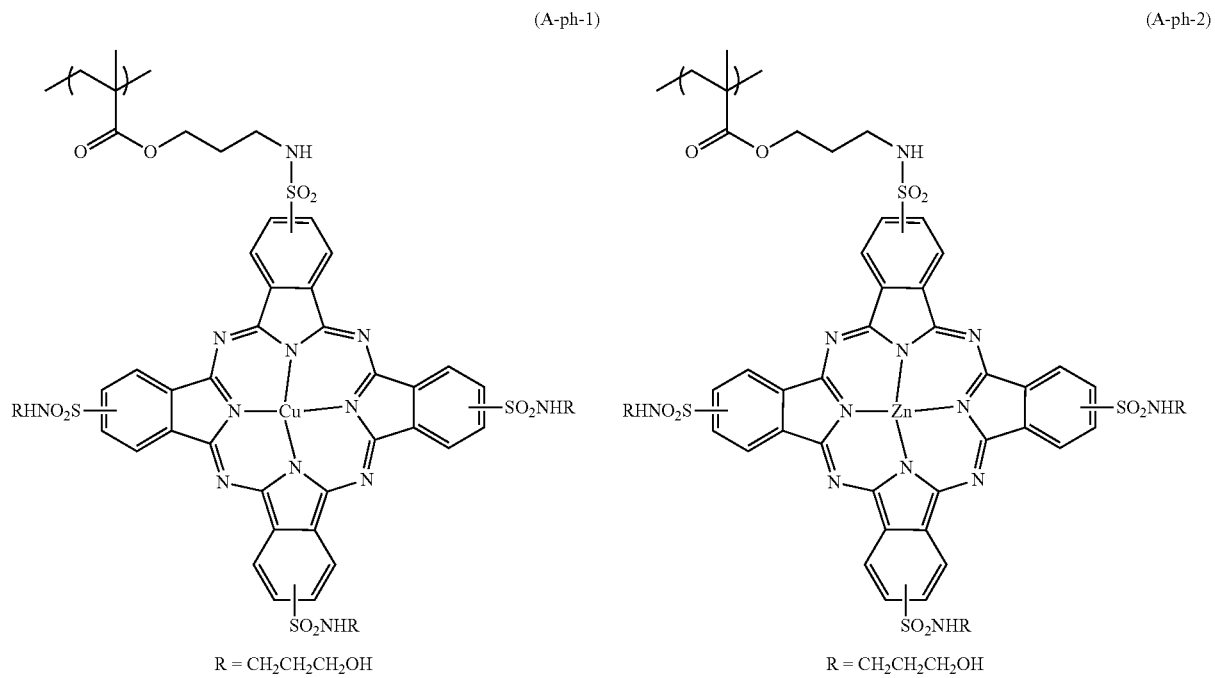
(A-ph-1) (A-ph-2)
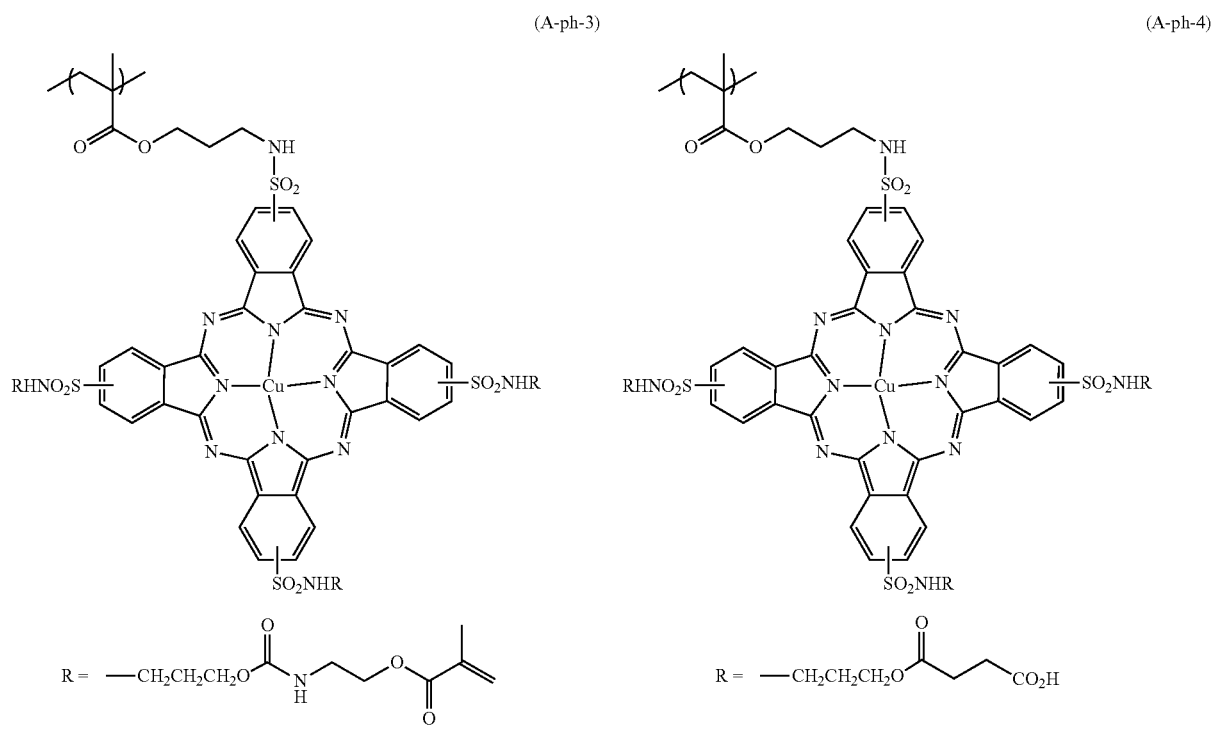
(A-ph-3) (A-ph-4)

-continued (A-st-1)

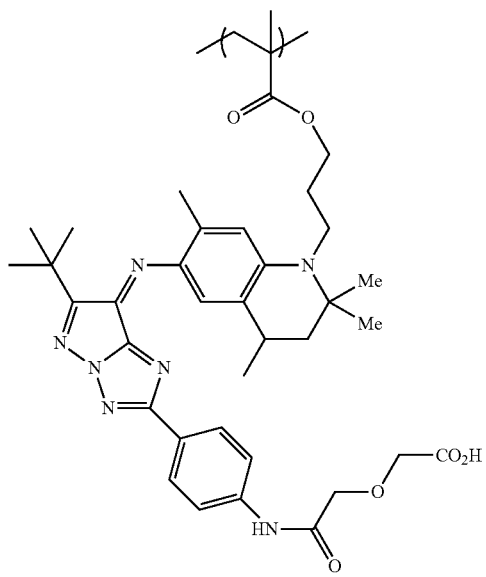

(A-st-2)

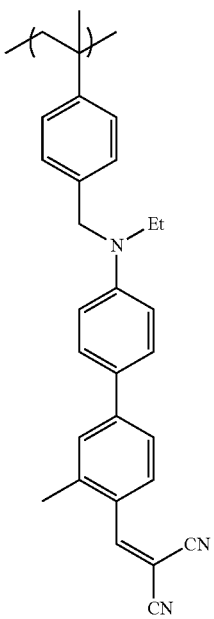

(A-st-3)

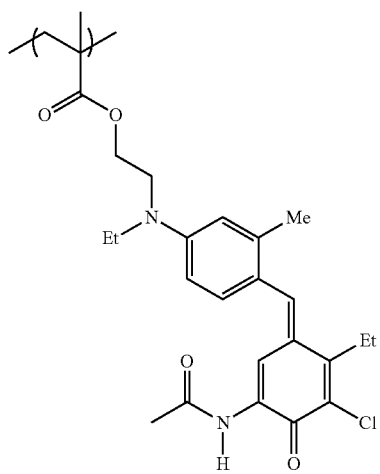

(A-st-4)

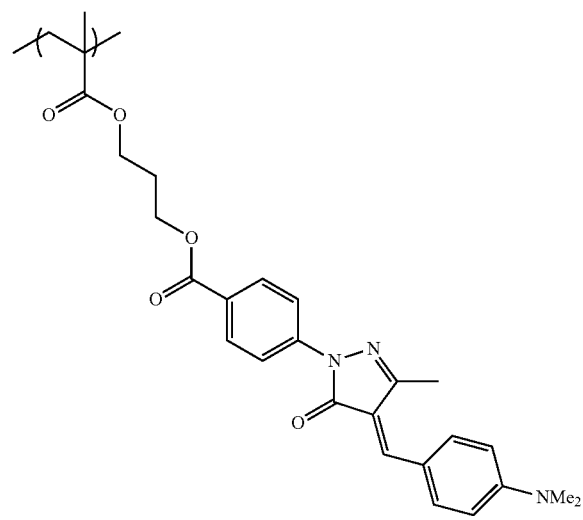

<Constitutional Unit Represented by General Formula (B)>

Next, a constitutional unit represented by General Formula (B) will be described in detail.

[Chem. 62]

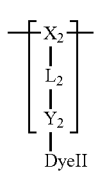

General Formula (B)

In General Formula (B), $X_2$ has the same definition as that of $X_1$ in the General Formula (A). $L_2$ has the same definition as that of $L_1$ in the General Formula (A). $Y_2$ represents a group that can form an ionic bond or a coordinate bond with DyeII. DyeII represents a dye structure. Hereinafter, the General Formula (B) will be described in detail.

In General Formula (B), $X_2$ has the same definition as that of $X_1$ in the General Formula (A), and the preferable range thereof is also the same. $L_2$ has the same definition as that of $L_1$ in the General Formula (A), and the preferable range thereof is also the same. $Y_2$ is preferably a group that can form an ionic bond or a coordinate bond with DyeII, and may be either an anionic group or a cationic bond. Examples of the anionic group include $COO^-$, $PO_3H^-$, $SO_3^-$, —$SO_3NH^-$, —$SO_2N^-CO$—, and the like, and among these, $COO^-$, $PO_3H^-$, and $SO_3^-$ are preferable.

Examples of the cationic group include substituted or unsubstituted onium cations (for example, ammonium, pyridinium, imidazolium, phosphonium, and the like), and among these, an ammonium cation is particularly preferable.

$Y_2$ can be bonded to an anion portion (COO$^-$, SO$_3^-$, O$^-$, or the like) or a cation portion (the onium cation described above, a metal cation, or the like) that DyeII has.

The resin having a dye structure that has the constitutional unit represented by General Formula (B) in the present invention can be synthesized in the same manner as the resin having a dye structure that has the constitutional unit represented by the General Formula (A).

In view of suitably setting a proportion of a peak area of the component having a molecular weight of 20,000 or more to 10% or less with respect to a peak area of the total molecular weight distribution of the resin (A), the above-described (i) method of producing the resin by a polymerization reaction performed in the presence of a polymerization inhibitor, and the (ii) method of producing the resin by a step of adding a poor solvent (water or the like) of the high-molecular weight component having a molecular weight of 20,000 or more to the polymerized solution, and removing the precipitated high-molecular weight component having a molecular weight of 20,000 or more by filtration may be applied in the same manner.

Among these, in view of inhibiting residues from being generated on a pattern of other colors and inhibiting coating defects, the resin having a dye structure that has the constitutional unit represented by General Formula (B) is preferably a radical polymer that is obtained by radical polymerization using a dye monomer (monomer having a dye structure) having an ethylenically unsaturated bond.

Specific examples of the constitutional unit represented by General Formula (B) will be shown below, but the present invention is not limited thereto.

[Chem. 63]

(B-dp-1)

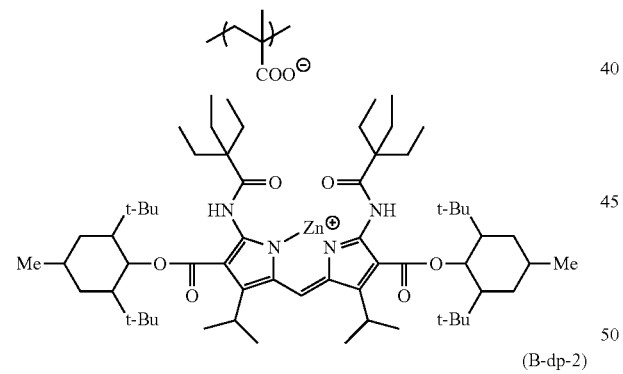

(B-dp-2)

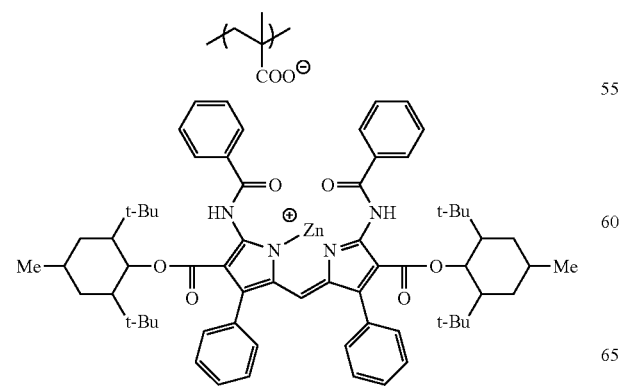

-continued (B-tp-1)

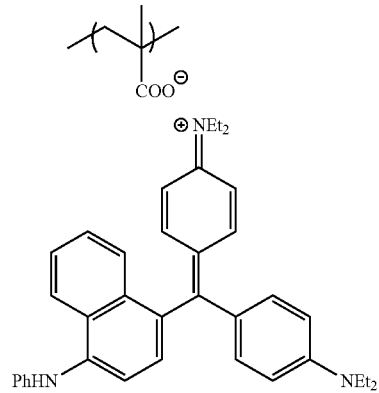

(B-tp-2)

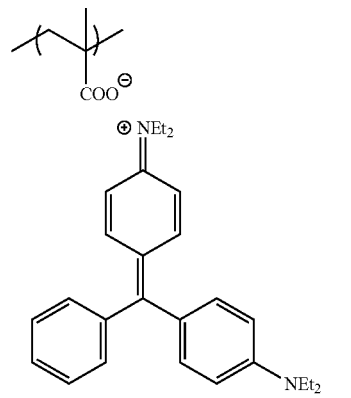

(B-pm-1)

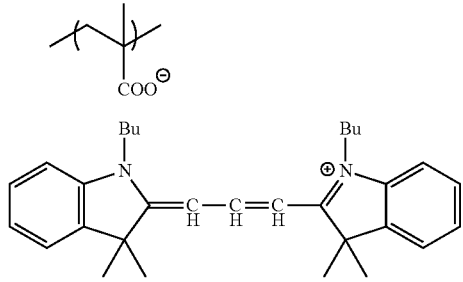

(B-sp-1)

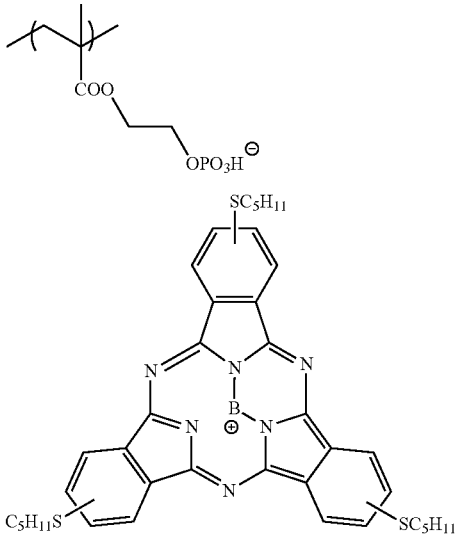

-continued (B-pm-2)

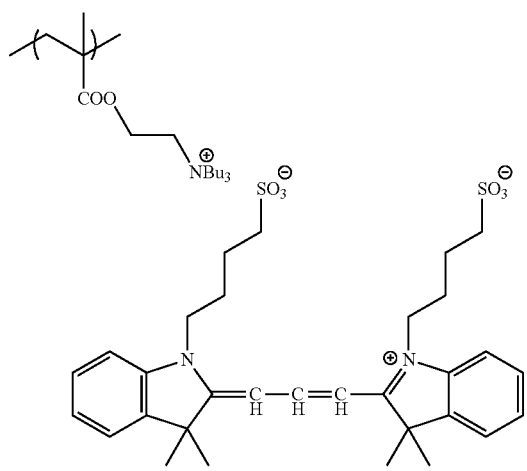

<Constitutional Unit Represented by General Formula (C)>

[Chem. 64]

$$*\!-\!\!\left[\text{DyeIII}\!-\!\left(\text{L}_3\right)_{\!m}\right]\!-\!*$$

General Formula (C)

In General Formula (C), $L_3$ represents a single bond or a divalent linking group. DyeIII represents a partial structure of a dye, and m represents 0 or 1. Hereinafter, the formula will be described in detail.

In General Formula (C), suitable examples of the divalent linking group represented by $L_3$ include a substituted or unsubstituted linear, branched, or cyclic alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthylene group), a substituted or unsubstituted heterocyclic linking group, —CH=CH—, —O—, —S—, —NR— (each R independently represents a hydrogen atom, an alkyl group, an aryl group, or a heterocyclic group), —C(=O)—, —SO—, —SO$_2$—, and a linking group that is formed of two or more of these linked to each other. m represents 0 or 1, and is preferably 1.

Specific examples that are suitably used as the divalent linking group represented by $L_3$ in General Formula (C) will be described below, but $L_3$ of the present invention is not limited thereto.

[Chem. 65]

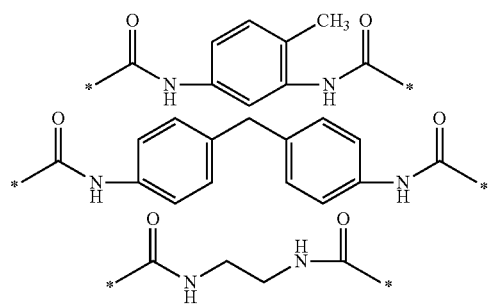

-continued

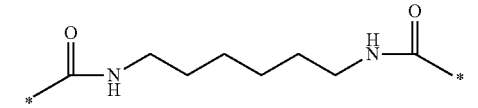

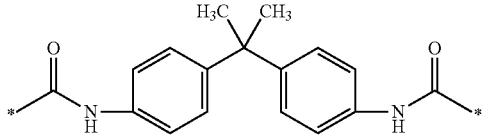

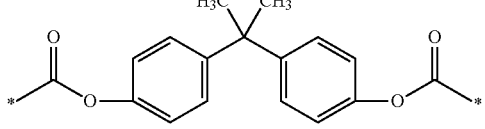

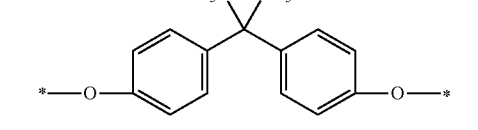

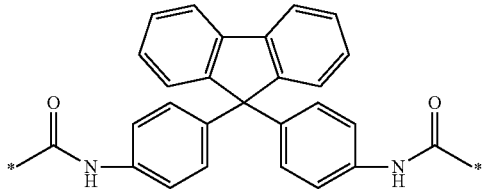

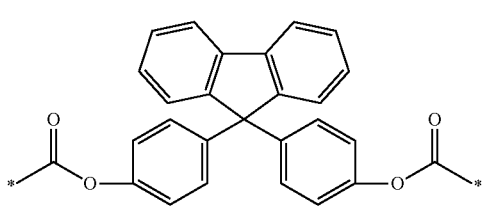

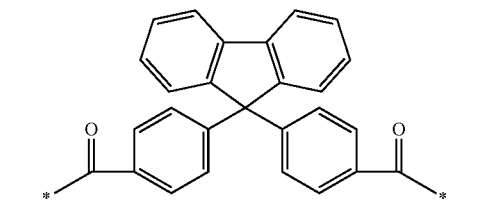

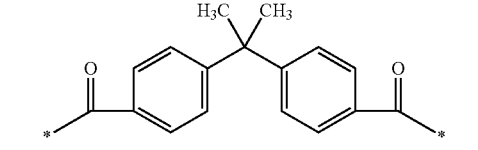

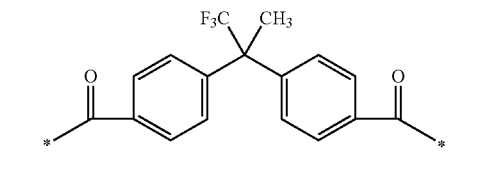

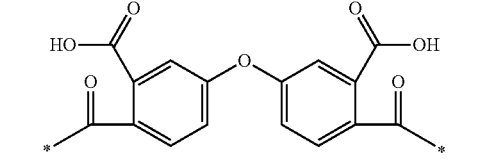

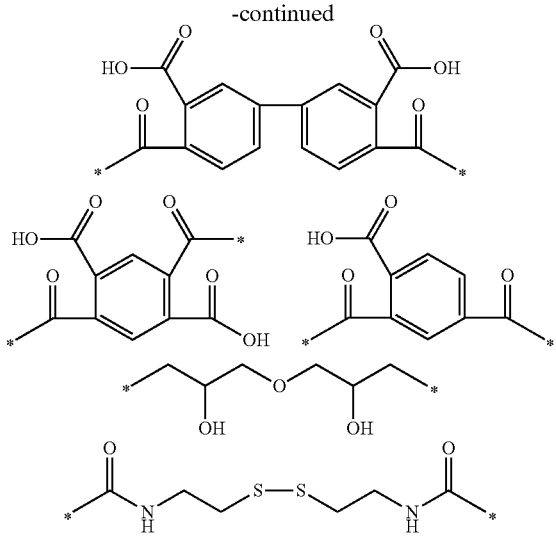

The resin having a dye structure that has the constitutional unit represented by General Formula (C) is synthesized by sequential polymerization. Examples of the sequential polymerization include polyaddition (for example, a reaction between an diisocyanate compound and diol, a reaction between a diepoxy compound and a dicarboxylic acid, a reaction between a tetracarboxylic dianhydride and diol, or the like) and polycondensation (for example, a reaction between a dicarboxylic acid and diol, a reaction between a dicarboxylic acid and diamine, or the like). Among these, the resin is particularly preferably synthesized by a polyaddition reaction since the reaction conditions can be set to be mild, and a dye structure is not decomposed by the reaction. For the sequential polymerization, known reaction conditions can be applied.

At the time of the sequential polymerization, by applying the above-described (i) method of producing the resin by a polymerization reaction performed in the presence of a polymerization inhibitor, a proportion of a peak area of the component having a molecular weight of 20,000 or more can be suitably set to 10% or less with respect to a peak area of the total molecular weight distribution of the resin (A). In addition, after the sequential polymerization, the above described (ii) method of producing the resin by a step of adding a poor solvent (water or the like) of the high-molecular weight component having a molecular weight of 20,000 or more to the obtained polymerized solution, and removing the precipitated high-molecular weight component having a molecular weight of 20,000 or more by filtration may be applied.

Specific examples of the constitutional unit represented by General Formula (C) will be shown below, but the present invention is not limited thereto.

[Chem. 66]

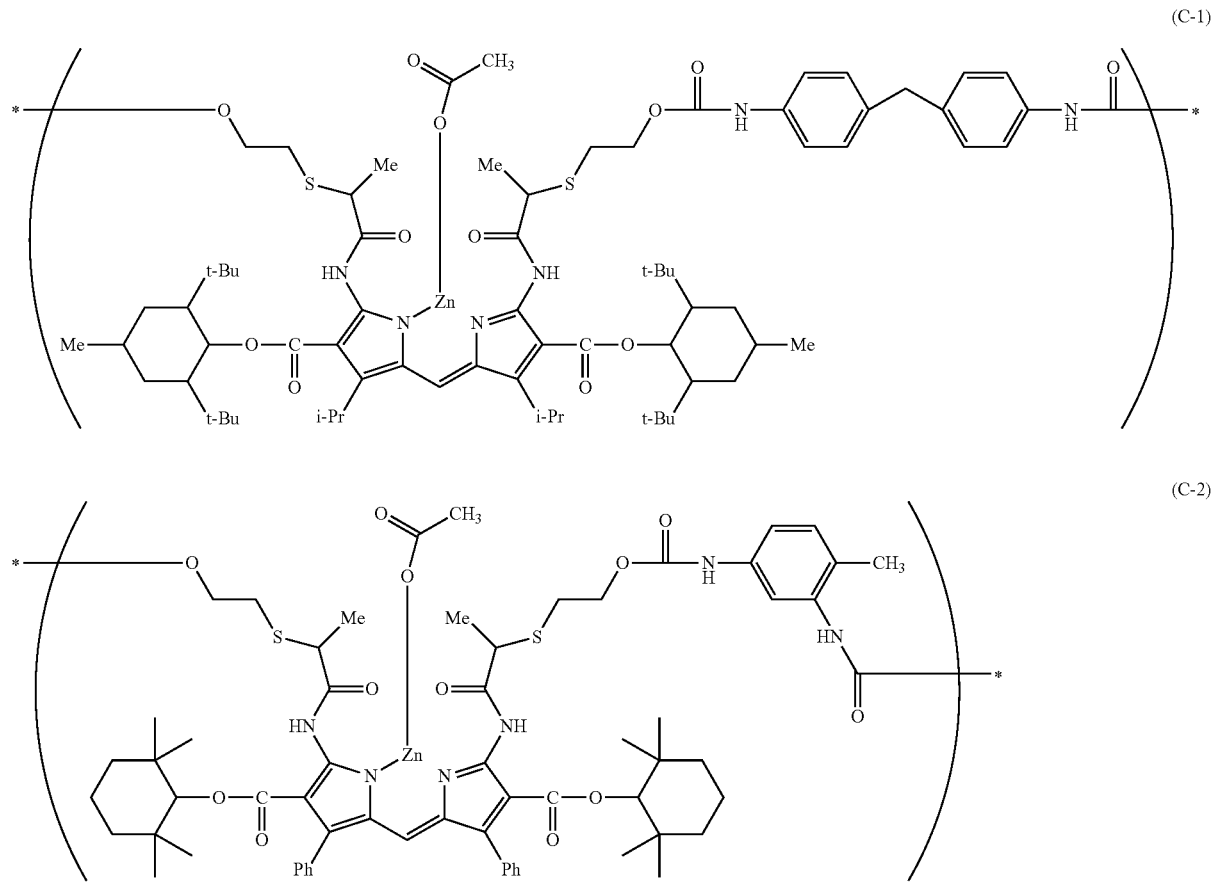

-continued
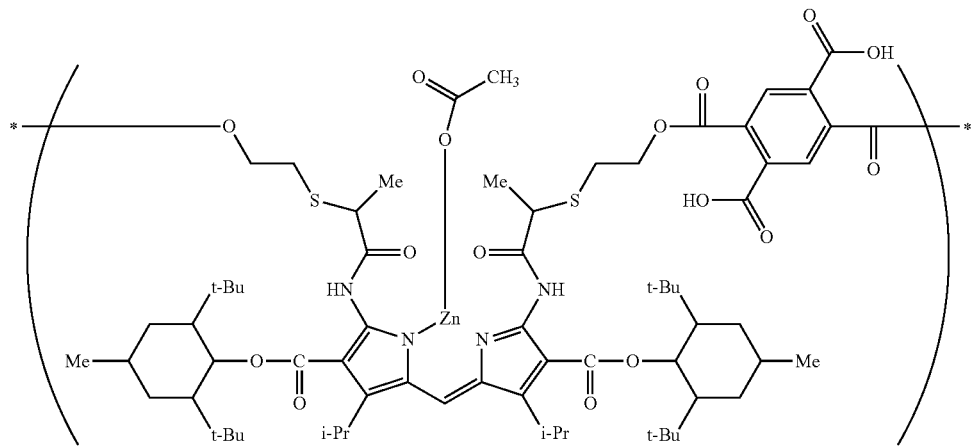
(C-3)
[Chem. 67]
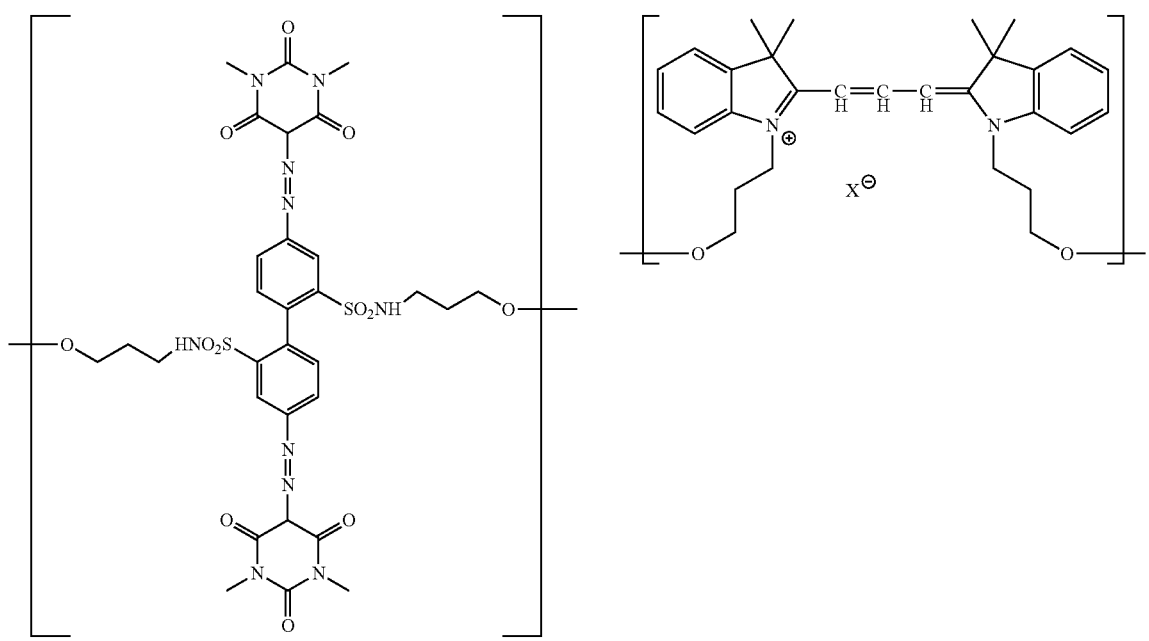
(C-az-1)
(C-pm-1)
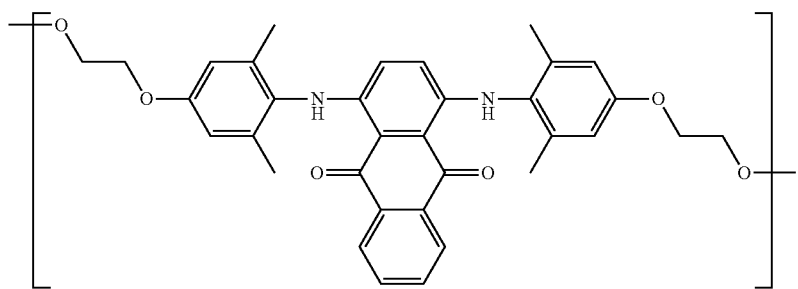
(C-aq-1)

(C-sq-1)

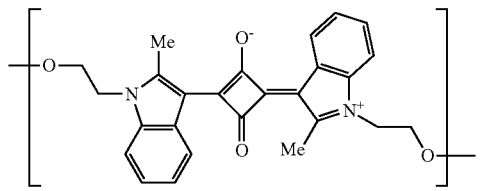

(C-az-2)

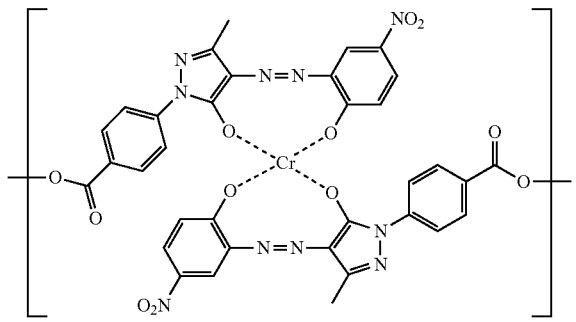

Among the resins having a dye structure that has the constitutional unit represented by General Formula (A), General Formula (B), and/or General Formula (C), in the resin having a dye structure that has the constitutional unit represented by General Formulae (A) and (C), the dye-derived partial structure is not linked to the molecular structure by a covalent bond. Accordingly, a coloring composition containing the resin having such a dye structure has excellent heat resistance. Consequently, when this coloring composition is applied to the pattern formation including a high-temperature process, an effect of inhibiting color migration to another colored pattern adjacent thereto is obtained, which is thus preferable. In addition, the compound represented by General Formula (A) is particularly preferable since the compound makes it easy to control the molecular weight of the resin having a dye structure (Polymerizable Group that Resin (A) Having a Dye Structure has)

The resin (A) having a dye structure in the present invention preferably has a polymerizable group. In this manner, even when the resin made into a thin layer, light resistance, heat resistance, solvent resistance, and the like are excellent, and a cured colored film having excellent pattern formability can be formed.

As the polymerizable group, known polymerizable groups that can be crosslinked by a radical, an acid, or heat can be used, and examples thereof include groups having an ethylenically unsaturated bond, cyclic ether groups (an epoxy group and a oxetane group), methylol groups, and the like. Particularly, groups having an ethylenically unsaturated bond are preferable, (meth)acryloyl groups are more preferable, and (meth)acryloyl groups derived from glycidyl (meth)acrylate and 3,4-epoxy-cyclohexyl methyl(meth) acrylate are most preferable. The resin (A) having a dye structure may have two or more kinds of the polymerizable groups.

As the method of introducing the polymerizable group, there are (1) a method of introducing the polymerizable group by modifying the resin having a dye structure with a polymerizable group-containing compound, (2) a method of introducing the polymerizable group by copolymerizing a dye monomer with a polymerizable group-containing compound, and the like. Hereinafter, the methods will be described in detail.

—(1) Method of Introducing Polymerizable Group by Modifying Resin Having Dye Structure with Polymerizable Group-Containing Compound—

As the method of introducing the polymerizable group by modifying the resin having a dye structure with a polymerizable group-containing compound, known methods can be used without particular limitation. For example, (a) a method of causing a reaction between a carboxylic acid included in the resin having a dye structure and an unsaturated bond-containing epoxy compound, (b) a method of causing a reaction between a hydroxyl group or an amino group included in the resin having a dye structure and an unsaturated bond-containing isocyanate compound, and (c) a method of causing a reaction between an epoxy compound included in the resin having a dye structure and an unsaturated bond-containing carboxylic acid compound are preferable in view of production.

Examples of the unsaturated bond-containing epoxy compound in (a) a method of causing a reaction between a carboxylic acid included in the resin having a dye structure and an unsaturated bond-containing epoxy compound include glycidyl methacrylate, glycidyl acrylate, allylglycidyl ether, 3,4-epoxy-cyclohexylmethyl acrylate, 3,4-epoxy-cyclohexylmethyl methacrylate, and the like. Particularly, glycidyl methacrylate, and 3,4-epoxy-cyclohexylmethyl methacrylate are preferable since these compounds are excellent in a crosslinking property and storage stability. Known conditions can be used as the reaction conditions.

Examples of the unsaturated bond-containing isocyanate compound in (b) a method of causing a reaction between a hydroxyl group or an amino group included in the resin having a dye structure and an unsaturated bond-containing isocyanate compound include 2-isocyanatoethyl methacrylate, 2-isocyanatoethyl acrylate, 1,1-bis(acryloyloxymethyl) ethyl isocyanate, and the like. Among these, 2-isocyanatoethyl methacrylate is preferable since this compound has an excellent crosslinking property and storage stability. Known conditions can be used as the reaction conditions.

As the unsaturated bond-containing carboxylic acid compound in (c) a method of causing a reaction between an epoxy compound included in the resin having a dye structure and an unsaturated bond-containing carboxylic acid compound, any carboxylic acid compounds can be used without particular limitation as long as the compound has a known (meth)acryloyloxy group. Among these, methacrylic acid and acrylic acid are preferable, and methacrylic acid is particularly preferable since this acid has an excellent crosslinking property and storage stability. Known conditions can be used as the reaction conditions.

—(2) Method of Introducing Polymerizable Group by Copolymerizing Dye Monomer and Polymerizable Group-Containing Compound—

As (2) a method of introducing a polymerizable group by copolymerizing a dye monomer and a polymerizable group-containing compound, any known methods can be used without particular limitation. Among these, (d) a method of copolymerizing a radically polymerizable dye monomer with a polymerizable group-containing compound that can be radically polymerized, and (e) a method of copolymerizing a dye monomer that can be subjected to polyaddition with a polymerizable group-containing compound that can be subjected to polyaddition are preferable.

Examples of the polymerizable group-containing compound that can be radically polymerized in (d) a method of copolymerizing a radically polymerizable dye monomer with a polymerizable group-containing compound that can be radically polymerized particularly include an allyl group-containing compound (for example, allyl(meth)acrylate or the like), an epoxy group-containing compound (for example, glycidyl(meth)acrylate, 3,4-epoxy-cyclohexyl methyl(meth)acrylate), an oxetane group-containing compound (for example, 3-methyl-3-oxetanyl methyl(meth)acrylate or the like), and a methylol group-containing compound (for example, N-(hydroxymethyl)acrylamide or the like). Among these, an epoxy group-containing compound and an oxetane group-containing compound are particularly preferable. Known conditions can be used as the reaction conditions.

Examples of the polymerizable group-containing compound that can be subjected to polyaddition in (e) a method of copolymerizing a dye monomer that can be subjected to polyaddition with a polymerizable group-containing compound that can be subjected to polyaddition include an unsaturated bond-containing diol compound (for example, 2,3-dihydroxypropyl(meth)acrylate), and the like. Known conditions can be used as the reaction conditions.

As the method of introducing a polymerizable group, a method of causing a reaction between a carboxylic acid included in the resin having a dye structure and an unsaturated bond-containing epoxy compound is most preferable.

The amount of the polymerizable group included in the resin (A) having a dye structure is preferably 0.1 mmol to 2.0 mmol, more preferably 0.2 mmol to 1.5 mmol, and most preferably 0.3 mmol to 1.0 mmol, based on 1 g of the resin (A) having a dye structure.

Specific examples of the constitutional unit having the polymerizable group include the following, but the present invention is not limited thereto.

[Chem. 68]

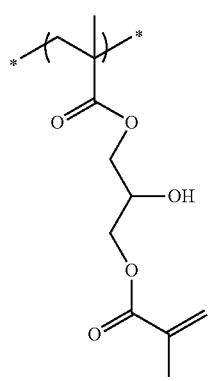

(G-1)

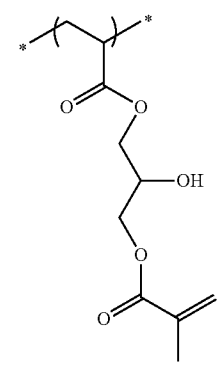

(G-2)

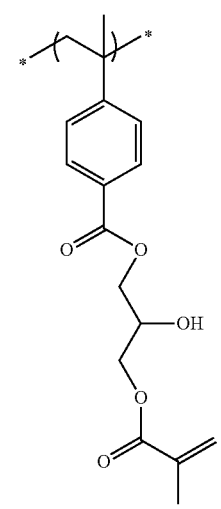

(G-3)

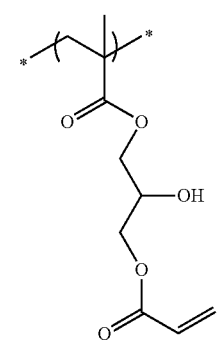

(G-4)

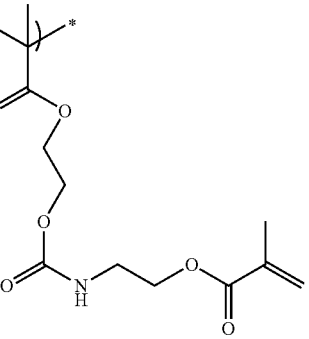

(G-5)

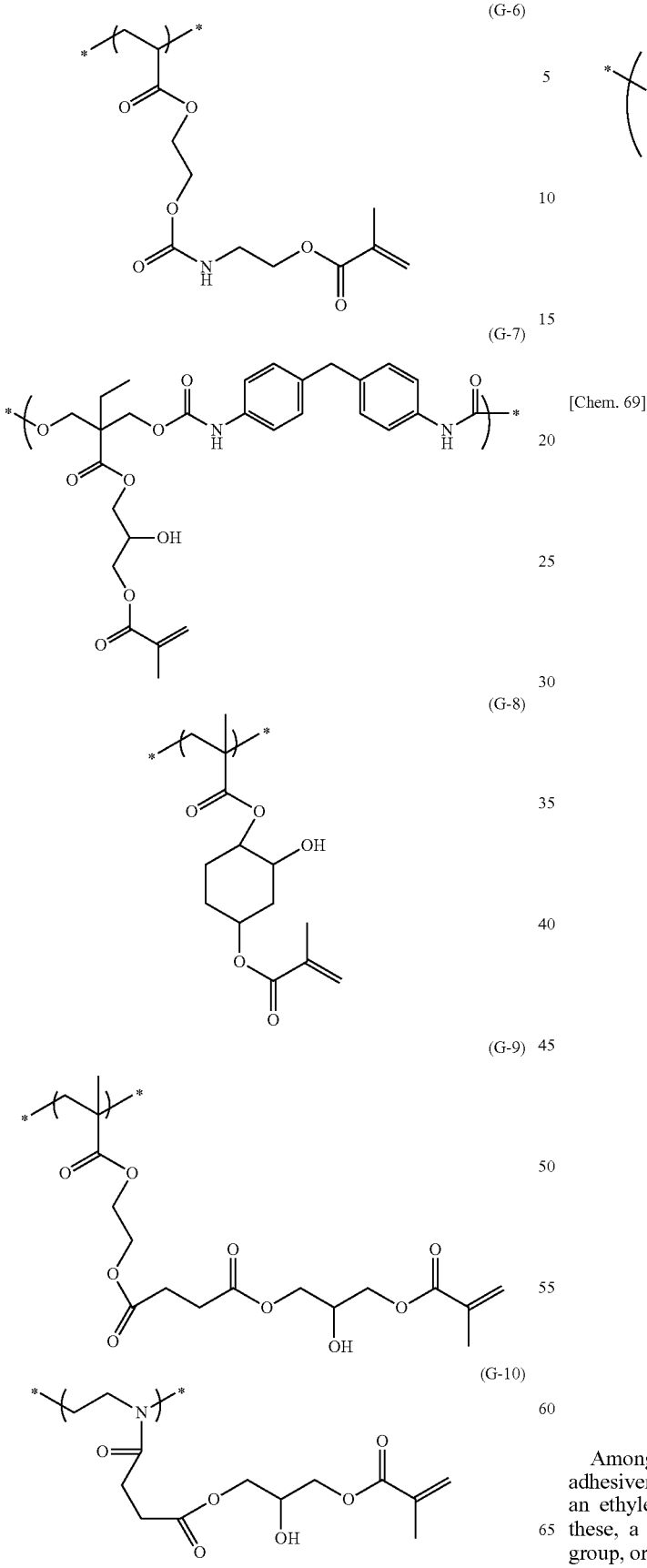
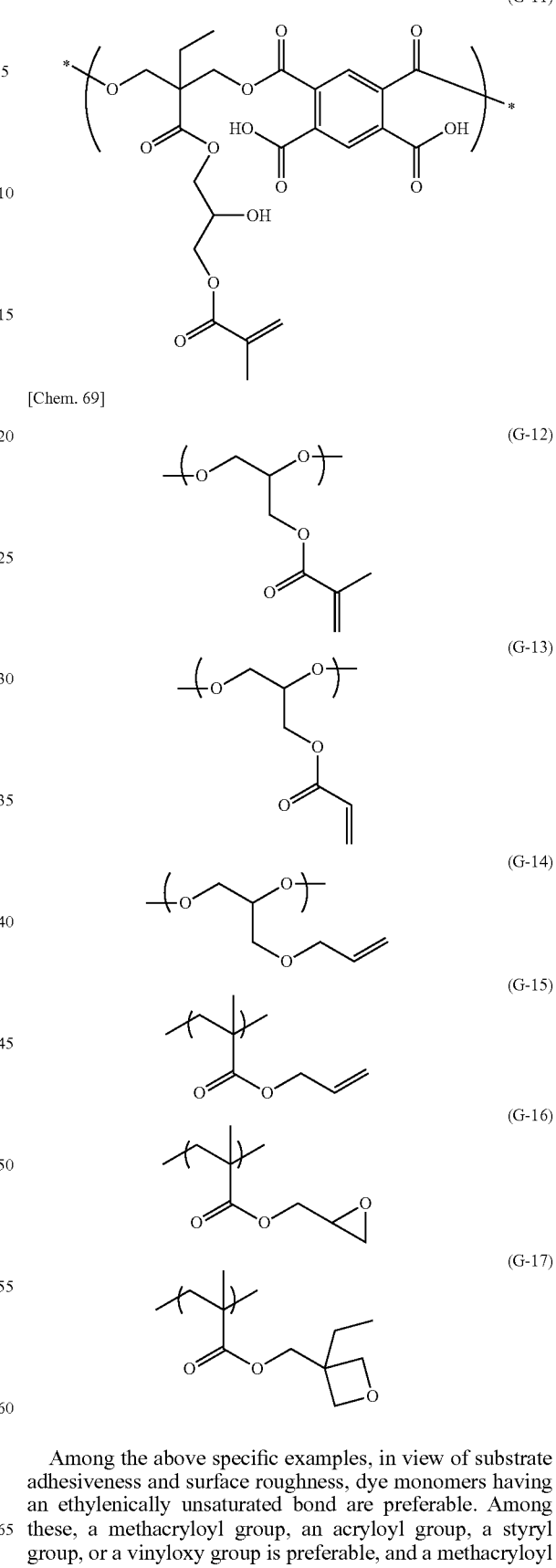
Among the above specific examples, in view of substrate adhesiveness and surface roughness, dye monomers having an ethylenically unsaturated bond are preferable. Among these, a methacryloyl group, an acryloyl group, a styryl group, or a vinyloxy group is preferable, and a methacryloyl group is most preferable.

(Other Functional Groups that Resin (A) Having Dye Structure has)

The resin (A) having a dye structure in the present invention may have other functional groups. The resin (A) preferably has alkali-soluble groups such as a carboxylic acid, a sulfonic acid, a phosphoric acid, and a phenolic hydroxyl group as other functional groups. As the alkali-soluble group, a carboxylic acid is most preferable.

Examples of the method of introducing the alkali-soluble group to the resin having a dye structure include a method of introducing in advance the alkali-soluble group to a dye monomer and a method of copolymerizing monomers (a caprolactone-modified derivative of a (meth)acrylic acid or an acrylic acid, a succinic anhydride-modified derivative of 2-hydroxyethyl(meth)acrylate, a phthalic anhydride-modified derivative of 2-hydroxyethyl(meth)acrylate, a 1,2-cyclohexanecarboxylic anhydride-modified derivative of 2-hydroxyethyl(meth)acrylate, a carboxylic acid-containing monomer such as a styrene carboxylic acid, itaconic acid, maleic acid, or norbornene carboxylic acid, a phosphoric acid-containing monomer such as acid phosphoxy ethyl methacrylate or vinyl phosphonate and a sulfonic acid-containing monomer such as vinyl sulfonate 2-acrylamide-2-methyl phosphonate) other than the dye monomer having the alkali-soluble group. It is most preferable to use both the methods.

The amount (acid value) of the alkali-soluble group included in the resin (A) having a dye structure is preferably 0.3 mmol to 2.0 mmol, more preferably 0.4 mmol to 1.5 mmol, and most preferably 0.5 mmol to 1.0 mmol, based on 1 g of the resin (A) having a dye structure.

In the present invention, the acid value of the resin having a dye structure can be calculated from, for example, the average content of the alkali-soluble group (acid group) in the resin having a dye structure. In addition, by varying the content of the repeating unit (constitutional unit) that contains the acid group constituting the resin having a dye structure, a resin having a desired acid value can be obtained.

Examples of other functional groups that the resin (A) having a dye structure has include a development accelerator such as lactone, acid anhydride, amide, —COCH₂CO—, or a cyano group, a hydrophilici and hydrophobic-adjusting group such as an aralkyl group, an aryl group, a polyalkylene oxide group, a hydroxyl group, a maleimide group, or an amino group, and the like which can be appropriately introduced.

Examples of the method of introducing the functional group include a method of introducing the functional group in advance to a dye monomer, a method of copolymerizing a monomer having the above functional group, and the like.

Specific examples of the repeating unit having other functional groups that the resin (A) having a dye structure has will be shown, but the present invention is not limited thereto.

[Chem. 70]

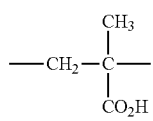

(H-1)

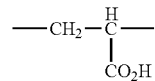

(H-2)

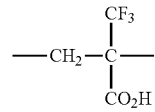

(H-3)

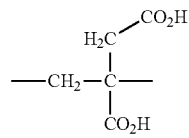

(H-4)

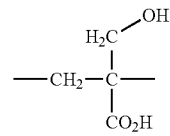

(H-5)

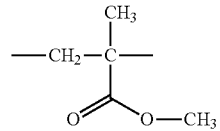

(H-6)

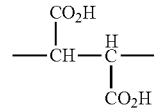

(H-7)

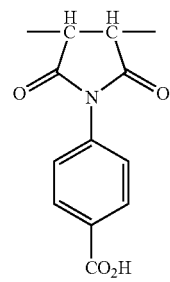

(H-8)

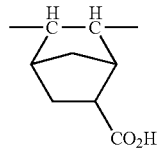

(H-9)

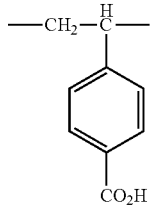

(H-10)

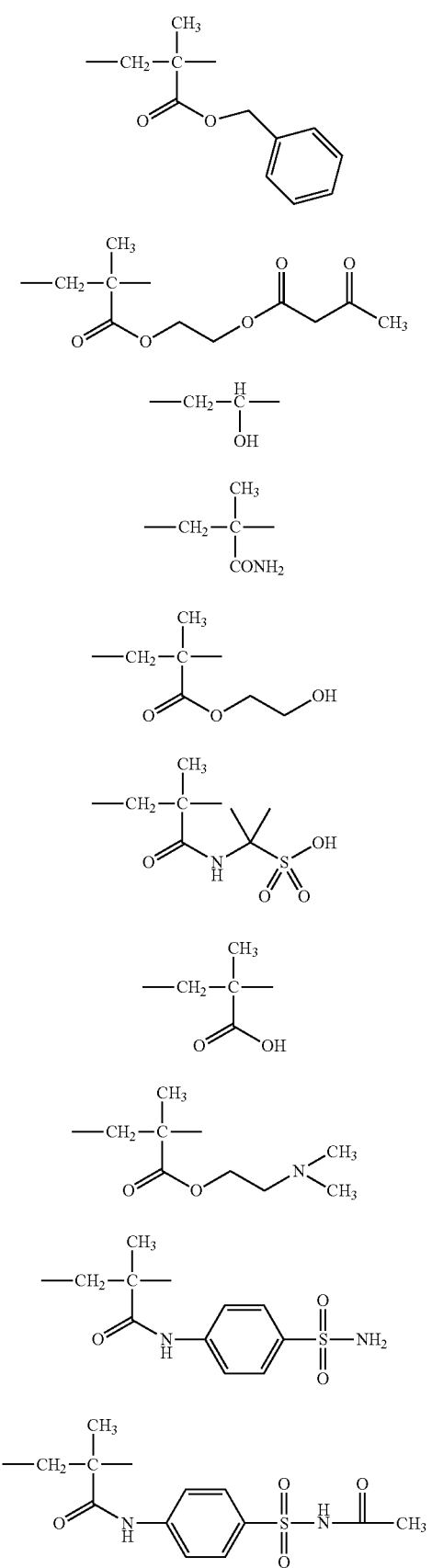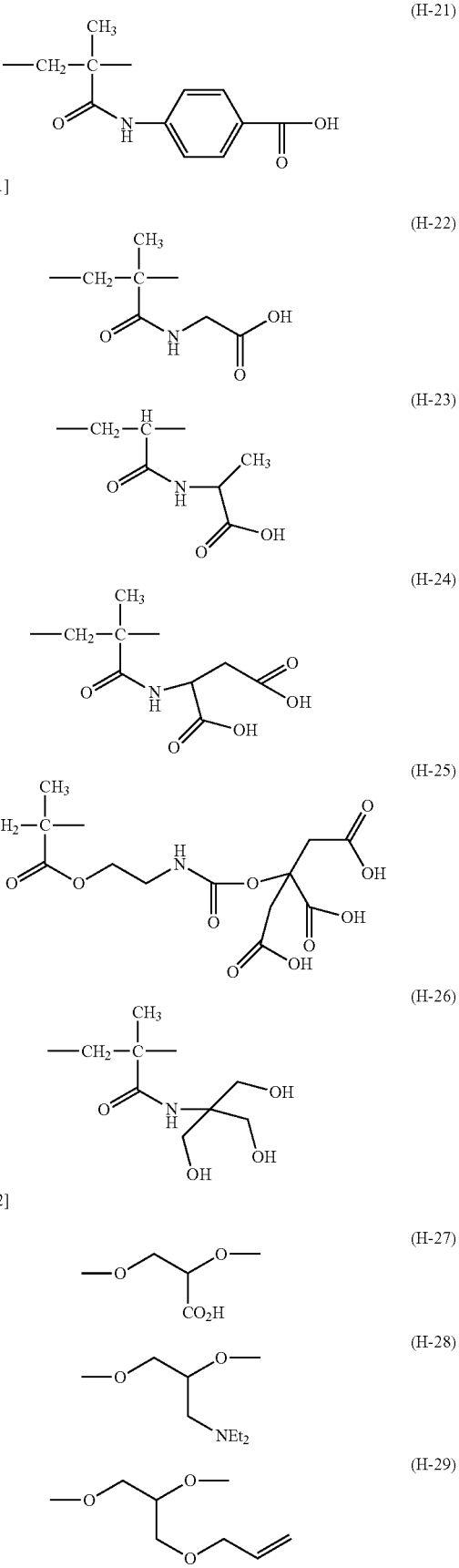

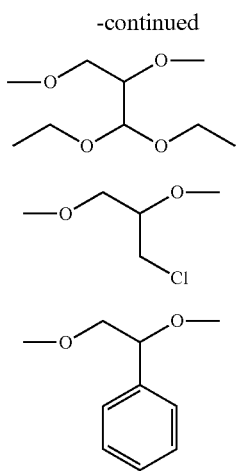

(H-30)

(H-31)

(H-32)

Tg of the resin (A) having a dye structure according to the present invention is preferably 50° C. or higher and more preferably 100° C. or higher. In addition 5% weight reduction temperature measured by thermogravimetric analysis (TGA measurement) is preferably 120° C. or higher, more preferably 150° C. or higher, and even more preferably 200° C. or higher. If the temperature is in this range, when the coloring composition of the present invention is applied to the preparation of a color filter, change in density caused by a heating process can be reduced.

In addition, the extinction coefficient (hereinafter, described as $\epsilon'$. $\epsilon'=\epsilon$/average molecular weight, unit: L/g·cm) per unit weight of the resin having a dye structure according to the present invention is preferably 30 or more, more preferably 60 or more, and even more preferably 100 or more. If the extinction coefficient is in this range, when a color filter is prepared using the coloring composition of the present invention, a color filter having excellent color reproducibility can be prepared.

The molar extinction coefficient of the resin (A) having a dye structure that is used in the coloring composition of the present invention is preferably as high as possible, in view of a coloring ability.

The resin (A) having a dye structure according to the present invention is preferably a compound that dissolves in the following organic solvents.

Examples of the organic solvents include esters (for example, methyl 3-ethoxypropionate, ethyl 3-ethoxypropionate, ethyl lactate, butyl acetate, and methyl 3-methoxypropionate), ethers (for example, methyl cellosolve acetate, ethyl cellosolve acetate, propylene glycol monomethyl ether, and propylene glycol monomethyl ether acetate), ketones (methyl ethyl ketone, cyclohexanone, 2-heptanone, 3-heptanone, and the like), and aromatic hydrocarbons (for example, toluene and xylene). The resin (A) dissolves preferably from 1% by mass to 50% by mass, more preferably from 5% by mass to 40% by mass, and even more preferably from 10% by mass to 30% by mass in these solvents (25° C.) If the resin (A) dissolves in the organic solvent in this range, when the coloring composition of the present invention is applied to the preparation of a color filter or the like, preferable coating surface properties can be obtained or reduction in concentration caused by elution after coating of other colors can be decreased.

In the coloring composition of the present invention, one kind of the resin having a dye structure may be used alone, or two or more kinds thereof may be used concurrently.

The content of the resin having a dye structure in the coloring composition of the present invention is set in consideration of the content ratio between this resin and (B) a pigment described later.

A mass ratio (resin (A) having a dye structure/pigment) between a pigment and the resin having a dye structure is preferably 0.1 to 5, more preferably 0.2 to 2, and even more preferably 0.3 to 1.

[(B) Pigment]

The coloring composition of the present invention preferably contains a pigment.

As the pigment used in the present invention, various inorganic or organic pigments known in the related art can be used, and the pigment preferably has a high transmissivity.

Examples of the inorganic pigment include carbon, metal oxides, and metal compounds represented by a metal complex salt and the like, and specific examples thereof include metal oxides of iron, cobalt, aluminum, cadmium, lead, copper, titanium, magnesium, chromium, zinc, antimony, and the like, and complex oxides of the above metals.

Examples of the organic pigment include C. I. Pigment Yellow 11, 24, 31, 53, 83, 93, 99, 108, 109, 110, 138, 139, 147, 150, 151, 154, 155, 167, 180, 185, 199; C. I. Pigment Orange 36, 38, 43, 71; C. I. Pigment Red 81, 105, 122, 149, 150, 155, 171, 175, 176, 177, 209, 220, 224, 242, 254, 255, 264, 270; C. I. Pigment Violet 19, 23, 32, 39; C. I. Pigment Blue 1, 2, 15, 15:1, 15:3, 15:6, 16, 22, 60, 66; C. I. Pigment Green 7, 36, 37, 58; C. I. Pigment Brown 25, 28; C. I. Pigment Black 1; and the like.

Examples of pigments that can be preferably used in the present invention include the following, but the present invention is not limited thereto.

C. I. Pigment Yellow 11, 24, 108, 109, 110, 138, 139, 150, 151, 154, 167, 180, 185; C. I. Pigment Orange 36, 71; C. I. Pigment Red 122, 150, 171, 175, 177, 209, 224, 242, 254, 255, 264; C. I. Pigment Violet 19, 23, 32; C. I. Pigment Blue 15:1, 15:3, 15:6, 16, 22, 60, 66; C. I. Pigment Green 7, 36, 37, 58; C. I. Pigment Black 1

These organic pigments can be used alone or used in combination of various kinds thereof for spectral adjustment or improvement of color purity. Specific examples of the combination will be shown below. For example, as a red pigment, a mixture of only one of an anthraquinone-based pigment, a perylene-based pigment, and a diketopyrrolopyrrole-based pigment or at least one kind of these with a disazo-based yellow pigment, an isoindoline-based yellow pigment, a quinophthalone-based yellow pigment, or a perylene-based red pigment can be used. In addition, examples of the anthraquinone-based pigment include C. I. Pigment Red 177, examples of the perylene-based pigment include C. I. Pigment Red 155 and C. I. Pigment Red 224, and examples of the diketopyrrolopyrrole-based pigment include C. I. Pigment Red 254. In view of color separation properties, a mixture of the above pigment with C. I. Pigment Yellow 139 is preferable. The mass ratio between the red pigment and the yellow pigment is preferably 100:5 to 100:50. If the mass ratio is 100:4 or less, it is difficult to suppress a light transmissivity at 400 nm to 500 nm, and if it is 100:51 or higher, a dominant wavelength moves closer to a short wavelength, so chromatic resolving power cannot be improved in some cases. Particularly, the above mass ratio is optimally in a range of 100:10 to 100:30. Moreover, in a case of a combination of red pigments, the mass ratio can be adjusted according to the required spectrum.

As a green pigment, a halogenated phthalocyanine-based pigment can be used alone, or a mixture of this pigment with a disazo-based yellow pigment, a quinophthalone-based yellow pigment, an azomethine-based yellow pigment, or an isoindoline-based yellow pigment can be used. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is particularly preferably in a range of 100:30 to 100:120.

As a blue pigment, a phthalocyanine-based pigment can be used alone, or a mixture of this pigment with a dioxazine-based violet pigment can be used. For example, a mixture of C. I. Pigment Blue 15:6 with C. I. Pigment Violet 23 is preferable. The mass ratio between the blue pigment and the violet pigment is preferably 100:0 to 100:100 and more preferably 100:10 or less.

In addition, as a pigment for a black matrix, carbon, titanium black, iron oxide, or titanium oxide may be used alone or used as a mixture, and a combination of carbon with titanium black is preferable. The mass ratio between carbon and titanium black is preferably in a rage of 100:0 to 100:60.

When a pigment is used for a color filter, the primary particle size of the pigment is preferably 100 nm or less in view of color unevenness or contrast, and in view of dispersion stability, the primary particle size is preferably 5 nm or less. The primary particle size of the pigment is more preferably 5 nm to 75 nm, even more preferably 5 nm to 55 nm, and particularly preferably 5 nm to 35 nm. The specific resin of the present invention can exert effects particularly when the primary particle size thereof is in a range of 5 nm to 35 nm.

The primary particle size of a pigment can be measured by known methods such as an electron microscope.

Among the above, the pigment is preferably a pigment selected from pigments based on anthraquinone, diketopyrrolopyrrole, phthalocyanine, quinophthalone, isoindoline, and dioxazine. Particularly, C. I. Pigment Red 177 (based on anthraquinone), C. I. Pigment Red 254 (based on diketopyrrolopyrrole), C. I. Pigment Green 7, 36, 58, C. I. Pigment Blue 15:6 (based on phthalocyanine), C. I. Pigment Yellow 138 (based on quinophthalone), C. I. Pigment Yellow 139, 185 (based on isoindoline), C. I. Pigment Yellow 150 (based on azomethine), and C. I. Pigment Violet 23 (based on dioxazine) are most preferable.

—Dispersant—

The coloring composition of the present invention can contain a pigment dispersant.

Examples of the pigment dispersant usable in the present invention include polymer dispersants (for example, polyamide amine and a salt thereof, polycarboxylic acid and a salt thereof, a high-molecular weight unsaturated acid ester, modified polyurethane, modified polyester, modified poly(meth)acrylate, a (meth)acrylic copolymer, and a naphthalene sulfonate formaldehyde condensate), surfactants such as a polyoxyethylene alkyl phosphoric acid ester, polyoxyethylene alkylamine, and alkanolamine, and pigment derivatives.

The polymer dispersants can be further classified into straight-chain polymers, terminal-modified polymers, graft polymers, and block polymers.

Examples of the terminal-modified polymers that has a moiety anchored to the pigment surface include a polymer having a phosphoric acid group in the terminal as disclosed in JP1991-112992A (JP-H3-112992A), JP2003-533455A, and the like, a polymer having a sulfonic acid group in the terminal as disclosed in JP2002-273191A, a polymer having a partial skeleton or a heterocycle of an organic dye as disclosed in JP1997-77994A (JP-H9-77994), and the like. In addition, a polymer obtained by introducing two or more moieties (an acid group, a basic group, a partial skeleton of an organic dye, or a heterocycle) anchored to the pigment surface to a polymer terminal as disclosed in JP2007-277514A is also preferable since this polymer is excellent in dispersion stability.

Examples of the graft polymers having a moiety anchored to the pigment surface include polyester-based dispersant and the like, and specific examples thereof include a product of a reaction between poly(lower alkyleneimine) and polyester, disclosed in JP1979-37082A (JP-S54-37082A), JP1996-507960A (JP-H8-507960A), JP2009-258668A, and the like, a product of a reaction between polyallylamine and polyester, disclosed in JP1997-169821A (JP-H9-169821A) and the like, a copolymer of a macromonomer and a nitrogen atom monomer, disclosed in JP1998-339949A (JP-H10-339949A), JP2004-37986A, WO2010/110491, and the like, a graft polymer having a partial skeleton or a heterocycle of an organic dye, disclosed in JP2003-238837A, JP2008-9426A, JP2008-81732A, and the like, and a copolymer of a macromonomer and an acid group-containing monomer, disclosed in JP2010-106268A and the like. Particularly, an amphoteric dispersed resin having basic and acid groups disclosed in JP2009-203462A is preferable in view of dispersibility of a pigment dispersion, dispersion stability, and developability that a coloring composition using a pigment dispersion exhibits.

As the macromonomer used in producing a graft polymer having a moiety anchored to the pigment surface by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD Placcel FM 5 (a product obtained by adding 5 molar equivalents of ε-caprolactone to 2-hydroxyethyl methacrylate) and FA10L (a product obtained by adding 10 molar equivalents of ε-caprolactone to 2-hydroxyethyl acrylate) manufactured by DAICEL CORPORATION, a polyester-based macromonomer disclosed in JP1990-272009A (JP-H2-272009A), and the like. Among these, the polyester-based macromonomer excellent in flexibility and solvent compatibility is particularly preferable in view of dispersibility of the pigment dispersion, dispersion stability, and the developability that a coloring composition using the pigment dispersion exhibits. In addition, a polyester-based macromonomer represented by the polyester-based macromonomer disclosed in JP1990-272009A (JP-H2-272009A) is most preferable.

As the block polymer having a moiety anchored to the pigment surface, block polymers disclosed in JP2003-49110A, JP2009-52010A, and the like are preferable.

The pigment dispersant usable in the present invention can be obtained as commercially available products, and specific examples thereof include "DA-7301" manufactured by Kusumoto Chemicals, Ltd., "Disperbyk-101 (polyamidamine phosphoric acid salt), 107 (carboxylic acid ester), 110 (copolymer including an acid group), 130 (polyamide), 161, 162, 163, 164, 165, 166, 170 (polymeric copolymer)" and "BYK-P104, P105 (high-molecular weight unsaturated polycarboxylic acid) manufactured by BYK-Chemie, "EFKA 4047, 4010 to 4050, 4050 to 4165 (polyurethane-based dispersant), FEKA 4330 to 4340 (block copolymer), 4400 to 4402 (modified polyacrylate), 5010 (polyester-amide), 5765 (high-molecular weight polycarboxylic acid salt), 6220 (aliphatic polyester), 6745 (phthalocyanine derivative), 6750 (azo pigment derivative)" manufactured by EFKA, "Ajisper PB821, PB822, PB880, PB881" manufactured by Ajinomoto Fine-Techno Co., Inc., "Flowlen TG-710 (urethane oligomer)" and "Polyflow No. 50E, No. 300 (acrylic copolymer) manufactured by KYOEISHA CHEMICAL Co., LTD., "Disparlon KS-860, 873 SN, 874, #2150 (aliphatic polyvalent carboxylic acid), #7004 (polyether ester), DA-703-50, DA-705, and DA-725" manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid), "Emulgen 920, 930, 935, 985 (polyoxyethylene nonyl phenyl ether)", and "Acetamine 86 (stearylamine acetate)" manufactured by Kao Corporation, "Solsperse 5000 (phthalocyanine derivative), 22000 (azo pigment derivative), 13240 (polyesteramine), 3000, 17000, 27000 (polymer having a functional portion in the terminal portion), 24000, 28000, 32000, 38500 (graft polymer)" manufactured by The Lubrizol Corporation, Japan, "Nikkol T106 (polyoxyethylene sorbitan monooleate) and MYS-IEX (polyoxyethylene monostearate)" manufactured by NIKKO CHEMICAL CO., LTD., Hinoact T-8000E and the like manufactured by Kawaken Fine Chemicals Co., Ltd., organosiloxane polymer KP341 manufactured by Shin-Etsu Chemical Co., Ltd., "W001: cationic surfactant" and nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, ethylene glycol distearate, and sorbitan aliphatic acid ester, and anionic surfactants such as "W004, W005, and W017" manufactured by Yusho Co., Ltd., "EFKA-46, EFKA-47, EFKA-47EA, EFKA polymer 100, EFKA polymer 400, EFKA polymer 401, and EFKA polymer 450" manufactured by MORISHITA SANGYO CORPORATION, polymer dispersants such as "Disperse aid 6, Disperse aid 8, Disperse aid 15, and Disperse aid 9100" manufactured by SAN NOPCO LIMITED, "Adeka Pluronic L31, F38, L42, L44, L61, L64, F68, L72, P95, F77, P84, F87, P94, L101, P103, F108, L121, and P-123" manufactured by ADEKA CORPORATION, "Ionet (product name) S-20" manufactured by Sanyo Chemical Industries, Ltd., and the like.

These pigment dispersants may be used alone or used in combination of two or more kinds thereof. In the present invention, it is particularly preferable to use a combination of a pigment derivative and a polymer dispersant. In addition, for the pigment dispersant of the present invention, a terminal-modified polymer having a moiety anchored to the pigment surface, a graft polymer, and a block polymer may be used concurrently with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in a side chain, and a resin obtained by modifying an acid anhydride with a polymer having a hydroxyl group, and particularly, a (meth)acrylic acid copolymer is preferable. In addition, an N position-substituted maleimide monomer copolymer disclosed in JP1998-300922A (JP-H10-300922A), an ether dimer copolymer disclosed in JP2004-300204A, and an alkali-soluble resin containing a polymerizable group disclosed in JP1995-319161A (JP-H7-319161 A) are also preferable.

The content of the pigment dispersant in the coloring composition is preferably 1 part by mass to 80 parts by mass, more preferably 5 parts by mass to 70 parts by mass, and even more preferably 10 parts by mass to 60 parts by mass, based on 100 parts by mass of a pigment.

Specifically, when a polymer dispersant is used, the amount of the dispersant used preferably ranges from 5 parts to 100 parts, and more preferably ranges from 10 parts to 80 parts converted in terms of mass, based on 100 parts by mass of a pigment.

Moreover, when a pigment derivative is used concurrently, the amount of the pigment dispersant used preferably ranges from 1 part to 30 parts, more preferably ranges from 3 parts to 20 parts, and particularly preferably ranges from 5 parts to 15 parts converted in terms of mass, based on 100 parts by mass of a pigment.

In the coloring composition, when a pigment as a colorant is concurrently used with the pigment dispersant, the total content of the colorant and the dispersant is preferably from 50% by mass to 90% by mass, more preferably from 55% by mass to 85% by mass, and even more preferably from 60% by mass to 80% by mass, based on the total solid contents constituting the coloring composition, in view of curing sensitivity and color density.

[(C) Polymerizable Compound]

The coloring composition of the present invention preferably contains a polymerizable compound.

Known polymerizable compounds that can be crosslinked by a radical, an acid, or heat can be used, and examples thereof include polymerizable compounds having an ethylenically unsaturated bond, a cyclic ether (epoxy or oxetane), methylol, and the like. In view of sensitivity, the polymerizable compound is suitably selected from compounds having one and preferably two or more terminal ethylenically unsaturated bonds. Among these, polyfunctional polymerizable compounds that are tetra- or higher functional are preferable, and polyfunctional polymerizable compounds that are penta- or higher functional are more preferable.

Such compound groups are widely known in the industrial field of the related art and can be used in the present invention without particular limitation. These may be in any type of chemical forms such as a monomer, a prepolymer, that is, dimer, a trimer, an oligomer, a mixture of these, and a multimer of these. The polymerizable compound in the present invention may be used alone, or two or more kinds thereof may be used concurrently.

More specifically, examples of the monomer and prepolymer include unsaturated carboxylic acids (for example, acrylic acid, methacrylic acid, itaconic acid, crotonic acid, isocrotonic acid, maleic acid, and the like) or esters thereof, amides, and multimers of these, and among these, an ester of unsaturated carboxylic acid and an aliphatic polyol compound, amides of unsaturated carboxylic acid and an aliphatic polyamine compound, and multimers of these are preferable. Moreover, products of an addition reaction between unsaturated carboxylic acid esters or amides having nucleophilic substituent such as a hydroxyl group, an amino group, or a mercapto group and monofunctional or polyfunctional isocyanates or epoxies, products of a dehydration condensation reaction between the unsaturated carboxylic acid esters or amides and a monofunctional or polyfunctional carboxylic acid, and the like are also suitably used. In addition, products of an addition reaction between unsaturated carboxylic acid esters or amides having an electrophilic substituent such as an isocyanate group or an epoxy group and monofunctional or polyfunctional alcohols, amines, or thiols, and products of a substitution reaction between unsaturated carboxylic acid esters or amides having an elimination substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds disclosed in JP2009-288705A, Paragraphs 0095 to 0108 can also be suitably used in the present invention.

As the polymerizable compound, compounds that have at least one addition-polymerizable ethylene group and have an ethylenically unsaturated group having a boiling point of 100° C. under normal pressure are also preferable. Examples of the compounds include polyfunctional acrylate or methacrylate such as polyethylene glycol mono(meth)acrylate, polypropylene glycol mono(meth)acrylate, and phenoxyethyl(meth)acrylate; compounds that are obtained by adding ethylene oxide or propylene oxide to a polyfunctional alcohol and then (meth)acrylating the resultant, such as polyethylene glycol di(meth)acrylate, trimethylolethane tri(meth)acrylate, neopentyl glycol di(meth)acrylate, ipentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl) ether, tri(acryloyloxyethyl) isocyanurate, glycerin, and trimethylolethane; urethane(meth)acrylates disclosed in JP1973-41708B (JP-S48-41708B), JP1975-6034B (JP-S50-6034B), and JP1976-37193A (JP-S51-37193A); polyester acrylates disclosed in JP1973-64183A (JP-S48-37093A), JP1974-43191B (JP-S49-43191B), and JP1977-30490B (JP-S52-30490B); polyfunctional acrylate or methacrylate such as epoxy acrylates as products of a reaction between an epoxy resin and (meth)acrylic acid; and mixtures of these.

The above examples also include polyfunctional (meth)acrylate and the like that is obtained by reacting polyfunctional carboxylic acid with a compound having a cyclic ether such as glycidyl(meth)acrylate and an ethylenically unsaturated group.

In addition, as other preferable polymerizable compounds, compounds having a fluorene ring and di- or higher functional ethylenically unsaturated group disclosed in JP2010-160418A, JP2010-129825A, and JP4364216B, and a cardo resin can also be used.

Moreover, as the compound that has a boiling point of 100° C. or higher under normal pressure and has at least one addition-polymerizable ethylenically unsaturated group, compounds disclosed in JP2008-292970A, Paragraphs 0254 to 0257 are also suitable.

In addition to the above, radically polymerizable monomers represented by the following General Formulae (MO-1) to (MO-5) can also be used. In the formulae, when T is an oxyalkylene group, the terminal at a carbon atom side binds to R.

[Chem. 73]

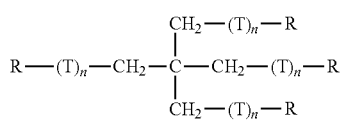
(MO-1)

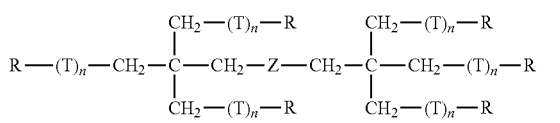
(MO-2)

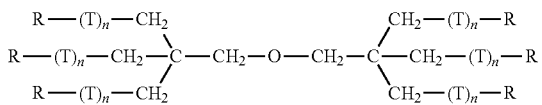
(MO-3)

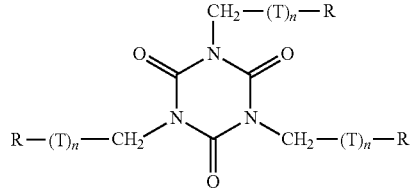
(MO-4)

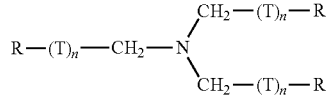
(MO-5)

[Chem. 74]

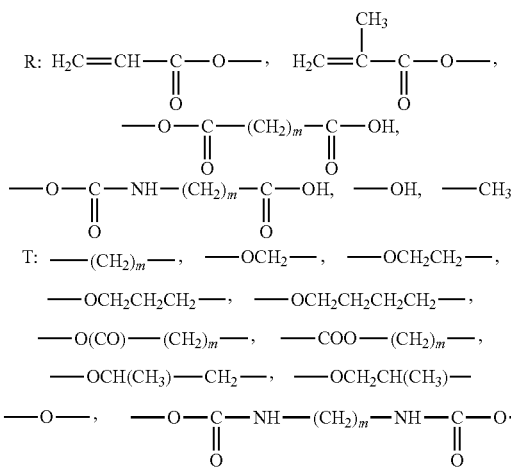

In the General Formula, n represents 0 to 14, and m represents 1 to 8. Each of R and T present in the same molecule in a plural number may be the same as or different from each other.

In each of the polymerizable compounds represented by the General Formulae (MO-1) to (MO-5), at least one of the plural Rs represents a group represented by —OC(=O)CH=CH$_2$ or —OC(=O)C(CH$_3$)=CH$_2$.

As specific examples of the polymerizable compounds represented by the General Formulae (MO-1) to (MO-5), compounds disclosed in JP2007-269779A, Paragraphs 0248 to 0251 can be suitably used in the present invention.

In addition, a compound that is obtained by adding ethylene oxide or propylene oxide to the polyfunctional alcohol and then (meth)acrylating the resultant, which is disclosed in JP1998-62986A (JP-H10-62986A) as General Formulae (1) and (2) together with the specific examples thereof can also be used as a polymerizable compound.

Among these, as the polymerizable compound, dipentaerythritol acrylate (KAYARAD D-330 as a commercially available product; manufactured by NIPPON KAYAKU Co., Ltd.), dipentaerythritol tetraacrylate (KAYARAD D-320 as a commercially available product; manufactured by NIPPON KAYAKU Co., Ltd.), dipentaerythritol penta (meth)acrylate (KAYARAD D-310 as a commercially available product; manufactured by NIPPON KAYAKU Co., Ltd.), dipentaerythritol hexa(meth)acrylate (KAYARAD DPHA as a commercially available product; manufactured by NIPPON KAYAKU Co., Ltd.), and a structure in which ethylene glycol or propylene glycol is interposed between these (meth)acryloyl groups are preferable. Oligomer type of these can also be used. Preferable embodiments of the polymerizable compound will be shown below.

The polymerizable compound is a polyfunctional monomer and may have an acid group such as a carboxyl group, a sulfonic acid group, or a phosphoric acid group. If an ethylenic compound has an unreacted carboxyl group as in a case where the ethylene compound is a mixture described above, this compound can be used as is. However, if necessary, a hydroxyl group of the above ethylenic compound may be reacted with an aromatic carboxylic anhydride so as to introduce an acid group. In this case, specific examples of the aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, a polyfunctional monomer is preferable which is an ester obtained between an aliphatic polyhydroxy compound and an unsaturated carboxylic acid and obtains an acid group by reacting an unreacted hydroxyl group of the aliphatic polyhydroxy compound with a non-aromatic carboxylic anhydride.

Particularly, a monomer in which the aliphatic polyhydroxy compound in the ester is pentaerythritol and/or dipentaerythritol is preferable. Examples of commercially available products thereof include M-510, M-520, or the like which is a polybasic modified acryl oligomer manufactured by TOAGOSEI, CO., LTD.

These monomers may be used alone, but since it is difficult to use a single compound in production, two or more kinds thereof may be used as a mixture. Moreover, a polyfunctional monomers not having an acid group and a polyfunctional monomer having an acid group may be used concurrently as the monomer.

The acid value of the polyfunctional monomer having an acid group is preferably 0.1 mgKOH/g to 40 mgKOH/g and particularly preferably 5 mgKOH/g to 30 mgKOH/g. If the acid value of the polyfunctional monomer is too low, characteristics of development solubility deteriorate. If the acid value is too high, difficulty is caused in production and handleability, so a photopolymerization performance deteriorates, which leads to deterioration of curability such as surface smoothness of pixels. Therefore, when two or more kinds of polyfunctional monomers having different acid groups are used concurrently, or when a polyfunctional monomer not having an acid group is used concurrently, it is preferable to adjust the acid value such that the acid value of the whole polyfunctional monomers falls within the above range.

In addition, an embodiment is also preferable in which the coloring composition contains a polyfunctional monomer having a caprolactone structure, as the polymerizable monomer.

The polyfunctional monomer having a caprolactone structure is not particularly limited as long as this monomer has a caprolactone structure in its molecule, and examples thereof include ε-caprolactone-modified polyfunctional (meth)acrylates that are obtained by esterifying polyols such as trimethylolethane, ditrimethylolethane, trimethylolpropane, ditrimethylolpropane, pentaerythritol, dipentaerythritol, tripentaerythritol, glycerin, diglycerol, and trimethylolamine with (meth)acrylic acid and ε-caprolactone. Among these, a polyfunctional monomer having a caprolactone structure represented by the following General Formula (Z-1) is preferable.

[Chem. 75]

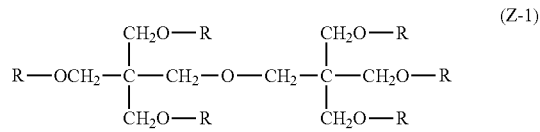

(Z-1)

In General Formula (Z-1), all of six Rs are a group represented by the following General Formula (Z-2). Alternatively, one to five of six Rs are a group represented by the following General Formula (Z-2), and the remainder is a group represented by the following General Formula (Z-3).

[Chem. 76]

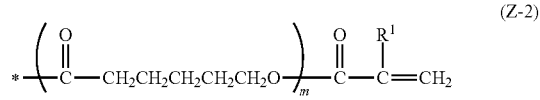

(Z-2)

In General Formula (Z-2), $R^1$ represents a hydrogen atom or a methyl group, m represents a number 1 or 2, and "*" represents a bond.

[Chem. 77]

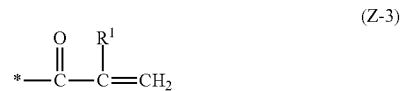

(Z-3)

In General Formula (Z-3), $R^1$ represents a hydrogen atom or a methyl group, and "*" represents a bond.

The polyfunctional monomer having such a caprolactone structure is commercially available from NIPPON KAYAKU Co., Ltd., as a KAYARAD DPCA series, and examples thereof include DPCA-20 (a compound in which m=1 in the Formulae (1) to (3), the number of the group represented by Formula (2)=2, and all of $R^1$s are hydrogen atoms), DPCA-30 (a compound in which m=1 in the Formulae (1) to (3), the number of the group represented by Formula (2)=3, and all of $R^1$s are hydrogen atoms), DPCA-60 (a compound in which m=1 in the Formulae (1) to (3), the number of the group represented by Formula (2)=6, and all of $R^1$s are hydrogen atoms), DPCA-120 (a compound in which m=2 in the Formulae (1) to (3), the number of the group represented by Formula (2)-6, and all of $R^1$s are hydrogen atoms), and the like.

In the present invention, the polyfunctional monomer having a caprolactone structure can be used alone or used as a mixture of two or more kinds thereof.

In addition, the specific monomer in the present invention is preferably at least one kind selected from a group of compounds represented by the following General Formula (Z-4) or (Z-5).

[Chem. 78]

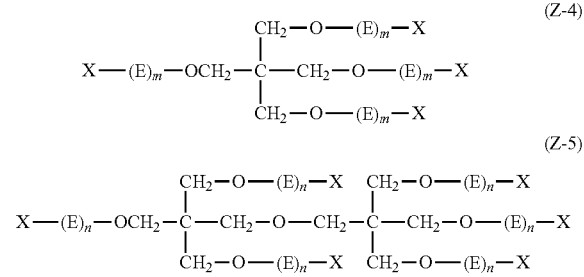

In the General Formulae (Z-4) and (Z-5), each E independently represents —((CH$_2$)yCH$_2$O)— or —((CH$_2$)yCH(CH$_3$)O)—, each y independently represents an integer of 0 to 10, and each X independently represents an acryloyl group, a methacryloyl group, a hydrogen atom, or a carboxyl group.

In the General Formula (Z-4), the sum of the acryloyl group and the methacryloyl group is 3 or 4, each m independently represents an integer of 0 to 10, and the sum of each m is an integer of 0 to 40. Here, when the sum of each m is 0, one of Xs is a carboxyl group.

In the General Formula (Z-5), the sum of the acryloyl group and the methacryloyl group is 5 or 6, each n independently represents an integer of 0 to 10, and the sum of each n is an integer of 0 to 60. Here, when the sum of each n is 0, one of Xs is a carboxyl group.

In the General Formula (Z-4), m is preferably an integer of 0 to 6 and more preferably an integer of 0 to 4.

Moreover, the sum of each m is preferably an integer of 2 to 40, more preferably an integer of 2 to 16, and particularly preferably an integer of 4 to 8.

In the General Formula (Z-5), n is preferably an integer of 0 to 6 and more preferably an integer of 0 to 4.

Moreover, the sum of each n is preferably an integer of 3 to 60, more preferably an integer of 3 to 24, and particularly preferably an integer of 6 to 12.

In addition, —((CH$_2$)yCH$_2$O)— or —((CH$_2$)yCH(CH$_3$)O)— in the General Formula (Z-4) or (Z-5) is preferably in the form in which the terminal at a carbon atom side binds to X.

The compound represented by the General Formula (Z-4) or (Z-5) may be used alone, or two or more kinds thereof may be used concurrently. Particularly, in General Formula (Z-5), a form is preferable in which all of six Xs are acryloyl groups.

The total content of the compound represented by General Formula (Z-4) or (Z-5) in the polymerizable compound is preferably 20% by mass or more and more preferably 50% by mass or more.

The compound represented by the General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, so a person skilled in the related art can easily synthesize the compound represented by General Formula (Z-4) or (Z-5).

Among the compounds represented by the General Formula (Z-4) or (Z-5), a pentaerythritol derivative and/or dipentaerythritol derivative are/is more preferable.

Specific examples thereof include compounds (hereinafter, also referred to as example compounds (a) to (f)) represented by the following Formulae (a) to (f), and among these, examples compounds (a), (b), (e), and (f) are preferable.

[Chem. 79]

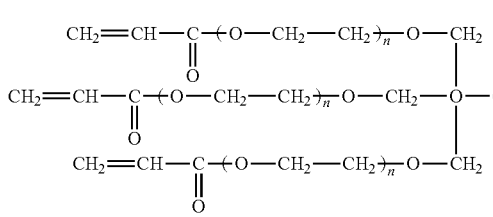 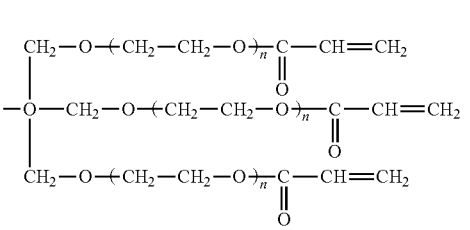

(a)

(sum of each $n$ is 6)

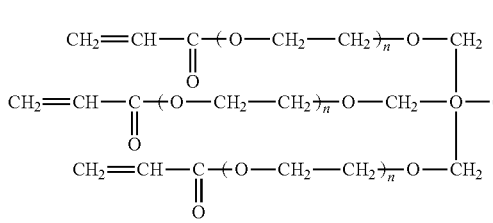 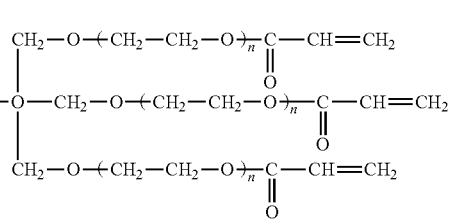

(b)

(sum of each $n$ is 12)

-continued

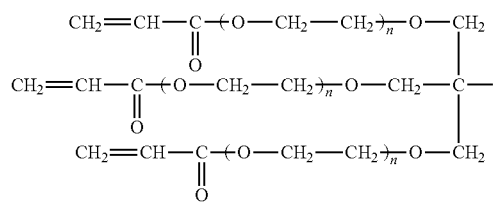
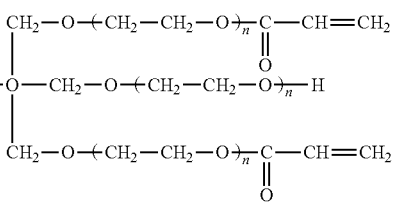

(c)

(sum of each n is 12)

[Chem. 80]

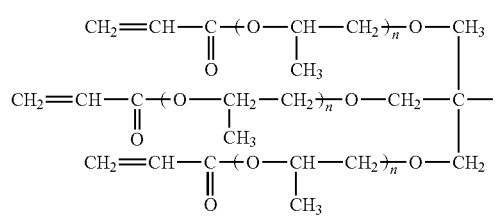
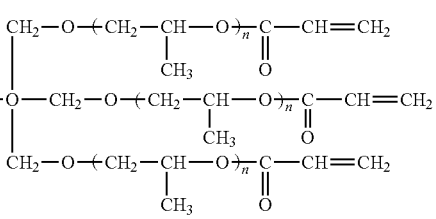

(d)

(sum of each n is 6)

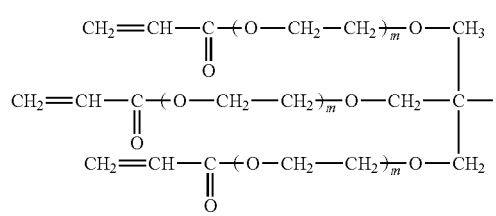

(e)

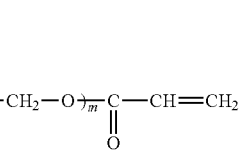

(sum of each m is 4)

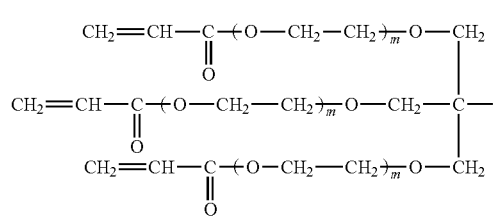

(f)

(sum of each m is 12)

Examples of commercially available products of the polymerizable compound represented by General Formulae (Z-4) and (Z-5) include SR-494 manufactured by Sartomer, which is tetrafunctional acrylate having four ethyleneoxy chains, DPCA as hexafunctional acrylate having six pentyleneoxy chains and TPA-33 as trifunctional acrylate having three isobutyleneoxy chains, which are manufactured by NIPPON KAYAKU Co., Ltd., and the like.

In addition, as the polymerizable compound, urethane acrylates disclosed in JP1973-41708B (JP-S48-41708B), JP1976-37193A (JP-S51-37193A), JP1990-32293B (JP-H2-32293B), and JP1990-16765B (JP-H2-16765B) or urethane compounds having an ethylene oxide-based skeleton disclosed in JP1983-49860B (JP-S58-49860B), JP1981-17654B (JP-S56-17654B), JP1987-39417B (JP-S62-39417B), and JP1987-39418B (JP-S62-39418B) are also suitable. Moreover, if addition-polymerizable compounds having an amino structure or a sulfide structure in a molecule, which are disclosed in JP1988-277653A (JP-S63-277653A), JP1988-260929A (JP-S63-260909A), and JP1989-105238A (JP-H1-105238A), are used as the polymerizable compound, a curable composition which extremely excellent in photosensitization speed can be obtained.

Examples of commercially available products of the polymerizable compound include urethane oligomers UAS-10 and UAB-140 (manufactured by Sanyo-Kokusaku Pulp, Co., Ltd.), "UA-7200" (manufactured by Shin-Nakamura Chemical Co., Ltd.), DPHA-40H (NIPPON KAYAKU Co., Ltd.), UA-306H, UA-306T, AH-600, T-600, and AI-600 (manufactured by KYOEISHA CHEMICAL Co., LTD.), and the like.

Details of how to use these polymerizable compounds, such as the structure, whether the polymerizable compounds are used alone or used concurrently, and the amount of the polymerizable compounds added, can be arbitrarily set according to the final performance of the coloring composition designed. For example, in view of sensitivity, a structure in which the content of an unsaturated group per molecule is large is preferable, and in many cases, a bi- or higher functional group is preferable. Moreover, in view of enhancing the strength of cured colored film, a tri- or higher functional group is preferable. In addition, a method of adjusting both the sensitivity and strength by concurrently using compounds that differ in the number of functional groups and have different polymerizable groups (for example, an acrylic acid ester, a methacrylic acid ester, a styrene-based compound, and a vinylether based compound) is also effective. Furthermore, it is preferable to concurrently use tri- or higher functional polymerizable compounds differing in the length of an ethylene oxide chain since the developability of a coloring composition can be adjusted, and an excellent pattern formability is obtained in this manner.

In addition, in the respect of the compatibility between the polymerizable compound and other components (for example, a photopolymerization initiator, a substance to be dispersed, and alkali-soluble resin) contained in the coloring composition and dispersibility, how to select and use the polymerizable compound is an important factor. For example, if a low-purity compound is used, or two or more kinds thereof are used concurrently, the compatibility can be improved. Moreover, in view of improving adhesiveness of the coloring composition to a hard surface of a support and the like, specific structures may be selected.

The content of the polymerizable compound in the coloring composition of the present invention is preferably 0.1% by mass to 90% by mass, more preferably 1.0% by mass to 50% by mass, and particularly preferably 2.0% by mass to 30% by mass, based on the total solid contents of the coloring composition.

[(D) Photopolymerization Initiator]

It is preferable that the coloring composition of the present invention further contain a photopolymerization initiator, in view of improving sensitivity.

The photopolymerization initiator can be appropriately selected from known photopolymerization initiators without particular limitation, as long as the photopolymerization initiator has a function of initiating polymerization of the polymerizable compound. For example, photopolymerization initiators sensitive to light beams in a range from ultraviolet region to visible light are preferable. In addition, the photopolymerization initiator may be either an activator that interacts with a photo-excited sensitizer in any way and generates active radicals or an initiator that initiates cationic polymerization according to the type of monomer.

The photopolymerization initiator preferably contains at least one kind of compound having at least a molecular extinction coefficient of about 50 in a range of from about 300 nm to about 800 nm (more preferably 330 nm to 500 nm).

Examples of the photopolymerization initiator include halogenated hydrocarbon derivatives (for example, a derivative having a triazine skeleton, a derivative having an oxadiazole skeleton, and the like), acyl phosphine compounds such as acyl phosphine oxide, oxime compounds such as hexaaryl biimidazole, and oxime derivatives, organic peroxide, thio compounds, ketone compounds, aromatic onium salts, ketoxime ether, aminoacetophenone compounds, hydroxyacetophenone, and the like.

In addition, in view of exposure sensitivity, a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, 3-aryl-substituted coumarin compound is preferable.

More preferably, at least one kind of compound that is a trihalomethyl triazine compound, an α-aminoketone compound, an acyl phosphine compound, a phosphine oxide compound, an oxime compound, a triallyl imidazole dimer, an onium compound, a benzophenone compound, or an acetophenone compound and selected from a group consisting of a trihalomethyl triazine compound, an α-aminoketone compound, an oxime compound, a triallyl imidazole dimer, and a benzophenone compound is most preferable.

Particularly, when the coloring composition of the present invention is used for preparing a color filter of a solid-state imaging device, in view of forming a fine pattern in a sharp shape, it is preferable that the pattern have curability and be developed without residues in an unexposed portion. From this viewpoint, it is particularly preferable to use an oxime compound as a polymerization initiator. Particularly, when a fine pattern is formed in the solid-state imaging device, stepper exposure is used for exposure for curing. However, the exposure machine used at this time is damaged by halogen in many cases, so the amount of a polymerization initiator added needs to be suppressed to low. In consideration of this point, for forming a fine pattern for a solid-state imaging device, it is most preferable to use an oxime compound as (D) a photopolymerization initiator.

Examples of the halogenated hydrocarbon compound having a triazine skeleton include the compound disclosed in Wakabayashi et al., Bull. Chem. Soc. Japan, 42, 2924 (1969), the compound disclosed in UK1388492B, the compound disclosed in JP1978-133428A (JP-S53-133428A), the compound disclosed in GE3337024B, the compound disclosed in F. C. Schaefer et al., J. Org. Chem.; 29, 1527 (1964), the compound disclosed in JP1987-58241A (JP-S62-58241A), the compound disclosed in JP1993-281728A (JP-H5-281728A), the compound disclosed in JP1993-34920A (JP-H5-34920A), the compound disclosed in U.S. Pat. No. 4,212,976A, and the like.

Examples of the compound disclosed in the U.S. Pat. No. 4,212,976A include compounds having an oxadiazole skeleton (for example, 2-trichloromethyl-5-phenyl-1,3,4-oxadiazole,
2-trichloromethyl-5-(4-chlorophenyl)-1,3,4-oxadiazole,
2-trichloromethyl-5-(1-naphthyl)-1,3,4-oxadiazole,
2-trichloromethyl-5-(2-naphthyl)-1,3,4-oxadiazole,
2-tribromomethyl-5-phenyl-1,3,4-oxadiazole,
2-tribromomethyl-5-(2-naphthyl)-1,3,4-oxadiazole;
2-trichloromethyl-5-styryl-1,3,4-oxadiazole,
2-trichloromethyl-5-(4-chlorostyryl)-1,3,4-oxadiazole,
2-trichloromethyl-5-(4-methoxystyryl)-1,3,4-oxadiazole,
2-trichloromethyl-5-(1-naphthyl)-1,3,4-oxadiazole,
2-trichloromethyl-5-(4-n-butoxystyryl)-1,3,4-oxadiazole, and
2-trichloromethyl-5-styryl-1,3,4-oxadiazole) and the like.

In addition, examples of photopolymerization initiators other than the above include acridine derivatives (for example, 9-phenylacridine and 1,7-bis(9,9'-acridinyl)heptane), N-phenylglycine, polyhalogen compounds (for example, carbon tetrabromide, phenyl tribromomethyl sulfone, and phenyl trichloromethyl ketone), coumarins (for example, 3-(2-benzofuranoyl)-7-dietmylaminocoumarin, 3-(2-benzofuroyl)-7-(1-pyrrolidinyl)coumarin, 3-benzoyl-7-diethylaminocoumarin, 3-(2-methoxybenzoyl)-7-di ethylaminocoumarin, 3-(4-dimethylaminobenzoyl)-7-diethylaminocoumarin, 3,3'-carbonyl bis(5,7-di-n-propoxycoumarin), 3,3'-carbonyl bis(7-diethylaminocoumarin), 3-benzoyl-7- methoxycoumarin, 3-(2-furoyl)-7-di ethyl aminocoumarin, 3-(4-diethylaminocinnamoyl)-7-di ethyl aminocoumarin, 7-methoxy-3-(3-pyridylcarbonyl)coumarin, 3-benzoyl-5,7-dipropoxycoumarin, 7-benzotriazol-2-ylcoumarin, and coumarin compounds disclosed in JP1993-19475A (JP-H5-19475 A), JP1995-271028A (JP-H7-271028A), JP2002-363206A, JP2002-363207A, JP2002-363208A, JP2002-363209A, and the like), acyl phosphine oxides (for example, bis(2,4,6-trimethylbenzoyl)-phenyl phosphine oxide, bis(2,6-dimethoxybenzoyl)-2,4,4-trimethyl-pentylphenyl phosphine oxide, and Lucirin TPO), metallocenes (for example, bis(η5-2,4-cyclopentadien-1-yl)-bis(2,6-difluoro-3-(1H-pyrrol-1-yl)-phenyl)titanium, and η5-cyclopentadienyl-η6-cumenyl-iron(1+)-hexafluorophosphate(1−)), the compounds disclosed in JP1978-133428A (JP-S53-133428A), JP1982-1819B (JP-S57-1819B), JP1982-6096B (JP-S57-6296B), and U.S. Pat. No. 3,615,455A, and the like.

Examples of the ketone compounds include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetramethyl ester thereof, 4,4'-bis(dialkylamino)benzophenones (for example, 4,4'-bis(dimethylamino)benzophenone, 4,4'-bis(dicyclohexylamino)benzophenone, 4,4'-bis(diethylamino)benzophenone, 4,4'-bis(hydroxyethylamino)benzophenone, 4-methoxy-4'-dimethylaminobenzophenone, 4,4'-dimethoxybenzophenone, 4-dimethylaminobenzophenone, and 4-dimethylaminoacetophenone), benzyl, anthraquinone, 2-t-butylanthraquinone, 2-methyl anthraquinone, phenanthraquinone, xanthone, 2-chloro-thioxanthone, 2,4-diethyl-thioxanthone, fluorenone, 2-benzyl-dimethylamino-1-(4-morpholinophenyl)-1-butanone, 2-methyl-1-[4-(methylthio)phenyl]-2-morpholino-1-propanone, a 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, and benzyl dimethyl ketal), acridone, chloroacridone, N-methylacridone, N-butylacridone, N-butyl-chloroacridone, and the like.

As the photopolymerization initiator, a hydroxyacetophenone compound, an aminoacetophenone compound, and an acyl phosphine compound can also be suitably used. More specifically, for example, the aminoacetophenone-based initiator disclosed in JP1998-291969A (JP-H10-291969A), and the acyl phosphine oxide-based initiator disclosed in JP4225898B can also be used.

As the hydroxyacetophenone-based initiator, IRGACURE-184, DAROCUR-1173, IRGACURE-500, IRGACURE-2959, and IRGACURE-127 (product names, all manufactured by BASF) can be used. As the aminoacetophenone-based initiator, IRGACURE-907, IRGACURE-369, and IRGACURE-379 (product names, all manufactured by BASF) which are commercially available products can be used. In addition, as the aminoacetophenone-based initiator, the compound disclosed in JP2009-191179A, of which an absorption wavelength matches with a light source of a long wavelength of 365 nm, 405 nm, or the like can be used. Moreover, as the acyl phosphine oxide-based initiator, IRGACURE-819 or DAROCUR-TPO (product name, all manufactured by BASF) which are commercially available products can be used.

Examples of the photopolymerization initiator more preferably include oxime compounds. Specific examples of the oxime compounds include the compound disclosed in JP2001-233842A, the compound disclosed in JP2000-80068A, and the compound disclosed in JP2006-342166A can be used.

Examples of the oxime compound such as an oxime derivative that is suitably used as the photopolymerization initiator in the present invention include 3-benzoyloxyiminobutan-2-one, 3-acetoxyiminobutan-2-one, 3-propionyloxyiminobutan-2-one, 2-acetoxyiminobutan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like.

Examples of the oxime ester compound include the compounds disclosed in J. C. S. Perkin II (1979), pp 1653-1660, J. C. S. Perkin II (1979), pp 156-162, Journal of Photopolymer Science and Technology (1995), pp 202-232, and JP2000-66385A, and the compounds disclosed respectively in JP2000-80068A, JP2004-534797A, and JP2006-342166A.

As commercially available products, IRGACURE-OXE01 and IRGACURE-OXE02 (manufactured by BASF) are also suitably used.

As oxime ester compounds other than the above, the compound disclosed in JP2009-519904A in which oxime is linked to an N-position of carbazole, the compound disclosed in U.S. Pat. No. 7,626,957B in which a heterosubstituent is introduced in a benzophenone moiety, the compounds disclosed in JP2010-15025A and US2009/292039A in which a nitro group is introduced to a dye moiety, the ketoxime compound disclosed in WO2009/131189A, the compound disclosed in U.S. Pat. No. 7,556,910B that contains a triazine skeleton and an oxime skeleton in the same molecule, the compound disclosed in JP2009-221114A that exhibits maximum absorption at 405 nm and exhibits excellent sensitivity to a light source of a g-ray, and the like may be used.

More preferably, the cyclic oxime compounds disclosed in JP2007-231000A and JP2007-322744A can also be suitably used. Among the cyclic oxime compounds, the cyclic oxime compounds condensed to a carbazole dye, which are disclosed in JP2010-32985A and JP2010-185072A, have a high degree of light absorptivity and are preferable in view of high degree of sensitization.

In addition, the compound disclosed in JP2009-242469A that is an oxime compound having an unsaturated bond in a specific moiety can also be suitably used since this compound can achieve high degree of sensitization by reproducing active radicals from polymerization-inactive radicals.

Most preferably, examples of the oxime compounds include the oxime compound having a specific substituent described in JP2007-269779A and the oxime compound having a thioaryl group described in JP2009-191061A.

Specifically, the oxime polymerization initiator is preferably a compound represented by the following General Formula (OX-1). In addition, an N—O bond of oxime may be an oxime compound of an (E) isomer, an oxime compound of a (Z) isomer, or a mixture of the (E) isomer and the (Z) isomer.

[Chem. 81]

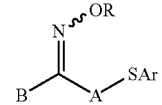

(OX-1)

In General Formula (OX-1), each of R and B independently represents a monovalent Substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, an arylthiocarbonyl group, and the like. In addition, these groups may have one or more substituents. Moreover, the above substituents may be further substituted with other substituents.

Examples of the substituents include a halogen atom, an aryloxy group, an alkoxycarbonyl group, an aryloxycarbonyl group, an acyloxy group, an acyl group, an alkyl group, an aryl group, and the like.

The alkyl group is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacy group, 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, an octaphenyl group, an o-tolyl group, an m-tolyl group, a p-tolyl group, a xylyl group, an o-cumenyl group, an m-cumemyl group, a p-cumenyl group, a mesityl group, a pentalenyl group, a binaphthalenyl group, a ternaphthalenyl group, an octanaphthalenyl group, a heptalenyl group, biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, an octaanthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the heterocyclic group, aromatic or aliphatic heterocycles including a nitrogen atom, an oxygen atom, a sulfur atom, or a phosphorus atom are preferable.

Specific examples of the heterocyclic group include a thienyl group, a benzo[b]thienyl group, a naphtho[2,3-b] thienyl group, a thianthrenyl group, a furyl group, a pyranyl group, an isobenzofuranyl group, a chromenyl group, a xanthenyl group, a phenoxathienyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthrydinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantholyl group.

Specific examples of the alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenythiocarbonyl group.

In General Formula (OX-1), the monovalent substituent represented by B represents an aryl group, a heterocyclic group, an arylcarbonyl group, or a heterocyclic carbonyl group. In addition, these groups may have one or more substituents, and examples of the substituents include the substituents described above. Moreover, the substituents described above may be further substituted with other substituents.

Among these, the following structures are particularly preferable.

In the following structure, each of Y, X, and in have the same definition as that of Y, X, and n in General Formula (OX-2) described later, and the preferable examples thereof are also the same.

[Chem. 82]

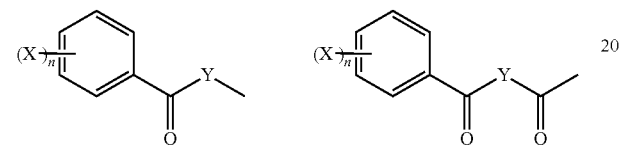

In the General Formula (OX-1), examples of the divalent organic group represented by A include an alkylene group having 1 to 12 carbon atoms, a cycloalkylene group, and an alkynylene group, and these groups may have one or more substituents. Examples of the substituents include the substituents described above. In addition, the substituents described above may further substituted with other substituents.

Among these, as A in Formula (OX-1), an unsubstituted alkylene group, an alkylene group substituted with an alkyl group (for example, a methyl group, an ethyl group, a tert-butyl group, or a dodecyl group), an alkylene group substituted with an ankenyl group (for example, a vinyl group or an allyl group), and an alkylene group substituted with an aryl group (for example, a phenyl group, a p-tolyl group, a xylyl group, a cumenyl group, a naphthyl group, an anthryl group, a phenanthryl group, or a styryl group) are preferable in view of improving sensitivity and inhibiting coloring caused by elapse of time during beating.

In the Formula (OX-1), the aryl group represented by Ar is preferably an aryl group having 6 to 30 carbon atoms, and may have a substitutent. Examples of the substituent include the satire ones as the substituents exemplified above as specific examples of the aryl group that may have a substituent and introduced to the substituted aryl group.

Among these, in view of improving sensitivity and inhibiting coloring caused by elapse of time during heating, a substituted or unsubstituted phenyl group is preferable.

In Formula (OX-1), a structure "SAr" that is formed of Ar and S adjacent thereto in the Formula (OX-1) is preferably the following structure, in view of sensitivity. In addition, Me represents a methyl group, and Et represents an ethyl group.

[Chem. 83]

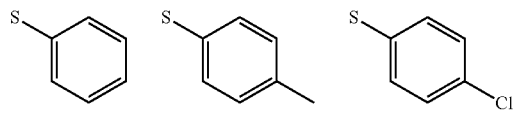

-continued

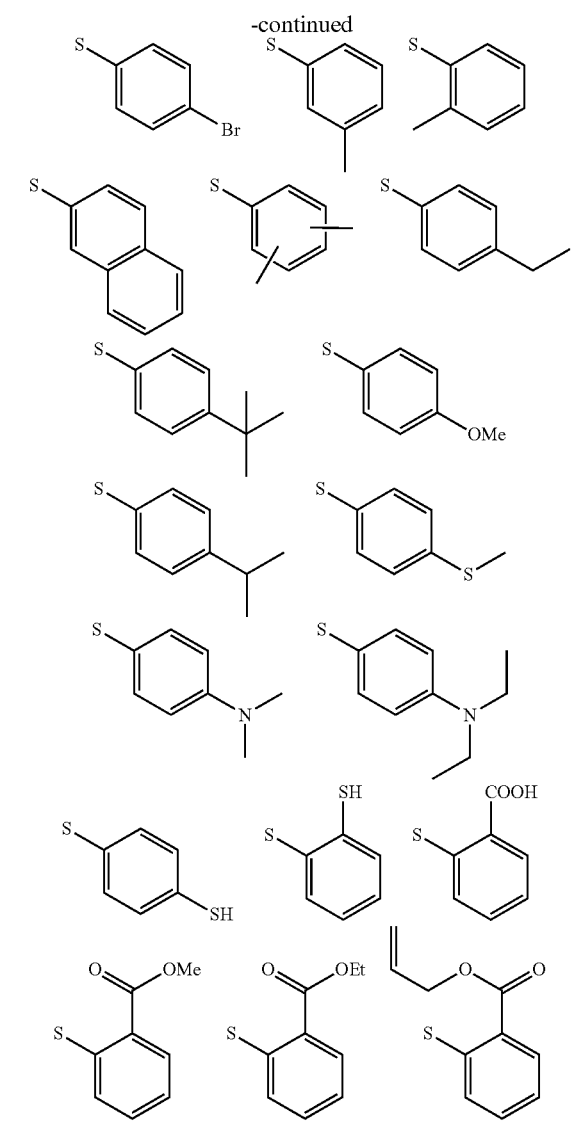

The oxime compound is preferably a compound represented by the following General Formula (OX-2).

[Chem. 84]

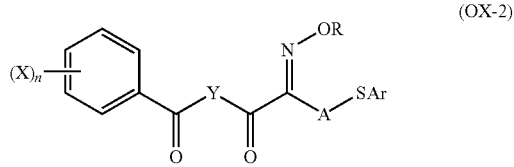

(OX-2)

In General Formula (OX-2), each of R and X independently represents a monovalent substituent, each of A and Y independently represents a divalent organic group, Ar represents an aryl group, and n represents an integer of 0 to 5. R, A, and Ar in General Formula (OX-2) have the same definition as that of R, A, and Ar in General Formula (OX-1), and the preferable examples thereof are also the same.

Examples of the monovalent substituent represented by X in General Formula (OX-2) include an alkyl group, an aryl group, an alkoxy group, an aryloxy group, an acyloxy group, an acyl group, an alkoxycarbonyl group, an amino group, a heterocyclic group, and a halogen atom. In addition, these groups may have one or more substituents, and examples of the substituents include the substituents described above. Moreover, the substituents described above may be further substituted with other substituents.

Among these, X in General Formula (OX-2) is preferably an alkyl group, in view of improving solvent solubility and absorption efficiency in a long-wavelength region.

In addition, n in Formula (OX-2) represents an integer of 0 to 5 and preferably represents an integer or 0 to 2.

Examples of the divalent organic group represented by Y in General Formula (OX-2) include the following structures. In the following groups, "*" represents a position where Y binds to an adjacent carbon atom in the Formula (OX-2).

[Chem. 85]

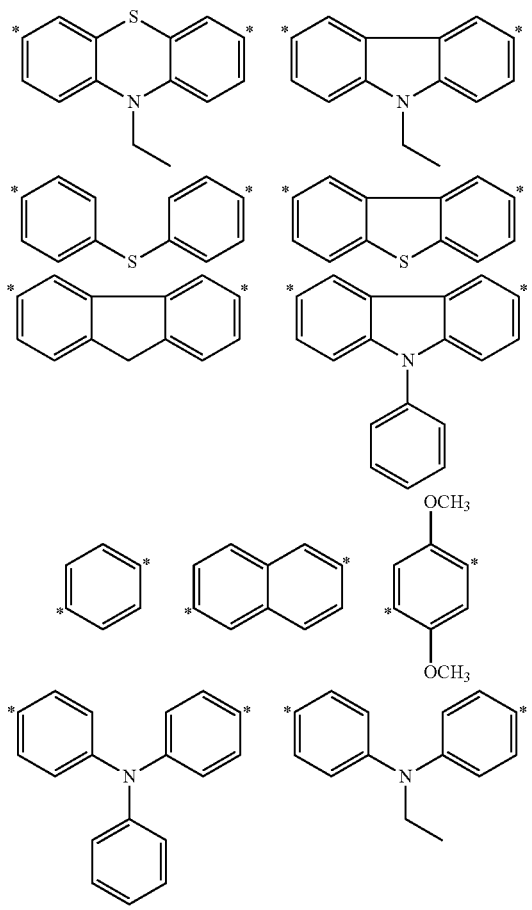

Among these, the following structures are preferable in view of a high degree of sensitization.

[Chem. 86]

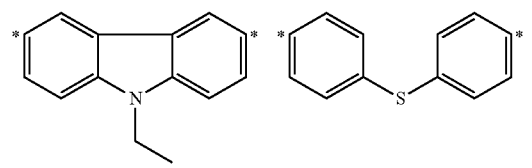

In addition, the oxime compound is preferably a compound represented by the following General Formula (OX-3) or (OX-4).

[Chem. 87]

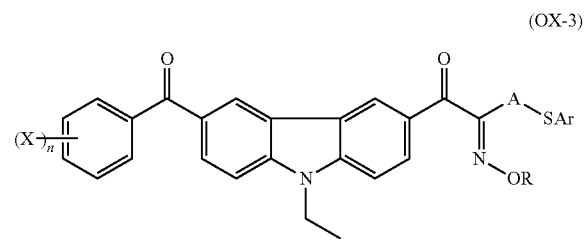

(In the General Formulae (OX-3) and (OX-4), each of R and X independently represents a monovalent substituent, A represents a divalent organic group, Ar represents an aryl group, an n represents an integer of 0 to 5.)

Each of R, X. A, Ar, and n in Formulae (OX-3) and (OX-4) has the same definition as that of R, X, A, Ar, and n in the General Formula (OX-2), and the preferable examples thereof are also the same.

Specific examples (C-4) to (C-13) of the oxime compound used suitably will be shown below, but the present invention is not limited thereto.

[Chem. 88]

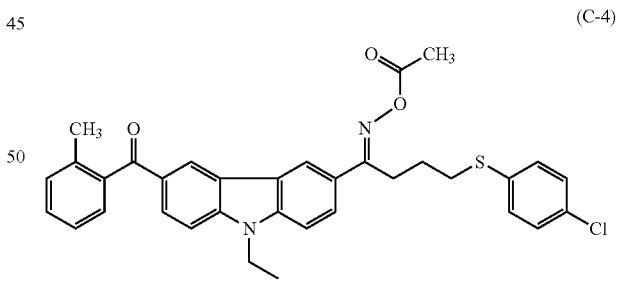

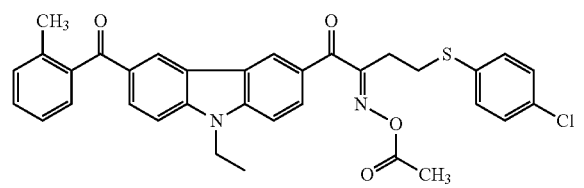

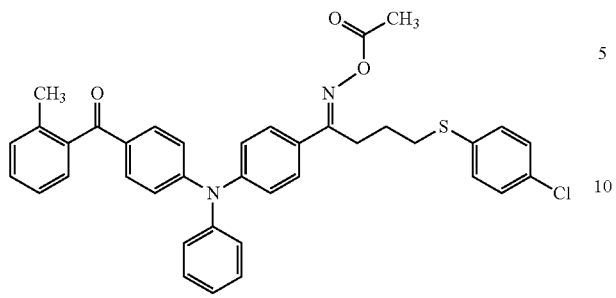

(C-6)

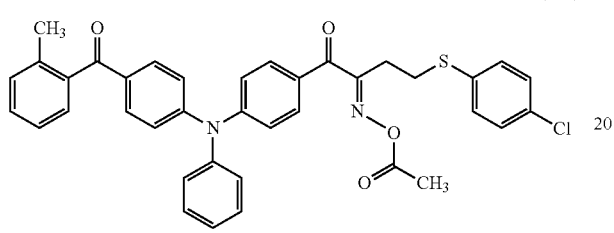

(C-7)

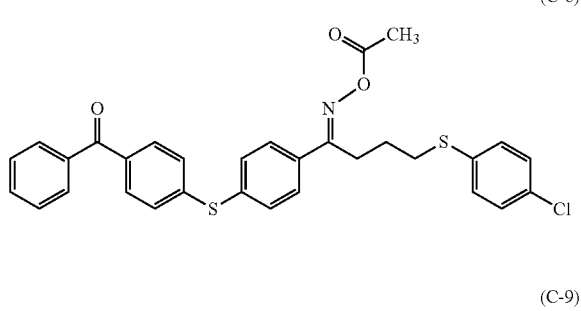

(C-8)

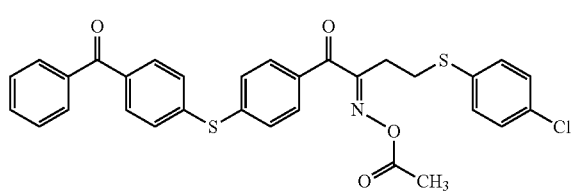

(C-9)

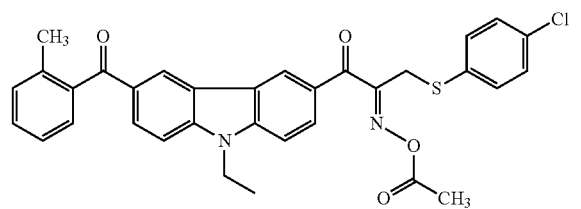

(C-10)

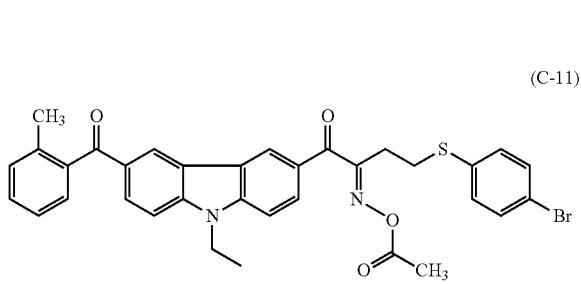

(C-11)

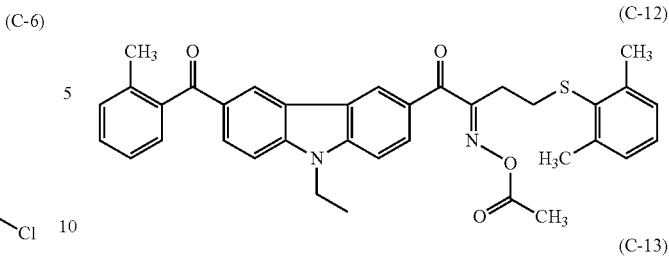

(C-12)

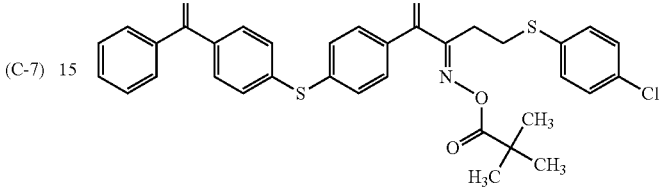

(C-13)

The oxime compound has a maximum absorption wavelength in a wavelength region of 350 nm to 500 nm and preferably in a wavelength region of 360 nm to 480 nm, and an oxime compound showing a high absorbance at 365 nm and 405 nm is particularly preferable.

The molar extinction coefficient at 356 nm or 405 nm of the oxime compound is preferably 1,000 to 300,000, and more preferably 2,000 to 300,000, and particularly preferably 5,000 to 200,000, in view of sensitivity.

The molar extinction coefficient of a compound can be measured using a known method. Specifically, the molar extinction coefficient is preferably measured with, for example, an ultraviolet and visible light spectrophotometer (Cary-5 spectrophotometer manufactured by Varian) by using an ethyl acetate solvent at a concentration of 0.01 g/L.

The photopolymerization initiator used in the present invention may optionally be used in combination of two or more kinds thereof.

The content of (D) a photopolymerization initiator contained in the coloring composition of the present invention is preferably from 0.1% by mass to 50% by mass, more preferably from 0.5% by mass to 30% by mass, and even more preferably from 1% by mass to 20% by mass, based on the total solid contents of the coloring composition. Better sensitivity and pattern formability are obtained in this range.

[(E) Alkali-Soluble Resin]

The coloring composition of the present invention preferably further contains (E) an alkali-soluble resin.

The alkali-soluble resin is a linear organic high-molecular weight polymer, and can be appropriately selected from alkali-soluble resins having at least one group promoting alkali solubility in a molecule (preferably, a molecule including an acrylic copolymer or a styrene-based copolymer as a main chain). In view of heat resistance, a polyhydroxystyrene-based resin, a polysiloxane-based resin, an acrylic resin, an acrylamide-based resin, and an acryl/acrylamide copolymer resin are preferable, and in view of controlling developability, an acrylic resin, an acrylamide-based resin, an acryl/acrylamide copolymer resin are preferable.

Examples of the group (hereinafter, also referred to as an "acid group") promoting alkali solubility include a carboxyl group, a phosphoric acid group, a sulfonic acid group, a phenolic hydroxyl group, and the like. The group promoting alkali solubility is preferably a group that is soluble in an organic solvent and can be developed by an aqueous weak alkaline solution, and preferable examples thereof include (meth)acrylic acid. The acid groups may be used alone or used in combination of two or more kinds thereof.

Examples of the monomer that can impart the acid group after polymerization include monomers having a hydroxyl group, such as 2-hydroxyethyl(meth)acrylate, monomers having an epoxy group, such as glycidyl(meth)acrylate, monomers having an isocyanate group, such as 2-isocyanate ethyl(meth)acrylate, and the like. The monomers for introducing these acid groups may be used alone or used in combination of two or more kinds thereof. In order to introduce the acid group to the alkali-soluble resin, for example, the monomer having the acid group and/or the monomer that can impart the acid group after polymerization (hereinafter, also referred to as a "monomer for introducing an acid group" in some cases) may be polymerized as a monomer component.

In addition, when the monomer that can impart the acid group after polymerization is used as a monomer component to introduce the acid group, for example, a treatment for imparting the acid group described later is necessary after polymerization.

To the production of the alkali-soluble resin, for example, a method implemented by known radical polymerization can be applied. Various polymerization conditions for producing the alkali-soluble resin by radical polymerization, such as temperature, pressure, the type and amount of radical initiators, and the type of solvents, can be easily set by a person skilled in the art, and the conditions can also be set experimentally.

As the linear organic high-molecular weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac resin, acidic cellulose derivatives having a carboxylic acid in a side chain, and a polymer obtained by adding acid anhydride to a polymer having a hydroxyl group. Particularly, a copolymer of a (meth)acrylic acid and another monomer copolymerizable with the (meth)acrylic acid is suitable as the alkali-soluble resin. Examples of the monomer copolymerizable with a (meth)acrylic acid include alkyl(meth)acrylate, aryl(meth)acrylate, vinyl compounds, and the like. Examples of the alkyl(meth)acrylate and aryl (meth)acrylate include methyl(meth)acrylate, ethyl(meth) acrylate, propyl(meth)acrylate, butyl(meth)acrylate, isobutyl(meth)acrylate, pentyl(meth)acrylate, hexyl(meth) acrylate, octyl(meth)acrylate, phenyl(meth)acrylate, benzyl (meth)acrylate, tolyl(meth)acrylate, naphthyl(meth)acrylate, cyclohexyl(meth)acrylate, and the like. Examples of the vinyl compounds include α-methylstyrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and the like. Examples of the N-position substituted maleimide monomer disclosed in JP1998-300922A (JP-H10-300922A) include N-phenylmaleimide, N-cyclohexylmaleimide, and the like. Other monomers that can be copolymerized with a (meth)acrylic acid may be used alone or used in combination of two or more kinds thereof.

As the alkali-soluble resin, a resin is preferable which contains a polymer (a) obtained by polymerizing a compound (hereinafter, referred to as an "ether dimer" in some cases) represented by the following General Formula (ED) as a monomer component.

[Chem. 89]

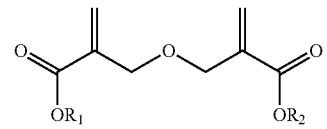

General Formula (ED)

In General Formula (ED), each of $R^1$ and $R^2$ independently represents a hydrogen atom or a hydrocarbon group having 1 to 25 carbon atoms that may have a substituent.

In this manner, the coloring composition of the present invention can form a cured coating film having extremely excellent heat resistance and transparency. In the General Formula (ED) represents the ether dimer, the hydrocarbon group having 1 to 25 carbon atoms that may have a substituent, which is represented by $R^1$ and $R^2$, is not particularly limited, and examples thereof include linear or branched alkyl groups such as methyl, ethyl, n-propyl, isopropyl, n-butyl, isobutyl, t-butyl, t-amyl, stearyl, lauryl, and 2-ethylhexyl; aryl groups such as phenyl; alicyclic groups such as cyclohexyl, t-butylcyclohexyl, cyclopentadienyl, tricyclodecanyl, isobornyl, adamantyl, and 2-methyl-2-adamantyl; alkyl groups substituted with alkoxy such as 1-methoxyethyl and 1-ethoxyethyl; alkyl groups substituted with an aryl group such as benzyl; and the like. Among these, substituents of primary or secondary carbon that are not easily eliminated by an acid or heat, such as methyl, ethyl, cyclohexyl, and benzyl, are preferable in view of heat resistance.

Specific examples of the ether dimer include
dimethyl-2,2'-[oxybis(methylene)]bis-2-propenoate,
diethyl-2,2'-[oxybis(methylene)]bis-2-propenoate,
di(n-propyl)-2,2'-[oxybis(methylene)]bis-2-propenoate,
di(isopropyl)-2,2'-[oxybis(methylene)]bis-2-propenoate,
di(n-butyl)-2,2-[oxybis(methylene)]bis-2-propenoate,
di(isobutyl)-2,2-[oxybis(methylene)]bis-2-propenoate,
di(t-butyl)-2,2'-[oxybis(methylene)]bis-2-propenoate,
di(t-amyl)-2,2'-[oxybis(methylene)]bis-2-propenoate,
di(stearyl)-2,2'-[oxybis(methylene)]bis-2-propenoate,
di(lauryl)-2,2'-[oxybis(methylene)]bis-2-propenoate,
di(2-ethylhexyl)-2,2'-[oxybis(methyl ene)]bis-2-propenoate,
di(1-methoxyethyl)-2,2'-[oxybis(methyl ene)]bis-2-propenoate,
di(1-ethoxyethyl)-2,2'-[oxybis(methylene)]bis-2-propenoate,
dibenzyl-2,2'-[oxybis(methylene)]bis-2-propenoate,
diphenyl-2,2'-[oxybis(methylene)]bis-2-propenoate,
dicyclohexyl-2,2'-[oxybis(methylene)]bis-2-propenoate,
di(t-butylcyclohexyl)-2,2'-[oxybis(methylene)]bis-2-propenoate,
di(cyclopentadienyl)-2,2'-[oxybis(methylene)]bis-2-propenoate,
di(tricyclodecanyl)-2,2'-[oxybis(methylene)]bis-2-propenoate,
di(isobornyl)-2,2'-[oxybis(methylene)]bis-2-propenoate,
diadamantyl-2,2'-[oxybis(methylene)]bis-2-propenoate,
di(2-methyl-2-adamantyl)-2,2'-[oxybis(methylene)]bis-2-propenoate, and the like. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used alone or used in combination of two or more kinds thereof. The structure derived from the compound represented by the General Formula (ED) may be copolymerized with other monomers.

In addition, in order to improve efficiency in crosslinking the coloring composition of the present invention, an alkali-soluble resin having a polymerizable group may be used. As the alkali-soluble resin having a polymerizable group, alkali-soluble resins and the like containing an allyl group, a (meth)acryl group, an allyloxyalkyl group, and the like in a side chain are useful. Examples of polymers containing the above polymerizable group include Dianal NR series (manufactured by Mitsubishi Rayon Co., Ltd.), Photomer 6173 (a polyurethane acrylic oligomer containing COOH, manufactured by Diamond Shamrock Co., Ltd.), Biscoat R-264 and KR Resist 106 (all manufactured by OSAKA ORGANIC CHEMICAL INDUSTRY LTD.), Cyclomer P series and Placcel CF200 series (all manufactured by DAICEL CORPORATION), Ebecryl 3800 (manufactured by DAICEL-UCB Co., Ltd.), and the like. As these alkali-soluble resins containing a polymerizable group, a polymerizable double bond-containing acrylic resin modified with urethane, which is a resin obtained by reacting an isocyanate group and an OH group in advance to leave an unreacted isocyanate group and causing a reaction between compound having a (meth) acryloyl group and an acrylic resin having a carboxyl group, an unsaturated bond-containing acrylic resin which is obtained by a reaction between an acrylic resin having a carboxyl group and a compound having both an epoxy group and a polymerizable double bond in a molecule, a polymerizable double bond-containing acrylic resin which is obtained by a reaction between an acid pendant type epoxy acrylate resin, an acrylic resin having an OH group, and a dibasic acid anhydride having a polymerizable double bond, a resin obtained by a reaction between an acrylic resin having an OH group and a compound having isocyanate and a polymerizable group, a resin that is obtained by treating a resin, which has an ester group having an elimination group such as a halogen atom or a sulfonate group in an $\alpha$-position or a $\beta$-position disclosed in JP2002-229207A and JP2003-335814A in a side chain, with a base, and the like are preferable.

As the alkali-soluble resin, particularly, a benzyl(meth) acrylate/(meth)acrylic acid copolymer or a multicomponent copolymer including benzyl(meth)acrylate/(meth)acrylic acid/other monomers is suitable. Examples thereof also include a resin obtained by copolymerizing 2-hydroxyethyl methacrylate, a 2-hydroxypropyl(meth)acrylate/a polystyrene macromonomer/benzyl methacrylate/methacrylic acid copolymer disclosed in JP1995-140654A (JP-H7-140654A), a 2-hydroxy-3-phenoxypropyl acrylate/a polymethyl methacrylate macromonomer/benzyl methacrylate/methacrylic acid copolymer, a 2-hydroxyethyl methacrylate/a polystyrene macromonomer/methyl methacrylate/methacrylic acid copolymer, a 2-hydroxyethyl methacrylate/a polystyrene macromonomer/benzyl methacrylate/methacrylic acid copolymer, and the like, and particularly, a copolymer of benzyl methacrylate/methacrylic acid is preferable.

The acid value of the alkali-soluble resin is preferably 30 mgKOH/g to 200 mgKOH/g, more preferably 50 mgKOH/g to 150 mgKOH/g, and most preferably 70 mgKOH/g to 120 mgKOH/g.

The weight average molecular weight (Mw) of the alkali-soluble resin is preferably 2,000 to 50,000, more preferably 5,000 to 30,000, and most preferably 7,000 to 20,000.

The content of the alkali-soluble resin in the coloring composition is preferably 1% by mass to 15% by mass, more preferably 2% by mass to 12% by mass, and particularly preferably 3% by mass to 10% by mass, based on the total solid contents of the coloring composition.

[Other Components]

The coloring composition of the present invention may contain other components such as an organic solvent and a crosslinking agent in addition to the above respective components, within a range that does not impair the effect of the present invention.

(Organic Solvent)

The coloring composition of the present invention may contain an organic solvent. Basically, the organic solvent is not particularly limited as long as the solvent satisfies the solubility of the respective components or the coating properties of the coloring composition. Particularly, the organic solvent is preferably selected in consideration of the solubility of an ultraviolet absorber, the alkali-soluble resin, or the dispersant, coating properties, and safety. In addition, when the coloring composition of the present invention is prepared, the composition preferably contains at least two kinds of organic solvents.

Examples of the organic solvent suitably include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), alkyl 3-propionate esters (for example, methyl 3-oxypropionate or ethyl 3-oxypropionate (for example, methyl 3-methoxypropionate, ethyl 3-methoxypropionate, methyl 3-ethoxypropionate, or ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and methyl 2-oxy-2-methyl propionate (for example, methyl 2-methoxy-2-methyl propionate or ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethy ether acetate, propylene glycol monoethyl ether acetate, and propylene glycol monopropyl ether acetate; ketones such as methyl ethyl ketone, cyclohexanone, 2-heptanone, and 3-butanone; aromatic hydrocarbons such as toluene and xylene; and the like.

These organic solvents are preferably used as a mixture of two or more kinds thereof, in view of solubility of an ultraviolet absorber and the alkali-soluble resin, and improving the shape of the coated surface. In this case, a mixed solvent constituted with two or more kinds selected from the above methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol monomethyl ether, and propylene glycol methyl ether acetate is particularly preferable.

The content of the organic solvent in the coloring composition is in such an amount that the concentration of the total solid contents of the composition becomes 5% by mass to 80% by mass, more preferably 5% by mass to 60% by mass, and particularly preferably 10% by mass to 50% by mass, in view of coating properties.

(Crosslinking Agent)

If a crosslinking agent is complementarily used for the coloring composition of the present invention, the hardness of the cured colored film obtained by curing the coloring composition can be improved.

The crosslinking agent is not particularly limited as long as the crosslinking agent enables curing of a film by a crosslinking reaction, and examples thereof include (e) an epoxy resin, (b) a melamine compound, a guanamine compound, a glycoluril compound, or a urea compound that is substituted with at least one substituent selected from a methylol group, an alkoxymethyl group, and an acyloxymethyl group, and (c) a phenol compound, a naphthol compound, or a hydroxyanthracene compound substituted with at least one substituent selected from a methylol group, an alkoxymethyl group, and an acyloxymethyl group. Among these, a polyfunctional epoxy resin is preferable.

Details of the specific examples of the crosslinking agent may be referred to the disclosure of JP2004-295116A, Paragraphs 0134 to 0147.

(Polymerization Inhibitor)

It is desirable to add a small amount of a polymerization inhibitor to the coloring composition of the present invention so as to hinder unnecessary thermal polymerization of the polymerizable compound during production or storage of the coloring composition.

Examples of the polymerization inhibitor usable in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (I) salt, and the like.

The amount of the polymerization inhibitor added is preferably about 0.01% by mass to about 5% by mass, based on the total mass of the composition.

(Surfactant)

Various surfactants may be added to the coloring composition of the present invention in view of further improving coating properties. As the surfactant, various surfactants such as a fluorosurfactant, a nonionic surfactant, a cationic surfactant, an anionic surfactant, and silicone-based surfactant can be used.

Particularly, if the coloring composition of the present invention contains a fluorosurfactant, liquid characteristics (particularly, fluidity) are further improved when the composition is prepared as a coating liquid, and accordingly, evenness of coating thickness or liquid saving properties can be further improved.

That is, when a coating liquid to which the coloring composition containing a fluorosurfactant is applied is used to form a film, surface tension between a surface to be coated and the coating liquid is reduced. Consequently, wettability with respect to the surface to be coated is improved, and coating properties with respect to the surface to be coated is enhanced. Therefore, such a coloring composition is effective in the respect that even when a thin film of about several μm is formed using a small amount of liquid, a film with a uniform thickness in which thickness unevenness is small is more suitably formed.

The fluorine content of the fluorosurfactant is suitably 3% by mass to 40% by mass, more preferably 5% by mass to 30% by mass, and particularly preferably 7% by mass to 25% by mass. The fluorosurfactant in which the fluorine content is in this range is effective in the respect of the thickness of the coating film or liquid saving properties, and solubility of the surfactant in the coloring composition is also excellent.

Examples of the fluorosurfactant include Megaface F171, F172, F173, F176, F177, F141, F142, F143, F144, R30, F437, F475, F479, F482, F554, F780, and F781 (all manufactured by DIC CORPORATION), Fluorad FC430, FC431, and FC171 (all manufactured by Sumitomo 3M), Surflon S-382, SC-101, SC-103, SC-104, SC-105, SC1068, SC-381, SC-383, SC-393, and KH-40 (all manufactured by ASAHI GLASS CO., LTD.), and the like.

Specific examples of the nonionic surfactant include glycerol, trimethylolpropane, trimethylolethane, and ethoxylate and propoxylate of these (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyoxyethylene glycol dilaurate, polyoxyethylene glycol distearate, sorbitan fatty acid esters (Pluronic L10, L31, L61, L62, 10R5, 17R2, and 25R2, Tetronic 304, 701, 704, 901, 904, and 150R1 manufactured by BASF), Solseperse 20000 (manufactured by The Lubrizol Corporation, Japan), and the like.

Specific examples of the cationic surfactant include phthalocyanine derivatives (product name: EFKA-745 manufactured by MORTSHITA SANGYO CORPORATION), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL Co., LTD.), W001 (manufactured by Yusho Co., Ltd.), and the like.

Specific examples of the anionic surfactant include W004, W005, and W017 (manufactured by Yusho Co., Ltd.), and the like.

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400" manufactured by Dow Corning Toray, "TSF-4440", "TSF-4300", "TSF-4445", "TSF-4460", and "TSF-4452" manufactured by Momentive Performance Materials Inc., "KP341", "KF6001", and "KF6002" manufactured by Shin-Etsu Silicones, "BYK307", "BYK323", and "BYK330" manufactured by BYK-Chemie, and the like.

The surfactant may be used alone or used in combination of two or more kinds thereof.

The amount of the surfactant added is preferably 0.001% by mass to 2.0% by mass and more preferably 0.005% by mass to 1.0% by mass, based on the total mass of the coloring composition.

(Other Additives)

Various additives such as a filler, an adhesion promoting agent, an antioxidant, an ultraviolet absorber, and an antiaggregation agent may be optionally mixed in the coloring composition. Examples of these additives include those disclosed in JP2004-295116A, Paragraphs 0155 to 0156.

The coloring composition of the present invention can contain the sensitizer or a light stabilizer disclosed in JP2004-295116A, Paragraph 0078, and the thermal polymerization inhibitor disclosed in JP2004-295116A, Paragraph 0081.

(Organic Carboxylic Acid and Organic Carboxylic Anhydride)

The coloring composition of the present invention may contain an organic carboxylic acid having a molecular weight of 1000 or less and/or an organic carboxylic anhydride.

Specific examples of the organic carboxylic acid compound include aliphatic carboxylic acid and aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid, and aconitic acid, and the like. Examples of the aromatic carboxylic acid include benzoic acid, a carboxylic acid in which a carboxyl group is directly bonded to a phenyl group such as a phthalic acid, and carboxylic acids in which a phenyl group is bonded to a carboxyl group via a carbon bond. Among these, carboxylic acids having a molecular weight of 600 or less, particularly having a molecular weight of 50 to 500, specifically, maleic acid, malonic acid, and itaconic acid are particularly preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, naphthalic anhydride, and the like. Among these, those having a molecular weight of 600 or less, particularly having a molecular weight of 50 to 500, specifically, for example, maleic anhydride, succinic anhydride, citraconic anhydride, and itaconic anhydride are preferable.

The amount of these organic carboxylic acids and/or the organic carboxylic anhydrides added generally ranges from 0.01% by weight to 10% by weight, preferably ranges from 0.03% by weight to 5% by weight, and more preferably ranges from 0.05% by weight to 3% by weight in the total solid contents.

If these organic carboxylic acids and/or the organic carboxylic anhydrides having a molecular weight of 1000 or less are added, the amount of the residual undissolved substance of the coloring composition can be further reduced while also maintaining a high degree of pattern adhesiveness.

[Method of Preparing Coloring Composition]

The coloring composition of the present invention is prepared by mixing the above components.

When the coloring composition is prepared, the respective components constituting the coloring composition may be mixed at the same time or mixed sequentially after dissolved and dispersed in a solvent. In addition, during the mixing, the order of introducing the component and operation conditions are not particularly restricted. For example, all components may be dissolved and dispersed in a solvent at the same time to prepare the composition. Alternatively, optionally, the respective components may be appropriately prepared as two or more solutions and dispersions and mixed at the time of use (time of coating) to prepare the composition.

(Filter Filtration)

For the purpose of removing foreign substances and reducing defects, the coloring composition of the present invention is preferably filtered through a filter.

As the filter used for filter filtration, any filter can be used without particular limitation as long as the filter is used in the related art for filtering.

Examples of the material of the filter include fluororesins such as PTFE (polytetrafluoroethylene); polyamide-based resins such as nylon-6 and nylon-6,6; polyolefin resins (including resins with high density and an ultra-high molecular weight) such as polyethylene and polypropylene (PP); and the like. Among these materials, polypropylene (including high-density polypropylene) is preferable.

Though not particularly limited, the pore size of the filter is, for example, about 0.01 µm to 20.0 µm, preferably about 0.01 µm to 5 µm, and more preferably about 0.01 µm to 2.0 µm.

If the pore size of the filter is in the above range, fine particles can be effectively removed, and turbidity can be more reduced.

Regarding the pore size of the filter, official value measured by filter makers can be referred to. Commercially available filters can be selected from various filters provided from, for example, Pall Corporation, Japan, Advantec Toyo Kaisha, Ltd., Entegris, Japan (former Mykrolis, Japan), or KITZ MICRO FILTER CORPORATION.

During the filter filtration, two or more kinds of filters may be used in combination.

For example, first, filtering can be performed using a first filter, and then filtering can be performed again using a second filter having a pore size different from that of the first filter.

At this time, each of the filtering using the first filter and the filtering using the second filter may be performed only once or performed twice or more.

As the second filter, a filter that is formed of the same material or the like as that of the first filter can be used.

The coloring composition of the present invention can form a colored film (cured film) having excellent heat resistance and color characteristics such as hue, color separation properties, and color unevenness, so the coloring composition is suitably used for forming a colored layer of a color filter. In addition, the coloring composition of the present invention can be suitably used for forming a colored pattern of a color filter and the like used in solid-state imaging devices (for example, CCD and CMOS) or image display devices such as a liquid crystal display (LCD). Moreover, the coloring composition can also be suitably used for the purpose of preparing a print ink, an ink jet ink, a coating material, and the like. Among theses, the coloring composition can be suitably used for the purpose of preparing a color filter for solid-state imaging devices such as CCD and CMOS.

<Pattern Forming Method and Method of Producing Color Filter>

The pattern forming method of the present invention includes a step of forming a colored layer by imparting the coloring composition onto a support, a step of exposing the colored layer, and a step of developing the colored layer after exposure and removing an unexposed portion to form a colored pattern.

The support for forming a pattern by the pattern forming method of the present invention includes plate-like substances such as a substrate and is not particularly limited as long as the support can be applied to the pattern formation.

The pattern forming method of the present invention can be suitably applied to the formation of colored patterns (pixels) included in a color filter.

That is, the method of producing a color filter of the present invention uses the above pattern forming method of the present invention, and includes a step of forming a colored layer by imparting the coloring composition onto a support, a step of exposing the colored layer, and a step of developing the colored layer after exposure and removing an unexposed portion to form a colored pattern.

Optionally, a step of baking the colored pattern (pre-baking step) and a step of baking the developed colored layer (post-baking step) may be included in the method.

Hereinafter, these steps are collectively called a pattern forming step in some cases.

The color filter of the present invention can be suitably obtained by the above production method.

Hereinafter, the color filter for a solid-state imaging device is simply called a "color filter" in some cases.

[Step of Forming Colored Layer]

In the step of forming a colored layer, the coloring composition of the present invention is imparted onto a support to form a colored layer.

As the support usable in this step, for example, a substrate for a solid-state imaging device that is formed by providing an imaging device (light-receiving device) such as Charge Coupled Device (CCD) or Complementary Metal-Oxide Semiconductor (CMOS) onto a substrate (for example, a silicon substrate) can be used.

The colored pattern of the present invention may be formed on the imaging device-formed surface (front surface) of the substrate for a solid-state imaging device or on the surface (rear surface) where the imaging device is not formed.

A light shielding film may be provided between colored patterns in the solid-state imaging device or onto the rear surface of the substrate for a solid-state imaging device.

In addition, if necessary, an undercoat layer may be provided onto the support so as to improve adhesiveness with respect to the layers in the upper portion, prevent diffusion of substances, or planarize the surface of the substrate.

As the method of imparting the coloring composition of the present invention onto the support, various coating methods such as slit coating, ink jet coating, spin coating, cast coating, roll coating, and screen printing can be applied.

Drying (pre-baking) of the colored layer coated onto the support can be performed using a hot plate, an oven, or the like at 50° C. to 140° C. for 10 seconds to 300 seconds.

[Step of Exposing]

In the step of exposing, the colored layer formed by the step of forming a colored layer is subjected to pattern exposure by using, for example, an exposure device such as a stepper, via a mask having a predetermined mask pattern. In this manner, a colored cured film is obtained.

As radiation (light) usable in exposure, particularly, ultra-violet rays such as a g-ray and an i-ray are preferably (particularly preferably the i-ray) used. The radiation amount (exposure amount) is preferably 30 mJ/cm$^2$ to 1500 mJ/cm$^2$, more preferably 50 mJ/cm$^2$ to 1000 mJ/cm$^2$, and most preferably 80 mJ/cm$^2$ to 500 mJ/cm$^2$.

The film thickness of the colored cured film is preferably 1.0 μm or less, more preferably 0.1 μm to 0.9 μm, and even more preferably 0.2 μm to 0.8 μm.

If the film thickness is set to 1.0 μm or less, this is preferable since high resolution and high adhesiveness are obtained.

[Step of Forming Pattern]

Subsequently, by performing an alkali development treatment, the colored layer in a portion not irradiated with light in the step of exposing is eluted in an aqueous alkaline solution, whereby only a photocured portion remains.

As a developer, an organic alkaline developer not damaging the imaging device in the underlayer or a circuit is desirable. The development temperature is generally 20° C. to 30° C., and the development time is 20 seconds to 90 seconds in the related art. In order to further remove residues, in recent years, development has been performed for 120 seconds to 180 seconds in some cases. In addition, in order to improve residue removal properties, a step of shaking off the developer every 60 seconds and newly supplying a developer is repeated plural times in some cases.

Examples of alkaline agents used for the developer include organic alkaline compounds such as aqueous ammonia, ethylamine, diethylamine, dimethyl ethanolamine, tetramethyl ammonium hydroxide, tetraethyl ammonium hydroxide, choline, pyrrole, piperidine, and 1,8-diazabicyclo-[5,4,0]-7-undecene. Aqueous alkaline solutions obtained by diluting these alkaline agents in pure water so as to yield a concentration of the agent of 0.001% by mass to 10% by mass, more preferably 0.01% by mass to 1% by mass are preferably used as the developer.

In addition, inorganic alkalis may be used for the developer, and as the inorganic alkali, for example, sodium hydroxide, potassium hydroxide, sodium carbonate, sodium hydrogen carbonate, sodium silicate, sodium metasilicate, and the like are preferable.

When a developer formed of such an aqueous alkaline solution is used, generally, the pattern is rinsed with pure water after development.

Thereafter, it is preferable to perform a heating treatment (post-baking) after drying. If a multicolored colored pattern is formed, the above steps can be sequentially repeated for each color to produce a cured coat. In this manner, a color filter is obtained.

The post-baking is a heating treatment performed after development so as to complete curing, and in the post-baking, a thermal curing treatment is performed generally at 100° C. to 240° C. and preferably at 200° C. to 240° C.

The post-baking treatment can be performed on the coating film after development consecutively or in a batch manner, by using heating means such as a hot plate, a convection oven (a hot-air circulation type drier), and a high-frequency heater under the above conditions.

In addition, the production method of the present invention may optionally include, as a step other than the above, a step known as a production method of a color filter for a solid-state imaging device. For example, after the step of forming a colored layer, the step of exposing, and the step of forming a pattern described above, a curing step for curing the formed colored pattern by heating and/or exposure may optionally be included in the production method.

When the coloring composition of the present invention is used, for example, a nozzle of a discharge portion or a piping portion of a coating device is clogged, or the coloring composition or a pigment is attached to or precipitated or dried in the inside of a coater, whereby contamination and the like are caused in some cases. Therefore, in order to efficiently clean the contamination caused by the coloring composition of the present invention, it is preferable to use the above-described solvent relating to the present composition as a rinse solution. In addition, rinse solutions disclosed in JP1995-128867A (JP-H7-128867A), JP1995-146562A (JP-H7-146562A), JP1996-278637A (JP-H8-278637A), JP2000-273370A, JP2006-85140A, JP2006-291191A, JP2007-2101A, JP2007-2102A, JP2007-281523A, and the like can also be suitably used to rinse and remove the coloring composition according to the present invention.

Among the above, alkylene glycol monoalkyl ether carboxylate and alkylene glycol monoalkyl ether are preferable.

These solvents may be used alone or used as a mixture of two or more kinds thereof. When two or more kinds are mixed, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and even more preferably 20/80 to 80/20. A mixed solvent in which propylene glycol monomethyl ether acetate (PGMEA) is mixed with propylene glycol monomethyl ether (PGME) at a ratio of 60/40 is particularly preferable. In addition, in order to improve the permeability of the rinse solution with respect to the contaminant, it is preferable to add the above-described surfactant relating to the present invention to the rinse solution.

Since the color filter for a solid-state imaging device of the present invention uses the coloring composition of the present invention, exposure showing excellent exposure margin can be performed, and the formed colored pattern (colored pixel) has excellent heat resistance. Moreover, in forming a multicolored colored pattern, even when the pattern is subjected to a heating process such as post-heating, color migration to the adjacent pattern is effectively inhibited. Consequently, the color filter of the present invention has excellent color characteristics such as a hue, color separation properties, and color unevenness.

The color filter for a solid-state imaging device of the present invention can be suitably used for solid-state imaging devices such as CCD and CMOS, and is particularly suitable for CCD, CMOS, and the like with a high resolution including more than 1,000,000 pixels. The color filter for a solid-state imaging device of the present invention can be used, for example, a color filter disposed between a light-receiving portion of each pixel constituting CCD or CMOS and a microlens for condensing light.

The film thickness of the colored pattern (colored pixel) in the color filter for a solid-state imaging device is preferably 2.0 µm or less and more preferably 1.0 µm or less.

In addition, the size (pattern width) of the colored pattern (colored pixel) is preferably 2.5 µm or less, more preferably 2.0 µm or less, and particularly preferably 1.7 µm or less.

<Solid-State Imaging Device>

The solid-state imaging device of the present invention includes the above-described color filter for a solid-state imaging device of the present invention. The color filter for a solid-state imaging device of the present invention is included in the constitution of the solid-state imaging device of the present invention. The constitution functioning as the solid-state imaging device is not particularly limited, and examples thereof include the following constitution.

In the constitution, a plurality of photodiodes and transfer electrodes formed of polysilicon or the like constituting a light-receiving area of a solid-state imaging device (a CCD image sensor, a CMOS image sensor, or the like) are provided onto a support, a light shielding film that is opened only to the light-receiving portion of the photodiode and is formed of tungsten or the like is provided onto the photodiodes and the transfer electrodes, a device protecting film that is formed so as to cover the whole surface of the light shielding film and the light receiving portion of the photodiodes and is formed of silicon nitride or the like is provided onto the light shielding film, and the color filter for a solid-state imaging device of the present invention is provided onto the device protecting film.

In addition, a constitution in which light-condensing means (for example, a microlens or the like, applied in the same manner hereinafter) is provided to a portion which is positioned on the device protecting portion and under the color filter (side close to the support), a constitution in which light-condensing means is provided on the color filter, and the like may be employed.

<Image Display Device>

The color filter of the present invention can be used not only for the solid-state imaging device, but also for an image display device such as a liquid crystal display device or organic EL display device, and is particularly suitable for the use of a liquid crystal display device.

When the color filter is used for the liquid crystal display device, orientation defects of liquid crystal molecules caused by the decrease in specific resistance are reduced, and the color shade of the displayed image is excellent, hence display characteristics become excellent.

Consequently, the liquid crystal display device including the color filter of the present invention is excellent in the color shade of the displayed image and can display images of high image quality excellent in display characteristics.

The definition of display devices or details of the respective display devices are disclosed in, for example, "Electronic display device (Akio Sasaki, Kogyo Chosakai Publishing Co., Ltd., 1990)", "Display device (Toshiyuki Ibuki, Sangyo-Tosho Publishing Co., Ltd., 1989), and the like. In addition, regarding a liquid crystal display device, for example "Liquid crystal display technology for next generation (edited by Tatsuo Uchida, Kogyo Chosakai Publishing Co., Ltd., 1994)" includes a disclosure. The liquid crystal display device to which the present invention can be applied is not particularly limited, and for example, liquid crystal display devices employing various systems disclosed in the "Liquid crystal display technology for next generation" can be applied.

The color filter of the present invention may be used for a liquid crystal display device using a color TFT system. Regarding the liquid crystal display device using a color TFT system, for example, "Color TFT liquid crystal display (KYORITSU SHUPPAN CO., LTD., 1996" includes a disclosure. In addition, the present invention can be applied to liquid crystal display devices that use an in-plane switching driving system such as IPS, a pixel division system such as MVA, and the like and have an enlarged viewing angle, STN, TN, VA, OCS, FFS, R-OCB, and the like.

In addition, the color filter of the present invention can be provided to a COA (Color-filter On Array) system that is a bright and high-definition system. In the liquid crystal display device of the COA system, the characteristics required for a color filter layer need to include characteristics required for an interlayer insulating film, that is, a low dielectric constant and resistance to peeling in a liquid in some cases, in addition to the above characteristics that are generally required. In the color filter of the present invention, the resin (A) having a dye structure is used. Accordingly, the color purity, light transmissivity, and the like are excellent, and the color shade of the colored pattern (pixel) is excellent. Consequently, a liquid crystal display device of a COA system that has a high resolution and is excellent in long-term durability can be provided. Moreover, in order to satisfy the requirement for the characteristic of a low dielectric constant, a resin coat may be provided onto the color filter layer.

Regarding these image display systems, for example, "EL, PDP, and LCD display technologies and recent trend in market (TORAY RESEARCH CENTER, research department, 2001)" includes a disclosure on p. 43 and the like.

The liquid crystal display device including the color filter of the present invention is constituted with various members such as an electrode substrate, a polarizing film, a phase difference film, a backlight, a spacer, and a viewing angle compensation film, in addition to the color filter of the present invention. The color filter of the present invention can be applied to a liquid crystal display device constituted with these known members. Regarding these members, for example, "'94 Market of peripheral materials and chemicals of liquid crystal display (Kentaro Shima, CMC Co., Ltd., 1994" and "2003 Current situation of market relating to liquid crystal and prospects (Vol. 2) (Yoshikichi Hyo, Fuji Chimera Research Institute, Inc., 2003)" include disclosures.

Regarding the backlight, SID meeting Digest 1380 (2005) (A. Konno et al.), December issue of monthly "Display", 2005, pp 18-24 (Yasuhiro Shima) and pp 25-30 (Takaaki Hagi), and the like include disclosures.

If the color filter of the present invention is used in a liquid crystal display device, high contrast can be realized when the color filter is combined with a three-wavelength tube of a cold cathode tube known in the related art. In addition, if a light source of LED of red, green and blue (RGB-LED) is used as a backlight, a liquid crystal display device having a high luminance, high color purity, and an excellently high degree of color reproducibility can be provided.

EXAMPLES

Hereinafter, the present invention will be described in more detail based on examples, but the present invention is not limited to the examples as long as the object of the invention is not impaired. In addition, "%" and "part(s)" are based on mass unless otherwise specified.

Synthesis Example 1

Synthesis of Resin (J-1) Having Dye Structure

[Chem. 90]

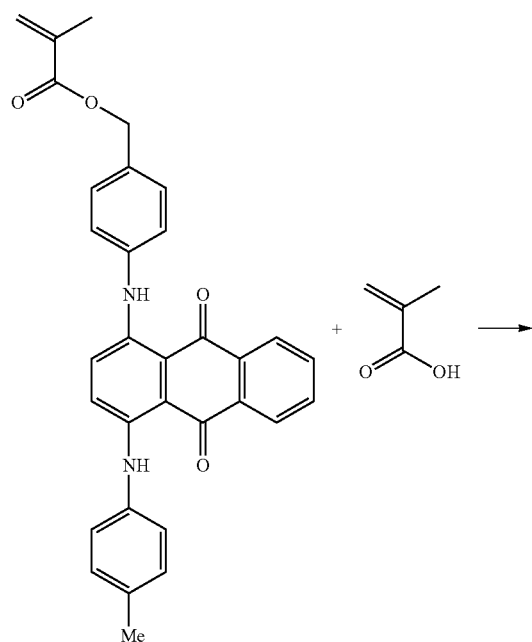

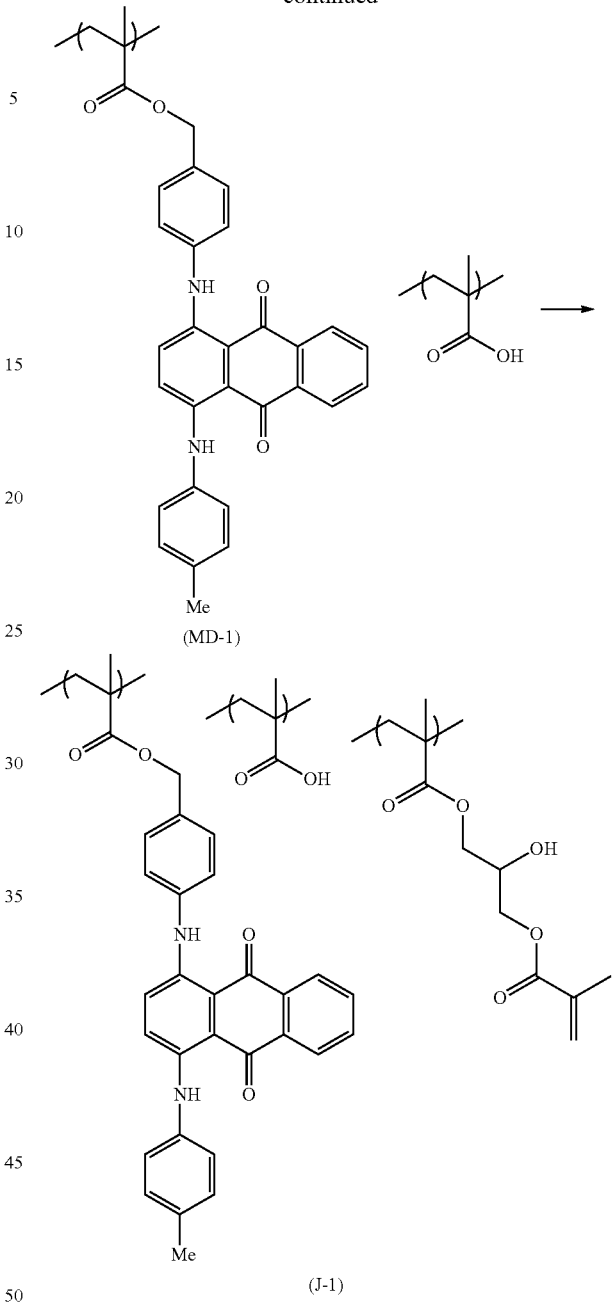

Monomer 1

A monomer 1 (8.21 g), methacrylic acid (1.08 g), propylene glycol 1-monomethyl ether 2-acetate (hereinafter, also referred to as "PGMEA") (23.3 g), and p-methoxyphenol (polymerization inhibitor) (8.2 mg, 1000 ppm based on the monomer 1) were added to a 100 mL three-neck flask, followed by heating at 80° C. in a nitrogen atmosphere. To the obtained solution, a solution as a mixture of the monomer 1 (8.21 g), methacrylic acid (hereinafter, also referred to as "MMA") (1.08 g), p-methoxyphenol (8.2 mg, 1000 ppm based on the monomer 1), dimethyl 2,2'-azobis(isobutyrate) (product name: V601, manufactured by Wako Pure Chemical Industries, LTD.) (1.16 g), and PGMEA (23.3 g) was added dropwise over 2 hours. Thereafter, the resultant was stirred for 3 hours, and then the temperature thereof was increased to 90° C., followed by stirring under heating for 2 hours. Subsequently, the resultant was left to cool, thereby obtaining a PGMEA solution of (MD-1). Then glycidyl methacrylate (hereinafter, also referred to as "GMA") (1.42 g), tetrabutyl ammonium bromide (80 mg), and p-methoxyphenol (20 mg) were added to the PGMEA solution of (MD-1), and the resultant was heated at 100° C. for 15 hours in an air atmosphere to confirm the removal of glycidyl methacrylate. After being cooled, the resultant was reprecipitated by being added dropwise to a mixed solvent of methanol/deionized water=100 mL/10 mL, thereby obtaining 17.6 g of a resin (J-1) having a dye structure.

The weight average molecular weight (Mw) of the resin (J-1) having a dye structure confirmed by GPC measurement was 8,900, and a proportion of a peak area of the component having a molecular weight of 20,000 or more in a peak area of the total molecular weight distribution of the resin was 3%.

The measurement of the molecular weight and weight average molecular weight using GPC was performed under the following conditions to obtain values converted in terms of polystyrene.

Measurement instrument: HLC-8220GPC (manufactured by TOSOH CORPORATION)

dye structure was confirmed to be 0.40 mmol based on 1 g of the resin (J-1) having a dye structure.

Synthesis Examples 2 to 18

Synthesis of Resins (J-2) to (J-18) Having Dye Structure

Resins (J-2) to (J-18) having a dye structure were obtained by performing the same operation as in Synthesis Examples 1, except that the amount of the components used (here, regarding p-methoxyphenol, concentration (ppm) based on the monomer 1) in Synthesis Example 1 was changed to the value described in Table 1.

For the obtained resins (J-2) to (J-18) having a dye structure, the weight average molecular weight (Mw), a ratio (dispersity) between the weight average molecular weight/number average molecular weight (Mw/Mn), the proportion (%) of a peak area of the component having a molecular weight of 20,000 or more in a peak area of the total molecular weight distribution of the resin, the acid value (mmol/g), and the amount of the polymerizable group (mmol/g) were measured in the same manner as in the resin (J-1) having a dye structure. The results are shown in Table 2.

TABLE 1

| Synthesis Example | Resin | Monomer 1 (g) | MMA (g) | GMA (g) | p-Methoxyphenol (ppm) | V601 (g) | Mw | Proportion of peak area of component having molecular weight of 20000 or more (%)* |
|---|---|---|---|---|---|---|---|---|
| 1 | (J-1) | 16.4 | 2.15 | 1.42 | 1000 | 1.16 | 8900 | 3 |
| 2 | (J-2) | 16.4 | 2.15 | 1.42 | 100 | 1.16 | 8700 | 5 |
| 3 | (J-3) | 16.4 | 2.15 | 1.42 | 70 | 1.16 | 8500 | 7 |
| 4 | (J-4) | 16.4 | 2.15 | 1.42 | 1500 | 1.16 | 8800 | 3 |
| 5 | (J-5) | 16.4 | 2.15 | 1.42 | 10 | 1.16 | 8900 | 9 |
| 6 | (J-6) | 16.4 | 2.15 | 1.42 | 1000 | 0.70 | 15400 | 9 |
| 7 | (J-7) | 16.4 | 2.15 | 1.42 | 1000 | 2.12 | 5100 | 3 |
| 8 | (J-8) | 16.4 | 2.15 | 1.42 | 1000 | 2.54 | 4200 | 2 |
| 9 | (J-9) | 16.4 | 2.15 | 1.42 | 1000 | 4.21 | 3100 | 2 |
| 10 | (J-10) | 16.3 | 1.94 | 1.78 | 1000 | 1.16 | 8400 | 3 |
| 11 | (J-11) | 16.1 | 2.58 | 1.42 | 1000 | 1.16 | 8300 | 2 |
| 12 | (J-12) | 17.2 | 1.55 | 1.42 | 1000 | 1.16 | 7900 | 3 |
| 13 | (J-13) | 15.7 | 2.93 | 1.42 | 1000 | 1.16 | 8500 | 2 |
| 14 | (J-14) | 17.2 | 1.94 | 1.07 | 1000 | 1.16 | 8400 | 3 |
| 15 | (J-15) | 14.2 | 2.93 | 2.84 | 1000 | 1.16 | 8100 | 4 |
| 16 | (J-16) | 13.0 | 3.44 | 3.55 | 1000 | 1.16 | 8000 | 3 |
| 17 | (J-17) | 17.7 | 1.64 | 0.71 | 1000 | 1.16 | 8200 | 2 |
| 18 | (J-18) | 12.5 | 3.57 | 2.84 | 1000 | 1.16 | 7900 | 3 |

*Proportion in a peak area of the total molecular weight distribution of resin

Guard column: HZ-L (manufactured by TOSOH CORPORATION)

Columns: TSK gel Super HZM-M (manufactured by TOSOH CORPORATION), TSK gel Super HZM-4000 (manufactured by TOSOH CORPORATION), TSK gel Super HZM-3000 (manufactured by TOSOH CORPORATION), and TSK gel Super HZM-2000 (manufactured by TOSOH CORPORATION)

Eluent: tetrahydrofuran

Conditions for solution delivery: a sample pump 0.35 mL/min, and a reference pump 0.20 mL/min Column temperature: 40° C.

Concentration of sample measured: 0.1% by mass (tetrahydrofuran solution)

Injection amount: 10 μL

In addition, by titration using a 0.1 N aqueous sodium hydroxide solution, the acid value was confirmed to be 0.75 mmol/g, and by NMR measurement, the amount of the polymerizable group contained in the resin (J-1) having a Synthesis Example 19

Synthesis of a Resin (J-19)

17.3 g of a resin (J-19) was obtained by performing the same operation as in Synthesis Example 1, except that the p-methoxyphenol used in Synthesis Example 1 was changed to benzoquinone. The physical properties are shown in Table 2.

Synthesis Example 20

Synthesis of a Resin (J-20)

17.4 g of a resin (J-20) was obtained by performing the same operation as in Synthesis Example 1, except that the p-methoxyphenol used in Synthesis Example 1 was changed to a 4-hydroxy-2,2,6,6-tetramethylpyridine-1-oxyl free radical. The physical properties are shown in Table 2.

Synthesis Examples 21 to 34
Synthesis of Resins (J-21) to (J-34) Having a Dye Structure
Resins (J-21) to (J-34) having a dye structure were obtained in the same manner as in Synthesis Example 1, except that the dye monomer (monomer 1) used in Synthesis Example 1 was changed. The physical properties are shown in Table 2.
[Chem. 91]
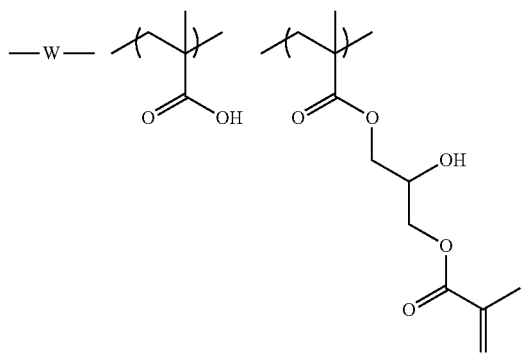
(J-21)
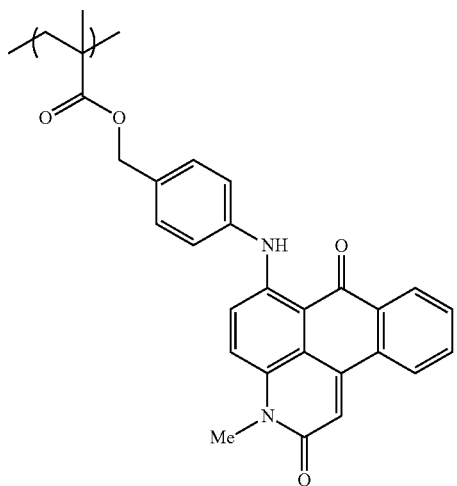
(J-22)
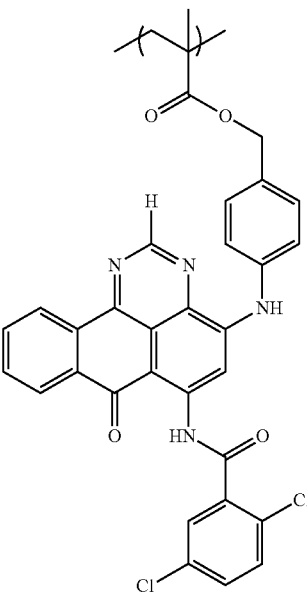
(J-23)
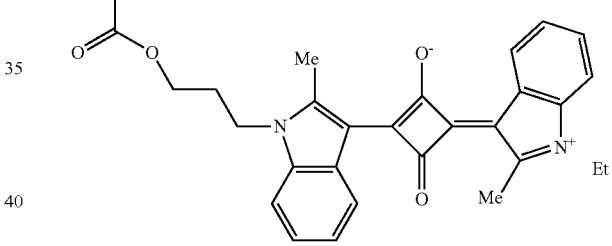
(J-24)
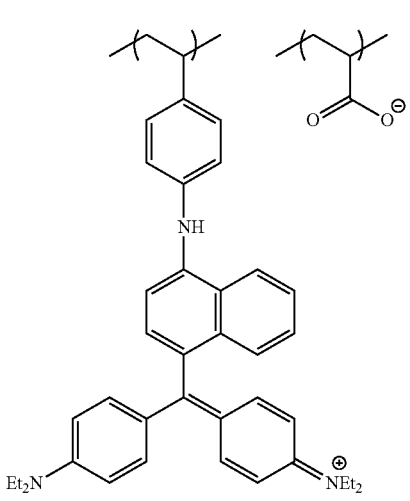

-continued
(J-25)
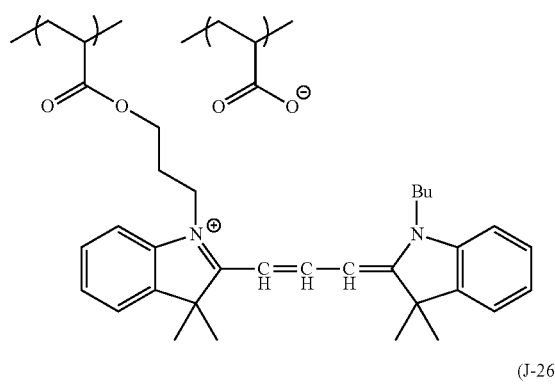
(J-26)
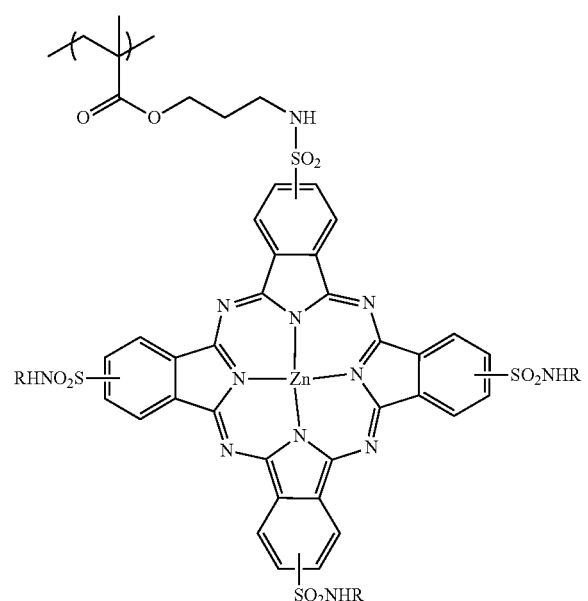
R = CH2CH2CH2OH
(J-27)
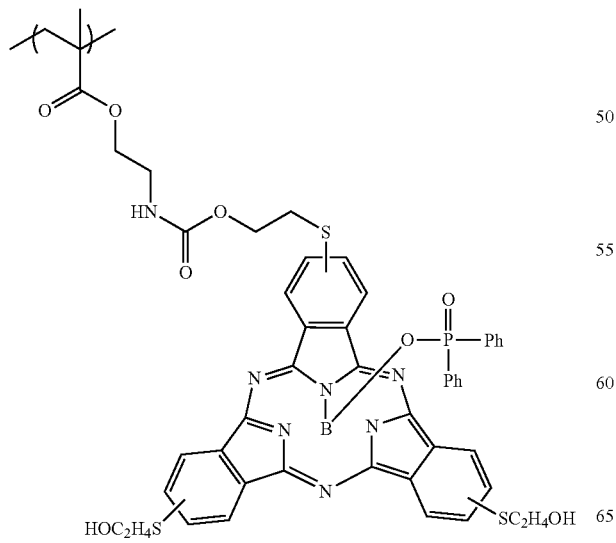
-continued
(J-28)
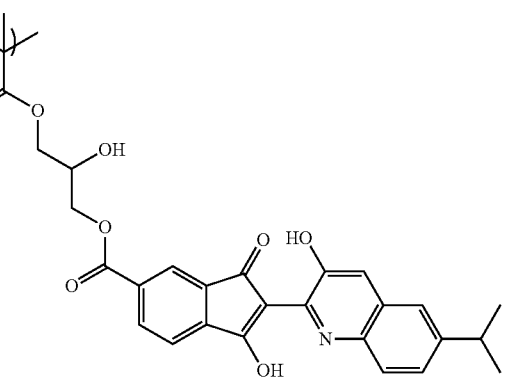
(J-29)
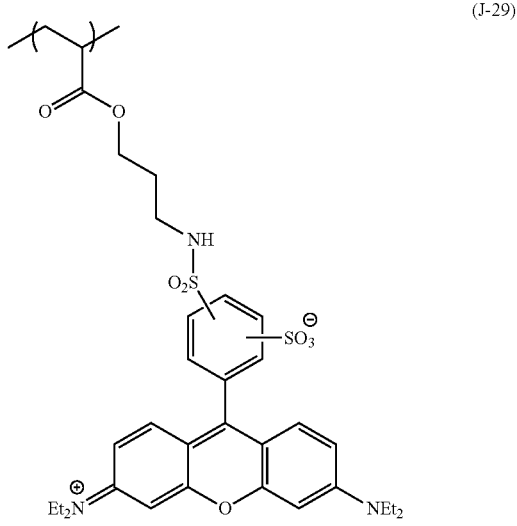
[Chem. 92]
—W— =
(J-30)
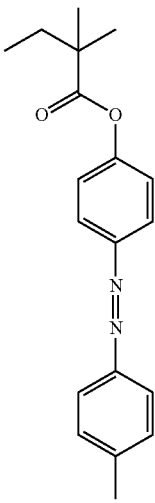

(J-31)
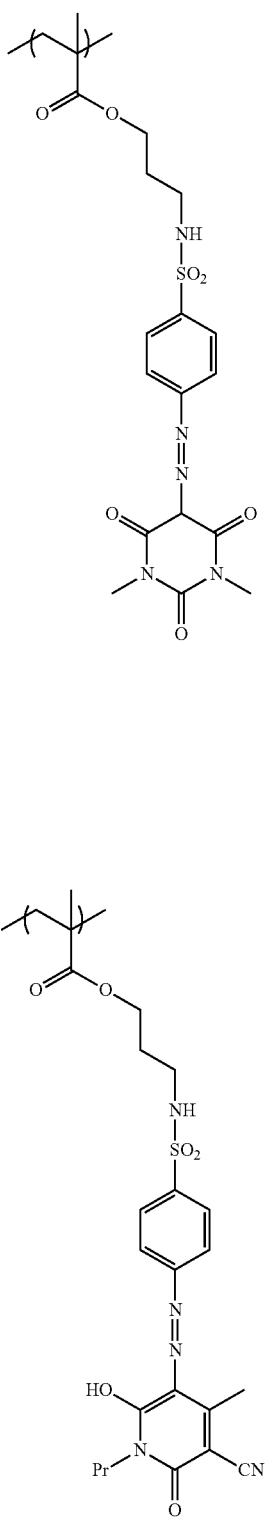
(J-32)
(J-33)
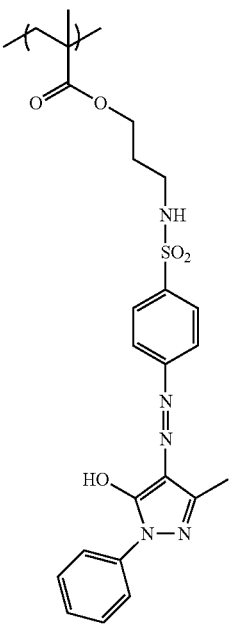
(J-34)
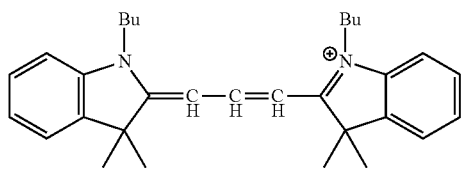
Synthesis Example 35
Synthesis of a Resin (J-35) Having a Dye Structure
A resin (J-35) was synthesized by the following scheme.
[Chem. 93]
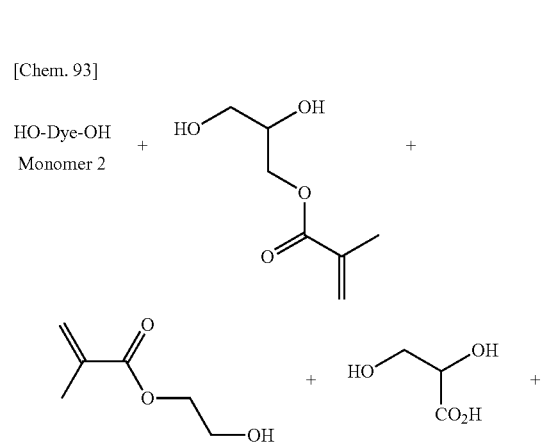

-continued

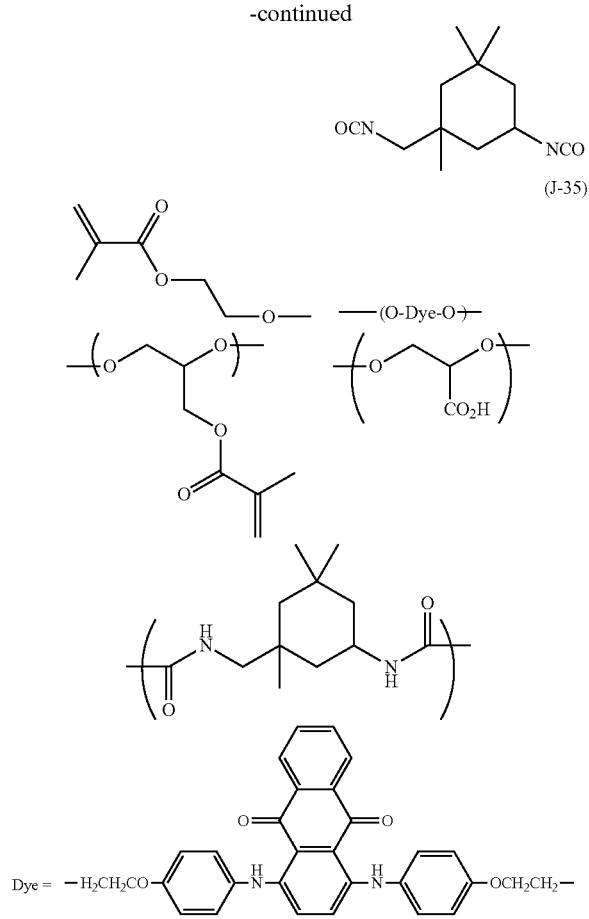

(J-35)

Dye = —H₂CH₂CO—⟨⟩—N(H)—[anthraquinone]—N(H)—⟨⟩—OCH₂CH₂—

2-Hydroxy ethyl methacylate (1.29 g), a monomer 2 (9.40 g), 2,3-dihydroxypropyl methacrylate (0.53 g), 1,2-dihydroxypropionic acid (1.41 g), 2,5-di-tertbutyl-4-methyl phenol (9.4 mg, 1000 ppm based on the monomer 2), and isophorone diisocyanate (7.37 g) were added to PGMEA (46.7 g), followed by heating at 80° C. in a nitrogen atmosphere. Thereafter, Neostann U-600 (manufactured by NITTO KASEI CO., LTD.) (20 mg) was added thereto, followed by heating for 10 hours and then cooling, thereby obtaining a 30% by mass PGMEA solution including the resin (J-35) having a dye structure.

The weight average molecular weight (Mw) of the resin (J-35) having a dye structure confirmed by GPC measurement was 8,100, and the proportion of a peak area of the component having a molecular weight of 20,000 or more in a peak area of the total molecular weight distribution of the resin was 3%.

In addition, by titration using a 0.1 N aqueous sodium hydroxide solution, the acid value was confirmed to be 0.67 mmol/g, and by NMR measurement, the amount of the polymerizable group contained in the resin (J-35) having a dye structure was confirmed to be 0.64 mmol based on 1 g of the resin (J-35) having a dye structure.

Synthesis Examples 36 to 38

Synthesis of Resins (J-36) to (J-38) Having Dye Structure

Resins (J-36) to (J-38) having a dye structure were obtained by performing the same operation as in Synthesis Example 35, except that the monomer 2 used in Synthesis Example 35 was replaced with a monomer having a dye structure corresponding to the following structure.

[Chem. 94]

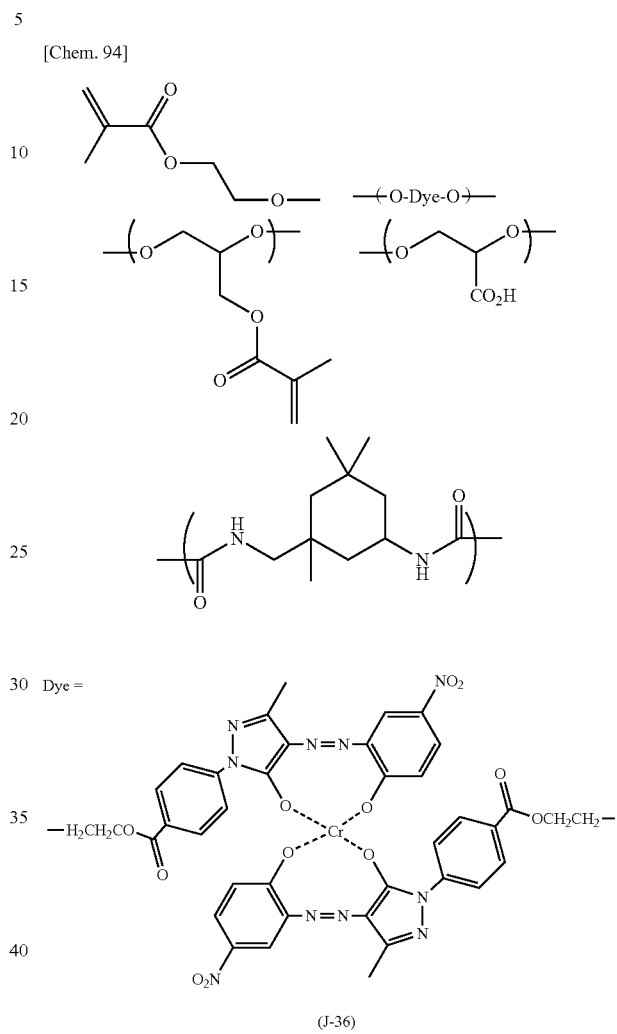

Dye =

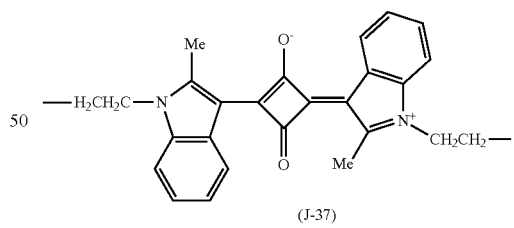

(J-37)

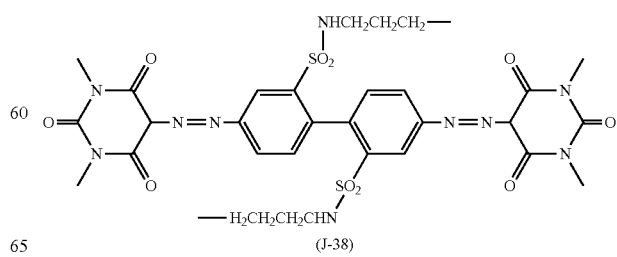

(J-38)

Synthesis Example 39

Synthesis of a Resin (J-39) Having a Dye Structure

A resin (J-39) was synthesized by the following scheme.

[Chem. 95]

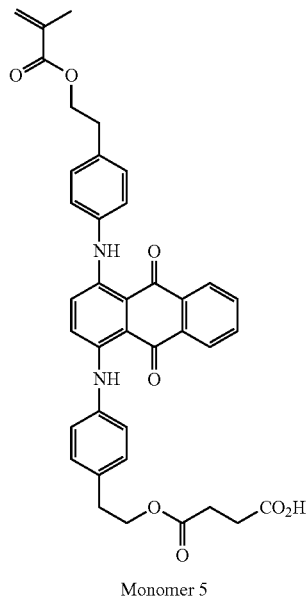 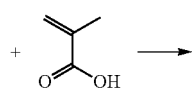

Monomer 5

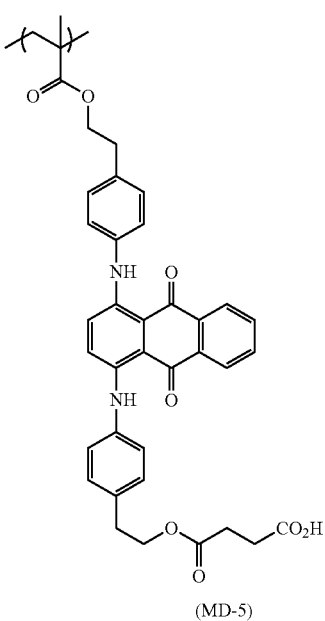 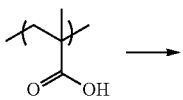

(MD-5)

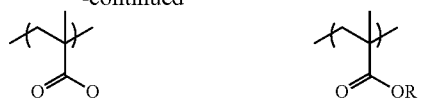

(J-39)

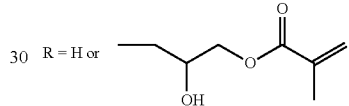

R = H or

A monomer 5 (8.51 g), methacrylic acid (0.35 g), and PGMEA (23.3 g) were added to a 100 mL three-neck flask, followed by heating at 80° C. in a nitrogen atmosphere. To the obtained solution, a solution as a mixture of the monomer 5 (8.51 g), methacrylic acid (0.35 g), dimethyl 2,2'-azobis(isobutyrate) (2.58 g), and PGMEA (23.3 g) was added dropwise over 2 hours. Thereafter, the resultant was stirred for 3 hours, and then the temperature thereof was increased to 90° C., followed by stirring under heating for 2 hours Subsequently, the resultant was left to cool, thereby obtaining a PGMEA solution of (MD-5). Then glycidyl methacrylate (2.29 g), tetrabutyl ammonium bromide (80 mg), and p-methoxyphenol (20 mg) were added to the PGMEA solution of (MD-5), and the resultant was heated at 100° C. for 15 hours in an air atmosphere to confirm the removal of glycidyl methacrylate. After being cooled, the resultant was reprecipitated by being added dropwise to a mixed solvent of methanol/deionized water=100 mL/10 mL, thereby obtaining 18.6 g of a resin (J-39) having a dye structure.

The weight average molecular weight (Mw) of the resin (J-39) having a dye structure confirmed by GPC measurement was 7,500, and a proportion of a peak area of the component having a molecular weight of 20,000 or more in a peak area of the total molecular weight distribution of the resin was 3%.

In addition, by titration using a 0.1 N aqueous sodium hydroxide solution, the acid value was confirmed to be 0.81 mmol/g, and by NMR measurement, the amount of the polymerizable group contained in the resin (J-39) having a dye structure was confirmed to be 0.70 mmol based on 1 g of the resin (J-39) having a dye structure.

Synthesis Example 40
Synthesis of Resin (J-40) Having Dye Structure
A resin (J-40) was synthesized by the following scheme.
[Chem. 96]
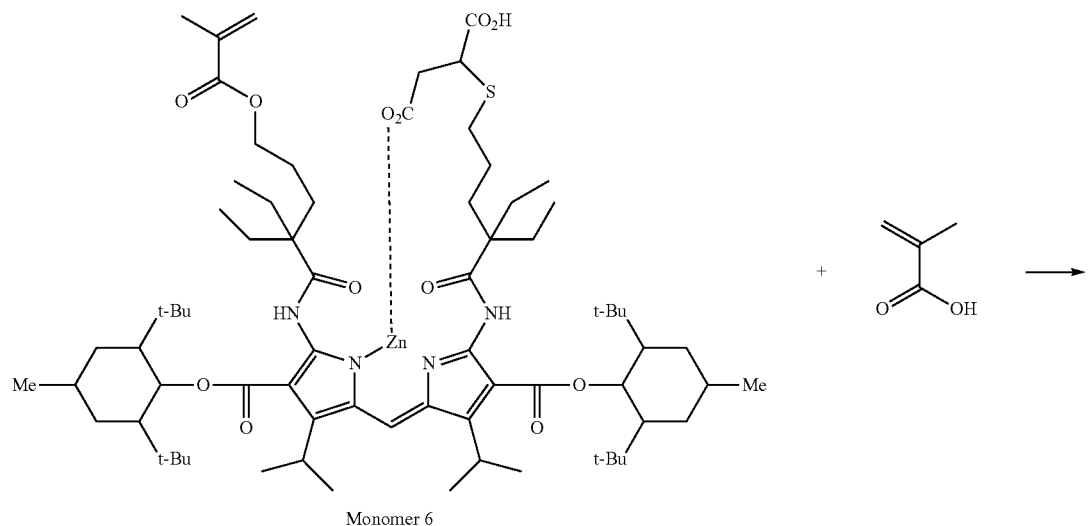
Monomer 6
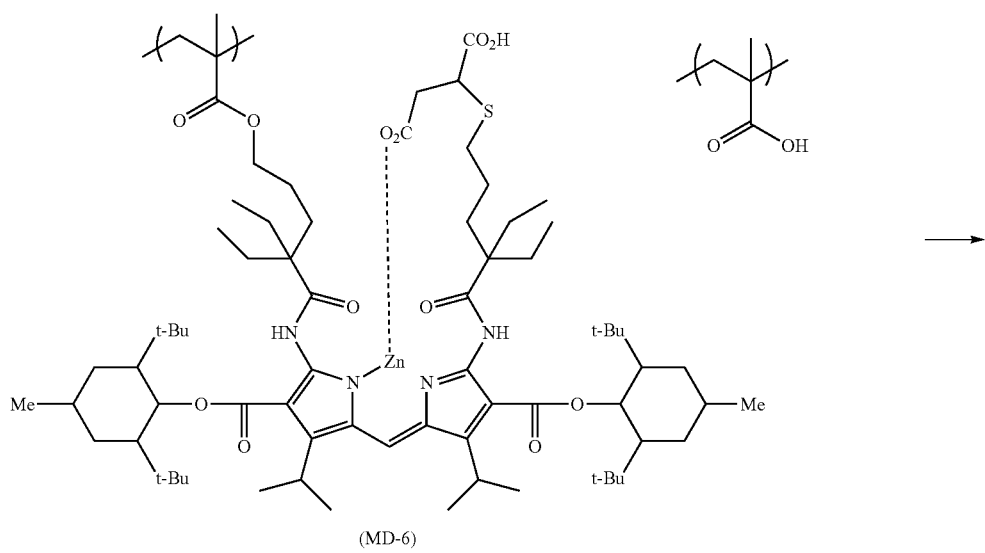
(MD-6)

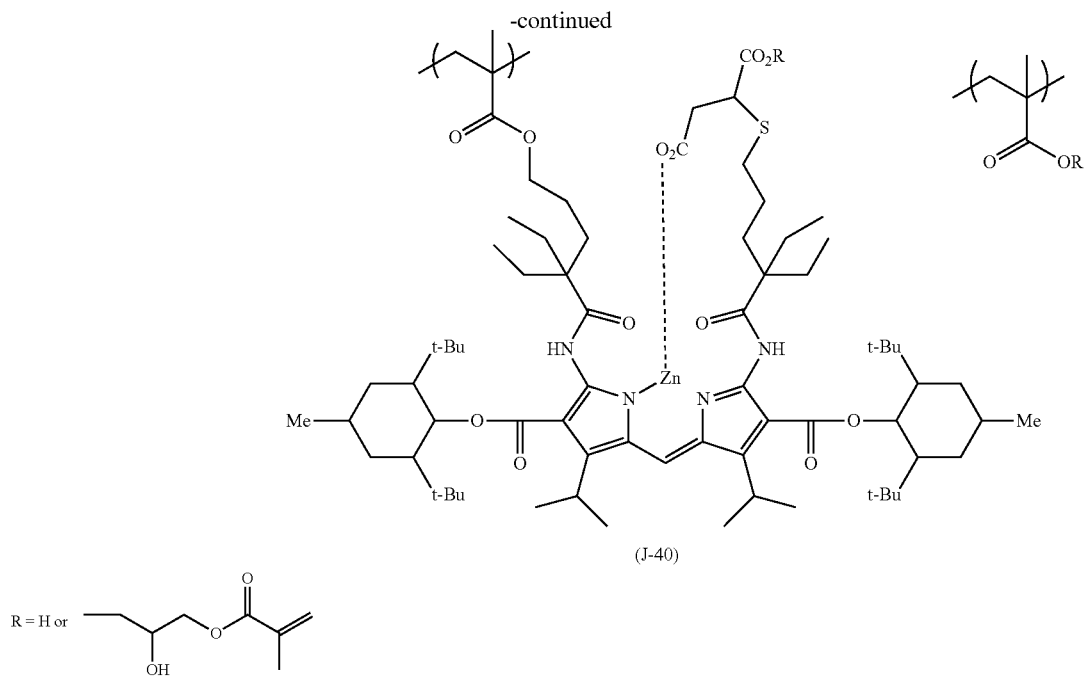

(J-40)

R = H or [structure shown]

A monomer 6 (8.51 g), methacrylic acid (0.35 g), and p-methoxyphenol (8.5 mg, 1000 ppm based on the monomer 6), and PGMEA (23.3 g) were added to a 100 mL three-neck flask, followed by heating at 80° C. in a nitrogen atmosphere. To the obtained solution, a solution as a mixture of the monomer 6 (8.51 g), methacrylic acid (0.35 g), p-methoxyphenol (8.5 mg, 1000 ppm based on the monomer 6), dimethyl 2,2'-azobis(isobutyrate) (2.58 g), and PGMEA (23.3 g) was added dropwise over 2 hours. Thereafter, the resultant was stirred for 3 hours, and then the temperature thereof was increased to 90° C., followed by stirring under heating for 2 hours. Subsequently, the resultant was left to cool, thereby obtaining a PGMEA solution of (MD-6). Then glycidyl methacrylate (2.29 g), tetrabutyl ammonium bromide (80 mg), and p-methoxyphenol (20 mg) were added to the PGMEA solution of (MD-6), and the resultant was heated at 100° C. for 15 hours in an air atmosphere to confirm the removal of glycidyl methacrylate. After being cooled, the resultant was reprecipitated by being added dropwise to a mixed solvent of methanol/deionized water=100 mL/10 mL, thereby obtaining 18.7 g of a resin (J-40) having a dye structure.

The weight average molecular weight (Mw) of the resin (J-40) having a dye structure confirmed by GPC measurement was 8,300, and a proportion of a peak area of the component having a molecular weight of 20,000 or more in a peak area of the total molecular weight distribution of the resin was 2%. In addition, by titration using a 0.1 N aqueous sodium hydroxide solution, the acid value was confirmed to be 0.83 mmol/g, and by NMR measurement, the amount of the polymerizable group contained in the resin (J-40) having a dye structure was confirmed to be 0.72 mmol based on 1 g of the resin (J-40) having a dye structure.

Synthesis Example 41

Synthesis of Resin (J-41)

The monomer 1 (9.33 g), methacrylic acid (0.67 g), and p-methoxyphenol (9.3 mg, 1000 ppm based on the monomer 1), and PGMEA (23.3 g) were added to a 100 mL three-neck flask, followed by heating at 80° C. in a nitrogen atmosphere. To the obtained solution, a solution as a mixture of the monomer 1 (9.33 g), methacrylic acid (0.67 g), p-methoxyphenol (9.3 mg, 1000 ppm based on the monomer 1), dimethyl 2,2'-azobis(isobutyrate) (product name: V601, manufactured by Wako Pure Chemical Industries, LTD.) (1.10 g), and PGMEA (23.3 g) was added dropwise over 2 hours. Thereafter, the resultant was stirred for 3 hours. Subsequently, the resultant was left to cool and reprecipitated by being added dropwise to a mixed solvent of methanol/deionized water=100 mL/10 mL, thereby obtaining 17.2 g of a resin (J-41) having a dye structure.

The weight average molecular weight (Mw) of the resin (J-41) having a dye structure confirmed by GPC measurement was 7,400, and a proportion of a peak area of the component having a molecular weight of 20,000 or more in a peak area of the total molecular weight distribution of the resin was 4%. In addition, by titration using a 0.1 N aqueous sodium hydroxide solution, the acid value of the resin (J-41) having a dye structure was confirmed to be 0.78 mmol/g.

Synthesis Example 42

Synthesis of Resin (J-42)

A monomer 1 (8.21 g), methacrylic acid (1.08 g), and propylene glycol 1-monomethyl ether 2-acetate (hereinafter, also referred to as "PGMEA") (23.3 g) were added to a 100 mL three-neck flask, followed by heating at 80° C. in a nitrogen atmosphere. To the obtained solution, a solution as a mixture of the monomer 1 (8.21 g), methacrylic acid (1.08 g), dimethyl 2,2'-azobis(isobutyrate) (product name: V601, manufactured by Wako Pure Chemical Industries, LTD.) (0.70 g), and PGMEA (23.3 g) was added dropwise over 2 hours. Thereafter, the resultant was stirred for 3 hours, and then the temperature thereof was increased to 90° C., followed by stirring under heating for 2 hours. Subsequently, the resultant was left to cool, thereby obtaining a PGMEA solution of (MD-1). Then glycidyl methacrylate (1.42 g), tetrabutyl ammonium bromide (80 mg), and p-methoxyphenol (20 mg) were added to the PGMEA solution of (MD-1), and the resultant was heated at 100° C. for 15 hours in an air atmosphere to confirm the removal of glycidyl methacrylate. After the resultant was cooled, a mixed solvent of methanol/deionized water=50 mL/5 mL was added thereto, and the precipitated polymer (high-molecular weight component) was removed by filtration. The filtrate was reprecipitated by being added dropwise to a mixed solvent of methanol/deionized water=100 mL/10 mL, thereby obtaining 17.6 g of a resin (J-42) having a dye structure.

The weight average molecular weight (Mw) of the resin (J-42) having a dye structure confirmed by GPC measurement was 14,900, and a proportion of a peak area of the component having a molecular weight of 20,000 or more in a peak area of the total molecular weight distribution of the resin was 5%.

In addition, by titration using a 0.1 N aqueous sodium hydroxide solution, the acid value was confirmed to be 0.74 mmol/g, and by NMR measurement, the amount of the polymerizable group contained in the resin (J-42) having a dye structure was confirmed to be 0.41 mmol based on 1 g of the resin (J-42) having a dye structure.

Table 2 shows physical properties of the resins (J-1) to (J-42) having a dye structure.

Comparative Synthesis Examples 1 to 5

Synthesis of Resins (H-1) to (H-5)

Resins (H-1) to (H-5) were obtained by performing the same operation as in Synthesis Examples 1, 23, 24, 26, and 28, except that p-methoxyphenol was not added in Synthesis Examples 1, 23, 24, 26, and 28. The physical properties are shown in Table 2.

TABLE 2

| Synthesis Example | Resin | Mw | Mw/Mn | Proportion of peak area of component having molecular weight of 20000 or more (%)* | Acid value (mmol/g) | Amount of polymerizable group (mmol/g) |
|---|---|---|---|---|---|---|
| 1 | (J-1) | 8900 | 1.8 | 3 | 0.75 | 0.40 |
| 2 | (J-2) | 8700 | 1.9 | 5 | 0.74 | 0.40 |
| 3 | (J-3) | 8500 | 2.1 | 7 | 0.75 | 0.42 |
| 4 | (J-4) | 8800 | 1.7 | 3 | 0.76 | 0.39 |
| 5 | (J-5) | 8900 | 2.2 | 9 | 0.75 | 0.42 |
| 6 | (J-6) | 15400 | 2.3 | 9 | 0.73 | 0.43 |
| 7 | (J-7) | 5100 | 1.8 | 3 | 0.74 | 0.41 |
| 8 | (J-8) | 4200 | 2.1 | 2 | 0.75 | 0.42 |
| 9 | (J-9) | 3100 | 2.2 | 2 | 0.74 | 0.43 |
| 10 | (J-10) | 8400 | 1.8 | 3 | 0.53 | 0.52 |
| 11 | (J-11) | 8300 | 1.9 | 2 | 1.01 | 0.41 |
| 12 | (J-12) | 7900 | 2.1 | 3 | 0.43 | 0.45 |
| 13 | (J-13) | 8500 | 2.1 | 2 | 1.26 | 0.48 |
| 14 | (J-14) | 8400 | 1.8 | 3 | 0.77 | 0.31 |
| 15 | (J-15) | 8100 | 1.9 | 4 | 0.71 | 0.79 |
| 16 | (J-16) | 8000 | 1.8 | 3 | 0.69 | 0.98 |
| 17 | (J-17) | 8200 | 2.1 | 2 | 0.72 | 0.23 |
| 18 | (J-18) | 7900 | 2.2 | 3 | 0.73 | 1.17 |
| 19 | (J-19) | 8900 | 1.8 | 3 | 0.75 | 0.40 |
| 20 | (J-20) | 8900 | 1.9 | 3 | 0.75 | 0.40 |
| 21 | (J-21) | 8400 | 1.8 | 3 | 0.63 | 0.35 |
| 22 | (J-22) | 8300 | 1.9 | 4 | 0.84 | 0.46 |
| 23 | (J-23) | 9900 | 1.8 | 4 | 0.60 | 0.61 |
| 24 | (J-24) | 7900 | 1.9 | 4 | 0.61 | 0.33 |
| 25 | (J-25) | 8200 | 1.8 | 3 | 0.67 | 0.76 |
| 26 | (J-26) | 7400 | 1.9 | 4 | 0.73 | 0.82 |
| 27 | (J-27) | 7500 | 1.8 | 3 | 0.94 | 0.68 |
| 28 | (J-28) | 6800 | 1.9 | 4 | 0.93 | 0.64 |
| 29 | (J-29) | 7900 | 1.8 | 3 | 0.59 | 0.66 |
| 30 | (J-30) | 7800 | 1.8 | 3 | 0.75 | 0.52 |
| 31 | (J-31) | 7500 | 1.9 | 4 | 0.66 | 0.31 |
| 32 | (J-32) | 7600 | 1.8 | 3 | 0.82 | 0.42 |
| 33 | (J-33) | 7700 | 1.8 | 4 | 0.91 | 0.52 |
| 34 | (J-34) | 7800 | 1.9 | 3 | 0.56 | 0.66 |
| 35 | (J-35) | 8100 | 2.8 | 3 | 0.67 | 0.64 |
| 36 | (J-36) | 7600 | 2.6 | 4 | 0.59 | 0.35 |
| 37 | (J-37) | 6400 | 2.6 | 4 | 0.80 | 0.82 |
| 38 | (J-38) | 7300 | 2.7 | 3 | 0.85 | 0.67 |
| 39 | (J-39) | 7500 | 1.8 | 3 | 0.81 | 0.70 |
| 40 | (J-40) | 8300 | 1.8 | 2 | 0.83 | 0.72 |
| 41 | (J-41) | 7400 | 1.9 | 4 | 0.78 | 0.00 |
| 42 | (J-42) | 14900 | 1.9 | 5 | 0.74 | 0.41 |
| Comparative Synthesis Example 1 | (H-1) | 9100 | 2.6 | 12 | 0.74 | 0.41 |
| Comparative Synthesis Example 2 | (H-2) | 8600 | 2.4 | 15 | 0.86 | 0.48 |
| Comparative Synthesis Example 3 | (H-3) | 8200 | 2.4 | 13 | 0.63 | 0.34 |

TABLE 2-continued

| Synthesis Example | Resin | Mw | Mw/Mn | Proportion of peak area of component having molecular weight of 20000 or more (%)* | Acid value (mmol/g) | Amount of polymerizable group (mmol/g) |
|---|---|---|---|---|---|---|
| Comparative Synthesis Example 4 | (H-4) | 7800 | 2.5 | 12 | 0.75 | 0.83 |
| Comparative Synthesis Example 5 | (H-5) | 7200 | 2.2 | 14 | 0.94 | 0.66 |

*Proportion in a peak area of the total molecular weight distribution of a resin Examples 1 to 51 and Comparative Examples 1 to 5

1. Preparation of Composition for Undercoat Layer

Components composed as follows were mixed and dissolved, thereby preparing a composition for an undercoat layer.

<Constitution of Composition for Forming Undercoat Layer>

| | |
|---|---|
| Solvent: propylene glycol monomethyl ether acetate | 19.20 parts |
| Solvent: ethyl lactate | 36.67 parts |
| Alkali-soluble resin: a 40% PGMEA solution including a benzyl methacrylate/methacrylic acid/2-hydroxyethyl methacrylate copolymer (molar ratio = 60/22/18, weight average molecular weight of 15,000, number average molecular weight of 9,000) | 30.51 parts |
| Ethylenically unsaturated double bond-containing compound: dipentaerythritol hexaacrylate (KAYARAD DPHA; manufactured by NIPPON KAYAKU Co., Ltd.) | 12.20 parts |
| Polymerization inhibitor: p-methoxyphenol | 0.0061 parts |
| Fluorosurfactant: F-475 manufactured by DIC CORPORATION | 0.83 parts |
| Photopolymerization initiator: a trihalomethyltriazine-based photopolymerization initiator (TAZ-107 manufactured by Midori Kagaku Co., Ltd.) | 0.586 parts |

2-1. Preparation of Undercoat Layer-Attached Glass Substrate

A glass substrate (Corning 1737) was rinsed with a 0.5% NaOH solution by using ultrasonic waves, followed by rinsing with water, and dehydrated by baking (200° C./20 min). Subsequently, the composition for an undercoat layer obtained in the above section 1 was coated onto the rinsed glass substrate by using a spin coater so as to yield a film thickness after drying of 2 μm, and the resultant was dried by heating at 220° C. for an hour, thereby obtaining an undercoat layer-attached glass substrate.

2-2. Preparation of Undercoat Layer-Attached Silicon Wafer Substrate

A silicon wafer (6 inch) was heated in an oven at 200° C. for 30 minutes. Thereafter, the composition for an undercoat layer was coated onto this silicon wafer so as to yield a dry film thickness of 1.5 μm. In addition, the resultant was further heated in an oven at 220° C. for an hour to form an undercoat layer, thereby obtaining an undercoat layer-attached silicon wafer substrate.

3. Preparation of Radiation-Sensitive Coloring Composition 3-1 Preparation of Pigment Dispersion for Blue A pigment dispersion for blue was prepared in the following manner.

A mixed solution consisting of 13.0 parts by mass of C. I. Pigment Blue 15:6 (blue pigment, average particle size of 55 nm), 5.0 parts by mass of a dispersed resin A (following structure) as a pigment dispersant, and 82.0 parts by mass of PGMEA was mixed and dispersed for 3 hours by a beads mill (zirconia beads having a diameter of 0.3 mm), thereby preparing a pigment dispersion. Thereafter, by using a depressurizing mechanism-attached high-pressure dispersing machine NANO-3000-10 (manufactured by Nihon B.E.E Co., Ltd.), a dispersing treatment was performed under a pressure of 2000 kg/cm³ and at a flow rate of 500 g/min. The dispersing treatment was repeated 10 times, thereby obtaining a pigment dispersion for blue (dispersion of C. I. Pigment Blue 15:6).

For the obtained pigment dispersion for blue, a particle size of the pigment was measured using a dynamic light scattering method (Microtrac Nanotrac UPA-EX150 manufactured by Nikkiso Co., Ltd.), and the particle size was measured to be 24 nm.

[Chem. 97]

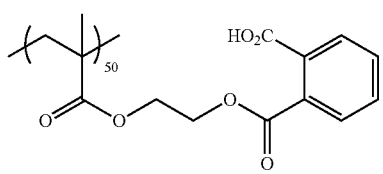

-continued

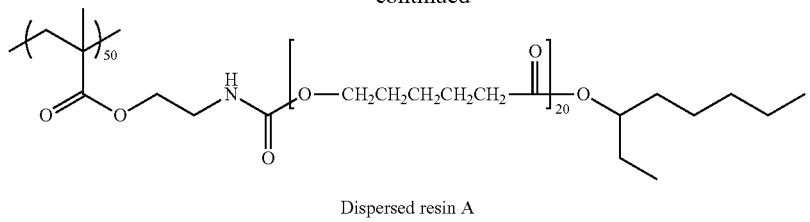

Dispersed resin A

Weight average molecular weight (Mw): 30,000
Compositional ratio: 50/50 (mass ratio)

A pigment dispersion for red, a pigment dispersion for green, and a pigment dispersion for yellow were prepared in the same manner as in the preparation of the pigment dispersion for blue, except that the following pigments were used instead of the C. I. Pigment Blue 15:6 used as a blue pigment in the "3-1. Preparation of pigment dispersion for blue".

Pigment A for red
C. I. Pigment Red 254 (PR254) (particle size 26 nm)
Pigment B for red
C. I. Pigment Red 177 (PR177) (particle size 28 nm)
Pigment A for green
C. I. Pigment Green 36 (PG36) (particle size 25 nm)
Pigment B for green
C. I. Pigment Green 58 (PG58) (particle size 30 nm)
Pigment A for yellow
C. I. Pigment Yellow 139 (PY139) (particle size 27 nm)
Pigment B for yellow
C. I. Pigment Yellow 150 (PY150) (particle size 26 nm)

3-2. Preparation of Radiation-Sensitive Coloring Composition (1) Radiation-Sensitive Coloring Compositions of Examples 1 to 49 and Comparative Examples 1 to 5

The following respective components were mixed, dispersed, and dissolved, thereby obtaining the respective radiation-sensitive coloring compositions of Examples 1 to 49 and Comparative Examples 1 to 5.

| | |
|---|---|
| Cyclohexanone | 1.133 parts |
| Alkali-soluble resin (K1 or K2: compound described in Table 3) | 0.030 parts |
| Solsperse 20000 (1% cyclohexane solution, manufactured by The Lubrizol Corporation, Japan) | 0.125 parts |
| Photopolymerization initiator (compound having the following structure: compound described in Table 3) | 0.012 parts |
| Colorant (resin having a dye structure: resins (J-1) to (J-42) and (H-1) to (H-5) having a dye structure: compounds described in Table 3) | 0.040 parts as solid content |
| Pigment dispersion described in Table 3 (pigment concentration 13.0%) | 0.615 parts |
| Dipentaerythritol hexaacrylate (KAYARAD DPHA; manufactured by NIPPON KAYAKU Co., Ltd.) | 0.070 parts |
| Glycerol propoxylate (1% cyclohexane solution) | 0.048 parts |

(2) Radiation-Sensitive Coloring Composition of Example 50

A radiation-sensitive coloring composition of Example 50 was obtained in the same manner as in Example 1, except that in the preparation of the radiation-sensitive coloring composition of Example 1, a pigment dispersion was not used, and 0.120 parts (as a solid content) of the resin J-1 having a dye structure was added.

(3) Radiation-Sensitive Coloring Composition of Example 51

A radiation-sensitive coloring composition of Example 51 was obtained in the same manner as in Example 1, except that in the preparation of the radiation-sensitive coloring composition of Example 1, the alkali-soluble resin and the pigment dispersion were not used, and 0.100 parts (as a solid content) of dipentaerythritol hexaacrylate was added.

[Chem. 98]

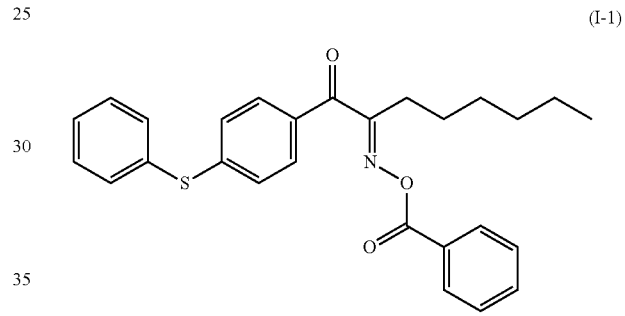

(I-1)

IRUGACURE OXE01
(Manufactured by BASF)

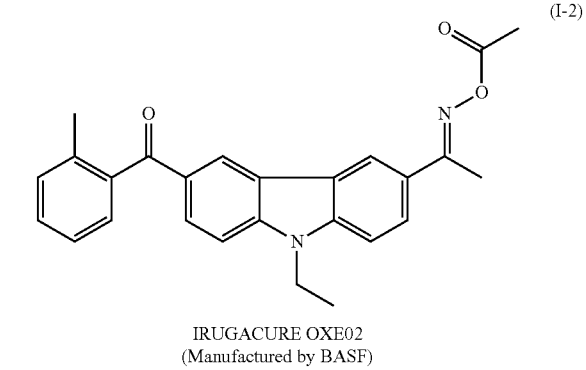

(I-2)

IRUGACURE OXE02
(Manufactured by BASF)

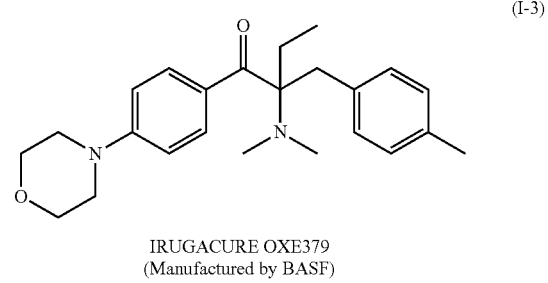

(I-3)

IRUGACURE OXE379
(Manufactured by BASF)

-continued (I-4)

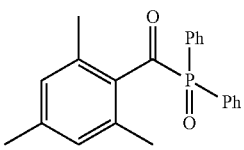

DAROCUR TPO
(Manufactured by BASF)

(I-5)

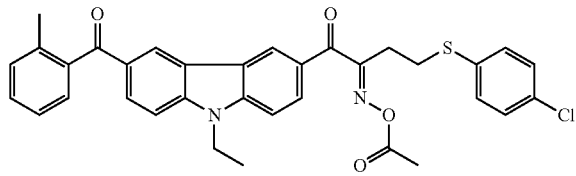

(I-6a)

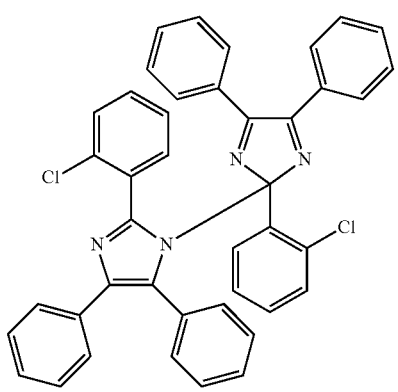

(I-6b)

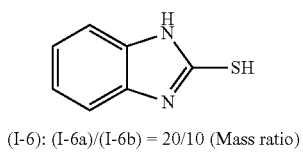

(I-6): (I-6a)/(I-6b) = 20/10 (Mass ratio)

(I-7)

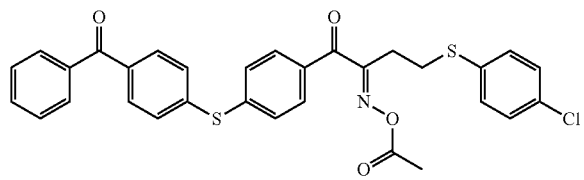

(I-8)

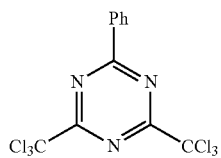

[Chem. 99]

(K1)

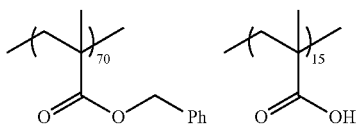

-continued

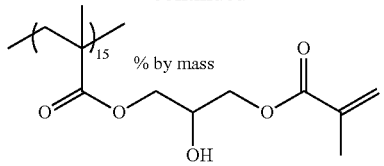

Mw 15,000

(K2)

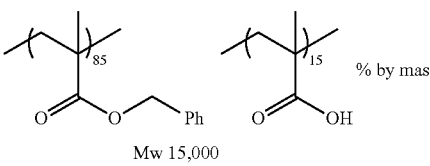

Mw 15,000

4. Performance Evaluation 4-1. Residues on Pattern of Other Colors 4-1-1. Residues on Red Pattern (Examples 1 to 20, 28, 32 to 36, 39, and 41 to 51, and Comparative Examples 1 and 5)

The following red composition was coated onto the undercoat layer of the undercoat layer-attached glass substrate obtained in section 2-1, thereby forming a coating film A. Thereafter, a heating treatment (pre-baking) was performed for 120 seconds by using a hot plate at 100° C. such that the dry film thickness of the coating film A became 1 μm. Subsequently, by using an exposure device UX3100-SR (manufactured by USHIO INC), the coating film was irradiated at a wavelength of 365 nm and an exposure amount of 100 mJ/cm². After exposure, by using a developer CD-2000 (manufactured by FUJIFILM Electronic Materials), development was performed at 25° C. for 40 seconds. Then the film was rinsed with running water for 30 seconds, followed by spray drying. Thereafter, post-baking was performed at 200° C. for 15 minutes. The spectrum of the obtained coating film A was measured to measure a transmissivity (transmissivity A) at 630 nm.

Subsequently, the radiation-sensitive coloring compositions of Examples 1 to 20, 28, 32 to 36, 39, and 41 to 51, and Comparative Examples 1 and 5 were coated respectively so as to yield a dry film thickness of 1 μm, and a heating treatment (pre-baking) was performed for 120 seconds by using a hot plate at 100° C., thereby obtaining a coating film B. Thereafter, the obtained glass substrate was loaded on a horizontal spinning table of a spin-shower developing machine (DW-30 model, manufactured by Chemitronics Co., Ltd.), and paddle development was performed at 23° C. for 60 seconds by using CD-2000 (manufactured by FUJIFILM Electronic Materials) to remove the coating film B. The spectrum of the obtained coating film was measured to measure a transmissivity (transmissivity B) at 630 nm. From a difference between transmissivities A and B, a percentage (%) was calculated so as to be used as an index for evaluating residues on a pattern. As the numerical value becomes close to 0%, this shows that the generation of residues have been suppressed.

(Coloring Composition for Red)

| | |
|---|---|
| Cyclohexanone | 1.133 parts |
| Alkali-soluble resin (K1) | 0.030 parts |
| Solsperse 20000 (1% cyclohexanone solution, manufactured by The Lubrizol Corporation, Japan) | 0.125 parts |
| Photopolymerization initiator (I-1) | 0.012 parts |

-continued

| | |
|---|---|
| The above pigment dispersion (PR254, pigment concentration 13.0%) | 0.615 parts |
| The above pigment dispersion (PY139, pigment concentration 13.0%) | 0.308 parts |
| Dipentaerythritol hexaacrylate (KAYARAD DPHA; manufactured by NIPPON KAYAKU Co., Ltd.) | 0.070 parts |
| Glycerol propoxylate (1% cyclohexane solution) | 0.048 parts |

4-1-2. Residues on Green Pattern (Examples 21 to 27, 29 to 31, 37, 38, and 40, and Comparative Examples 2 to 4)

The following green composition was coated onto the undercoat layer of the undercoat layer-attached glass substrate obtained in section 2-1, thereby forming a coating film C. Thereafter, a heating treatment (pre-baking) was performed for 120 seconds by using a hot plate at 100° C. such that the dry film thickness of the coating film became 1 p.m. Subsequently, by using an exposure device UX3100-SR (manufactured by USHIO INC), the coating film was irradiated at a wavelength of 365 nm and an exposure amount of 100 mJ/cm$^2$. After exposure, by using a developer CD-2000 (manufactured by FUJIFILM Electronic Materials), development was performed at 25° C. for 40 seconds. Then the film was rinsed with running water for 30 seconds, followed by spray drying. Thereafter, post-baking was performed at 200° C. for 15 minutes. The spectrum of the obtained coating film C was measured to measure a transmissivity (transmissivity C) at 530 nm.

Subsequently, the radiation-sensitive coloring compositions of Examples 21 to 27, 29 to 31, 37, 38, and 40, and Comparative Examples 2 to 4 were coated respectively so as to yield a dry film thickness of 1 μm, and a heating treatment (pre-baking) was performed for 120 seconds by using a hot plate at 100° C., thereby forming a coating film D. Thereafter, the obtained glass substrate was loaded on a horizontal spinning table of a spin-shower developing machine (DW-30 model, manufactured by Chemitronics Co., Ltd.), and paddle development was performed at 23° C. for 60 seconds by using CD-2000 (manufactured by FUJIFILM Electronic Materials) to remove the coating film D. The spectrum of the obtained coating film was measured to measure a transmissivity (transmissivity D) at 530 nm was measured. From a difference between transmissivities C and D, a percentage (%) was calculated so as to be used as an index for evaluating residues on a pattern. As the numerical value becomes close to 0%, this shows that the generation of residues have been suppressed.

(Coloring Composition for Green)

| | |
|---|---|
| Cyclohexanone | 1.133 parts |
| Alkali-soluble resin (K1) | 0.030 parts |
| Solsperse 20000 (1% cyclohexanone solution, manufactured by The Lubrizol Corporation, Japan) | 0.125 parts |
| Photopolymerization initiator (I-1) | 0.012 parts |
| The above pigment dispersion (PG36, pigment concentration 13.0%) | 0.615 parts |
| The above pigment dispersion (PY139, pigment concentration 13.0%) | 0.308 parts |
| Dipentaerythritol hexaacrylate (KAYARAD DPHA; manufactured by NIPPON KAYAKU Co., Ltd.) | 0.070 parts |
| Glycerol propoxylate (1% cyclohexane solution) | 0.048 parts |

4-2. Evaluation of Number of Coating Defects

The radiation-sensitive coloring compositions of Examples 1 to 51 and Comparative Examples 1 to 5 were coated onto the undercoat layer-attached silicon wafer by spin coating, followed by heating at 120° C. for 2 minutes on a hot plate. The film thickness after drying was 1.0 μm.

The number of defects (number/cm$^2$) of the substrate was measured using ComPlus manufactured by Applied Materials, Inc. The smaller the number of defects, the better.

TABLE 3

| Example | Color of pattern | Resin | Pigment | Initiator | Alkali-soluble resin | Residues on pattern of other colors (%) | Coating defects (number/cm$^2$) |
|---|---|---|---|---|---|---|---|
| 1 | Green | (J-1) | PY139 | (I-1) | K1 | 1 | 5 |
| 2 | Green | J-2 | PY139 | (I-1) | K1 | 1 | 6 |
| 3 | Green | (J-3) | PY139 | (I-1) | K1 | 3 | 13 |
| 4 | Green | (J-4) | PY139 | (I-1) | K1 | 1 | 5 |
| 5 | Green | (J-5) | PY139 | (I-1) | K1 | 5 | 22 |
| 6 | Green | (J-6) | PY139 | (I-1) | K1 | 5 | 25 |
| 7 | Green | (J-7) | PY139 | (I-1) | K1 | 1 | 6 |
| 8 | Green | (J-8) | PY139 | (I-1) | K1 | 6 | 8 |
| 9 | Green | (J-9) | PY139 | (I-1) | K1 | 8 | 9 |
| 10 | Green | (J-10)) | PY139 | (I-1) | K1 | 1 | 3 |
| 11 | Green | (J-11) | PY139 | (I-1) | K1 | 2 | 4 |
| 12 | Green | (J-12) | PY139 | (I-1) | K1 | 3 | 13 |
| 13 | Green | (J-13) | PY139 | (I-1) | K1 | 3 | 11 |
| 14 | Green | (J-14) | PY139 | (I-1) | K1 | 1 | 4 |
| 15 | Green | (J-15) | PY139 | (I-1) | K1 | 1 | 5 |
| 16 | Green | (J-16) | PY139 | (I-1) | K1 | 1 | 6 |
| 17 | Green | (J-17) | PY139 | (I-1) | K1 | 3 | 12 |
| 18 | Green | (J-18) | PY139 | (I-1) | K1 | 3 | 13 |
| 19 | Green | (J-19) | PY139 | (I-1) | K1 | 1 | 3 |
| 20 | Green | (J-20) | PY139 | (I-1) | K1 | 1 | 5 |
| 21 | Red | (J-21) | PY139 | (I-1) | K1 | 1 | 3 |
| 22 | Red | (J-22) | PY139 | (I-1) | K1 | 2 | 4 |
| 23 | Blue | (J-23) | PB 15:6 | (I-1) | K1 | 1 | 5 |
| 24 | Blue | (J-24) | PB 15:6 | (I-1) | K1 | 2 | 6 |
| 25 | Blue | (J-25) | PB 15:6 | (I-1) | K1 | 1 | 4 |
| 26 | Blue | (J-26) | PB 15:6 | (I-1) | K1 | 2 | 3 |
| 27 | Blue | (J-27) | PB 15:6 | (I-1) | K1 | 1 | 5 |
| 28 | Green | (J-28) | PG36 | (I-1) | K1 | 2 | 4 |
| 29 | Blue | (J-29) | PB 15:6 | (I-1) | K1 | 1 | 3 |
| 30 | Red | (J-30) | PR254 | (I-1) | K1 | 1 | 4 |
| 31 | Red | (J-31) | PR177 | (I-1) | K1 | 2 | 5 |
| 32 | Green | (J-32) | PG58 | (I-1) | K1 | 1 | 6 |

TABLE 3-continued

| Example | Color of pattern | Resin | Pigment | Initiator | Alkali-soluble resin | Residues on pattern of other colors (%) | Coating defects (number/cm$^2$) |
|---|---|---|---|---|---|---|---|
| 33 | Green | (J-33) | PG36 | (I-1) | K1 | 2 | 7 |
| 34 | Green | (J-34) | PG36 | (I-1) | K1 | 2 | 5 |
| 35 | Green | (J-35) | PY150 | (I-1) | K1 | 5 | 25 |
| 36 | Green | (J-36) | PG58 | (I-1) | K1 | 6 | 23 |
| 37 | Blue | (J-37) | PB 15:6 | (I-1) | K1 | 5 | 23 |
| 38 | Red | (J-38) | PR254 | (I-1) | K1 | 5 | 24 |
| 39 | Green | (J-39) | PY139 | (I-1) | K1 | 0 | 2 |
| 40 | Blue | (J-40) | PB 15:6 | (I-1) | K1 | 0 | 1 |
| 41 | Green | (J-41) | PY139 | (I-1) | K1 | 6 | 23 |
| 42 | Green | (J-42) | PB 15:6 | (I-1) | K1 | 1 | 6 |
| 42 | Green | (J-1) | PY139 | (I-2) | K1 | 1 | 6 |
| 43 | Green | (J-1) | PY139 | (I-3) | K1 | 5 | 23 |
| 44 | Green | (J-1) | PY139 | (I-4) | K1 | 6 | 28 |
| 45 | Green | (J-1) | PY139 | (I-5) | K1 | 0 | 1 |
| 46 | Green | (J-1) | PY139 | (I-6) | K1 | 3 | 16 |
| 47 | Green | (J-1) | PY139 | (I-7) | K1 | 0 | 1 |
| 48 | Green | (J-1) | PY139 | (I-8) | K1 | 3 | 14 |
| 49 | Green | (J-1) | PY139 | (I-1) | K2 | 6 | 24 |
| 50 | Green | (J-1) | — | (I-1) | K1 | 6 | 23 |
| 51 | Green | (J-1) | — | (I-1) | — | 7 | 24 |
| Comparative Synthesis Example 1 | Green | (H-1) | PY139 | (I-1) | K1 | 23 | 41 |
| Comparative Synthesis Example 2 | Red | (H-2) | PY139 | (I-1) | K1 | 24 | 46 |
| Comparative Synthesis Example 3 | Blue | (H-3) | PB 15:6 | (I-1) | K1 | 26 | 42 |
| Comparative Synthesis Example 4 | Blue | (H-4) | PB 15:6 | (I-1) | K1 | 22 | 42 |
| Comparative Synthesis Example 5 | Green | (H-5) | PY139 | (I-1) | K1 | 21 | 48 |

As clearly shown from the results described in Table 3, it is understood that Comparative Examples 1 to 5 using the resins (H-1) to (H-5) in which a proportion of a peak area of the component having a molecular weight of 20,000 or more in a peak area of the total molecular weight distribution of the resin exceeds 10% generate a large amount of residues on a pattern of other colors, and cause a large degree of coating defects.

On the other hand, it is understood that Examples 1 to 42 using the resins (J-1) to (J-42) in which a proportion of a peak area of the component having a molecular weight of 20,000 or more in a peak area of the total molecular weight distribution of the resin is 10% or less generates a small amount of residues on a pattern of other colors and causes a small degree of coating defects.

Example 52

Preparation of Color Filter of Full Colors for Solid-State Imaging Device

By using the radiation-sensitive coloring composition for green prepared in Example 39, green pixels were formed in a 1.2 μm×1.2 μm island bayer pattern. Thereafter, by using the radiation-sensitive coloring composition for red prepared in Example 21, red pixels were formed in a 1.2 μm×1.2 μm island pattern. In addition, in the remaining grid, blue pixels were formed in a 1.2 μm×1.2 μm island pattern by using the radiation-sensitive coloring composition for blue prepared in Example 40. In this manner, a color filter for a solid-state imaging device of a light shielding portion was prepared.

—Evaluation—

The obtained color filter of full colors for a solid-state imaging device was installed in a solid-state imaging device, and as a result, it was confirmed that the solid-state imaging device showed high resolution and excellent color separation properties.

What is claimed is:

1. A coloring composition comprising a resin (A) having a dye structure,
    wherein in a peak area of the total molecular weight distribution of the resin (A) measured by gel permeation chromatography, a proportion of a peak area of a component having a molecular weight of 20,000 or more is 10% or less,
    the dye structure of the resin (A) is a structure derived from a dye selected from the group consisting of a xanthene dye, a cyanine dye, a squarylium dye, a quinophthalone dye, and a subphthalocyanine dye, and
    the resin (A) contains a polymerizable group having an ethylenically unsaturated bond in the side chain of the resin (A) after polymerization.

2. The coloring composition according to claim 1, wherein the weight average molecular weight of the resin (A) is 4,000 to 15,000.

3. The coloring composition according to claim 1, further comprising (B) a pigment.

4. The coloring composition according to claim 1, further comprising (C) a polymerizable compound and (D) a photopolymerization initiator.

5. The coloring composition according to claim 1, further comprising (E) an alkali-soluble resin.

6. The coloring composition according to claim 1, which is used for forming a colored layer of a color filter.

7. The coloring composition according to claim 1, wherein the resin (A) is a resin having a dye structure that includes at least one of the constitutional units represented by the following General Formulae (A), (B), and (C):

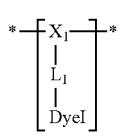

General Formula (A)

wherein in the General Formula (A), $X_1$ represents a linking group formed by polymerization, $L_1$ represents a single bond or a divalent linking group, and DyeI represents a dye structure;

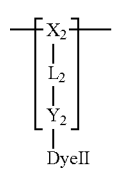

General Formula (B)

wherein in the General Formula (B), $X_2$ has the same definition as that of $X_1$ in the General Formula (A), $L_2$ has the same definition as that of $L_1$ in the General Formula (A), $Y_2$ represents a group that can form an ionic bond or a coordinate bond with DyeII, and DyeII represents a dye structure;

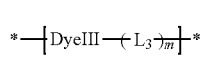

General Formula (C)

wherein in the General Formula (C), $L_3$ represents a single bond or a divalent linking group, DyeIII represents a partial structure of a dye, and m represents 0 or 1.

8. The coloring composition according to claim 1, wherein the dye structure of the resin (A) is a structure derived from a dye selected from the group consisting of a xanthene dye and a squarylium dye.

9. The coloring composition according to claim 7, wherein DyeI, DyeII, and DyeIII represent a partial structure derived from a xanthene compound represented by the following General Formula (J):

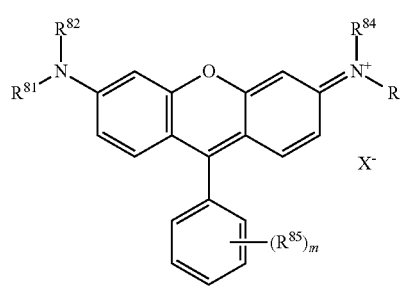

General Formula (J)

wherein in the General Formula (J), each of $R^{81}$, $R^{82}$, $R^{83}$, and $R^{84}$ independently represents a hydrogen atom or a monovalent substituent;

each $R^{85}$ independently represents a monovalent substituent;

m represents an integer of 0 to 5; and $X^-$ represents an anion.

10. The coloring composition according to claim 1, wherein the resin (A) has an acid value of from 0.3 mmol to 2.0 mmol based on 1 g of the resin (A).

11. The coloring composition according to claim 4, wherein the photopolymerization initiator (D) is an oxime compound.

12. The coloring composition according to claim 7, wherein the resin (A) is a resin having a dye structure that includes the constitutional unit represented by the General Formula (A).

13. The coloring composition according to claim 1, wherein the ethylenically unsaturated bond is a (meth) acryloyl group.

14. The coloring composition according to claim 13, wherein the resin (A) includes at least one of the constitutional units represented by the following Formulae (G-1) to (G-6), (G-8), and (G-9):

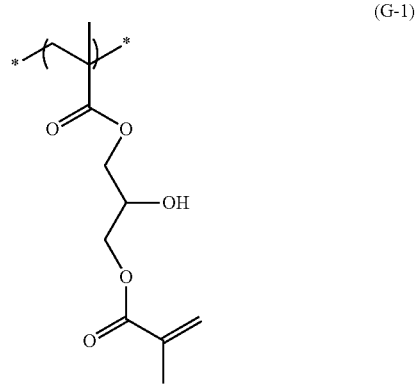

(G-1)

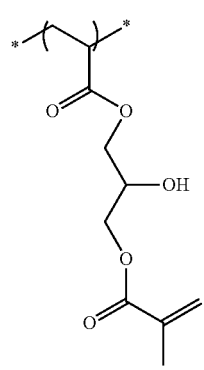

(G-2)

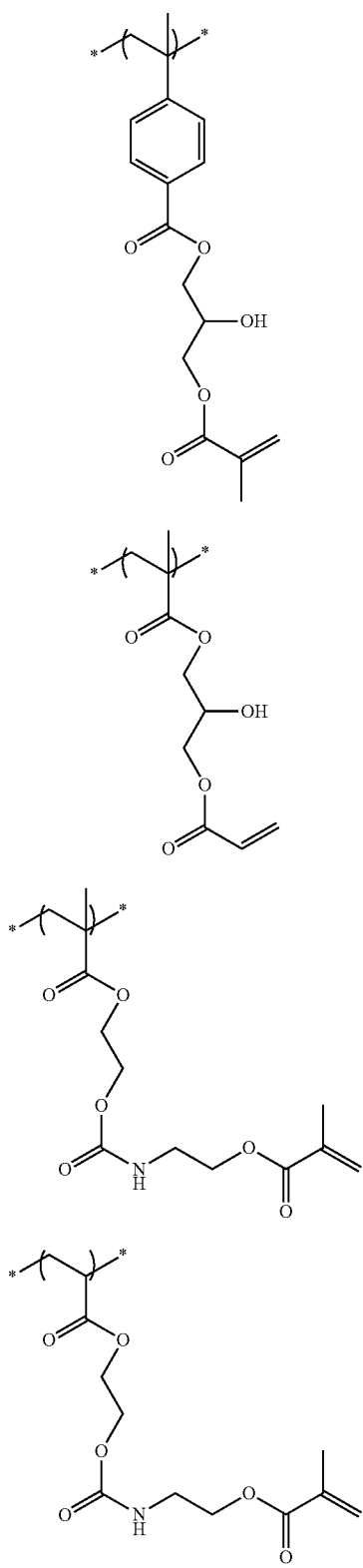

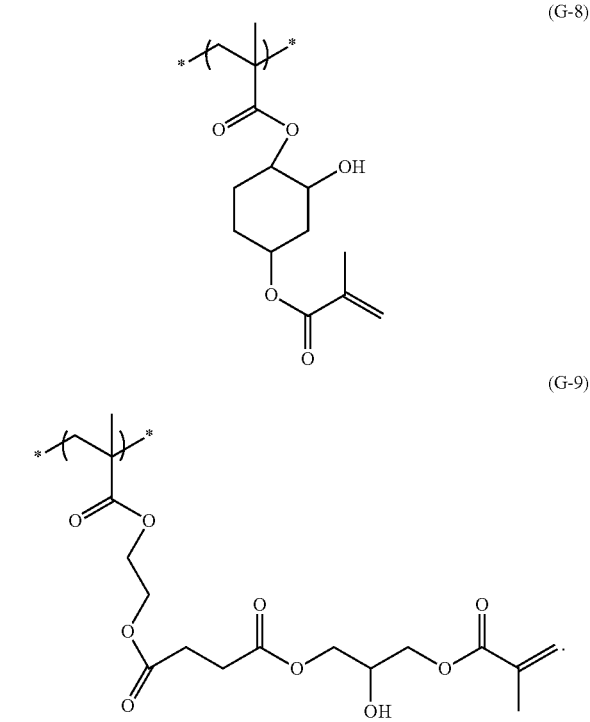

15. The coloring composition according to claim 7,
wherein DyeI, DyeII, and DyeIII represent a partial structure derived from a quinophthalone compound represented by the following General Formula (QP):

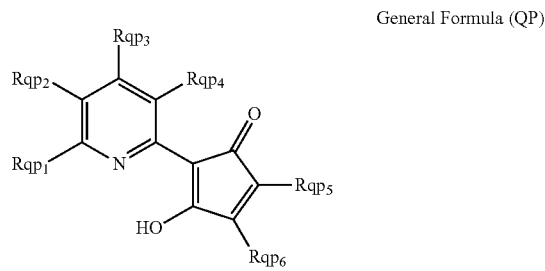

wherein in the General Formula (QP),
each of $Rqp_1$ to $Rqp_6$ independently represents a hydrogen atom or a substituent, when at least two out of $Rqp_1$ to $Rqp_6$ are adjacent to each other, these may form a ring by binding to each other, and the ring may further have a substituent.

16. The coloring composition according to claim 9,
wherein in the General Formula (J),
each of $R^{82}$ and $R^{83}$ represents a hydrogen atom; and
each of $R^{81}$ and $R^{84}$ independently represents a substituted or unsubstituted phenyl group.

* * * * *